United States Patent [19]

Hyatt

[11] Patent Number: 4,910,706

[45] Date of Patent: Mar. 20, 1990

[54] ANALOG MEMORY FOR STORING DIGITAL INFORMATION

[76] Inventor: Gilbert P. Hyatt, P.O. Box 846, Cypress, Calif. 90630

[21] Appl. No.: 520,277

[22] Filed: Aug. 4, 1983

Related U.S. Application Data

[60] Division of Ser. No. 160,871, Jun. 19, 1980, Pat. No. 4,445,189, which is a continuation-in-part of Ser. No. 899,301, Mar. 23, 1978, Pat. No. 4,332,819, Ser. No. 860,278, Dec. 13, 1977, Pat. No. 4,471,385, Ser. No. 849,812, Nov. 9, 1977, Ser. No. 844,765, Oct. 25, 1977, Pat. No. 4,523,290, Ser. No. 812,285, Jul. 1, 1977, Pat. No. 4,371,953, Ser. No. 801,879, May 13, 1977, Pat. No. 4,144,582, Ser. No. 754,660, Dec. 27, 1976, Pat. No. 4,486,850, Ser. No. 752,240, Dec. 20, 1976, abandoned, Ser. No. 730,756, Oct. 7, 1976, abandoned, Ser. No. 727,330, Sep. 27, 1976, abandoned, Ser. No. 550,231, Feb. 14, 1975, Pat. No. 4,209,843, Ser. No. 552,559, Nov. 11, 1974, Pat. No. 4,209,852, Ser. No. 490,816, Jul. 22, 1974, Pat. No. 4,209,853, Ser. No. 476,743, Jun. 5, 1974, Pat. No. 4,364,110, Ser. No. 402,520, Oct. 1, 1973, Pat. No. 4,825,364, Ser. No. 366,714, Jun. 4, 1973, Pat. No. 3,986,922, Ser. No. 339,817, Mar. 9, 1973, Pat. No. 4,034,276, Ser. No. 325,941, Jan. 22, 1973, Pat. No. 4,060,848, Ser. No. 325,933, Jan. 22, 1973, Pat. No. 4,016,540, Ser. No. 302,771, Nov. 1, 1972, Ser. No. 291,394, Sep. 22, 1972, Pat. No. 4,396,976, Ser. No. 288,247, Sep. 11, 1972, Pat. No. 4,121,284, Ser. No. 246,867, Apr. 24, 1972, Pat. No. 4,310,878, Ser. No. 229,213, Apr. 13, 1972, Pat. No. 3,820,894, Ser. No. 232,459, Mar. 7, 1972, Pat. No. 4,370,720, Ser. No. 230,872, Mar. 1, 1972, Pat. No. 4,531,182, Ser. No. 135,040, Apr. 19, 1971, Ser. No. 134,958, Apr. 19, 1971, and Ser. No. 101,881, Dec. 28, 1970.

[51] Int. Cl.$^4$ .............................................. G11C 13/00
[52] U.S. Cl. ............................... 365/45; 365/189.01; 365/230.01; 365/222
[58] Field of Search .............. 365/45, 189, 230, 222, 365/189.01, 230.01

[56] References Cited

U.S. PATENT DOCUMENTS 3,763,480 10/1973 Weimer ......................... 365/45 SM
3,772,658 11/1973 Sarlo ............................. 365/45 SM
3,914,748 10/1975 Barton ................................ 365/45
3,958,210 5/1976 Levine ............................... 365/183
3,986,176 10/1976 Weimer ............................. 365/45
3,991,409 11/1976 Dautremont ..................... 365/45
4,092,734 5/1978 Collins et al. .................... 365/45
4,271,488 6/1981 Saxe .................................. 365/45

OTHER PUBLICATIONS

Huskey et al., *Computer Handbook*, First Edition, McGraw-Hill Book Company, Inc., New York, 1962, pp. 6–26, 27, 44 (hereinafter Huskey).

Primary Examiner—Terrell W. Fears
Attorney, Agent, or Firm—Gilbert P. Hyatt

[57] ABSTRACT

The present invention is directed to an analog memory for storing digital information in analog signal form. Typically, digital information is stored in digital signal form, where each digital bit is stored in a separate digital memory cell. In accordance with the present invention, an analog memory such as a charge transfer device (CTD), bubble memory, or magnetostrictive memory is used to store analog signals. Each analog signal is representative of a plurality of digital bits, thereby providing storage for a plurality of digital bits in each analog memory cell. Use of such an analog memory in combination with a digital system facilitates a hybrid memory, where digital information is stored in analog signal form. In one embodiment, a digital to analog converter is used to convert digital information from a digital processor to analog signal form for storage in an analog memory and an analog to digital converter is used to convert analog signals stored in an analog memory to digital signal form for processing with the digital processor. In another embodiment, an analog read only memory is used to store a program for a stored program digital computer in analog signal form. Storage of digital information in analog signal form increases the efficiency of storage because a plurality of digital bits can be stored in each memory cell. An embodiment having analog error compensation utilizes a reference signal for adaptive compensation of errors. Various systems using such memories are disclosed including signal processors, stored program computers, reverberation systems, and others.

35 Claims, 13 Drawing Sheets

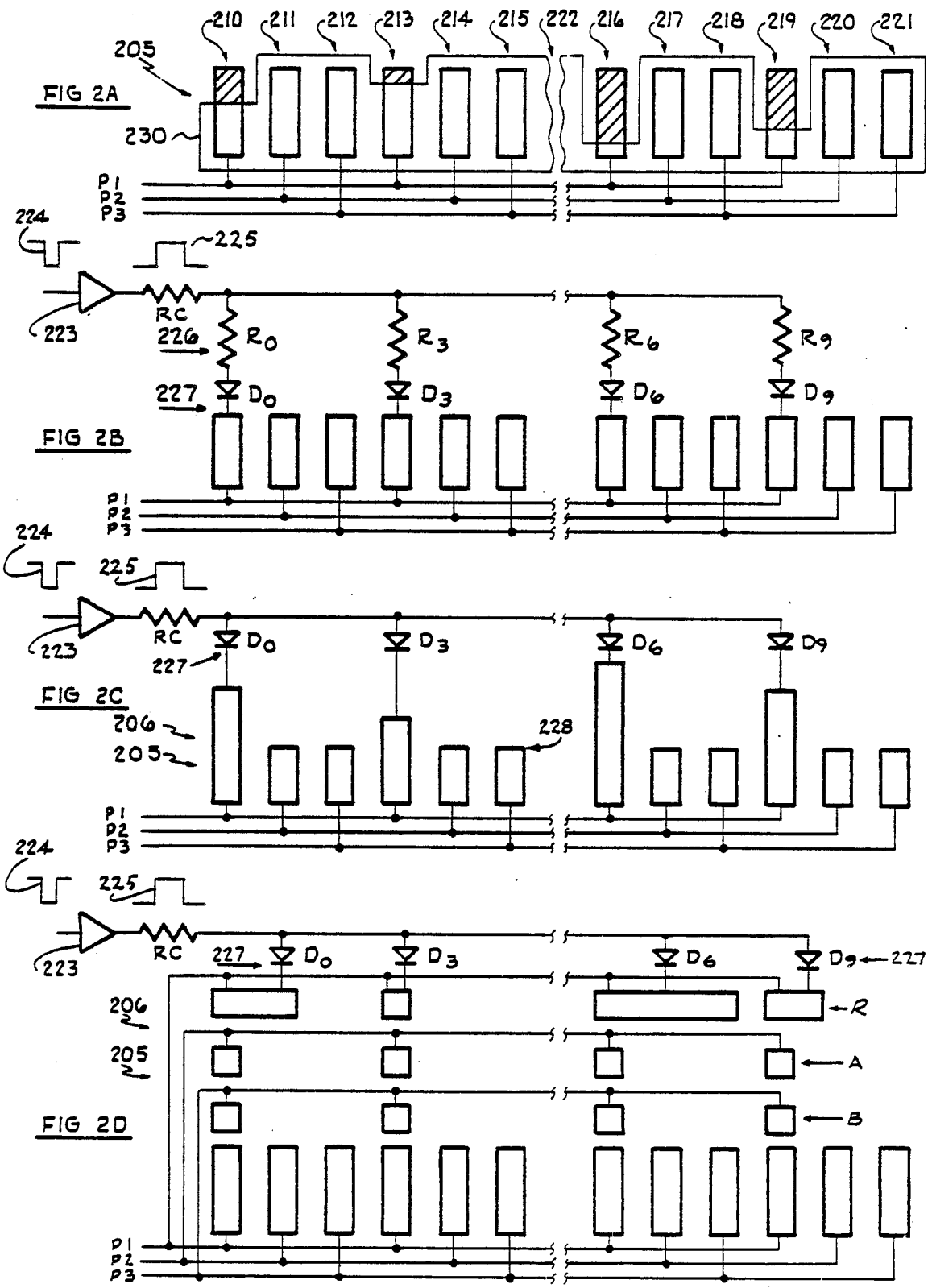

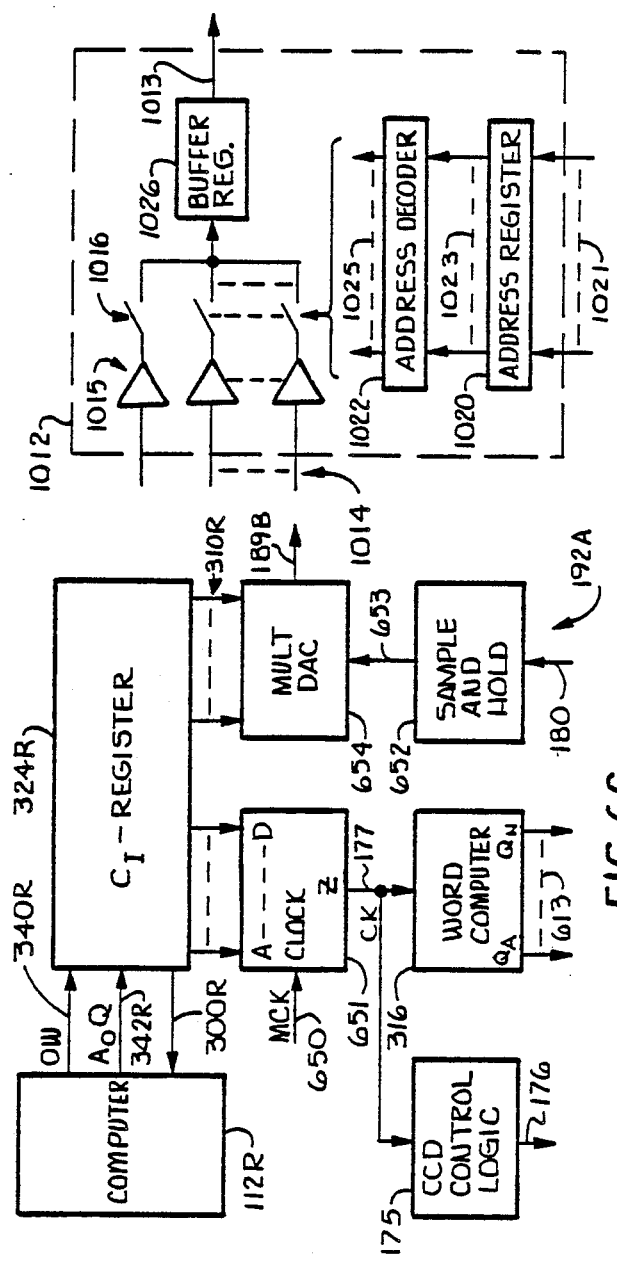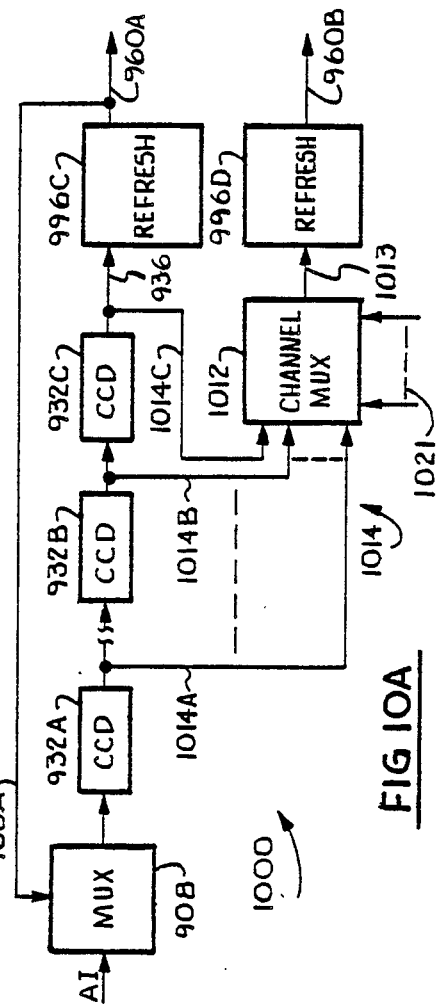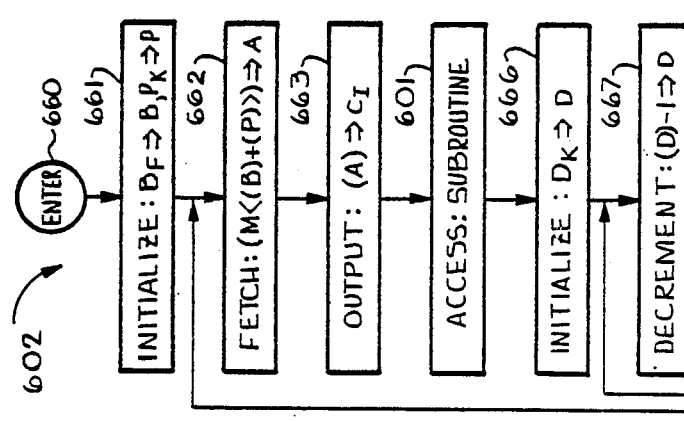

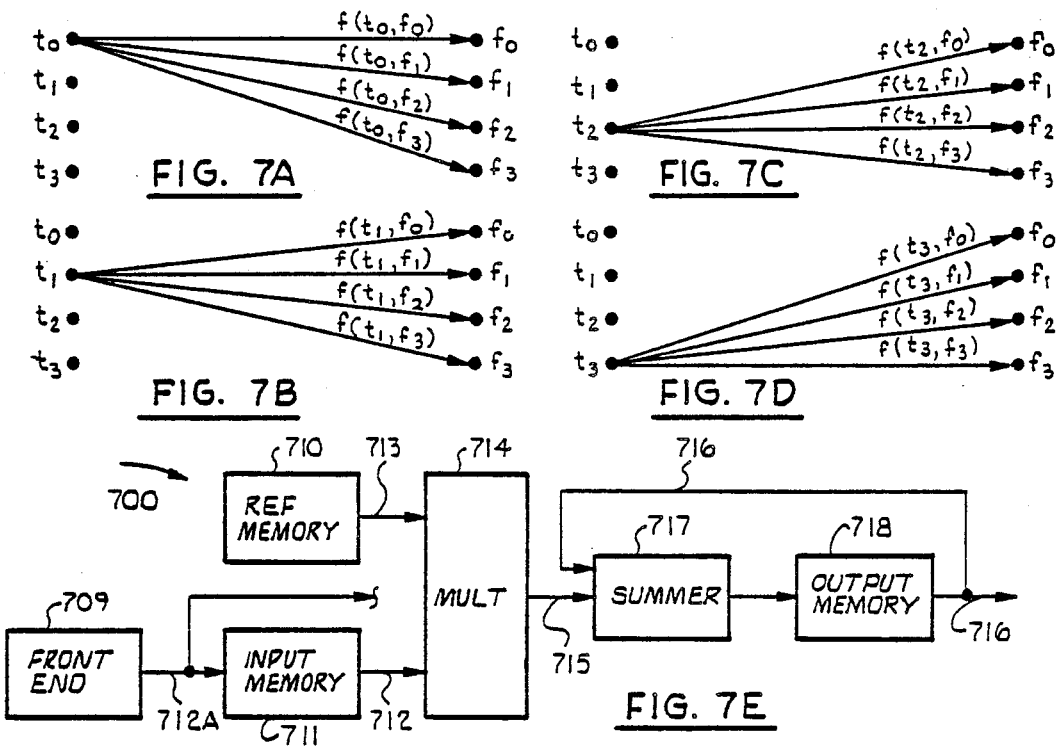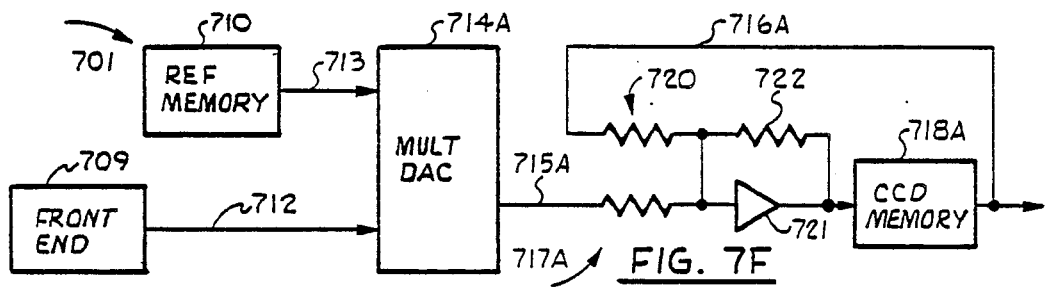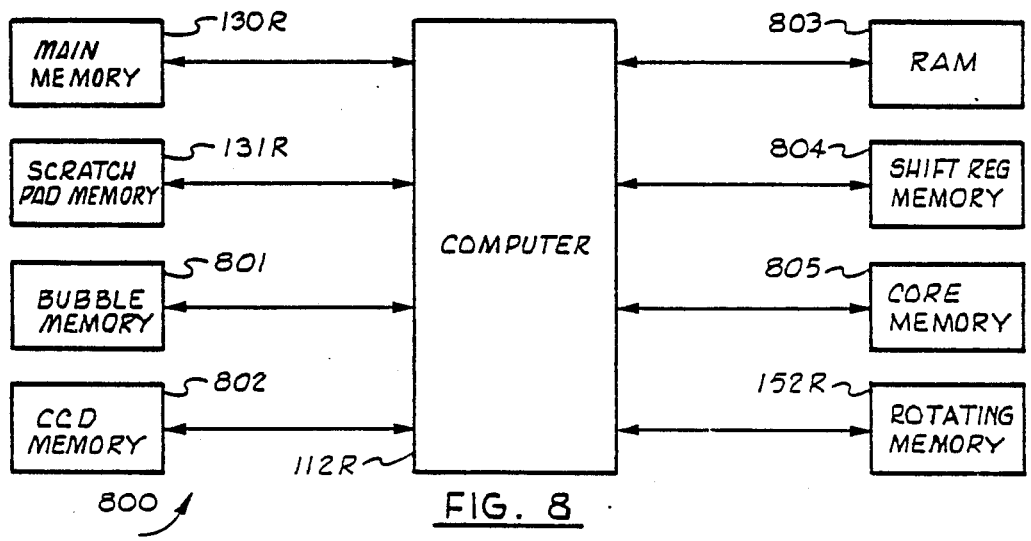

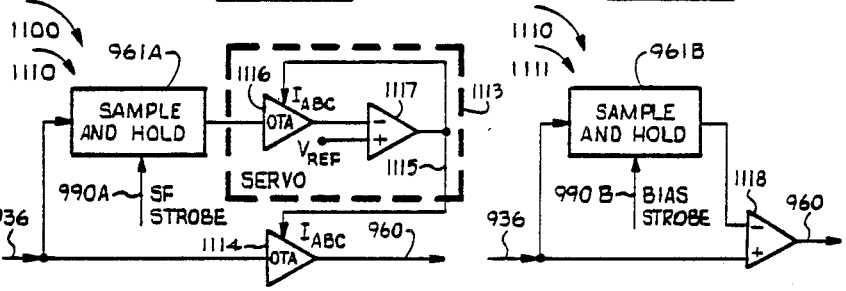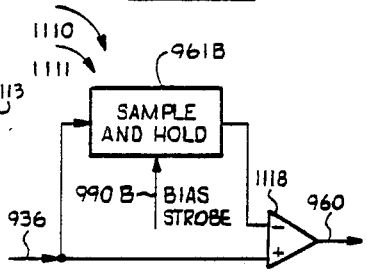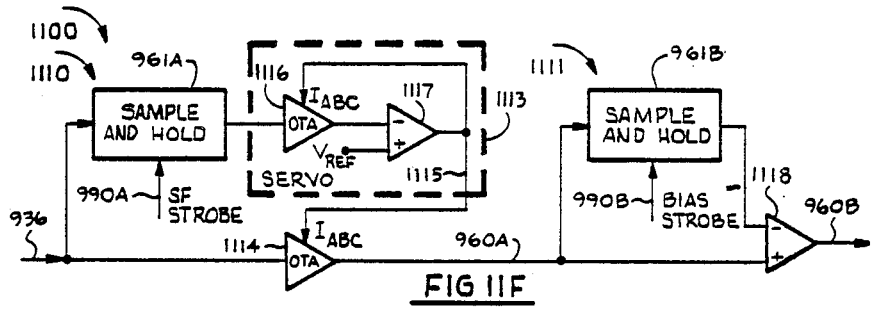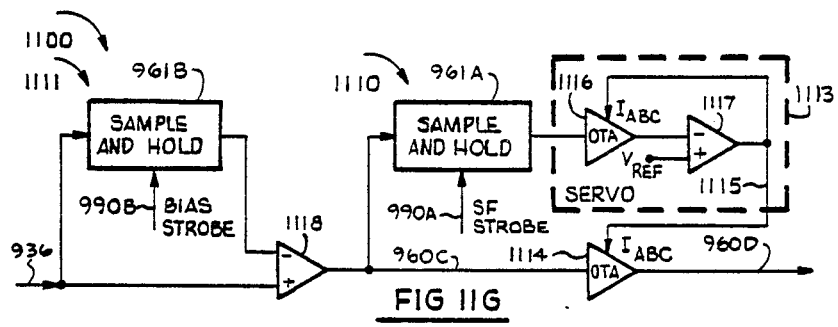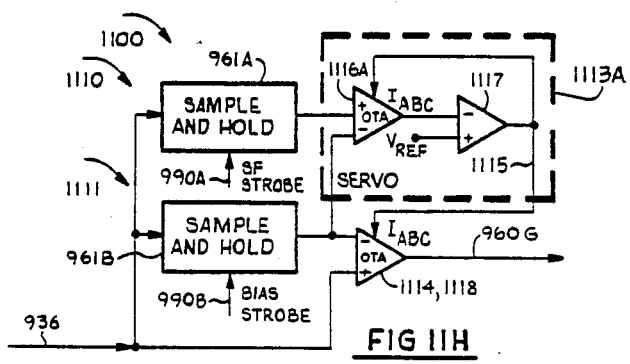

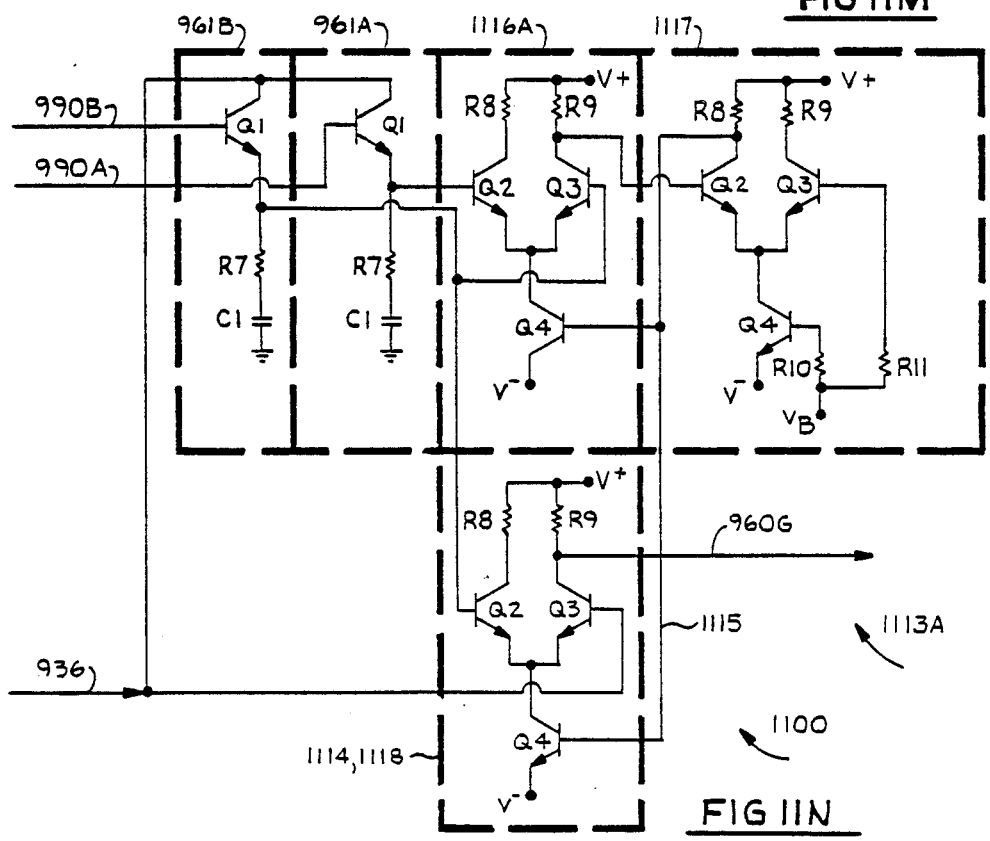

ANALOG MEMORY FOR STORING DIGITAL INFORMATION

CROSS REFERENCE TO RELATED APPLICATIONS

This application is a divisional application of parent application ANALOG MEMORY FOR STORING DIGITAL INFORMATION S/N 160,871 filed on June 19, 1980 now U.S. Pat. No. 4,445,189 issued on Apr. 24, 1984 which is a continuation in part of each application in the following chain of parent patent applications copending therebetween:

(1) FACTORED DATA PROCESSING SYSTEM FOR DEDICATED APPLICATIONS S/N 101,881 filed on Dec. 28, 1970 wherein proceedings therein have been terminated;

(2) CONTROL SYSTEM AND METHOD S/N 134,958 filed on Apr. 19, 1971 and still pending;

(3) CONTROL APPARATUS S/N 135,040 filed on Apr. 19, 1971 and still pending;

(4) APPARATUS AND METHOD FOR PRODUCING HIGH REGISTRATION PHOTOMASKS S/N 229,213 filed on Apr. 13, 1972 now Pat. No. 3,820,894 issued on June 28, 1974;

(5) MACHINE CONTROL SYSTEM OPERATING FROM REMOTE COMMANDS S/N 230,872 filed on Mar. 1, 1972 now Pat. No. 4,531,182 issued on July 23, 1985;

(6) COORDINATE ROTATION FOR MACHINE COONTROL SYSTEMS Pat. No. 4,370,720 issued on Jan. 25, 1983;

(7) DIGITAL FEEDBACK CONTROL SYSTEM S/N 246,867 filed on Apr. 24, 1972 now Pat. No. 4,310,878 issued on Jan. 12, 1982;

(8) COMPUTERIZED SYSTEM FOR OPERATOR INTERACTION S/N 288,247 filed on Sept. 11, 1972 now Pat. No. 4,121,284 issued on Oct. 17, 1978;

(9) A SYSTEM FOR INTERFACING A COMPUTER TO A MACHINE S/N 291,394 filed on Sept. 22, 1972 now Pat. No. 4,396,976 issued on Aug. 2, 1983;

(10) DIGITAL ARRANGEMENT FOR PROCESSING SQUAREWAVE SIGNALS S/N 302,771 filed on Nov. 1, 1972 and still pending;

(11) APPARATUS AND METHOD FOR PROVIDING INTERACTIVE AUDIO COMMUNICATION S/N 325,933 filed on Jan. 22, 1973 now Pat. No., 4,016,540 issued on Apr. 5, 1977;

(12) ELECTRONIC CALCULATOR SYSTEM HAVING AUDIO MESSAGES FOR OPERATOR INTERACTION S/N 325,941 filed on Jan. 22, 1973 now Pat. No. 4,060,848 issued on Nov. 29, 1977;

(13) ILLUMINATION CONTROL SYSTEM S/N 366,714 filed on June 4, 1973 now Pat. No. 3,986,922 issued on Oct. 12, 1976;

(14) DIGITAL SIGNAL PROCESSOR FOR SERVO VELOCITY CONTROL S/N 339,817 filed on Mar. 9, 1973 now Pat. No. 4,034,276 issued on July 5, 1977;

(15) MONOLITHIC DATA PROCESSOR WITH MEMORY REFRESH S/N 402,520 filed on Oct. 1, 1973 now Pat. No. 4,825,364 issued on Apr. 25, 1989;

(16) HOLOGRAPHIC SYSTEM FOR OBJECT LOCATION AND IDENTIFICATION S/N 490,816 filed on July 22, 1974 now Pat. No. 4,029,853 issued on June 24, 1980;

(17) COMPUTERIZED MACHINE CONTROL SYSTEM S/N 476,743 filed on June 5, 1974 now Pat. No. 4,364,110 issued on Dec. 14, 1982;

(18) SIGNAL PROCESSING AND MEMORY ARRANGEMENT S/N 522,559 filed on Nov. 11, 1974 now Pat. No. 4,209,852 issued on June 24, 1980;

(19) METHOD AND APPARATUS FOR SIGNAL ENHANCEMENT WITH IMPROVED DIGITAL FILTERING S/N 550,231 filed on Feb. 14, 1975 now Pat. No. 4,209,843 issued on June 24, 1980;

(20) ILLUMINATION SIGNAL PROCESSING SYSTEM S/N 727,330 filed on Sept. 27, 1976 now abandoned in favor of continuing applications;

(21) PROJECTION TELEVISION SYSTEM USING LIQUID CRYSTAL DEVICES S/N 730,756 filed on Oct. 7, 1976 now abandoned;

(22) INCREMENTAL DIGITAL FILTER S/N 754,660 filed on Dec. 27, 1976 now Pat. No. 4,486,850 issued on Dec. 4, 1984;

(23) MEANS AND METHOD FOR COMPUTERIZED SOUND SYNTHESIS S/N 752,240 filed on Dec. 20, 1976 now abandoned in favor of continuing applications;

(24) VOICE SIGNAL PROCESSING SYSTEM S/N 801,879 filed on May 13, 1977 now Pat. No. 4,144,582 issued on Mar. 13, 1979;

(25) ANALOG READ ONLY MEMORY S/N 812,285 filed on July 1, 1977 now Pat. No. 4,371,953 issued on Feb. 1, 1983;

(26) DATA PROCESSOR ARCHITECTURE S/N 844,765 filed on Oct. 25, 1977 now Pat. No. 4,523,290 issued on June 11, 1985;

(27) DIGITAL SOUND SYSTEM FOR CONSUMER PRODUCTS S/N 849,812 filed on Nov. 9, 1977 and still pending;

(28) ELECTRO-OPTICAL ILLUMINATION CONTROL SYSTEM S/N 860,278 filed on Dec. 13, 1977 now Pat. No. 4,471,385 issued on Sept. 11, 1984; and

(29) MEMORY SYSTEM HAVING SERVO COMPENSATION S/N 889,301 filed on Mar. 23, 1978 now Pat. No. 4,322,819 issued on Mar. 30, 1982;

all by Gilbert P. Hyatt; where the benefit of the filing dates of the above-listed parent applications are herein claimed in accordance with the United States Code such as with 35 USC 120 and 35 USC 121:

where all of the above listed patents and patent applications are incorporated herein by reference as if fully set forth at length herein; and where one skilled in the art will be able to combine the disclosures in said applications and patents that are incorporated by reference with the disclosure in the instant application from the disclosures therein and the disclosures herein.

BACKGROUND OF THE INVENTION

1. Field of the invention.

The present invention is related to electronic memories such as may be used for data processors and signal processors.

2. Description of the prior art.

The prior art uses many different types of memories such as magnetic memories, integrated circuit memories, magnetostrictive delay line memories, and optical memories. Magnetic memories include magnetic core memories and plated wire memories. Integrated circuit memories include shift registers, charge transfer devices (CTDs), and random access memories (RAMs). Bubble memories are magnetic in nature and are implemented with integrated circuit processes. These memories are used with digital systems, where digital information is stored as a single digital bit per memory cell. Hence, a digital word having a plurality of digital bits is stored in a plurality of memory cells storing a single digital bit per memory cell. In analog systems such as analog computers or analog signal processors, analog signals are stored in analog signal form with memories such as potentionmeters and CCD memories. Digital systems do not store digital information in analog signal form, such as interfacing an analog memory to a digital processor with a digital to analog converter at the input to the analog memory and an analog to digital converter at the output from the analog memory interfacing to the processor. Main memories for stored program computers are implemented with digital memories, not analog memories.

The prior art is further defined in the art-of-record of the related applications in the chain of continuing applications including Pat. No. 3,356,989 to Autry; Pat. No. 3,613,771 to Quay; Pat. No. 3,618,052 to Kwei; Pat. No. 3,643,106 to Berwin; Pat. No. 3,654,499 to Smith; Pat. No. 3,662,351 to Ho; Pat. No. 3,775,738 to Quay; Pat. No. 3,753,242 to Townsend; Pat. No. 3,755,793 to Ho; Pat. No. 3,757,313 to Hines; Pat. No. 3,761,901 to Aneshansely; Pat. No. 3,771,148 to Aneshansley; Pat. No. 3,774,177 to Schaffer; Pat. No. 3,787,852 to Puckette; Pat. No. 3,801,967 to Berger; Pat. No. 3,826,926 to White; Pat. No. 3,852,745 to Le Bail; Pat. No. 3,873,958 to Whitehouse; Pat. No. 3,876,989 to Bankowski; Pat. No. 3,889,245 to Gosney; Pat. No. 3,891,977 to Amelio; Pat. No. 3,895,342 to Mallet; Pat. No. 3,909,806 to Uchida; Pat. No. 3,914,748 to Barton; and Pat. No. 3,942,034 to Buss and including the article by Dennard, IBM Technical Disclosure Bulletin, Vol 14, No 12, May 1972, pages 3791-3792; the article by Altman, Electronics Magazine, Feb. 28, 1972, pages 62-71; and the article by Baertsch, Electronics Magazine, Dec. 6, 1971, pages 86-91 which references are all incorporated herein by reference.

SUMMARY OF THE INVENTION

The present invention is directed to an improved memory system. In one embodiment, this memory system may be termed a hybrid memory system where digital information is stored in analog signal form. This digital information that is stored in the analog memory may be a stored program for a stored program digital computer, operands, data, and other information. This information is used by the data processor as digital information and is stored in the memory in analog signal form. Digital information can be stored in an analog memory by converting the digital information to an analog signal form such as with a digital to analog converter. Analog information from the analog memory can be used with a digital processor by converting the analog information to digital signal form such as with an analog to digital converter. In one embodiment, a digital system is interfaced as an analog memory with a digital to analog converter accepting digital information from the digital system and converting it to analog information for storage in the analog memory and with an analog to digital converter receiving analog information from the analog memory and providing digital information to the digital system. Storage of digital information in analog signal form provides important efficiencies. For example, an analog memory can store a plurality of digital bits in analog signal form in a single analog memory cell while a digital memory stores a single digital bit in each digital memory cell. Particular advantages are obtained by using analog serial memories such as charge transfer devices (CTDs), magnetic bubble memories, and magnetostrictive delay line memories.

The system of the present invention provides for servo control of memory compensation. In one embodiment, a memory compensation signal is generated in response to stored information to compensate for memory errors. Also, an implicit servo may be used for compensation of stored information such as for amplitude compensation.

One embodiment of the memory system of the present invention is a read only memory, where the preferred embodiment thereof is an analog read only memory using charge coupled devices. Fixed but selectable charge packets are used to charge elements in a charge coupled device array; where selectable charging may be provided by selecting resistor values, selecting capacitor values, selectable masking of photo detectors, and other such methods. The accumulated fixed packets of charge are then shifted with a charge coupled device register to provide sequential analog signal outputs. Use of an analog read only memory permits hybrid signal processing such as for voice response. Use of a serial output simplifies the accessing and reduces accessing electronics by eliminating the more complex random access arrangements. The analog read only memory of the present invention has the additional advantage of being a nonvolatile memory for preserving stored information when power is removed; where conventional charge coupled device memories are volatile and lose all stored information when power is removed. The analog read only memory of the present invention is particularly useful in systems for generating analog output signals such as voice response systems and filtering systems. Accessing of analog samples from the read only memory can be controlled with a digital processor such as by controlling shifting of the charge coupled device shift register and by selecting the desired output information under digital control.

The CCD ROM of the present invention provides an important solution to a major technological problem. Multitudes of electronic systems such as electronic game systems, electronic appliance systems, electronic calculators, and other such devices have been severely limited in the amount of memory available because of the high cost of memory. For example, in implementing a talking doll the memory required for speech sample storage completely dominated the total cost budget thereby rendering such a device to be economically unfeasible. Various memory alternatives were considered such as conventional CCD memories and bubble memories which are both indicated to be low in cost.

Relative to bubble memories, the cost per bit is low but only for large systems wherein bubble memories require complex overhead circuitry devices such as magnets. Therefore, although large bubble memories have a low cost per bit, a minimum bubble memory system may cost several hundred dollars due to overhead cost factors.

Relative to CCD memories, they are conceptually low in cost even for small memory systems but are inherently volatile type memories which lose information due to power removal or due to other conditions such as electrical noise. Therefore, CCD memories have been considered to be inappropriate for storing permanent information.

In view of the above, memory technologies are generally considered in the art to preclude low-cost applications requiring large amounts of memory such as an electronic talking doll system. In order to solve this "unfilled need", the present invention is directed to a CCD ROM having non-volatile storage for permanent information and having low cost.

Further, in accordance with the hybrid memory arrangement of the present invention, a hybrid memory is provided for storing analog information under digital control. Therefore a complete analog parameter may be stored in one CCD memory element in direct contrast to prior art digital memories which merely store one digital bit of one word in a CCD memory element, thereby achieving greater storage density and lower cost per word with the memory arrangement of the present invention.

An object of the present invention is to provide a low-cost electronic memory.

Another object of the present invention is to provide a non-volatile electronic memory.

Yet another object of the present invention is to provide an analog read only memory.

Yet another object of the present invention is to provide a reverberation filter.

Still another object of the present invention is to provide a non-volatile CCD memory.

Yet still another object of the present invention is to provide a combination non-volatile and volatile CCD memory.

Yet still another object of the present invention is to provide an adaptive refresh arrangement.

A further object of the present invention is to provide a hybrid memory for improved storage capacity.

A still further object of the present invention is to provide improved signal processing arrangements.

A yet still further object of the present invention is to provide a monolithic memory system.

The foregoing and other objects, features, and advantages of the present invention will become apparent from the following detailed descriptions of preferred embodiments of this invention, as illustrated in the accompanying drawings.

BRIEF DESCRIPTION OF THE DRAWINGS

A better understanding of the present invention may be obtained from a consideration of the detailed description hereinafter taken in conjunction with the drawings which are briefly described below.

FIG. 2 comprising FIGS. 2A-2D illustrates ROM arrangements in accordance with the present invention wherein FIG. 2A sets forth an optical ROM arrangement, FIG. 2B sets forth a resistance ROM arrangement, FIG. 2C sets forth an electrode dimensional ROM arrangement, and FIG. 2D sets forth an electrode dimensional ROM arrangement in combination with a parallel input load serial output arrangement in accordance with the block diagram of FIG. 1.

FIG. 3 comprising

FIG. 6 comprising FIGS. 6A-6D illustrates memory control and memory access arrangements wherein FIG. 6A sets forth a block access arrangement, FIG. 6B sets forth a computer program flow diagram for implementing block accesses, FIG. 6C sets forth an arrangement for controlling characteristics of a block of information, and FIG. 6D sets forth a computer program flow diagram for accessing multiple blocks of stored information and for controlling characteristics of each block in accordance with the ROM control logic block of FIG. 1.

FIG. 7 comprising FIGS. 7A-7F illustrates a sampled filter arrangement in accordance with the system of the present invention wherein FIGS. 7A-7D set forth signal flow diagrams for a filter implementation, FIG. 7E sets forth a filter system block diagram, and FIG. 7F sets forth a hybrid filter arrangement in accordance with the block diagram of FIG. 7E.

FIG. 8 comprises a block diagram of a system having a plurality of memory devices.

FIG. 9 comprising FIGS. 9A-9T illustrates signal processing arrangements using charge couple devices (CCDs) in accordance with the present invention wherein FIG. 9A illustrates a CCD channel processor arrangement; FIGS. 9S and 9T illustrate combined scale factor and bias refresh circuits using both analog and hybrid implicit servos for scale factor refresh with parallel bias and scale factor refresh circuits.

FIG. 10 comprising FIGS. 10A and 10B illustrates an improved memory access arrangement in accordance with the present invention wherein FIG. 10A sets forth a block diagram of the improved memory access arrangement and FIG. 10B sets forth a detailed diagram of a channel multiplexer in accordance with FIG. 10A.

FIG. 11 comprising FIGS. 11A to 11N illustrates memory refresh arrangements wherein FIGS. 11A to 11M illustrate various refresh arrangements and FIG.

11N illustrates a monolithic circuit embodiment of a respresetative refresh arrangement.

Figure 12A:
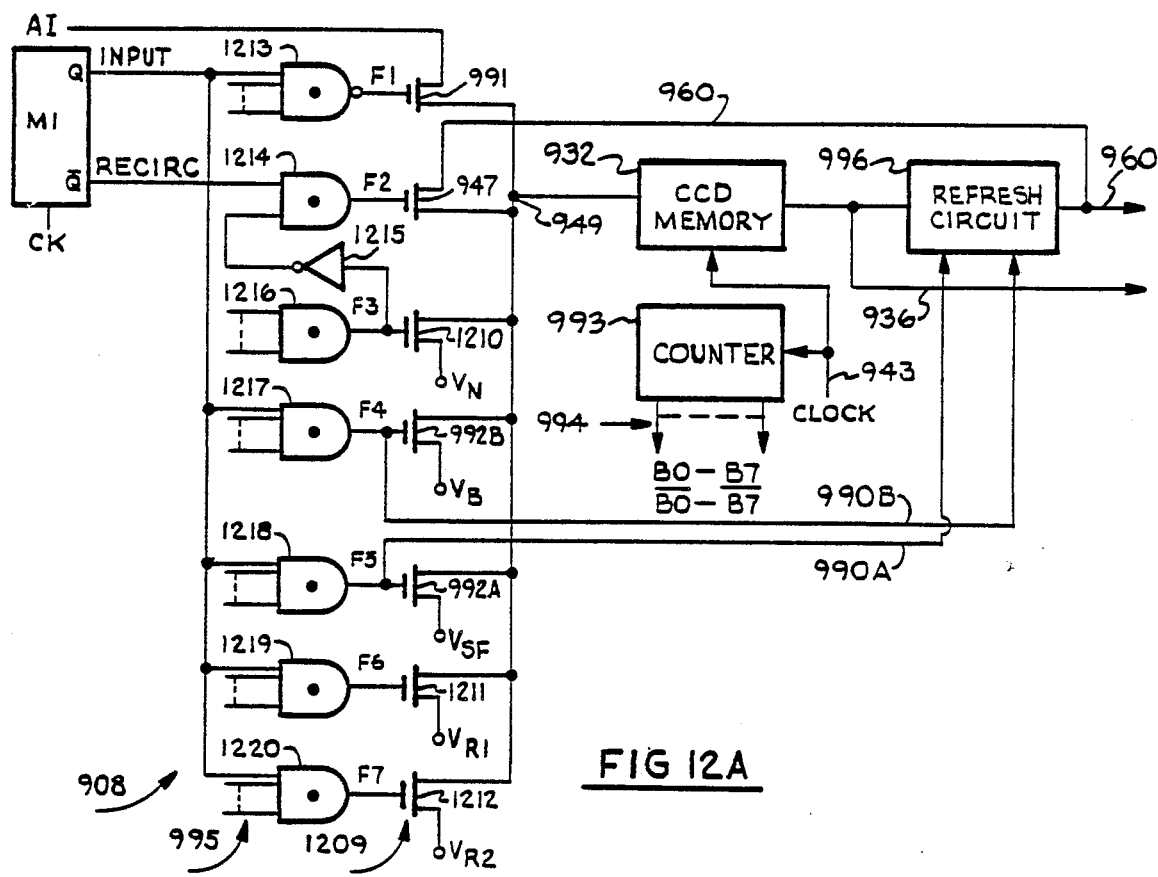
Figure 12B:
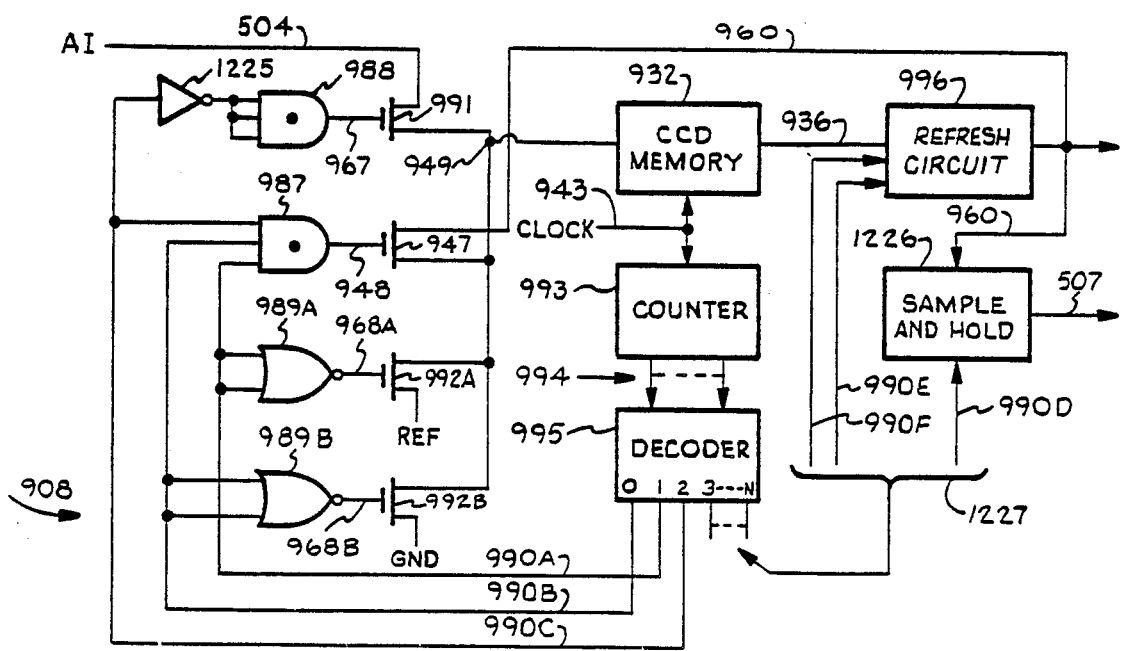

FIG. 12 comprising FIGS. 12A and 12B illustrates memory recirculation and input/output control arrangements wherein FIG. 12A shows an extended multiplexer arrangement and FIG. 12B shows a precessional control arrangement.

By way of introduction of the illustrated embodiments, the components shown in the figures have been assigned general reference numerals and a description of each such component is given in the following detailed description. The components in the figures have been assigned three-digit reference numerals wherein the hundreds-digit of the reference numeral is related to the figure number except that the same component appearing in successive figures has maintained the first reference numeral. For example, the components in FIG. 1 have one-hundred series reference numerals (100 to 199) and the components in FIG. 2 have two-hundred series reference numerals (200 to 299).

Reference numerals may herein be presented either with alphabetical characters or without alphabetical characters; wherein corresponding reference numerals with or without alphabetical characters show relationships therebetween and alphabetical characters show alternatives therebetween. For example, FET component 992 (FIG. 9F) is related to FET components 992A and 992B (FIG. 9K) as being related but alternated embodiments; wherein these alternate devices include corresponding reference numerals to show relationships therebetween and further include alphabetical designations to identify distinctions therebetween.

Reference numerals followed by a letter R represent reference numerals used in Pat. No. 4,016,540 and continuations therefrom and are so designated for consistency of cross-referencing between the instant application and said referenced patent and related applications.

DETAILED DESCRIPTION OF THE PRESENTLY PREFERRED EMBODIMENT

System Description

The electronic memory arrangement of the present invention can take any of a number of possible forms. Preferred embodiments of several features of the present invention are shown in the accompanying figures and will be described in detail hereinafter.

Figure 1:
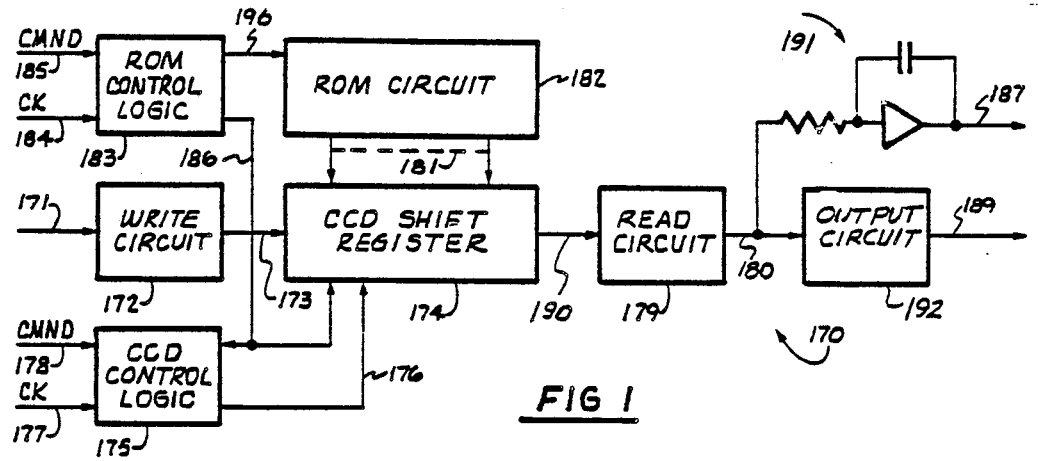
FIG. 1 comprises a block diagram of the memory system of the present invention.

The read only memory (ROM) feature of the present invention 170 is exemplified with the simplified block diagram shown in FIG. 1. Input signal 171 may be an analog input signal or a digital input signal for storing in shift register 174. Write circuitry 172 writes information into CCD shift register 174 in response to input signal 171. Shift register 174 shifts signals stored therein under control of control signals 176 from control logic 175 generated in response to clock signals CK 177 and input command signals CMND 178. Signals shifted in register 174 are shifted out as signals 190 to read circuitry 179 to generate output signal 180. Fixed signals 181 may be loaded into register 174 under control of ROM control logic 183 operating in response to clock signal CK 184 and command signal CMND 185. Fixed signals 181 may be implicit in the memory structure or may be generated with ROM circuitry 182 operating under control of control signal 196 generated by ROM control logic 183 in response to clock signal 184 and command signal 185.

Many of the elements shown in FIG. 1 are either described in the copending applications incorporated by reference or are old in the art. For example, CCD shift register 174 having appropriate write circuitry 172 and read circuitry 179 and operating under control of CCD control logic 175 is well known in the art; wherein a preferred embodiment thereof is provided in copending applications incorporated herein by reference and further discussed with reference to FIG. 9 herein. For example, write circuitry 172, CCD shift register 174, and read circuitry 179 may be a single monolithic integrated circuit; wherein write circuitry 172 may comprise a monolithic write diode, CCD shift register 174 may comprise storage elements having triple electrodes deposited thereon for a three-phase clock system, and read circuitry 179 may comprise a monolithic sense amplifier and output amplifier. CCD control logic 175 may generate three-phase clock signals 176 or any other well-known clock signals such as two-phase or four-phase clock signals to control shifting of information in register 174. Control logic 175 may operate in response to a single clock signal 177 for generating multi-phase clock signals 176 and a command signal 178 for commanding shifting or non-shifting by enabling or disabling, respectively, control logic 175 for generating or not generating, respectively, multiple-phase clock signals 176. Such elements and the interconnection and cooperation therebetween are well known in the art and widely described in the literature such as in the patents referenced herein.

The loading of signals into a CCD shift register such as the loading of parallel signals 181 into shift register 174 is well known in the art and may be performed in various ways such as by accumulating photo-optically generated charge or parallel transfer of signals with CCD circuit techniques. Further, new and unique ways of loading signals 181 into register 174 are herein provided using prior art circuit techniques in a unique manner such as accumulation of thermally generated charge which is similar to accumulating photo-electrically generated charge and such as accumulating electronically generated charge by connecting ROM charging circuits 182 to CCD elements in register 174.

Various output circuits may be used such as a generalized output circuit 192 for generating output signal 189; or an integration output circuit 191 for generating integration output signal 187; or any known output circuit.

Although the prior art does not show CCD ROM arrangements nor analog ROM arrangements, well-known prior art methods may be used with some modification to provide such unique ROM capability. As will be discussed herein, ROM input signals 181 may be implicit in CCD register 174 such as by explicitly accumulating thermally generated or photo-electrically generated charge or may utilize external circuitry such as ROM circuitry 182 to provide ROM charge signals 181. ROM control logic 183 may control ROM circuitry 182 to generate ROM signals 181, may control CCD register 174 to load ROM signals 181, and may control CCD control logic 175 to enable and disable shift register operations. For example, command signal 185 to ROM control logic 183 may command readout for ROM information such as with signal 180. Command signal 185 may enable a circuit such as a well-known one-shot multivibrator to generate a predetermined duration pulse signal 196 to enable ROM circuit 182 to generate charge signals 181 for loading into register 174 and pulse signal 186 to disable CCD control logic 175 to discontinue shifting of register 174 until charge accumulation has been completed. Completion of the fixed duration signal 196 may disable ROM circuits 182 from generating additional charge and may control shifting of register 174 to shift out accumulated charge signals with register 174 as output signal 180 to external circuitry. Enabling and disabling of clock signals and use of one-shot multivibrators for time delays and timing signals is described in copending patent applications incorporated by reference herein and is well known in the art, and therefore need not be described in greater detail herein. Further, loading of parallel signals into a serial register and outputting of the signals loaded in parallel as serial signals is well known in the art and therefore need not be described further herein.

Detailed embodiments of CCD shift register 174 are shown in FIG. 9 hereinafter and detailed embodiments of ROM circuit 182 and the use thereof in memory system 170 is shown in FIG. 2 hereinafter. Further, the manner in which signals 181 are formed as fixed signals and the manner in which signals 181 are formed as analog signals will be described in detail with reference to FIG. 2 hereinafter.

The arrangement described with reference to FIG. 1 is shown in the form of parallel fixed input signals 181 and serial output signals 190 using parallel-to-serial conversion for simplicity of discussion. This arrangement exemplifies the broad scope of the present invention which is directed to non-volatile CCD signals; a unique read only memory concept, arrangement, and method; a generalized analog ROM; and other inventive features not known in the prior art. Many other arrangements can be used to implement these features wherein the present invention is not limited to CCDs, nor to parallel-to-serial arrangements, nor to any particular circuit arrangement but is generally applicable. For example, register 174 may be a bucket-brigade device, a bubble memory device, a magnetostrictive delay line, or other devices. Further, fixed signals may be charge signals 181 loaded into CCD register 174 in either explicit form with ROM circuit 182 or in implicit form such as by accumulating thermally generated or optically generated charge or may be other signals for other circuit types such as voltage signals, current signals, acoustical signals, illumination signals, or other signals. In an acoustical signal embodiment, register 174 may be exemplified by acoustical propogation in an acoustic surface wave (SAW) device and ROM circuitry 182 may be electrodes for introducing acoustical signals. In an illumination embodiment described with reference to FIG. 2A herein, ROM circuitry 182 may be implemented as an optical masking arrangement to implicitly generate photo-optically generated fixed charge signals 181. Yet further, random access such as with a conventional random access memory (RAM) may be used in place of the CCD shift register shown for a preferred embodiment. Therefore, the specific embodiment described for a CCD arrangement with reference to FIG. 1 merely exemplifies the broad scope of the present invention and is not intended to be limited to the presently preferred specific embodiment described herein.

For simplicity of discussion, the arrangement shown in FIG. 1 has a single block of ROM circuits 182 for loading fixed signals 181 into register 174. In alternate embodiments, a plurality of ROM circuits 182 may be connected having corresponding charge signals 181 connected together such as ORed together so that an appropriate ROM circuit 182 out of a plurality of ROM circuits may be selected such as by selection of the appropriate one-shot signal 225 (FIGS. 2B-2D and 3B) to select a block of ROM circuits to load fixed information into register 174.

The various portions of the memory system illustrated in FIG. 1 may be implemented with similar monolithic integrated circuit processes such as the well-known MOS technology to provide a fully monolithic memory system, thereby providing still further advantages.

Based upon the foregoing description, it can be seen that register 174 may be a conventional volatile CCD shift register for storing input information 171 and for generating stored output information 180 in addition to receiving fixed input information 181 for generating fixed output information 180. This dual function capability of memory system 170 and particularly register 174 is considered to provide important advantages in electronic system implementation.

Read Only Memory Implementation

Various means for generating fixed charge input signals 181 will now be discussed with reference to FIG. 2. For simplicity of discussion and because peripheral circuits have been discussed with reference to FIG. 1; circuits 172, 175, 179, and 183 are not shown in FIG. 2; wherein FIG. 2 shows register 174 and may also show ROM circuit 182 and fixed charge signals 181 as required to illustrate operation. FIG. 2 shows a CCD memory in the form of a conventional three-phase clocked CCD register which is modified to incorporate the features of the present invention. Because of this high level of detail in the disclosure, it is desirable to assume a particular illustrative configuration, herein selected as a three-phase clocked CCD register system. For example, FIGS. 2A-2D show three-phase clock signals P1, P2, and P3 which are used to sequence charge signals from a first to a second and to a third CCD electrode in a well-known manner, wherein construction and use of three-phase signal generators, three-phase clock interconnections, three-phase CCD registers, and three-phase CCD electrodes are well known in the art and are shown herein in schematic and illustrative form for simplicity of discussion. Such a specific embodiment is provided merely for illustrative purposes and is not intended to limit the scope of the present invention.

In order to exemplify the teachings of the present invention, a plurality of preferred embodiments will now be discussed with reference to FIG. 2. For consistency of discussion, 12 electrodes 210-221 are shown for each embodiment (FIGS. 2A-2D), wherein corresponding electrodes between the different embodiments are lined up vertically in the plane of the page of FIG. 2. An extended length of the CCD shift register is implied with the "break" schematic representation 222. Electrode and schematic break notations are lined up vertically in the plane of the page of FIG. 2 and reference numerals 210-222 apply to corresponding electrode and break notations for each of FIGS. 2A-2D. Similarly, three-phase clock signals P1-P3 are shown for each of the preferred embodiments and shown connected to corresponding CCD electrodes for each of the preferred embodiments in FIG. 2. Other corresponding elements and signals are provided with corresponding notations in FIGS. 2A-2D.

Further, the three-phase clocking system is shown with electrode triplets for each memory element, wherein the adjacent electrode triplet connected to clock signals P1, P2, and P3 form a memory element with signal transfer capability. For example, electrodes 210, 213, 216, and 219 are shown having the ROM parameter formed therewith and are associated with the second transfer electrodes 211, 214, 217, and 220 respectively and the third transfer electrodes 212, 215, 218, and 221 respectively.

In the disclosed embodiment, only a single electrode 210, 213, 216, and 219 of each electrode triplet is shown having an analog ROM parameter provided therewith for purposes of illustration. In alternate embodiments, a plurality of electrodes in each memory element may have the analog ROM parameter constructed therewith where, for example, each of the electrodes in each electrode triplet shown in each of FIGS. 2A-2D may be structured as shown for the signal electrode 210, 213, 216, and 219 in each of FIGS. 2A-2D to have ROM capability for the plurality of electrodes associated with a triplet memory element. For example, electrodes 211 and 212 may be masked as shown for electrode 210 (FIG. 2A); electrodes 211 and 212 may be connected either with or without diodes to resistor R0 or to similar resistors as shown for electrode 210 (FIG. 2B): electrodes 211 and 212 may have sizes related to the size of electrode 210 (FIG. 2C); and electrodes 211 and 212 may have ROM transfer electrodes connected thereto such as electrodes 210R, 210A and 210B for electrode 210 (FIG. 2D).

For convenience of discussion, a group of corresponding electrodes for each memory element may be herein referred to by the clock phase connected thereto wherein for example electrodes 210, 213, 216, and 219 may be referred to as the P1 electrodes. Further, a memory element may comprise a plurality of electrodes such as three electrodes for the three-phase memory system discussed with reference to FIG. 2, wherein a memory element or memory cell may be herein referred to by the electrode shown as the P1 electrode for that particular cell. For example, the memory cell comprising electrodes 210-212 may be referred to as memory element 210.

One embodiment of the analog ROM of the present invention will now be discussed with reference to FIG. 2A. Photo-optical CCD arrangements are well known in the art such as for CCD television cameras, where illumination 205 is focused upon electrodes 210-221 providing charge accumulation on an illuminated electrode that is proportional to the intensity of the illumination. If illumination 205 is uniform over the array of electrodes 210-221 and if a mask is provided for each electrode such as mask 230 (which is shown continuous but broken at point 222), the charge accumulation on each electrode in response to the uniform illumination is proportional to the size of the sensitive area which can be considered proportional to the size of the unmasked electrode portion such as the cross-hatched portions of the P1 electrodes shown outside of mask 230 (FIG. 2A). For example, the active area of electrode 210 is shown greater than the active area of electrode 213 illustrated with the unmasked (cross-hatched) portions of these electrodes; wherein photo-electrically generated charge is proportionately greater for electrode 210 than for electrode 213. For the purposes of this example, electrode 216 has the greatest magnitude analog ROM parameter followed by electrodes 219, 210, and 213 having progressively decreasing analog magnitudes for ROM parameters.

Except for the use of mask 230 and uniform illumination 205, the CCD register shown in FIG. 2A may be a conventional photo-electrode CCD device including control electronics for exposing, accumulating, and outputting signals. Such conventional exposure, charge accumulation, and outputting of information may be used for the other embodiments shown in FIGS. 2B-2D.

It will now become obvious to those skilled in the art from the teachings herein that charge accumulation for each P1 electrode is proportional to the unmasked area, or sensitive area, or cross-hatched area (FIG. 2A) and therefore a group of related charge signals having predetermined relative magnitudes can be provided. A scale factor parameter may be intensity of illumination 205 and a bias parameter may be thermally generated charge accumulation during the exposure and shifting time; wherein scale factor and bias errors may be measured and/or reduced such as with the adaptive compensation arrangements shown in FIG. 9 herein.

Masking of integrated circuits is well known in the art such as using thin film techniques with photo-resist or passivation technologies, using thick film techniques such as silk screening and depositions, and using other such methods.

Alternate preferred embodiments of the ROM of the present invention will now be discussed with reference to FIGS. 2B and 2C. A command pulse 224 may be processed with circuitry 223 such as a one-shot multivibrator for generating a precision pulse signal 225 which is conducted through charging resistor $R_C$ (FIGS. 2B and 2C) aand through ROM selectable resistors $R_0$, $R_3$, $R_6$, and $R_9$ 226 (FIG. 2B) to charge P1 electrodes. Diodes 227 may be used for electrical isolation. The amount of charge accumulated on each P1 electrode may be related to the magnitude of the charging resistance, which is the charging resistance $R_C$ (FIGS. 2B and 2C) and the ROM parameter charging resistance 226 (FIG. 2B) for a particular electrode and further related to the capacitance of the electrode to establish an RC time constant. For a particular charging time and charging signal amplitude (the width and amplitude of pulse 225) and for a particular RC time constant associated with the electrode, an amount of charge will be accumulated with each P1 electrode that is related to the value of the charging resistance and to the value of the electrode capacitance. For simplicity of discussion, the arrangement shown in FIG. 2B has constant dimension electrodes (implying constant capacitance values) and selectable resistor values and the arrangement shown in FIG. 2C has constant charging resistor values (implied by charging resistor $R_C$ being common to all electrodes) and selectable P1 electrode capacitance values (implied by the selectable dimensions of the P1 electrodes). From these two illustrations (FIGS. 2B and 2C), one skilled in the art will be able to provide various combinations of these teachings such as by using selected size P1 electrodes shown in FIG. 2C in combination with the arrangement of FIG. 2B having selected value resistors for providing additional control of the RC time constant for the ROM of the present invention.

After the ROM charge has been accumulated on the P1 electrodes (FIGS. 2B and 2C), multiple-phase shifting operations may be initiated with clock signals P1-P3 as is well known in the art.

In one embodiment, the P1 electrodes accumulating ROM related charge may be excited by maintaining the P1 clock signal constant for charge accumulation and by disabling the P2 and P3 clock signals to minimize charge accumulation such as thermally generated charge accumulation on the P2 and P3 electrodes.

Another embodiment will now be discussed with reference to FIG. 2C. Charge accumulation may be provided with photo-electrically generated charge 205 in response to illumination signal 205 or with thermally generated charge in response to thermal signal 206; wherein electrically generated charge through diodes 227 to the P1 electrodes may be eliminated from this embodiment. The photo-optically generated charge or thermally generated charge may be accumulated in proportion to the dimensions of the electrode. Unmasked P1 electrodes may provide photo-electric charge accumulation proportional to the area of the electrode exposed to the illumination and thermally generated charge may be accumulated in proportion to the area of the electrode. The P1 electrodes are shown having a dimension above the bias dimension 228 proportional to the ROM parameter; wherein the bias dimension 228 is shown as the dimension for the P2 and P3 electrodes for purposes of illustration.

Charge may be accumulated in response to illumination signal 205 or thermal signal 206 for a period of time and may then be shifted out of the memory as is well known for CCD imaging arrays. Charge accumulation time should be such that the amount of charge accumulated during the accumulation period does not exceed the capacity of the smaller electrodes (such as the P2 and P3 electrodes) to insure that the smaller electrodes will not be saturated as the accumulated charge from the larger electrodes (such as the P1 electrodes) are shifted through the register. Therefore, the charging time limits the maximum charge and the area of the P1 electrodes determines the magnitude of the charge to provide ROM analog parameters that will not saturate the register.

Figure 9A:
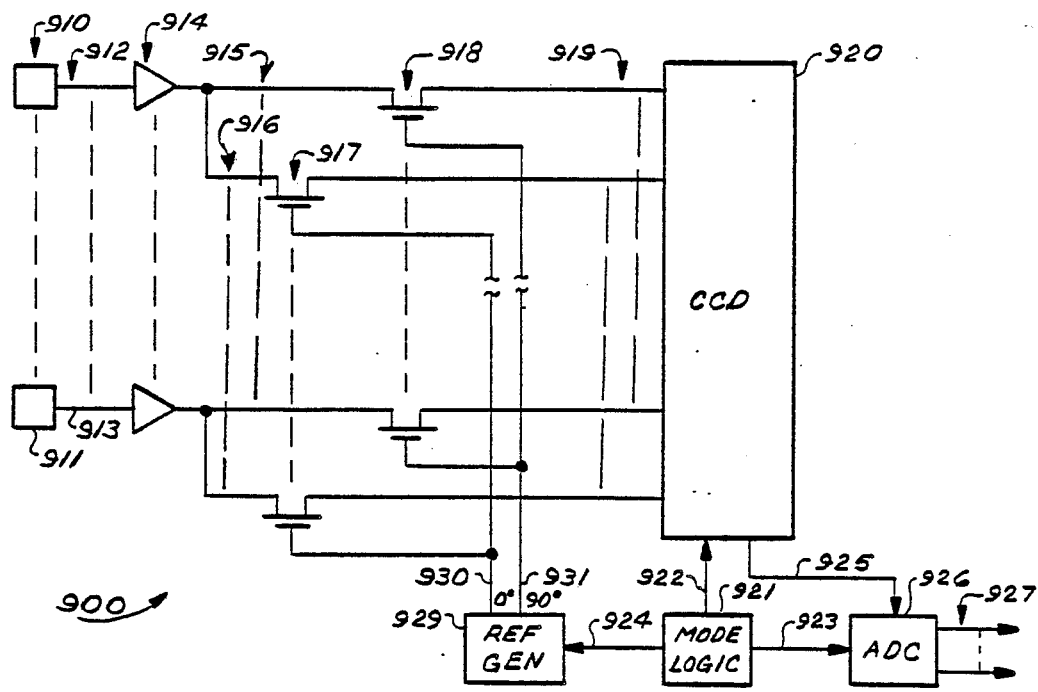
Figure 9B:
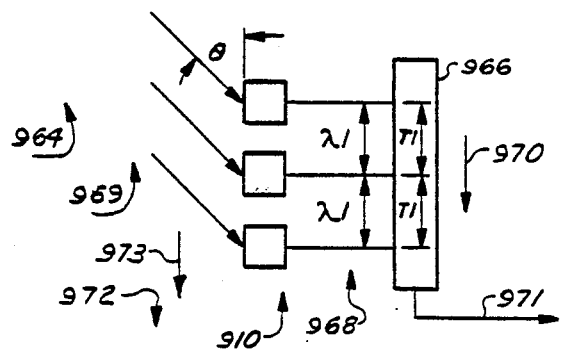
FIG. 9B illustrates a CCD beam-forming arrangement.
Figure 9C:
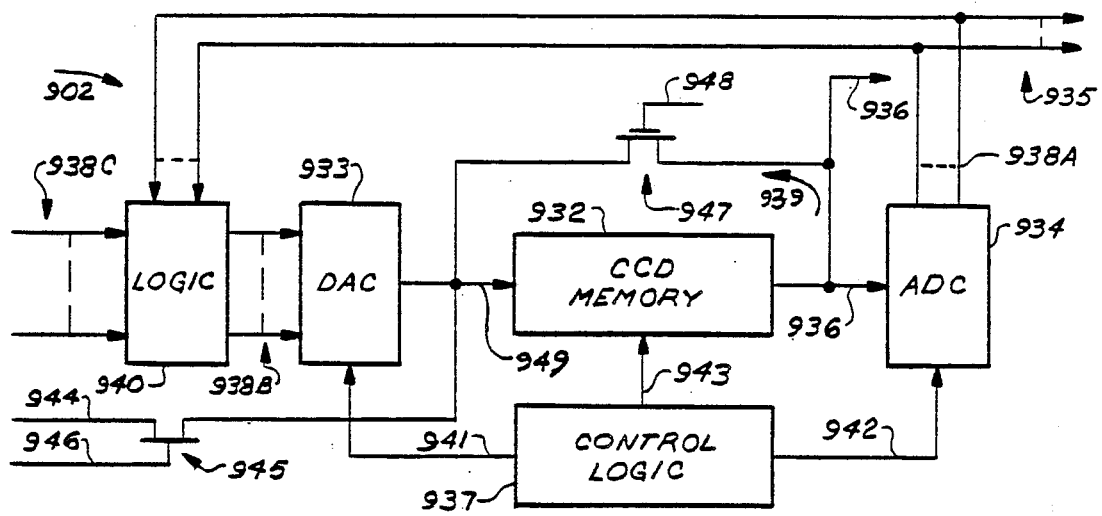
FIG. 9C illustrates a CCD hybrid memory arrangement.
Figure 9D:
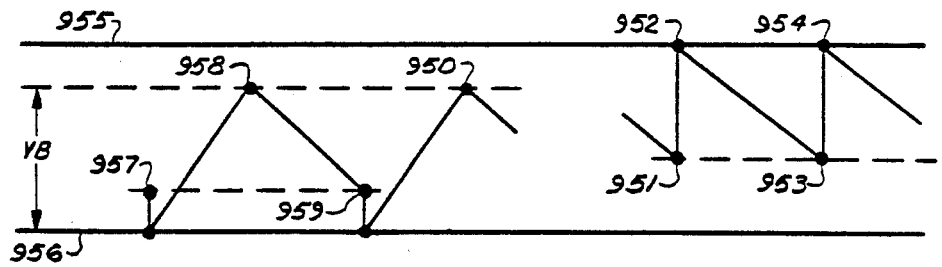
FIG. 9D illustrates signal degradation and compensation in accordance with the hybrid memory arrangement of FIG. 9C.
Figure 9E:
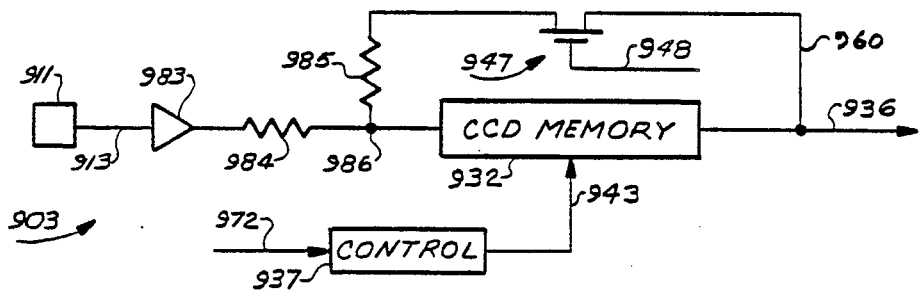
FIG. 9E illustrates an alternate embodiment of a CCD memory arrangement.
Figure 9F:
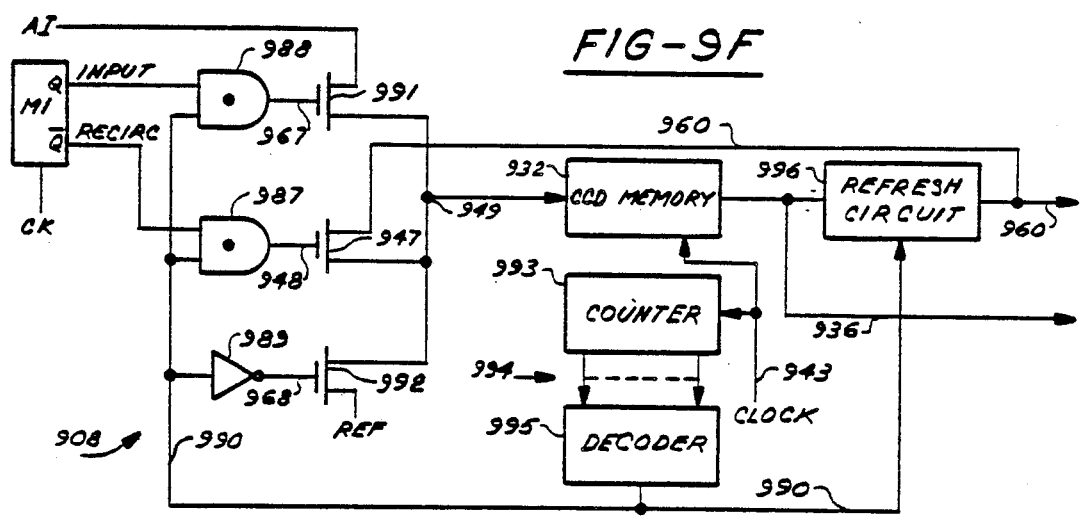
FIG. 9F illustrates an adaptive memory refresh arrangement.

An adaptive compensation arrangement may be used, where one of the P2 or P3 electrode signals may be used as a bias signal and one of the P1 electrode signals may be used as a scale factor signal or alternately P1 electrode signals may be used for both bias and scale factor signals in accordance with the adaptive compensation arrangement shown in FIG. 9F et seq.

Another alternate embodiment will now be discussed with reference to FIG. 2D. Charge accumulation may be provided with an independent set of electrodes, the R electrodes, wherein charging may be provided with electrical charging through diodes 227 and charging resistor $R_C$ as discussed with reference to FIG. 2C above; or may be photo-electric charging as discussed with reference to FIGS. 2A and 2C above; or may be thermal charging as discussed with reference to FIG. 2C above. Alternately, R electrodes may be constant in dimension and may be charged through weighted resistors as discussed with reference to FIG. 2B above or alternately R electrodes may have controllable capacitance and controllable resistance associated therewith for having a selectable RC time constant, as discussed with reference to FIGS. 2B and 2C above.

Using any of the analog ROM charging techniques discussed herein, auxiliary electrodes R may be charged to a level related to a desired ROM parameter. These ROM parameters may be stored on the R electrodes as analog charge accumulated with any of the above-listed methods or with other methods that will become obvious to those skilled in the art from the teachings herein. The charge accumulated to the R electrodes may be transferred through transfer electrodes A and B to the P1 electrodes of the CCD shift register. Transfer may be provided with a three-phase clock having the corresponding R, A, and B electrodes of the parallel transfer shift register as being the three-phase triplet electrodes associated with a memory element. Parallel transfer of information through the R, A, and B electrodes into the shift register and then serial transfer of the shift register information through the P1, P2, and P3 electrodes is well known in the art and need not be described in greater detail herein.

It may be desirable to clear register 174 prior to charge accumulation operations. Such register clearing may be provided by rapidly shifting all of the information out of register 174 to minimize photo-electrically and thermally generated charge accumulation and disabling electrical inputs into register 174 to minimize electrically generated charge accumulation.

Diodes, charging resistors, and various other components may be used as required; wherein certain diodes and resistors are shown herein in order to exemplify the use of such components, but not to establish a requirement. For example, charging resistor $R_C$ merely sets a time constant for charging of the P1 electrodes (FIGS. 2B–2D). Further, diodes $D_0$, $D_3$, $D_6$, and $D_9$ are shown for illustrative purposes to provide isolation between enable signal 225 and the P1 electrodes. Still further, one-shot multivibrator 223 is shown for generating output pulse 225 having a prescribed pulse width in response to input ROM command pulse 224 which may be a digital signal or other type of command signal. Still further, element 223 may include amplitude control circuits such as for providing a precise voltage amplitude for pulse 225, a precise current for pulse 225, or other pulse characteristics. Yet further, variations in charging signals such as illumination signals 205, thermal signals 206, and electrical pulse 225 may be compensated for with the adaptive refresh arrangement shown in FIG. 9 herein. For example, one of the P1 electrodes may be reference electrode for providing a reference signal used to compensate the other signals such as for scale factor compensation or a plurality of the P1 electrodes may be a reference electrodes for providing a plurality of reference signals such as for bias and scale factor compensation. For this example, electrodes 216 having a large charge signal impressed thereon may be used for a scale factor reference signal and electrodes 213 having a small charge signal impressed thereon may be used for a bias reference signal consistent with the adaptive compensation arrangements shown in FIG. 9F et seq herein.

For consistency of discussion, each of the presently preferred embodiments shown in FIGS. 2A–2D have consistent structure and consistent magnitudes for cross-referencing therebetween. For example, the exposed electrodes shown in cross-hatched form in FIG. 2A have a cross-hatched dimension proportional to the ROM signal amplitude; wherein the relative magnitudes of these cross-hatched segments are consistent with FIG. 2B wherein resistors $R_0$, $R_3$, $R_6$, and $R_9$ (FIG. 2B) may have values proportional to the cross-hatched dimensions of the exposed electrodes shown in FIG. 2A; wherein dimensions of the P1 electrodes (FIG. 2C) may be consistent with the ROM parameters of corresponding electrodes in FIG. 2A; and wherein the dimensions of each ROM electrode R (FIG. 2D) may be consistent with the dimensions of the cross-hatched electrodes of FIG. 2A for consistency of discussion of these presently preferred embodiments.

One feature of the present invention is a fully monolithic memory arrangement wherein it is herein intended that all elements may be provided on the monolithic structure such as monolithic resistors $R_C$, $R_0$, $R_3$, $R_6$, and $R_9$; diodes $D_0$, $D_3$, $D_6$, and $D_9$; and control electronics such as circuit 223.

Although the ROM feature of the present invention has been discussed for an analog ROM embodiment, those skilled in the art will readily recognize that a digital ROM embodiment is a simplified version of an analog ROM, wherein the digital ROM merely has two amplitude levels instead of a plurality of intermediate amplitude levels; wherein the two digital amplitude levels may be the highest level and the lowest level or the scale factor level and the bias level such as discussed for the adaptive compensation arrangement with reference to FIG. 9. Therefore, any references herein to an analog ROM or an ROM in general is also intended to imply a digital ROM as an alternate embodiment.

For simplicity of discussion, a simplified schematic representation of CCD structure has been discussed relative to FIG. 2. Expansion of this simplified schematic representation into a full design will now become obvious to those skilled in the art from the teachings herein. For example, FIG. 2A shows a simplified photo-optical CCD electrode pattern to exemplify the ROM photo-optical mask teaching of the present invention. Well-known photo-optical CCDs accumulate photo-optically generated charge with an electrode from a sensitive charge generating area. For simplicity, the sensitive charge generating area is illustrated as the electrode area. Further, well-known photo-optical CCDs use one set of accumulating electrodes and another set of shifting electrodes (similar to the arrangement shown in FIG. 2D) but for simplicity of illustration these accumulating and shifting electrode functions are shown combined into one set of electrodes.

In view of the above, a method for providing a non-volatile analog ROM in conjunction with a CCD circuit has been provided. This specific embodiment is exemplary of many other embodiments and may be implemented for read only memories and/or alterable memories, non-volatile memories and/or volatile memories, CCD memories and/or other types of memories, analog memories and/or digital memories, and other alternatives and/or combinations of the features of the present invention.

CCD Register Control Electronics

Control electronics for CCD registers will now be discussed in simplified form to illustrate implementations thereof, although many other control arrangements are well known in the art and may be used with the system of the present invention.

Figure 3A:
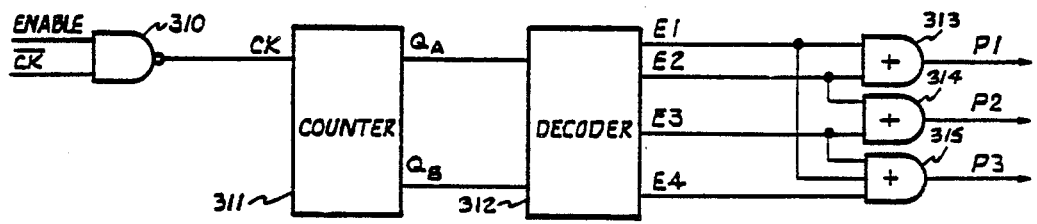
FIGS. 3A and 3B illustrates memory control electronics wherein FIG. 3A sets forth a three-phase clock circuit in accordance with the CCD control logic block shown in FIG. 1 and FIG. 3B sets forth an ROM control circuit in accordance with the ROM control logic block of FIG. 1.

A three-phase clock generator will now be discussed with reference to FIG. 3A. An inverted clock signal $\overline{CK}$ is input to an NAND-gate 310 and is controlled with the enable signal. When enabled, the clock signal is inverted with gate 310 and applied to counter 311. Counter 311 sequences through a plurality of states such as with a two-state counter having two output signals $Q_A$ and $Q_B$. Decoder 312 may decode counter signals $Q_A$ and $Q_B$ to provide one of four output signals E1–E4 related to the state of counter signals $Q_A$ and $Q_B$. Decoder output signals E1–E4 may be used directly as multiphase clock signals or may be logically combined to provide other clock signals.

For example, it may be desired to have overlapping clock signals such as for the P1 signal overlapping the P2 signal during the transition therebetween, the P2 signal overlapping the P3 signal during the transition therebetween, and the P3 signal overlapping the P1 signal during the transition therebetween; but where all three signals P1–P3 do not overlap at the same time. This can be achieved by ORing together the E1 and E2 signals with OR-gate 313 to form the P1 signal; ORing together the E2 and E3 signals with OR-gate 314 to form the P2 signal; and ORing together the E3, E4, and E1 signals with OR-gate 315 to form the P3 signal to use up the remainder of the four-bit counter times and to overlap the P1 signal. The logical diagram shown in FIG. 3A uses well-known components wherein NAND-gate 310 may be an S/N 7400 gate, counter 311 may be an S/N 7493 counter, decoder 312 may be an S/N 7445 decoder, and OR-gates 313 and 314 may be S/N 7432 gates.

The memory output control circuit will now be discussed with reference to FIG. 3B. A word counter 316 is conventionally used to count shift clock pulses to maintain track of the information being shifted out of a shift register. NAND-gate 317 may be used to logically combine a plurality of word counter outputs to detect the last word, or the first word, or a selected word in the count sequence. For example, when word counter 316 has a maximum output of all-ones, indicative of the last word being shifted out of the shift register; the all-one condition detected by gate 317 generates a low output signal 224 indicative of the last word being output. Signal 224 enables one-shot 223 which may be a one-shot multivibrator or synchronous one-shot circuit to generate a single charging pulse 225 (FIGS. 2B–2D and 3B) to initiate charging of the CCD electrodes with the fixed parameter prior to again enabling shifting operations with the next cycle of word counter 316.

The CCD shift register may also be used for alterable memory storage, wherein the ROM parameter can be disabled with signal 319 disabling gate 317 to disable circuit 223 to prevent generation of ROM command pulse 225; thereby making the CCD register available for alterable memory operations. These memory output control circuits may be implemented with commercially available integrated circuits, wherein counter 316 may be an S/N 7493 counter, NAND-gate 317 may be an S/N 7430 gate, and one-shot 223 may be an S/N 74121 monostable multivibrator or alternately may be a synchronous one-shot as discussed in copending patent application S/N 754,660 with reference to FIG. 4H at page 36 line 4 to page 37 line 23 therein.

Filtering Arrangement

An improved filtering arrangement will now be discussed with reference to FIG. 2A. Although this filtering arrangement will be discussed in the embodiment of an electro-optical, analog, CCD, correlator arrangement; this description merely exemplifies the general principles of implementing any of multitudes of filters which may be analog or digital and which may be correlator, Fourier transform, matched filter, or other filter types with CCD or other technologies for applications such as pattern recognition and signal processing.

Correlation is implemented by obtaining a plurality of signal samples, multiplying each signal sample by a related constant parameter, and then summing all of the products as is well known in the art. For illustrative purposes in exemplifying the improvement of the present invention, the input signal samples are illumination signal samples projected on a CCD imaging array, the reference signal samples are defined by masking of illumination sensitive elements of a CCD array, and the summation is provided with an analog integrator at the output of the shift register. A well-known imaging CCD array may be modified by providing a mask 230 as discussed with reference to FIG. 2A above, wherein the unmasked sensitive areas (shown in cross-hatched form) represent a constant magnitude or ROM parameter. An illumination image projected on the masked CCD array provides charge accumulation that is a function of (1) the intensity of illumination exposing a sensitive CCD element and (2) the dimensions of the sensitive CCD element. Therefore the charge accumulation may be proportional to both of these parameters, illumination sample intensity and masked sample dimensions, resulting in charge accumulation related to the product thereof. After a controlled charge accumulation time as implemented with well-known non-masked non-correlator imaging CCDs; the CCD shift register may shift the products out of the shift register and into a summing or integrating circuit such as circuit 191 (FIG. 1) for integration of CCD output signal samples 180 to provide integrated correlated output signal samples 187.

This correlation inventive feature may be better understood in view of the patent to Buss referenced herein. Buss provides for electronic generation of each of two sets of signal samples, electronic multiplication between corresponding sets of samples, and integration with a summing amplifier SA (FIGS. 1 and 2 therein). This is significantly different from the correlator feature of the present invention which provides multiplication with an extremely simple CCD photo-optical structure.

In an alternate embodiment, the summing of the photoelectrically generated products, generated in accordance with the teachings of the present invention, may be performed in parallel in a manner illustrated in the referenced Buss patent.

In still another embodiment, an optical image 205 may be focused and swept across the masked CCD array (FIG. 2A) to attempt to determine a peak output signal 187; indicative of correlation between a masked reference signature and an illumination image. Optical sweep techniques are well known in the art and are performed with oscillating mirrors and other mechanical devices. Alternately, a solid state liquid crystal scanning arrangement is discussed in copending patent applications S/N 727,330 and S/N 730,756 referenced herein.

Thin and thick film masking techniques have been discussed with reference to FIG. 2A above, wherein these masking methods provide relatively permanent masks which are inexpensive but may be difficult to change. In accordance with another feature of the present invention, a changeable mask selected from a plurality of masks may be interposed between an illumination source and an imaging CCD array such as with a slide or microfilm image. Illumination that is masked by the interposed selected mask may be projected onto the CCD imaging array to implement the above-described correlator having a changeable mask arrangement. In one version of this embodiment, an image may be scanned across the mask for projection of a scanned mask image onto the CCD imaging array for correlation, as discussed above for the permanent mask embodiment. The scanned image may be a picture of a fingerprint, a persian rug, an acoustical signal from an anti-submarine warfare oscillagram, or any other pictorial signal requiring correlation with a predetermined signature.

For simplicity of discussion, the masking arrangement of the present invention has been discussed with reference to FIG. 2A using an opaque mask. Alternately, the mask may have various degrees of transmissivity (constructed with well-known methods such as photographic methods) and need not be fully opaque, wherein the product parameter will be related to the illumination sample intensity and the masked area as discussed above and further will be related to the mask transmissivity for the present embodiment.

In still another alternate embodiment, mask 230 (FIG. 2A) may fully overlay all of the CCD element sensitive areas so that the fixed parameters are not area, but may have selected transmissivity, wherein the fixed parameter may be transmissivity and which operates in the same manner as discussed above for the opaque area mask.

A preferred embodiment of the correlator feature of the present invention will now be discussed with reference to FIG. 4. System 400 includes source 410 for generating illumination 411 which is processed with optics, images, and masks to generate processed illumination 421 for conversion with CCD electronics 422. Source 410 generates illumination 411 which may be processed with input optics 412 to generate preprocessed illumination 413 for illuminating image 414. Image illumination 415 may be processed with intermediate optics 416 for generating processed image illumination 417 for illuminating mask 418 to generated masked image illumination 419 which may be projected on CCD electronics 422 with projection optics 420 generating projection illumination 421. Filtered output signal 427 may be recorded, processed, or analyzed with well-known means and methods.

Rotation control 423 may be any convenient rotation control but in a preferred embodiment may be implemented as discussed in reference applications S/N 152,105 and S/N 366,714 and continuing applications therefrom. Rotation control 423 may rotate image 414 with linkage 424, optics 416 with linkage 425, mask 418 with linkage 426, or with other well-known methods. Image and/or mask rotation may be implemented as mechanical rotation of insertable images and/or masks. Optics rotation may use a well-known dove prism arrangement.

Source 410 and optics 412, 416, and 420 may be any well-known devices such as a projection bulb for source 410 and lenses, filters, fiber optics, prisms, sweep or scanning optics, etc for optics 412, 416, and 420 implemented in well-known arrangements. Further, optics 412, 416, or 420 may include a zoom lens for image dimensional control and may include a dove prism for rotational control. Image 414 and mask 418 may be exemplified with photographic slides and CCD electronics may be exemplified with a conventional CCD image sensor.

Stereo Reverberation Unit

In accordance with another feature of the present invention, a CCD input/output arrangement will now be discussed in the context of a reverberation unit for a hi-fi audio system with reference to FIG. 5. Reverberation provides the function of mixing signals having different delays to provide the effect of sound echos. It is herein intended that this reverberation unit be illustrative of the broader teachings of the present invention which are directed to arrangements for inputting and outputting information with shift registers such as a CCD shift register.

In accordance with the present invention, one or more audio mixers and/or a CCD shift register may be provided for receiving audio input signals, delaying audio signals, and generating audio output signals. A patchboard network may be provided for conveniently interconnecting input signals and output signals. A summing operation can either be performed with mixer 502 using explicit summing or with CCD input signals 505 using implicit CCD summing. Delay is provided with CCD register 501 under control of a clock such as a three-phase clock described herein. Delays may be selected with output taps providing output signals 506 from different stages of shift register 501. As an alternate therewith or in combination therewith, clock frequency may be controlled to provide controllable time delays through shift register 501 as described for the CCD beamformer application discussed herein with reference to FIG. 9B.

A programmable reverberation feature will now be discussed. For simplicity, a patchboard reverberation programmer will be discussed to exemplify the more general features of the present invention, wherein the disclosed patchboard arrangement is exemplary of other electro-mechanical, electronic, and programmable interconnecting arrangements. Well-known analog computers have patchboards for programming including a board structure for mounting female plugs, female connectors connected to electrical input and output signals, and jumper wires having male connectors at both ends for connecting between patchboard mounted female connectors.

Figure 5:
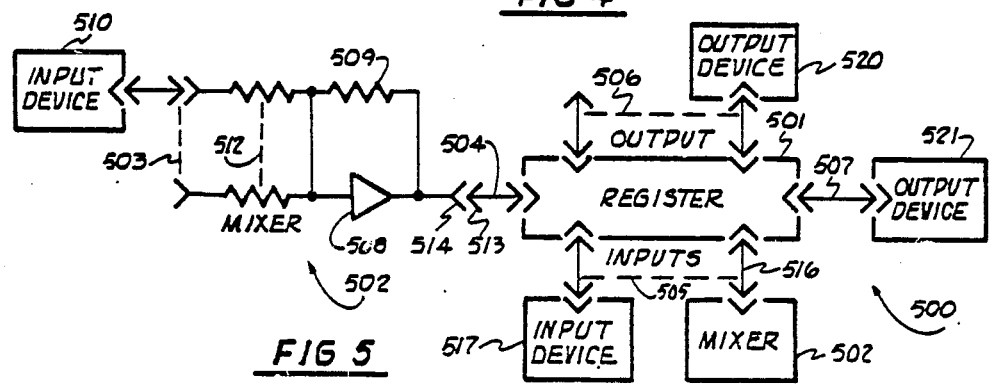
FIG. 5 comprises a reverberation filter embodiment of the memory system of the present invention.

A schematic patchboard notation is used in FIG. 5, wherein an arrowhead is used to indicate a patchboard plug or jumper plug. For example, arrowhead 513 may indicate a male plug terminating jumper wire 504 and arrowhead 514 may indicate a female plug mounted to a patchboard.

Register 501 may be any well-known register, but in a preferred embodiment is a CCD shift register and may have a plurality of parallel inputs 504 and 505 and/or a plurality of parallel outputs 506 and 507.

Mixer 502 may be any mixer such as a commercially available audio signal mixer or such as an operational amplifier 508 having a plurality of summing resistors 512 for summing together or mixing a plurality of input signals 503 as is well known in the circuit design art. Mixer 502 may provide output signal 504 related to a sum of input signals 503. Output signal 504 may be input to shift register 501 for shifting and time delay. Time delay output taps 506 located at different register stages may be connected to mixer inputs 503 or register inputs 505 for mixing or summing of signals having different time delays.

In the audio embodiment of a reverberation filter, input signals 503 to mixer 502 and input signals 504 and 505 to register 501 may be the outputs of mixers such as signal 504 from mixer 502; or may be delayed output signals of register 501 such as output signals 506 and 507; or may be input signals from various devices 517 such as a microphone, a guitar amplifier, a record player, a tape playback unit, an AM radio, a citizen's band radio, or multitudes of other well-known input devices. Signal conditioning for such input devices is well known in the electronics art, where such signals may be conditioned to be compatible with the arrangement of FIG. 5 by one skilled in the art from the prior art technology and from the teachings herein.

Output signals 504, 506, and 507 may be patched into output units such as a magnetic tape recorder for recording the processed signals, an amplifier and speaker arrangement for operator monitoring of the processed signals, a radio transmitter such as a Citizen's Band transmitter for transmitting the processed signals, or various other output devices. Signal processing interfaces between register 501 and conventional output devices are well known in the audio art and may be used for interfacing therebetween.

Mixer 502 mixes input signals 503 with summing resistors 512 using amplifier 508 with feedback resistor 509 to generate mixed output signal 504. Input signals 503 may be from various input devices such as device 510 or may be time delayed outputs of register 501. Output signal 504 of mixer 502 may be input to register 501 at various stages of delay such as an undelayed input signal 504 or a delayed input signal 516. Register 501 may receive input signals directly from input devices such as device 517, or from mixers such as mixers 502 with input signals 504 and 516, or from time delayed output signals 506 and 507 of the same shift register 501. Output signals 506 and 507 may be selectively connected to output devices 520 and 521 or may be selectively connected to input signal connections 503 to mixer 502 and input signal connections 504 and 505 at different stages of delay of register 501.

Input signals 504 and 505 and output signals 506 and 507 may be interconnected for feedforward and/or feedback operations. For example, an output signal 506 having a first time delay may be connected to an input signal 505 having a second time delay. If the first time delay is greater than the second time delay, then a feedback connection is provided. If the second time delay is greater than the first time delay, then a feedforward connection is provided.

In one embodiment, delayed sound signals can be mixed with non-delayed sound signals to provide various advantages. For example, if reverberation device 500 degrades signals, then mixing of degraded delayed signals with non-degraded non-delayed signals can provide both signal quality plus signal reverberation. In this embodiment, mixer 502 can mix delayed signal 516 with non-delayed signal 504 to provide the combination thereof.

Also, volume and/or amplitude and/or filter controls can be provided for mixing controllable amplitudes such as by implementing mixing resistors 512 as well-known variable resistors such as potentiometers.

Further, a plurality of channels can be provided such as for a stereo record player or stereo FM radio wherein each channel can have a reverberation unit with separately controllable delay, amplitude, etc. Further, mixing between channels can be provided such as by mixing a signal from a first channel, either delayed or non-delayed, with a signal from a second channel, either delayed or non-delayed.

Yet further, well-known reverberation effects such as echos, flanging, etc can now be implemented with the system of the present invention by one skilled in the art from the teachings herein.

Still further, the adaptive analog refresh arrangement discussed with reference to FIGS. 9F to 9T herein using reference signals can be used with the reverberation unit discussed with reference to FIG. 5 herein to improve precision and capability.

Yet still further, the reverberation unit of the present invention can be used with frequency synthesizers, electronic organs, the audionic arrangement disclosed in the referenced applications, and multitudes of other applications.

The controllable clock rate discussed can be provided with well-known rate multipliers, voltage controlled oscillators, etc or can be provided with arrangements disclosed in referenced application Ser. No. 550,231.

In view of the above, a programmable arrangement is provided for summing signals and for time delaying signals using any of a plurality of types of output devices for generation of signals having programmable summation and time delay characteristics.

Data Processor Architecture

In accordance with another feature of the present invention, an improved data processor architecture will now be described.

An improved data processor architecture having an integrated circuit ROM and an integrated circuit alterable memory has been described in related application S/N 101,881; wherein the improved ROM and alterable memory of the present invention may be used in place of the ROM and alterable memory of that data processor. For example, a CCD ROM and a CCD shift register memory may be used for the ROM and alterable memory of said data processor. The alterable memory in said data processor is disclosed as a shift register memory, wherein use of the shift register memory disclosed herein in CCD shift register form is readily adaptable to said data processor by one skilled in the art from the teachings herein. Similarly, the ROM of the present invention may be adapted to that data processor.

Although the ROM of the present invention is described herein as a serial shift register ROM and is described in said copending application as being a random access ROM, one skilled in the art will be able to adapt the architecture of said data processor to utilize the ROM of the present invention. For example, data processors using disk and drum memories for permanent program and alterable data storage are well known in the art, wherein the CCD ROM shift register and alterable shift register arrangements of the present invention may be used to replace the disk and drum memories in such prior art computer architectures. One such data processor is the Verdan computer manufactured by North American Aviation and used on the GAM-77 Hound Dog missile system. This data processor uses a small disk memory for program storage and for data storage, wherein the CCD ROM and CCD alterable memory of the present invention may be adapted by one skilled in the art to that type of data processor architecture from the teachings herein.

Alternately, the CCD ROM and CCD alterable memory of the present invention may be used in the form of an off-line memory such as with prior art disk and drum memories. For example, the data processor may have a self-contained main memory for storing program and operand information, wherein the program information may be loaded from the off-line memory, and wherein well-known prior art disk or drum memories may be replaced by the improved ROM and alterable memories of the present invention. Such a data processor architecture may load programs and data from a CCD off-line memory into the internal working memory which may be a well-known IC RAM such as used in micro-computers, then the data processor may execute the program from the internal RAM for processing information.

A data processor may have only low computational speed requirements but may have large program memory requirements. For example, a speech response data processor may be required to store large amounts of speech information for generating many words, but a word may not have to be generated any more rapidly than once per half second and word samples may not have to be generated any more rapidly than once every millisecond. This represents a computational requirement of possibly three orders of magnitude (1,000 times) slower than provided with conventional computers. Therefore, a serial memory including both ROM and alterable memory used in conjunction with a serial computer may provide both a low-cost memory and a low-cost processing capability. One form of serial computer is described in said application S/N 101,881. Another form of serial computer is the Verdan computer referenced above. Many other serial computers are well known in the art and may be adapted to use the serial ROM and serial alterable memory arrangements of the present invention from the teachings herein.

An incremental digital differential analyzer (DDA) and other processors may utilize the memory arrangements of the present invention. For example, one incremental-type structure is discussed in related application S/N 754,660 requiring a fixed constant memory register and an alterable memory register for incremental computational elements. In accordance with the present invention, a serial CCD ROM may be used to store a fixed parameter and a serial alterable memory may be used to store an alterable parameter; wherein serial processor architectures such as DDA processor architectures are well known in the art.

Further, many applications require analog output information in response to analog input information, but the information is processed under digital control. Such applications can efficiently use the system of the present invention which can receive and store analog input information in the analog alterable memory; can store analog fixed information in the analog ROM; can process information under digital computer control as discussed for the improved processor architecture of the present invention or with the processor described in application S/N 101,881; and can output analog information such as analog information stored in the analog memory arrangements of the present invention. One such embodiment may be a digital audionic system of the form described in U.S. Pat. No. 4,016,540; wherein sound samples may be stored in analog signal form in an analog ROM implemented in accordance with the present invention, wherein stored sound samples may be selected under digital data processor control such as with the digital data processor of said patent and may be output as analog signal samples to drive a sound transducer in accordance with said patent. One improvement for said digital audionic system provided with this feature of the present invention would be the use of an analog ROM to replace the digital sound sample memory of said patent to provide an analog sound sample memory for generating the analog sound samples to the sound transducer set forth in said patent.

Analog ROM Data Selection

A memory architecture will now be described for selecting a block of words from a memory, for selecting a plurality of blocks of words from a memory, and for controlling important parameters of these blocks of words. These features will be discussed for the preferred embodiment of the analog ROM of the present invention with reference to FIG. 6, but are intended to be exemplary of general memory access and signal processing arrangements. The arrangement discussed with reference to FIG. 1 will be used as a basis for the discussion of the memory accessing arrangement of FIG. 6; wherein additional circuitry is provided in FIG. 6 to illustrate selection of particular words or signals stored in the analog ROM of the present invention.

A block access control arrangement will now be discussed with reference to FIG. 6A. As discussed with reference to FIGS. 1 and 3; word counter 316, decoder 317, and one shot 223 generate ROM read pulse 225 to initiate loading of ROM signals 181 from ROM circuit 182 into CCD shift register 174 in preparation for shifting ROM signals 181 out of register 174 as output signal 190 to read circuit 179. Output signal 180 from read circuit 179 is processed with output circuit 192 to generate output signal 189. In one embodiment, output signal 189 is an analog output signal corresponding to one of a plurality of analog signals stored in the analog ROM of the present invention, which ROM comprises ROM circuit 182 and register 174. In the present illustrative embodiment, output circuit 192 may be a sample-and-hold circuit for sampling one of a plurality of output signals 180 shifted as a sequential set of output signals under control of clock signal 176. Selection circuitry 600 may be used to select which of the plurality of analog output signals is sampled with sample-and-hold 192 for storage as output signal 189.

Selection of a particular ROM word out of a plurality of words is accomplished by comparing a selected word address stored in Z-register 624 with the addresses of each of a sequence of words generated with counter 316 using comparitor 617, wherein the output of comparitor 617 is indicative of the address of the ROM output word identified with counter word 613 being equal to the selected word address 612 from Z-register 624. When such an address coincidence is detected with comparitor 617, comparitor output A=B enables one-shot 223B to load the selected analog sample 180 for storing the output sample as signal 189. Stored signal 189 may be used to excite a sound transducer such as transducer 104R shown in FIGS. 1A, 1B, and 3 of referenced Pat. No. 4,016,540. Alternatively, output circuit 192 may be an A/D converter such as the converter discussed with reference to FIG. 3 of referenced Pat. No. 4,016,540 or any other known A/D converter. Alternately, output circuit 192 may be a combination sample-and-hold and A/D converter or other known analog, hybrid, and/or digital signal processing arrangements.

Memory signal selection is shown as a computerized signal selection under control of computer 112R (FIG. 6A) for convenience of illustration and for consistency with referenced applications. This preferred embodiment is illustrative of many alternate embodiments that may be implemented by those skilled in the art from the teachings of the present invention. Computer 112R may be any computer or alternately may be non-computerized circuit arrangements but in a preferred embodiment computer 112R is the computer disclosed in detail in application Ser. No. 101,881 and in continuations therefrom. Computer 112R may monitor discrete memory ready input signal DI-11 as being indicative of the memory being ready to accept a new memory address word. Computer 112R may detect memory ready signal DI-11 with a skip-on-discrete instruction and may output a memory address word to register 624 with an I/O instruction which generates an OW gated clock pulse signal 340R such as the OW-7 signals or other selected OW signal and the A0Q accumulator output work 342R to Z-register 624 similar to the arrangements discussed in application Ser. No. 101,881 and Pat. No. 4,036,178. Z-register 624 has been discussed in detail in application Ser. No. 101,881 as a parallel scan-in register having complement outputs, but alternately Z-register 624 may be implemented as a conventional shift register such as the $C_I$ shift register discussed in application Ser. No. 101,881 and Pat. No. 4,036,178. To avoid conflict with the $C_I$ register as discussed in Pat. No. 4,036,178; the OW output channel associated with the Z-register of application Ser. No. 101,881 has been selected for illustration of the arrangement shown in FIG. 6A, wherein Z-register 624 is associated with said previously disclosed and available channel. The complement outputs of said Z-register may be compensated for by complementing the memory address word prior to outputting under program control of computer 112R, or using the uncomplemented outputs of each stage of the Z-register in place of the complemented outputs, or by incorporating inverters in either input signal line 342R or output signal lines ZQ 612, or by using an implementation similar to the $C_I$ register implementation in place of the Z-register implementation, or with other arrangements.

Output signals ZQ 612 may be compared with word counter output signals 613 using comparitor 617. Comparitor 617 may be a SN7485 four-bit comparitor as discussed on pages 202–207 of the referenced TI TTL Data Book. Such an SN7485 comparitor compares four input bits A0–A3 from Z-register 624 with four input bits B0–B3 from word counter 316 and generates an equivalent output A=B when the count word B0–B3 613 from counter 316 becomes equal to the work A0–A3 stored in Z-register 624. Comparitor 617 is shown as a single four-bit comparitor for simplicity of discussion, but such comparitors may be expanded as discussed at page 202 in the TTL Data Book to achieve comparison of longer address words. The output of comparitor 617 is low for a non-comparison condition and is high for one clock interval of word counter 316 for the clock interval that the number in counter 316 is equal to the number in Z-register 624. This positive pulse output from comparitor 617 is inverted with inverter 614 to generate negative pulse 224B to set latch 615 and to initiate generation of pulse 225B with one-shot 223B. Latch 615 may be an SN74279 latch which is set with negative going pulse 224B to generate a high discrete input signal DI-11 and which is reset with the negative going discrete pulse DO-11 to generate a low discrete input signal DI-11. One-shot circuits 223 and 223B are similar to one-shot 223 discussed with reference to FIG. 3B. One-shots 223 and 223B are disabled when disable signal 619 goes low.

Output signal 225B from one-shot 223B strobes sample-and-hold 192 to load a particular one of a sequence of analog output samples from register 174. Output circuit 192 stores the selected memory sample for a period of time, which may be one memory access iteration, or which may be a computer controlled time delay, or which may be other controlled periods for updating output signal 189.

Figure 3B:
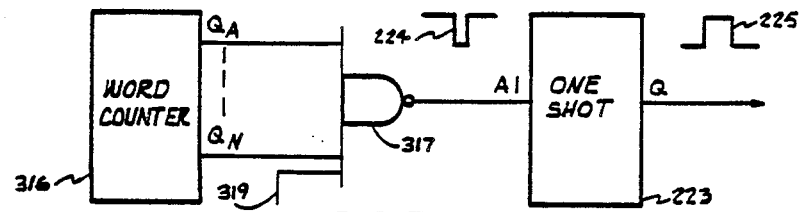

Word counter 316, decoder 317, and one-shot 223 may be implemented as discussed for FIG. 3B above for sequentially outputting fixed sequences of ROM signals from register 174. Outputting of a sequence of addresses into Z-register 624 from computer 112R causes the sequence of selected analog words from register 174 to be latched in sample-and-hold 192 as a sequence of latched analog signals generated as signal 189. Signal 189 may be used to drive a sound transducer such as transducer 104R (FIGS. 1A, 1B, and 3 of Pat. No. 4,016,540) or may be used to excite other analog, hybrid, or digital circuits.

A standby, non-operating, or other condition may be provided such as with various disable or standby mechanizations. Exemplary mechanizations are discussed below. One-shots 223 and 223B and decoder 317 may be disabled with disable signal 319. A disable signal may be packed into stages Z0–Z11 of Z-register 624 such as the YL3 signal from the Z9 stage of Z-register 624 disclosed in FIG. 14A of application Ser. No. 101,881 and shown in FIG. 6A herein as Z-register 624. Alternately, the address of a standby signal may be loaded into Z-register 624 to select such word from register 174 for loading into circuit 192 to provide a standby output signal 189. Further, for applications where a change in output word 189 is used such as for driving sound transducer 104R, merely not changing the word in Z-register 624 may result in a constant signal being loaded into circuit 192 for providing a constant output signal 189 as a standby condition.

Figure 6B:
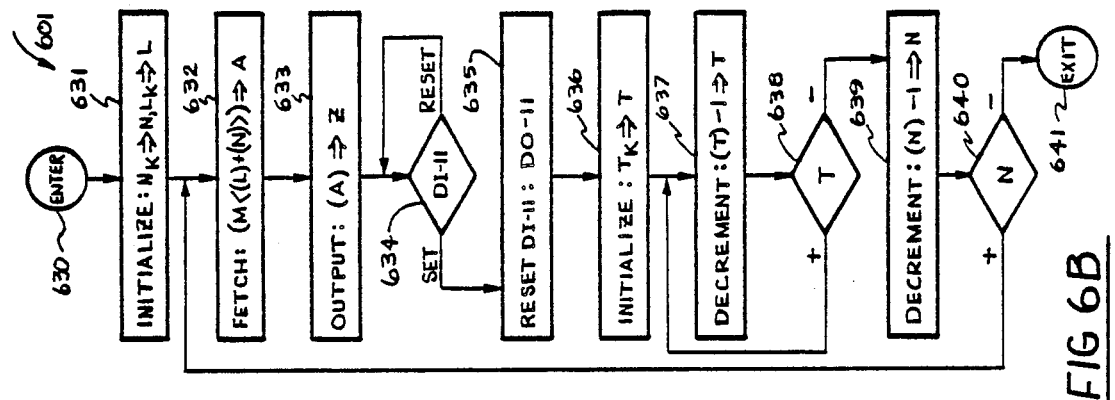
Figure 6A:
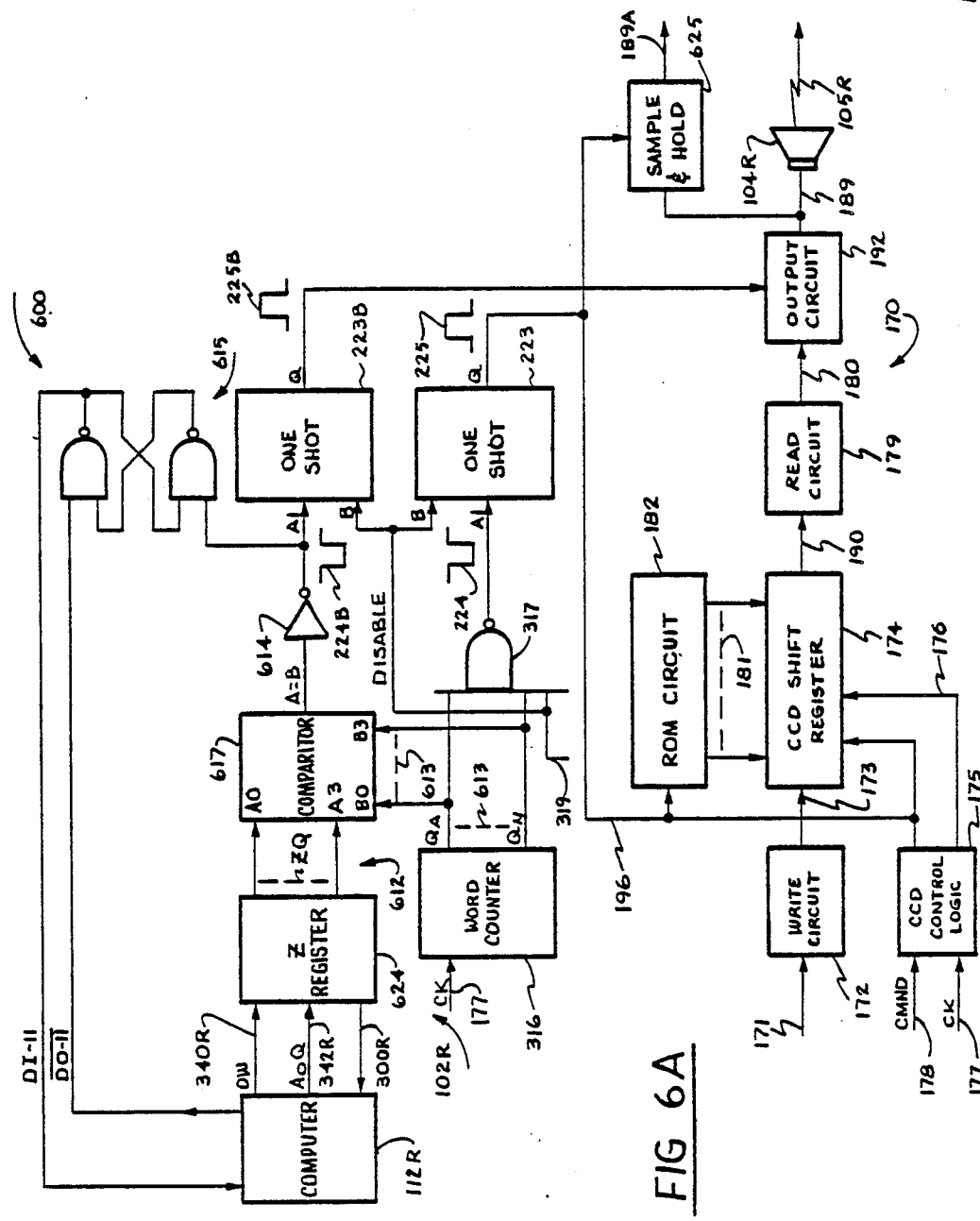

For simplicity of discussion, an arrangement is shown in FIG. 6A wherein a stored word is latched in sample-and-hold 192 when it becomes available from the output of register 174 and therefore the time that such signal is latched is a function of the storage location of that signal or the address of that signal. If the shifting time of register 174 is short compared to the holding time of output circuit 192, then the differences in access time for various signals may be of no consequence. Further, if signals are sampled in sequence such as for a sequence of sound samples stored in adjacent memory locations for an audionic embodiment, the difference in access time for adjacent signals may be only one shift clock period and therefore may be inconsequential. For applications where the access time delay is critical, access time delays may be equalized with any of a number of arrangements. Exemplary arrangements are discussed below.

In one alternate embodiment, accessing of an appropriate stored signal can be used to hold the accessing of other signals, where the desired signal is held until sampled at a fixed time. For example, detection of coincidence signal 224B with latch 615 can hold shifting of register 174 such as with signal DI-11 disabling clock pulse generator as the enable signal to gate 310 (FIG. 3A) or as command signal 178 to logic 175 (FIG. 3B abd FIG. 6A). Hold signal DI-11 preserves output signals 190 and 180 of register 174 to be sampled by output circuit 192 at a fixed time, where signal 225B from one-shot 223B strobes circuit 192 at such fixed time to load the output of register 174 that is held in a static condition with the hold signal.

In another embodiment, second sample-and-hold 625 stores output signal 189 of the first sample-and-hold 192 in response to signal 225 from one-shot 223, which signal 225 can occur at a fixed time interval. Therefore, sample-and-hold circuit 192 provides temporary storage for analog signal 180 when it becomes available in response to signal 225B and sample-and-hold 625 provides synchronous storage of the analog signal loaded from temporary sample-and-hold 192 at a fixed or synchronous time interval to provide synchronous output signal 189A in response to non-synchronous signal 189. Many other arrangements for synchronizing the analog output signal from the analog ROM will now become obvious from the teachings herein.

In accordance with another feature of the present invention, the memory arrangement of the present invention, which is characterized by the CCD analog ROM, may be accessed rapidly to minimize errors such as charge leakage errors, even for a low duty cycle requirement. For example, an audionic system may require output samples to be provided at a 10 KHz rate, but the CCD memory may be shifted at 10 MHz shift rate for rapid access and for reduced errors.

A computer subroutine will now be discussed with reference to FIG. 6B to illustrate how computer 112R (FIG. 6A) may be programmed to control single block memory accesses. Computer 112R enters subroutine 601 through operation 630 and exits subroutine 601 through operation 641 with well-known subroutine operations. For example, ENTER operation 630 may include a calling sequence such as saving the return address to the main program and EXIT operation 641 may include fetching the stored return address and transferring back to the main program location defined with the return address, as is well known in the computer programming art.

After entering subroutine 601 through operation 630, the program initializes subroutine 601 such as by loading parameters or constants into various registers and memory locations. For example, a memory address index word $N_k$ may be loaded into the N-scratchpad register and the base address location $L_k$ may be loaded into the L-scratchpad register such as shown in program operation 631 and a time delay parameter $T_k$ may be loaded into the T-scratchpad register such as shown in program operation 636; wherein these scratchpad register designations are provided for convenience and may be assigned to any scratchpad registers or other storage locations in the computer.

The program can fetch the appropriate address of the analog ROM word such as with a table-lookup type operation with operation 632 and can output the table-lookup address word to Z-register 624 (FIG. 6A) with operation 633. The address word can be fetched from the memory location defined by the sum of the base address (stored in the L-scratchpad register) and the index address (stored in the N-scratchpad register) with operation 632, where the fetched word can be loaded into the A-register with an indexed memory access instruction. The fetched word stored in the A-register can be output to Z-register 624 as the $A_0Q$ signal 342R (FIG. 6A) with operation 633 (FIG. 6B). Alternately, the analog ROM address can be defined by the N-parameter or can be defined by the indexed base address parameter, (L+N); wherein this direct ROM address can be output to Z-register 624 thereby eliminating the need for table-lookup fetch operation 632.

After outputting the analog ROM address word with operation 633, the program tests discrete input DI-11 with operation 634 to determine if the analog ROM signal has been accessed and, if so, the program resets DI-11 latch 615 with discrete output signal DO-11 with program operation 635. Testing of discrete input signal DI-11 can be accomplished with a skip-on-discrete instruction, which will cause the program to continue to loop back along the RESET path around test 634 when discrete input latch 615 is reset and to branch to the next program operation along the SET path when discrete input latch 615 is set. For example, if latch 615 is reset, the skip-on-discrete instruction can disable the skip operation and can cause the program to execute the next instruction which may be a transfer instruction tranferring back to the skip-on-discrete instruction. When discrete latch 615 is set, the skip-on-discrete instruction can cause the program to skip over the transfer instruction that provides the looping back around operation 634 and can resume sequential program operations along the SET path from operation 634. The program can then execute a discrete output 11 instruction 635 generating the DO-11 signal to reset latch 615.

A programmable time delay may be implemented with operations 636–638. The program loads a time delay parameter $T_k$ into the T-scratchpad register with operation 636. The T-parameter is successively decremented with operation 737 to provide a time delay and is tested with operation 638 to detect when the time delay has expired. Operations 637 and 638 can be implemented with a decrement-and-transfer-on-non-negative instruction, where the $T_k$ parameter in the T-register can be decremented and the program operation can be transferred until the T-parameter is decremented to a negative number. The conditional transfer on the T-parameter being non-negative is shown by the looping back from test operation 638 to the decrement operation 637 along the positive path. When the T-parameter has been decremented to a negative number, the conditional transfer is disabled and the program operations continue in sequence to operations 639 and 640.

Program opertions 639 and 640 control looping within the subroutine for accessing a block of analog ROM parameters in sequence. Decrement operation 639 and test operation 640 can be implemented as discussed for program operations 637 and 638 using a decrement-and-transfer-on-non-negative instruction. As long as the N-parameter is non-negative, program operations will branch back from test operation 640 along the positive path to operation 632. A new address parameter is output for each iteration or looping back from operation 640 until the N-parameter is decremented to a negative number, as indicative of completion of accessing of the block of sequential signals from the analog ROM. When the N-parameter is decremented to a negative number, operation branches along the negative path from test operation 640 to exit the subroutine through operation 641.

A multiple-block access arrangement will now be discussed with reference to FIG. 6C in the form of accessing a sequence of analog signals from an analog ROM having a controlled rate and a controlled amplitude. This preferred embodiment is intended to exemplify the more general features of the invention including accessing of digital signals or other signals, processing of signals that are not necessarily stored signals, and different applications thereof. Although this inventive feature will be discussed in the context of a particular embodiment, it is intended that this embodiment be exemplary of a broad range of other embodiments and uses thereof.

In an illustrative embodiment, computer 112R generates an output timing control parameter to $C_I$-register 324R for controlling rate multiplier 651. Rate multiplier 651 generates a programmable clock signal 177 in response to programmable rate signal 310R such as for controlling CCD control logic 175 and word counter 316 to operate at different memory access rates. The arrangement of computer 112R and $C_I$-register 324R communicating with OW clock signal 340R, data signal $A_0Q$ 342R, and feedback signal 300R are similar to the operation discussed with reference to corresponding elements in FIG. 3 of Pat. No. 4,016,540 and are similar to the computer communication arrangement discussed with reference to FIG. 6A herein. $C_I$-register 324R stores a rate-related parameter which is used to control rate multiplier 651 with signals 310R. Rate multiplier 651 may be a SN74167 rate multiplier that generates an output pulse rate Z that is proportional to the input clock pulse rate and also proportional to the programmed word 310R. Rate multiplier 651 is disclosed in detail in the TI TTL Data Book at pages 347–350; discussing operation, interconnections, expandability, etc.

Computer 112R loads a programmable rate parameter into $C_I$ register 324R for controlling rate multiplier 651 with signals 310R. Master clock MCK 650 has a rate that is divided down to provide the programmable rate of output clock signal CK 177 under control of program word 310R. Controllable rate clock 177 may be used to clock the appropriate circuitry such as CCD control logic 175 and word counter 316 to control access rate of the analog ROM.

Similar to the computer arrangement for the controlling clock rate, a computer controlled arrangement for controlling amplitude 192A can be implemented in combination with or in place of the programmable clock rate arrangement. For example, output circuit 192 (FIGS. 1 and 6A) can include sample-and-hold 652 and multiplying digital-to-analog converter 654 for generating analog output signal 189B in response to analog input signal 180. Sample-and-hold 652 can perform the function discussed for a sample-and-hold with reference to FIG. 6A above. DAC 654 can perform the function of controlling amplitude of signal 189B in response to programmable word 310R from $C_I$ register 324R. Multiplying DAC 654 provides output signal 189B having an analog amplitude that is proportional to both the amplitude of analog input signal 653 and the magnitude of the digital parameter 310R from register 324R. DAC 654 may be used to process signal 653 from sample-and-hold 652 as shown in FIG. 6C or alternately DAC 654 may be located before sample-and-hold 652, where DAC 654 may then process input signal 180 prior to processed with sample-and-hold 652.

The arrangement shown in FIG. 6C may provide access rate control, or amplitude control, or both access rate and amplitude control. Providing of either access rate or amplitude control independently can be implemented with $C_I$-register 324R exciting either rate multiplier 651 or DAC 654 as discussed above. When providing the combination capability, the same $C_I$-register 324R can be used to excite rate multiplier 651 and DAC 654 having rate control and amplitude control words packed together in $C_I$-register 324R or can be implemented with separate registers on separate computer output channels such as by using $C_I$-register 324R (FIG. 6C) for controlling rate multiplier 651 and by using Z-register 624 (FIG. 6A) for controlling DAC 654. Generating and outputting of packed words on the same output channel or separate words on different channels are well known in the art and are disclosed in the referenced patent applications.

For convenience of discussion, access rate control is discussed using a rate multiplier and amplitude control is discussed using a multiplying DAC. Other arrangements are known in the art. For example, rate multiplier 651 can be replaced with various rate controlling devices such as voltage controlled oscillators and multiplying DAC 654 can be replaced with various known amplitude control devices, where interfacing to these alternate devices will become obvious from the teachings herein.

The arrangement discussed with reference to FIG. 6C for multiple-block accessing, rate control, and amplitude control can also be used to provide other controllable capabilities. For example, word counter 316 can be preloaded with an initial word from computer 112R (FIG. 6A) defining the start address of the block to be accessed. Further, an auxiliary register (not shown) similar to Z-register 524 (FIG. 6A) can be preloaded with a block length parameter for defining the accessed number of samples in the block. For example, this preloaded register can be implemented in the form of a preloadable down-counter such as an SN74192 preloadable down-counter, wherein the down-counter can be indicative of the last word in the block to be accessed. This last word indication can be used to discontinue memory accesses for the selected block and to initialize the circuitry for the next block to be accessed. Alternately, interface controllers having first address and last address registers or first address and block length registers for accessing blocks of information from computer peripherals such as a disk memory are well known in the art, wherein these memory block access arrangements can be implemented for the analog ROM of the present invention from the teachings herein. Further, other memory access, control, and utilization arrangements known in the art can be used with the analog ROM of the present invention.

A computer subroutine will now be discussed with reference to FIG. 6D to illustrate how computer 112R (FIGS. 6A and 6C) may be programmed to control multiple-block memory accesses and to provide different control parameters for different blocks. Computer 112R may enter subroutine 602 through operation 660 and may exit subroutine 602 through operation 671 with well-known subroutine operations. For example, ENTER operation 660 may include a calling sequence such as saving the return address to the main program or to the executive program and EXIT operation 671 may include fetching the stored return address and transferring back to the main program location defined with the return address, as is well known in the computer programming art.

After entering subroutine 602 through operation 660, the program may inizialize the subroutine such as by loading parameters or constants into various registers and memory locations. For example, a memory address index word $P_K$ may be loaded into the P-scratchpad register and the base address location $B_K$ may be loaded into the B-scratchpad register such as shown in program operation 661, and a time delay parameter $D_K$ may be loaded into the D-scratchpad register such as shown in program operation 666; wherein these scratchpad register designations are provided for convenience and may be assigned to any scratchpad registers or other storage locations in the computer.

The program may fetch the appropriate parameter for output control such as with a table-lookup type operation with operation 662 and may output the table-lookup parameter to the $C_I$-register (FIG. 6C) with operation 663. The address word may be fetched from the memory location defined by the sum of the base address (stored in the B-register) and the index address (stored in the P-register) with operation 662, where the fetched word may be loaded into the A-register with an indexed memory access instruction. The fetched word stored in the A-register can be output to the $C_I$-register as th $A_0Q$ signal 342R (FIG. 6C) with operation 663 (FIG. 6D).

After outputting the control parameter with operation 663, the program transfers to subroutine 601 to output a block of memory signals; as discussed relative to FIG. 6B. Therefore, the control parameter in the $C_I$-register (FIG. 6C) is applied to each block of signals output from the analog ROM. Alternately, the control parameter may be changed for each output signal in the block of signals or may be implemented in other forms which will now become obvious from the teachings herein.

After execution of subroutine 601, the program returns to perform time delay operations 666-668 using the return address discussed for EXIT operation 641 in subroutine 601 (FIG. 6B).

A programmable time delay may be implemented with operations 666-668. The program loads a time delay parameter $D_K$ into the D-scratchpad register with operation 666. The D-parameter is successively decremented with operation 667 to provide a time delay and is tested with operation 668 to detect when the time delay has expired. Operations 667 and 668 may be implemented with a decrement-and-transfer-on-non-negative instruction, where the $D_K$ parameter in the D-register can be decremented and the program operation can be transferred until the D-parameter is decremented to a negative number. The conditional transfer on the D-parameter being non-negative is shown by the looping back from test operation 668 to the decrement operation 667 along the positive path. When the D-parameter has been decremented to a negative number, the conditional transfer is disabled and the program operations continue in sequence to operations 669 and 670.

Program operations 669 and 670 control looping within the subroutine for accessing a plurality of blocks of analog ROM parameters in sequence; wherein a different block control parameter may be provided for each block. Decrement operation 669 and test operation 670 can be implemented as discussed for program operations 667 and 668 using a decrement-and-transfer-on-non-negative instruction. As long as the P-parameter is non-negative, program operations will branch back from test operation 670 along the positive path to operation 662. A new control parameter is output for each iteration or looping back from operation 670 until the P-parameter is decremented to a negative number, as indicative of completion of accessing of the plurality of sequential signals from the analog ROM. When the P-parameter is decremented to a negative number, operation branches along the negative path from test operation 670 to exit the subroutine through operation 671.

The program operations discussed with reference to FIGS. 6B and 6D have been disclosed in a form that illustrates applicable programming methods, although many other implementations can be provided by those skilled in the art from the teachings herein. Further, various operations discussed may be redundant, unnecessary, and/or simplified for purposes of illustration. For example, time delay operations implemented with operations 636-638 (FIG. 6B) and operations 666-668 (FIG. 6D) may not be necessary or may not be desirable, particularly in view of the discrete signal handshaking operations with operations 634 and 635 (FIG. 6B) and implemented with latch 615 (FIG. 6A); but these time delay operations are disclosed to illustrate various alternate methods that may be used to interface computer 112R with the analog ROM of the present invention.

The arrangment discussed with reference to FIG. 6 may be a sequential accessing arrangement, a random accessing arrangement, or other such arrangement. Relative to a random accessing arrangement, computer 112R outputs any randomly defined address into Z-register 624 for random access of the analog ROM. Alternately, computer 112R may output a sequence of adjacent addresses to Z-register 624 such as by incrementing or decrementing the address parameter with well-known computer programming operations. Yet further, Z-register 624 may be implemented as a counter arrangement which may be initially loaded from computer 112R for a start address and may be incremented or decremented such as under control of signal DI-11, or signal 224B, or signal 225B, or signal 225, or other signals such as signals indicative of accessing of the previously selected stored analog ROM signal.

Because of the capability to sequentially access or randomly access audionic signal samples from the analog ROM as discussed above and because of the capability to manipulate analog signals such as by adding and subtracting analog signals, the arrangements discussed in Pat. No. 4,016,540 such as with reference to FIGS. 4-6 therein may be implemented with the analog ROM of the present invention. Such arrangements include superposition, iterative processing, subroutining, and other such methods. Further, the other means, methods, applications, etc set forth in said Pat. No. 4,016,540 may also be used in combination with the various inventive features of the present invention.

The system of the present invention has advantages in the area of signal generation and function generation, particularly for analog signals and analog functions. For example, a sequence of stored analog signals can be output as signal 189 with the arrangement discussed with reference to FIG. 6A, wherein this sequence of signals can be used to synthesize analog functions. In one embodiment, the sequence of signals 189 can synthesize a sound or speech function. In another embodiment, the sequence of signals 189 may synthesize various mathematical functions; exponential functions such as power and root functions; and other functions. In yet another embodiment, signal 189 may be used to generate arbitrary functions such as empirically derived functions that may not be analytically definable. In still another embodiment, signals can be provided to an analog or a hybrid signal processing circuit for processing signals 189 as either analog or digital signals in an analog or hybrid signal processor or data processor arrangement.

In a yet further embodiment, output circuit 192 can include an A/D converter such as the converter discussed with reference to FIG. 3 in Pat. No. 4,016,540 or various known converters for generating digital output signals as signals 189 in response to analog output signals 180. Digital signals from the A/D converter can be used to load a digital memory such as a digital integrated circuit RAM or shift register, a bubble memory, a core memory, a rotating memory, a digital CCD memory, or other known memories. Loading of a digital memory can be performed under control of a computer such as computer 112R, or can be provided under direct memory access (DMA) control as is well known in the art, or can be loaded in other known forms. In this embodiment, the analog ROM can be used as an off-line memory for generating off-line digital signals 189 to be loaded into an on-line digital memory such as a computer main memory in a manner well known in the art for conventional off-line memories such as magnetic disk, drum, and tape memories. This arrangement may be characterized as a hybrid ROM and may be utilized in a manner discussed with reference to FIG. 9 for the hybrid CCD memory arrangement having an analog memory with a digital output arrangement.

The arrangement described with reference to FIG. 6 may be used for multitudes of different applications. Some of these applications will be briefly described hereinafter to exemplify the wide range of applications.

An audionic arrangement such as discussed in Pat. No. 4,016,540 can be implemented with the system of the present invention. Memory arrangement 600 (FIG. 6A) corresponds to system 110 (FIG. 1A of Pat. No. 4,016,540). For example, the analog ROM arrangement of FIG. 6A generally corresponds to part of main memory 130 or to auxiliary memory 152 of said FIG. 1A as an audionic memory that is under computer control except that the analog output signals need not be processed with converter 102 and need not be output directly from the computer but can be output from the off-line analog ROM under computer control as discussed with reference to FIG. 6 herein and/or under control of non-computerized circuitry. In such an arrangement, a block of analog samples accessed from the analog ROM can pertain to a desired sound, word, or phrase. The block of analog samples can be used to drive a speaker such as speaker 104R (FIG. 6A) to produce the desired sound. A sequence of blocks can be accessed for providing a sequence of sounds such as for synthesizing a more complex sound, a word, a phrase, or a message, etc. An arrangement for generating a more complex sound from a plurality of blocks of simpler sounds is discussed with reference to FIG. 6D herein. In one audionic embodiment, the system may be a voice response system for building up speech messages. In this speech message embodiment, each block of analog signal samples pertains to a different word for building up a multi-word speech message. In another embodiment, a whistling toy may be provided wherein each note of a tune is synthesized by accessing a block of analog samples implemented as discussed with reference to FIGS. 6A and 6B and wherein the multi-note tune may be synthesized by accessing a sequence of tone blocks as discussed with reference to FIGS. 6C and 6D.

A signal generator arrangement may be implemented with the system of the present invention. For example, analog signals such as sinewave signals, cosinewave signals, and other trigonometric signals; squarewave and pulse type signals; triangular and sawtooth type signals, arbitrary signals that may not be analytically definable; and other signals may be generated with this signal generator arrangement. Generation of a particular type of signal can be provided by selecting the block of samples for that particular type of signal such as discussed with reference to FIGS. 6A and 6B and outputting the block of analog signal samples such as signal 189 from sample-and-hold 192. The block of analog samples may pertain to time-related samples of the particular waveform represented by the selected block. Related signals such as sinewave and cosinewave signals can be synthesized with the same block of samples, wherein the starting address of the block may be different for different but related signals. For example, the sinewave can start at the zero amplitude signal sample and the cosinewave can start at the peak amplitude signal sample, consistent with the 90-degree phase relationship therebetween.

A test system can be implemented with the system of the present invention. For example, analog circuits can be tested by generating a waveform or a plurality of waveforms to excite circuits under test using the waveform generating embodiment discussed above.

A servo system can be implemented with the system of the present invention. Servo systems are implemented with signal generators for supplying sinewaves, squarewaves, and other waveforms such as discussed in referenced applications Ser. No. 134,958 and Ser. No. 135,040 and as is known in the art. The analog signal generator discussed above can be used for generating these servo waveforms.

A display arrangement can be implemented with the system of the present invention. In a display embodiment, accessing of a block of samples or a plurality of blocks of samples can provide display functions such as character generation and symbol generation.

A pattern recognition system can be implemented with the system of the present invention. For example, a block of samples are accessed from the analog ROM for comparison with an input signal to establish correlation therebetween. Comparison between analog samples and digital samples is provided with a hybrid multiplier such as a multiplying DAC or with a hybrid summer such as including a DAC and an analog summer. Comparing of two analog signal samples can be implemented with analog multipliers which are well known in the art or with analog summers such as differential amplifiers.

A sample filter arrangement can be implemented with the system of the present invention. For example, reference samples can be accessed from the analog ROM of the present invention for processing with input signal samples. In one embodiment, a Fourier transform processor can be implemented with sum-of-the-products operations, where digital input samples are multiplied by analog ROM samples (representing Fourier transform trigonometric functions) using a multiplying DAC for generating an analog product signal which is then summed with other analog signals to provide a sum-of-the-products operation.

A multiple ROM arrangement can be implemented with the system of the present invention. For example, a plurality of analog ROM devices can be simultaneously accessed, wherein the outputs of a plurality of analog ROMs can be processed together. For example, an output sample from a first analog ROM can be processed with an output sample from a second analog ROM such as with a differential amplifier for addition or subtraction to generate a combination output signal in response to the plurality of input signals from a plurality of analog ROMs. Similarly, analog signals stored in an analog alterable CCD memory or digital signals stored in a digital memory can be processed with analog signals stored in an analog ROM. For example, analog samples of an input signal can be stored in an analog memory and can be processed in response to analog samples from an analog ROM for providing correlation therebetween, wherein the analog ROM information can be the reference information for the correlation operation. Therefore, it is herein intended that the memory arrangements set forth in the instant application and in the copending related applications, and the memory arrangements known in the prior art to be usable in combinations therebetween to provide further advantages.

Although the memory access arrangement of the present invention has been described in a computer controlled embodiment, many other arrangements can be used for implementing the memory access arrangements of the present invention. For example, computer 112R (FIGS. 6A and 6C) can be replaced with hardwired logic, wherein hardwired logic can be used to implement the flow diagrams shown in FIGS. 6B and 6D by one skilled in the art.

Accessing of the CCD analog ROM has been discussed with reference to a computer 112R (FIG. 6A) in a preferred embodiment. In an alternate embodiment, the analog ROM can be accessed with a simple arrangement such as a hardwired limited access arrangement. One hardwired arrangement will now be discussed with reference to a talking doll embodiment.

A talking doll embodiment has been discussed with reference to FIG. 8, being a batch-fabricated arrangement having switches 815, transducer 817, and electronic circuits 812, 813, and 814. In this embodiment, the talking doll may have a limited number of switches such as four switches or eight switches, wherein each switch is related to a different sound, word, phrase, or other audionic message. Depressing one of a plurality of switches results in generation of a related one of a plurality of sound messages.

In an alternate hardwired switch embodiment, switch signals may be encoded and used to load an address register such as register 624 (FIG. 6A herein), wherein the switches and encoder can be used in place of computer 112R for loading register 624 to access a block of sound samples from the analog ROM. One embodiment of encoded switch signals loading a register is shown in referenced application Ser. No. 101,881 and in referenced Pat. No. 4,038,640. In said patent, switches 34 (FIG. 1 therein) generate signals to encoder (FIGS. 1 and 3 therein) for encoding into digital codes (FIGS. 1 and 3 and Table IV at column 8 lines 40–65 therein) and loading into register 20 under control of the ENABLE switch detection signal from delayed one shot 62 (FIG. 3 therein). Register 20 (FIGS. 1 and 3 therein) may be used in place of address register 624 (FIG. 6A herein) to access a block of signals related to the selected switch from the analog ROM. Such an arrangement can be implemented with the system of FIG. 6A herein. Depression of one of a plurality of switches can be used to select one of a plurality of blocks of audionic information for generating a sound message in response thereto.

In view of the above, a non-computerized audionic arrangement can be implemented such as being directly responsive to manually accuated switches for accessing a block of analog signal samples for driving a transducer substantially directly without use of the stored program computer or the D/A converter discussed for a preferred embodiment with reference to FIG. 1 of Pat. No. 4,016,540.

Sampled Filter Arrangement

A sampled filter arrangement 700 having important advantages over prior art filters will now be discussed with reference to FIG. 7. Arrangement 700 incorporates many inventive features including a sample-on-the-fly arrangement, an improved memory arrangement, a hybrid arrangement, and other inventive features. For convenience of discussion, the sampled filter arrangement of the present invention will be discussed in the embodiment of a discrete Fourier transform (DFT) arrangement, which is intended to exemplify more general filter methods including other Fourier transforms, correlators, convolvers, compositors, FIR filters, and other filter arrangements.

The DFT arrangement of the present invention will now be discussed with reference to FIGS. 7A–7D to illustrate the processing method. Elements $t_0$–$t_3$ represent time domain samples; where the first sample is $t_0$, the second sample is $t_1$, the third sample is $t_2$, and the fourth sample is $t_3$. These samples may be analog samples, digital samples, single-bit samples, or other samples. The time domain samples are mapped into frequency domain samples through appropriate constants such as by multiplying the input sample by the appropriate constant and summing the product thereof into the appropriate output sample storage location. Output samples are designated as the $f_0$–$f_3$ samples wherein the $f_0$ sample is the lowest frequency sample, the $f_3$ sample is the highest frequency sample, and the $f_1$ and $f_2$ samples are intermediate frequency related samples of ascending frequency significance.

For simplicity of discussion, time domain samples $t_0$–$t_3$ are assumed to be equally spaced in time and frequency domain samples $f_0$–$f_3$ are assumed to be equally based in frequency; but such equal time spacing and equal frequency spacing is not necessary for implementation of the system of the present invention. Further, for simplicity of discussion the number of time domain samples $t_0$–$t_3$ is shown equal to the number of frequency domain samples of $f_0$–$f_3$; although there may be fewer time domain samples than frequency domain samples or there may be fewer frequency domain samples than time domain samples. Therefore, for the general method, any number of time domain samples having any desired time spacing therebetween may be mapped into any number of frequency samples having any frequency spacing therebetween.

The mapping of any time sample $t_n$ into any frequency sample $f_n$ can be performed in the following manner. The time sample $t_n$ is multiplied by an appropriate constant and added into the related frequency sample or frequency bin. The constant is a function of the time relationship of the time domain sample $t_n$ and the frequency relationship of the frequency domain sample $f_n$. For example, the constants may be a pair of trigonometric constants, being the sine and cosine functions of the argument wt; where $w=2\pi f$ and wherein the f and t values of this argument are derived from the time-related source and frequency-related destination of the particular operation. Alternately, other constant terms may be used.

An example of operation will now be provided relative to FIGS. 7A–7D. As shown in FIG. 7A, the first time domain sample $t_0$ is mapped into each of a plurality of frequency domain samples $f_n$ by multiplying the $t_0$ sample by the appropriate constant (which is a function of the $t_0$ time source and the related $f_n$ frequency destination) and then summing that product into the appropriate frequency sample $f_n$. As shown in FIG. 7B, the second time domain sample $t_1$ is mapped into each of a plurality of frequency domain samples $f_n$ by multiplying the $t_1$ sample by the appropriate constant and then summing that product into the appropriate frequency sample $f_n$. Similarly an as shown in FIGS. 7C and 7D, the third and fourth time domain samples $t_2$ and $t_3$ are mapped into each of a plurality of frequency domain samples $f_n$ by multiplying the t sample by the appropriate constant and then summing that product into the appropriate frequency sample $f_n$. Therefore, for each of four time domain samples $t_0$–$t_3$ updating each of four frequency domain samples $f_0$–$f_3$ (FIGS. 7A–7D), each frequency domain sample $f_0$–$f_3$ will be updated four times, once for each input sample $t_0$–$t_3$. Alternately, input sampling can continue past the $t_3$ sample for subsequent updating of each of the four frequency domain samples $f_0$–$f_3$ or conversely a limited number of time domain samples such as four time domain samples $t_0$–$t_3$ can each be used to update a large number of frequency domain samples such as 64 frequency domain samples.

For simplicity of discussion, a single time domain sample is shown updating a single frequency domain sample (FIGS. 7A–7D). As is well known in the DFT art, updating of samples is typically performed using a complex (real and imaginary) number representation characterized by in-phase and out-of-phase updates, or sine and cosine updates, etc. In one embodiment, two time domain samples may be provided for each time domain sample period $t_0$–$t_3$ and each of the pair of time domain samples can be multiplied by the appropriate constant to update the corresponding one of a pair of complex frequency domain samples. Therefore for example, the $t_0$ time domain sample (FIGS. 7A–7D) may represent a pair of complex time domain samples, the $f_0$ frequency domain sample (FIGS. 7A–7D) may represent a pair of complex frequency domain samples, and the constant being a function of $t_0$ and $f_0$ may represent a pair of constants being a sine function and a cosine function of the time and frequency related argument. Alternately, the time samples $t_0$–$t_3$ may be single (not complex) samples, wherein each time sample t may be multiplied by a complex pair of constants to generate a complex pair of frequency-related updates for updating a complex pair of frequency domain samples f for each frequency. As another alternative, a complex pair of time domain samples may be generated by using a pair of non-complex time domain samples offset in time such as offset by one-half of the sampling period. Many other methods for satisfying the complex number requirements of a DFT will now become obvious from the teachings herein.

For simplicity of discussion, the methods shown in FIGS. 7A–7D use only four time domain samples t and four frequency domain samples f. In an actual implementation, such sets of four may be quadrature signals having zero and unit trigonometric functions and therefore represente an extremely simple configuration. It is herein intended that these groupings of four be exemplary of larger groupings that represent more practical implementations of a DFT.

The transform on-the-fly method of the present invention will now be discussed. When the $t_0$ sample is received (FIG. 7), it is multiplied by the four constants that are functions of the $t_0$ time sample and of frequency and used to update each of the four frequency samples. When the $t_1$ sample is received (FIG. 7B), it is multiplied by the four constants that are functions of the $t_1$ time sample and of frequency and used to update each of the four frequency samples. When the $t_2$ sample is received (FIG. 7C), it is multiplied by the four constants that are functions of the $t_2$ time sample and of frequency and used to update each of the four frequency samples. When the $t_3$ sample is received (FIG. 3D), it is multiplied by the four constants that are functions of the $t_3$ time sample and of frequency and used to update each of the four frequency samples. Therefore, it can be seen that each time domain sample is fully processed and fully updates the frequency samples to implement the process-on-the-fly arrangement of the present invention.

A process-on-the-fly implementation has been discussed for a correlator processor in application Ser. No. 550,231; which arrangement is equally applicable to a DFT processor or other filter arrangement to provide other arrangements such as a DFT.

A general implementation of a filter exemplified by a DFT will be discussed with reference to FIG. 7E and a specific hybrid embodiment will be discussed with reference to FIG. 7F hereinafter. The sampled filter arrangement may be implemented in analog, digital, or hybrid signal processing form. Preferred embodiments of all three forms will be discussed hereinafter to exemplify the more generally applicable features of the present invention.

Many filtering and processing arrangements can be characterized as the sum-of-the-product arrangements, wherein an input sample 712 may be multiplied by a reference sample 713 using a multiplier 714 and summed with a summer 717, with the output sample stored in output memory 718. For example, a sequence of reference samples 713 can be provided by memory 710 to be processed with a sequence of input samples 712 such as from input memory 711 to be multiplied with multiplier 714 and summed with summer 717. Each input sample 712 can processed with a corresponding reference sample 713 such as disclosed in application Serial No 550,231 with reference to FIG. 6D therein.

Arrangement 700 is shown in block diagram form, wherein the elements and methods used therefor have been disclosed in detail in the instant application and in related applications. For example, reference memory 710 may be the analog ROM as discussed with reference to FIGS. 1-3 of the instant application or may be a digital ROM as discussed with reference to application Serial No 550,231 such as ROM 625 at FIG. 6D therein. Further, multiplier 714 may be an analog multiplier as is well known in the art, a hybrid multiplier such as a multiplying DAC, or a digital multiplier such as a single-bit multiplier or a whole-number multiplier as discussed in application Serial No 550,231 and as discussed herein. Further, summer 717 may be an analog summer or a digital summer and output memory 718 may be an analog memory or a digital memory as discussed herein and as further discussed in application Serial No 550,231.

Further control arrangements, addressing methods, and other concepts for sample filters are set forth in detail in application Serial No 550,231 and various addressing and control arrangements are set forth in the instant application, wherein the methods set forth in application Serial No 550,231 may be implemented in the structural form set forth herein from the teachings herein. For example, a start address for accessing an ROM may be derived as set forth in application Serial No 550,231 and may be preloaded into word counter 316 (FIG. 6A herein) to provide accessing the analog ROM of the present invention in accordance with the addressing method of application Serial No 550,231. Other adaptations of the system of the present invention and the methods and arrangements set forth in application Serial No 550,231 will now become obvious from the teachings herein.

Arrangement 700 characterizes a general sampled filter arrangement in accordance with the system of the present invention. Reference memory 710 provides constant or reference information 713. Memory 710 may be an analog ROM in accordance with the present invention or a digital ROM in accordance with the arrangement set forth in application Serial No 550,231 such as ROM 625 at FIG. 6D therein. Alternately, reference memory 710 may be an RAM, a core memory, or any other memory arrangement. Input memory 711 may be a CCD or other serial memory or other memory arrangement disclosed herein and/or known in the art. Alternately, a process-on-the-fly method in accordance with the disclosure in application Serial No 550,231 may be used, wherein input signal 712A may be sampled directly from front-end 709 as signal 712 and processed-on-the-fly without the need for input memory 711.

Because of the large number of combinations of analog an digital signal processors that may be implemented with the arrangement of FIG. 7E, the various combinations are summarized in tabular form in the TABLE OF PROCESSING ALTERNATIVES set forth herein. In this table; the elements (710, 711, 714, 717, and 718) are set forth in columns and the embodiments (P0 to P31) are set forth in rows. For each embodiment, the elements in the columns are identified as either an analog element with a "0" symbol or a digital element with a "1" symbol. The table is organized in truth table form as a binary progression to identify all combinations in a conventional manner. For example, the first embodiment is a fully analog embodiment having all "0" elements and the last embodiment is an all-digital embodiment having all "1" elements, wherein all other embodiments may be considered to be hybrid embodiments having combinations of analog and digital ("1" and "0") elements. For convenience of reference, the binary numerical value of the combination of "1" and "0" terms in an embodiment is characterized by the decimal numerical value of the P reference number for that particular embodiment. For example, a "00111" embodiment can be characterized as a 7 based upon the weighted binary numerical value and defined as the P7 embodiment having digital elements 710, 711, and 714 defined with "1" symbols and having analog elements 717 and 718 defined with "0" symbols.

For convenience of discussion and to limit the size of the TABLE OF PROCESSSING ALTERNATIVES to a practical level, elements are defined as analog elements or digital elements by the analog or digital nature of the signals output therefrom. For example, reference memory 710 may be the analog ROM of the present invention and may be characterized as an analog element if output signal 713 is in analog signal form. Alternately, if an A/D converter is used in combination with the analog ROM for reference memory 710, signal 713 will be a digital signal and therefore element 710 will be characterized as a digital element.

| TABLE OF PROCESSING ALTERNATIVES | | | | | |
| --- | --- | --- | --- | --- | --- |
| REF NO → | 718 | 717 | 714 | 711 | 710 | EMBODIMENT ↓ |
| P0  | 0 | 0 | 0 | 0 | 0 | ANALOG |
| P1  | 0 | 0 | 0 | 0 | 1 | HYBRID |
| P2  | 0 | 0 | 0 | 1 | 0 | HYBRID |
| P3  | 0 | 0 | 0 | 1 | 1 | HYBRID |
| P4  | 0 | 0 | 1 | 0 | 0 | HYBRID |
| P5  | 0 | 0 | 1 | 0 | 1 | HYBRID |
| P6  | 0 | 0 | 1 | 1 | 0 | HYBRID |
| P7  | 0 | 0 | 1 | 1 | 1 | HYBRID |
| P8  | 0 | 1 | 0 | 0 | 0 | HYBRID |
| P9  | 0 | 1 | 0 | 0 | 1 | HYBRID |
| P10 | 0 | 1 | 0 | 1 | 0 | HYBRID |
| P11 | 0 | 1 | 0 | 1 | 1 | HYBRID |
| P12 | 0 | 1 | 1 | 0 | 0 | HYBRID |
| P13 | 0 | 1 | 1 | 0 | 1 | HYBRID |
| P14 | 0 | 1 | 1 | 1 | 0 | HYBRID |
| P15 | 0 | 1 | 1 | 1 | 1 | HYBRID |
| P16 | 1 | 0 | 0 | 0 | 0 | HYBRID |
| P17 | 1 | 0 | 0 | 0 | 1 | HYBRID |
| P18 | 1 | 0 | 0 | 1 | 0 | HYBRID |
| P19 | 1 | 0 | 0 | 1 | 1 | HYBRID |
| P20 | 1 | 0 | 1 | 0 | 0 | HYBRID |
| P21 | 1 | 0 | 1 | 0 | 1 | HYBRID |
| P22 | 1 | 0 | 1 | 1 | 0 | HYBRID |
| P23 | 1 | 0 | 1 | 1 | 1 | HYBRID |
| P24 | 1 | 1 | 0 | 0 | 0 | HYBRID |
| P25 | 1 | 1 | 0 | 0 | 1 | HYBRID |
| P26 | 1 | 1 | 0 | 1 | 0 | HYBRID |
| P27 | 1 | 1 | 0 | 0 | 1 | HYBRID |
| P28 | 1 | 1 | 1 | 0 | 0 | HYBRID |
| P29 | 1 | 1 | 1 | 0 | 1 | HYBRID |
| P30 | 1 | 1 | 1 | 1 | 0 | HYBRID |
| P31 | 1 | 1 | 1 | 1 | 1 | DIGITAL |

Further, A/D converters may be used for generating digital output signals in response to analog input signals and D/A converters may be used to generate analog output signals in response to digital input signals to satisfy the conditions of the TABLE OF PROCESSING ALTERNATIVES. For example, relative to the P7 term; signals 712, 713, and 715 from elements 711, 710, and 714 respectively are digital signals while signals output from elements 717 and 718 are analog signals. In order to facilitate this embodiment, it may be necessary to provide a D/A converter to convert digital signal 715 to analog signal form for processing with analog summer 717 and analog output memory 718.

An analog sampled filter embodiment will now be discussed with reference to arrangement 700. Reference memory 710 may be the analog ROM of the present invention for generating analog samples 713 to multiplier 714. Input signal sample 712 may be an analog signal sample such as from an analog input memory 711 which may be a CCD or other analog memory. Alternately analog sample 712 may be sampled with a sample-and-hold circuit or other circuit or may be sampled implicit in multiplier 714; wherein such input signal sampling arrangements are discussed in application Serial No 550,231. Multiplier 714 can be any known analog multiplier. Further, multiplier 714 can have sample-and-hold circuits for processing input signals 712 and 713 and/or for processing product signal 715. Product signal 715 can be added to stored signal 716 with summer 717 and stored back into output memory 718 in accordance with the arrangement discussed in application Serial No 550,231 such as with reference to FIG. 6D therein. In this analog embodiment, summer 717 can be an analog summer such as a differential amplifier, a resistor summing network, or other known analog summing arrangements. Output memory 718 can be implemented as an analog output memory such as the CCD analog memory of the present invention or other analog memory arrangements.

A digital sampled filter arrangement will now be discussed with reference to arrangement 700. Reference memory 710, input memory 711, and output memory 718 can be any known digital memory devices such as ROM 625 and RAM 614 as discussed in application Serial No 550,231 relative to FIG. 6D therein. Input signal 712 and reference signal 713 can be digital signals processed with digital multiplier 714 to generate digital product signal 715 for summing with digital summer 717 and for storing in digital output memory 718. Such a digital arrangement is discussed in application Serial No 550,231 such as relative to FIG. 6D therein.

A hybrid sampled filter arrangement will now be discussed with reference to arrangement 700. A hybrid arrangement is herein intended to mean an arrangement combining analog and digital signal processing. Hybrid embodiments may be implemented by various combinations of the analog and digital sampled filter arrangements discussed above.

In one hybrid embodiment discussed with reference to FIG. 7E; reference signal 713 may be an analog signal and input signal 712 may be a digital signal. Reference memory 710 may be the analog ROM of the present invention for generating analog reference signal 713. Input memory 711 may be a digital memory for generating digital input signal 712 or alternately digital signal 712 may be derived directly from an A/D converter in a process-on-the-fly implementation. Multiplier 714 may be a hybrid multiplier such as a multiplying DAC for generating product signal 715 as an analog signal that is related to the product of analog reference signal 713 and digital input signal 712.

In another hybrid embodiment discussed with reference to FIG. 7F; reference signal 713 may be a digital signal and input signal 712 may be an analog signal. Reference memory 710 may be a digital ROM for generating digital reference signal 713 and input signal 712 may be an analog input signal such as received from front-end circuitry 709 such as transducers and signal processors. Multiplier 714A may be a hybrid multiplier such as a multiplying DAC for generating analog product signal 715A in response to the product of digital reference signal 713 and analog reference signal 712. Analog product signal 715A may be summed with output signal 716A with an analog summer such as summer 717A having input summing resistors 720, operational amplifier 721 and feedback resistor 722. The analog sum signal from summer 717A may be stored in output CCD memory 718A for subsequent updating with other product signals and for outputting as signal 716.

In other hybrid embodiments, A/D converters may generate digital signals in response to analog signals and D/A converters may generate analog signals in response to digital signals to provide different combinations of hybrid signal processing.

Many other sampled filter embodiments can be provided from the teachings of the present invention and the teachings of the referenced applications; wherein arrangement 700 is provided merely to exemplify a preferred embodiment of the broadly related teachings of the present invention.

Various types of filters may be implemented with arrangement 700 and with the various alternate embodiments from the teachings herein. For example, arrangement 700 may be used to implement a correlator sampled filter, a Fourier transform filter, a compositor filter, and multitudes of other filters; as will be exemplified with several descriptions of preferred embodiments hereinafter.

A sample on-the-fly filter implementation will now be discussed for arrangement 700. The on-the-fly filtering method has been described in detail in application Serial No 550,231; wherein this on-the-fly method will now be discussed relative to FIG. 7E. Input signal 712 is processed on a sample-to-sample basis, wherein each sample of input signal 712 is used to fully update a plurality of output samples prior to updating output samples with a next input sample. In this arrangement, input memory 711 may be eliminated, wherein input signal 712 may be a real time signal processed without memory buffering. In this arrangement, as each sample of input signal 712 is provided to multiplier 714, a plurality of reference samples 713 are provided to multiplier 714 for that single input sample 712 to update a plurality of output samples in response to the single input sample 712 and a plurality of reference samples 713. In one embodiment, reference memory 710 may be the analog ROM of the present invention that is sequentially accessed for blocks of reference samples and output memory 718 may be the alterable analog memory of the present invention. In this embodiment, a block of reference samples 713 from analog ROM 710 are accessed in synchronization with the accessing of a block of output signal samples 716 from output memory 718 for a particular input sample 712 to update each of the sequence of output samples 716 from output memory 718 in response to the corresponding sample in the block of analog reference samples 713 from reference memory 710. Block accessing of an analog memory has been described herein with reference to FIG. 6 and processing of input samples on-the-fly together with control logic, etc has been described in detail in application Serial No 550,231.

A conventional (non-on-the-fly) arrangement will now be discussed for arrangement 700. In a conventional arrangement, input samples are stored in input memory 711 and reference samples are stored in a reference memory 710. A block of input samples 712 are accessed from input memory 711 and a block of corresponding reference samples 713 are accessed from reference memory 710 in synchronization therebetween for providing the proper reference sample as signal 713 when a corresponding input sample is provided as signal 712. Therefore, a sequence of corresponding signal pairs 712 and 713 are provided to multiplier 714 in sequence for generating the product therebetween and for summing the sequence of products with summer 717 for storing of the sum of these products as a single sample in output memory 718. A change in the block of input samples accessed from input memory 711 and/or a change in the block of reference samples stored in reference memory 710 is then made to provide a new combination of signal sample pairs to multiplier 714 to generate the next sample for storage in output memory 718. Accessing of the appropriate blocks of samples from input memory 711 and from reference memory 710 for generating the particular output samples stored in output memory 718 is well known in the art and, for example, is described in the reference by Rabiner and Gold. Selection of the appropriate block in memory may be provided with well-known addressing and selection arrangements and may be provided with the preferred embodiment discussed with reference to FIG. 6 herein such as by preloading a start address into word counter 316 from computer 112R (FIG. 6A).

A correlator sampled filter will now be discussed for arrangement 700. A real-time correlator can be implemented by multiplying an appropriate reference sample 713 stored in memory 710 by appropriate input sample 712 using multiplier 714 and adding together the appropriate product signals 715 to generate output samples stored in output memory 718. Conventional (non-on-the-fly) methods are well known in the art and non-conventional (on-the-fly) methods are discussed in detail in application Serial No 550,231 such as with reference to FIG. 6D therein. For a process-on-the-fly embodiment, for each input sample 712; all output samples from memory 718 are accessed with the same start address and in the same sequence and a plurality of reference samples 713 are accessed from memory 710 with a start address that changes as a function of a propagation or shifting method such as by being incremented for each iteration of the processor, as discussed in detail in application Serial No 550,231 such as with reference to L-counter 618 and J-counter 617 in FIG. 6D therein. This changing in the accessing start address of reference memory 710 can be implemented with hard-wired counter logic such as discussed with reference to said FIG. 6D in application Serial No 550,231. Alternately, the accessing start address can be implemented under stored program processor control such as discussed with reference to FIG. 6 herein by preloading word counter 316 with a start address determined under program control in computer 112R as defined with the flowcharts set forth in FIGS. 5A and 5B in application Serial No 550,231. Therefore, the on-the-fly correlator of application Serial No 550,231 can be implemented with the analog ROM and/or the control arrangements of the present invention in the embodiment discussed with reference to FIG. 7A herein. Alternately, other correlator arrangements may be implemented with the arrangement shown in FIG. 7A using well-known methods for accessing reference samples 713, input samples 714, and output samples 716.

A Fourier transform processor arrangement will now be discussed for arrangement 700. For simplicity of discussion, a discrete Fourier transform (DFT) implementation will be discussed. A DFT is a well-known method of generating frequency-domain information from time-domain information, wherein each input signal sample is multiplied by a pair of complex (real and imaginary) trigonometric samples and used to update the appropriate complex (real and imaginary) output samples. For an on-the-fly DFT implementation, as each input sample 712 is made available to multiplier 714, a block of reference samples 713 are accessed from reference memory 710 to update a block of output samples 716 accessed from output memory 718. The block of reference samples 713 represent a sequence of complex pairs of trigonometric functions, having progressively increasing phases related to progressively increasing frequencies for a particular time delay, which are used to update output samples having progressively increasing frequencies corresponding to the frequency-related phases of the reference signals providing the updates. This method can be implemented with the correlator control arrangement set forth in application Serial No 550,231 with reference to FIG. 6D by storing the appropriate trigonometric constants in ROM 625 and by properly controlling the advancing of J-counter 617 for each input sample processed. In this DFT embodiment, the start address of J-counter 617 will be stepped to a start address related to the next block of reference samples rather than the next reference sample as implemented for the correlator mechanization. For example, the first block of DFT reference samples will correspond to the zero time phase shifts for each of the output frequency parameters, the second block of reference samples will correspond to the first sample time related phase shift for each of the output frequency parameters, etc. One form of this implementation would be to use L-counter 618 to identify the most significant part of the address and to use J-counter 617 for the least significant part of the address, being reset to zero and then incremented through the reference sample addresses of the selected block. In this form, J-counter 617 provides the least significant portion of the address, being the samples within the block, and L-counter 618 provides the most significant portion of the address, being the sample counter or block counter for accessing ROM 625 (application Serial No 550,231 at FIG. 6D therein).

A compositor arrangement will now be discussed for arrangement 700. A compositor is conventionally implemented by summing corresponding input samples from a plurality of different signals. In arrangement 700, reference memory 710 and multiplier 714 may not be necessary, wherein input signal 712 may be provided directly to summer 717 as signal 715 for summing with output signal samples 716 and for storage in output memory 718. This arrangement is similar to the compositor arrangement discussed with reference to FIG. 9E herein.

A beamformer arrangement will now be discussed for arrangement 700. In a preferred embodiment, the beamformer is implemented as a single-bit beamformer in conjunction with a Fourier transform processor but the beamformer may also be implemented in other forms such as in whole number form. The beamformer and/or Fourier transform arrangements discussed herein may be implemented for a single beam or for a plurality of beams.

A beamformer can be implemented by summing the appropriate time and space-related samples together for a particular beam angle. Because summation is implicit in a Fourier transform arrangement, beamforming and Fourier transformation (or beamforming and other filter arrangements) can be implemented together for a simplified implementation. Time and spacial domain input samples 712 can be obtained from a front-end transducer array 709, summed together with summer 717 and stored in output memory 718. The proper time and spacial domain samples to be summed together can be defined by well-known beamformer concepts.

If Fourier transformation is also required such as for time domain beamforming and for frequency domain analysis, then each time and spacial domain sample can be multiplied by an appropriate Fourier transform constant with multiplier 714 prior to summing of each update sample with summer 717 and storage of the updated sample in output memory 718. The proper product samples to be generated and summed together are defined by well-known beamformer and Fourier transform concepts.

A two-dimensional Fourier transformation can be implemented such as for frequency domain beamforming and frequency domain analysis in the form of a time domain and then a spacial domain transform. Each time domain and spacial domain sample may be multiplied by a pair of appropriate Fourier transform constants with multiplier 714 or with a pair of multipliers prior to summing of each update sample with summer 717 and storage of the updated sample in output memory 718. The proper product samples to be generated and summed together are defined by well-known beamformer and two-dimensional Fourier transform concepts.

In another embodiment, the analog ROM of the present invention can be used in combination with an analog alterable CCD memory for sampled data filtering such as for correlation, Fourier transformation, etc. For example, the analog ROM can contain reference signal samples or pilot signal samples and the analog alterable CCD memory can contain input signal samples. These reference and input signal samples can be correlated together as disclosed in a preferred embodiment in application Ser. No. 550,231 or as is well known in the art such as for shift register correlation arrangements.

It is herein intended that the single-bit processing arrangements of applications Ser. no. 550,231 and/or Ser. No. 754,660 be usable with the system of the present invention. For example, the single-bit arrangement discussed with reference to FIG. 6D of application Ser. No. 550,231 is intended to be usable with arrangement 700 discussed herein such as for a single-bit Fourier transform processor. Further, the memory arrangements of the present invention can be used for constant register 453 and/or remainder register 451 (FIG. 4D) of application Ser. No. 754,660. For example, the analog CCD ROM of the present invention can be used for said constant register 453 and the analog CCD alterable memory of the present invention can be used for said remainder register 451.

Filtering operations provide an implicit enhancement of signal-to-noise ratio (SNR) and processing gain such as with the summation operation. Therefore, signals can be processed with low resolution, low accuracy, and/or low SNR circuits up to the summation operation; often without significant degradation of the final solution. Therefore, in a preferred embodiment, signals can be processed with relatively low precision, resolution, and/or SNR circuits such as analog, hybrid, low resolution digital, and/or low precision digital circuits before the summation operation and can be processed with relatively high precision, resolution, and/or SNR circuits such as high resolution and precision digital circuits for the summation operation for subsequent processing.

Because analog and/or hybrid signal processing can be lower in cost than digital signal processing and because digital signal processing preserves resolution, precision, and SNR characteristics; therefore analog and/or hybrid circuits can be used for front-end signal processing where resolution, precision, and SNR are less significant and digital circuits can be used for rear-end signal processing where resolution, precision, and SNR are more significant. A preferred embodiment of the present invention is represented by a hybrid embodiment having analog front-end signal processing and digital rear-end signal processing. Such an arrangement is characterized by embodiments P24 and may also be characterized by embodiments P16 to P30 and particularly embodiments P24 to P30 as set forth in the TABLE OF PROCESSING ALTERNATIVES herein. For example, in embodiment P24 reference memory 710 may be the analog CCD ROM of the present invention, input memory 711 may be the analog alterable CCD memory of the present invention or alternately may be eliminated by processing signal 712A from front-end 709 directly with multiplier 714, multiplier 714 may be any well-known analog multiplier, summer 717 may be any digital summer and may include an analog-to-digital converter for converting analog product signal 715 from analog multiplier 714 to a digital signal for summing with digital stored signal 716, and output memory 718 may be a digital output memory such as a digital RAM as discussed in application Ser. No. 550,231 with reference to FIG. 6D therein.

Another feature of the filtering arrangement of the present invention provides for output signal processing after filtering in a form that is inexpensive, efficient, and eliminates many error mechanisms. For simplicity of illustration, this inventive feature will be described in the embodiment of a single bit or incremental signal processing arrangement, but it will now become obvious from the teachings herein that other arrangements may be used.

In prior art systems such as fast Fourier transforms, output information is represented by complex (real and imaginary) information such as sine and cosine functions. Magnitude information is conventionally derived by calculating the square-root-of-the-sum-of-the-squares, or root-sum-of-the-squares (RSS) or vector sum to obtain magnitude information from the two trigonometric (complex) components. For an incremental or single-bit processor, the output quadrature components have been found to be linear components, not trigonometric components; wherein the two output quadrature components of a single-bit output signal can be summed directly as magnitudes and need not be vector summed as quadrature trigonometric components. This capability provides a simple magnitude implementation, reduces or eliminates phase-related errors, and provides other advantages. Simplicity is achieved, wherein the two quadrature components can be directly summed and need not be vectorially summed, thereby providing simpler processing circuitry.

In prior art systems such as Fourier transform type systems, samples are taken over a time aperture or sampling period, transformed to frequency-domain complex (real and imaginary) samples, then added into the proper frequency "bins". Each transformed sample represents magnitude of an inphase or quadrature component of the particular frequency value. The amplitudes of the inphase and quadrature complex samples represent vectorial components and therefore must be added vectorially such as with an RSS calculation to obtain a magnitude parameter. Because different time domain samples are taken at different times, any phase variations in the input samples will cause phase variations in the output complex samples over the time aperture of the samples. Therefore, for a particular output frequency bin, transformed samples having different phases will be added together linearly because of the sum of the products processing; where linear addition of phase varying complex components will introduce errors in prior art vectorially related quadrature signals. There phase-related errors can be reduced or eliminated by various methods in accordance with the present invention. A first method involves providing a vectorial computation on all quadrature components before being summed either together for magnitude information and/or before being summed with transformed components related to another input sample. A second method involves providing linear (not a trigonometric or vector) quadrature signals for direct or linear (not trigonometric or vector) addition for sum of the products and/or for magnitude type summing.

For the first method, when a pair of complex samples are transformed, then an RSS computation is performed thereon before summing with the other transformed samples. For the second method, a single-bit transform computation is provided to generate linearly related single-bit transformed samples that may be added directly without an RSS type computation. These two methods will now be discussed with reference to FIG. 7.

For the first method an RSS (square-root-of-the-sum-of-the-squares) computation will be inserted in each path that maps time samples $t_0$–$t_3$ into transformed samples $f_0$–$f_3$. For example, each of the two components of the $t_0$ complex sample would usually be multiplied by a related complex constant $f(t_0, f_0)$ and added into the related complex output bins $f_0$. For the instant feature of the present invention, the two complex products would be combined with an RSS computation into a single magnitude product and added to other magnitude products in a single $f_0$ bin (not a pair of complex $f_0$ bins). Alternately, the RSS computation before summation can be replaced with other intermediate computations, where for example a simple sum-of-the-squares computation (without a square root computation) could be used to generate sum-of-the-squares or magnitude-squared outputs instead of RSS outputs. Therefore, because different transformed samples are added together in magnitude form, phase variations between input samples $t_0$–$t_3$ do not degrade precision of the output filtered signals. This feature of the present invention may be characterized as a magnitude-of-the-products calculation before sum-of-the-products calculation, or magnitude-before-summation calculation, or sum-of-the-magnitude calculation, or squaring-before-summing in place of the prior art sum-of-the-products calculation, or magnitude-after-summation calculation, or sum-of-the-complex-product calculation, or summing-before (or without) squaring respectively.

RSS or vector sum computations are well known in the art. An exact solution involves squaring the two components, then adding the squares, then taking the square root of the sum. A simplified approximate solution involves taking the absolute magnitude such as by changing any negative numbers to positive numbers, determining which is the larger of the two numbers, then adding the larger to one-fourth of the smaller of the numbers; wherein the sum thereof represents an approximation of the RSS.

For the second method, a single-bit arrangement is provided, where input samples are single-bit and products are single-bit in accordance with the disclosure herein and in the referenced patent applications. Because single-bit products have a linear relationship and may be summed directly without an RSS computation, the effects of phase variations over the input aperture are inherently improved.

In view of the above an incremental, or single-bit, etc Fourier transform processor such as an FFT or DFT processor or other filter arrangement can provide significant improvements over conventional whole-number processors. A single-bit processor arrangement will now be discussed with reference to FIG. 7E. Front-end 709 provides an analog time-domain signal 712 to incremental multiplier 714 to be incrementally multiplied with an incremental reference single-bit signal 713 from reference memory 710 using incremental multiplier 714. Incremental input signal 712 may be derived with a comparitor circuit such as a μA710 comparitor in front-end 709. Reference memory 710 stores the most significant bit or sign bit of the sine and cosine functions. Multiplier 714 can be an exclusive-OR circuit for generating single-bit output signal 715 in response to single-bit input signal 712 and single-bit reference signal 713. Summer 717 adds incremental product 715 such as by incrementing a counter, wherein the number to be conditionally incremented is stored in memory 718 and recirculated to summer 717 to be incremented or to be not incremented in response to product signal 715. This arrangement is similar to the correlator arrangement shown in FIG. 6D of parent application Ser. No. 550,231 wherein reference memory 710, front-end 709, incremental multiplier 714, incremental summer 717, and output memory 718 of FIG. 7E of the instant application may correspond to P-ROM reference memory 625, front-end element 623 and 624, incremental multiplier 626, incremental summer 613, and output memory 614 respectively as shown in FIG. 6D of application Ser. No. 550,231. Implementation of the arrangement shown in FIG. 6D of said application Ser. No. 550,231 in the form of a Fourier transform processor in accordance with the present invention has been discussed above such as by making minor changes to the logic associated with J-counter 617 and L-counter 618 and by entering the proper constants into P-ROM 625.

In one embodiment, the real and imaginary outputs may be preserved separately. In another embodiment, the real and imaginary outputs may be combined to form a vector sum or magnitude frequency related parameter for each output frequency value. In the former arrangement, each one of the two complex quadrature signals for each frequency value can be preserved separately, wherein input signal samples can be incrementally multiplied by incremental reference parameters and used to update the output complex parameters. In a vector magnitude embodiment, both the real incremental product and the imaginary incremental product can be used to update the same output frequency sample as a magnitude output frequency sample, wherein a complex input saample can be incrementally multiplied by each of two referenced samples and the two related incremental products can be added to the same frequency-related output signal sample.

In view of the above, the simple, efficient, low-cost implementation of a Fourier transform magnitude calculation is provided that reduces sensitivity to error mechanisms such as phase variations, phase jitter, noise, and other such effects.

This single-bit output signal processing feature of the present invention may be characterized as linear signal summation in contrast to vector signal summation or quadrature signal summation as implemented in prior art systems. In simple form, if a prior art signal processor were reduced in resolution to provide processing of single-bit signals and if output quadrature signals were added linearly rather than vectorially, then the improvements of the instant feature of the present invention is being practiced. Although this inventive feature represents a significant simplification over prior art signal processors in addition to the reduction in error mechanisms inherent in prior art signal processors, prior art signal processors are still implemented with the more expensive and more error prone arrangements, wherein the simplification provided by this feature of the present invention is certainly not obvious to prior art designers.

Combination Memory Arrangement

In accordance with another feature of the present invention, a combination memory arrangement 800 is provided as illustrated in FIG. 8. Computer 112R or other processor can be used in conjunction with main memory 130R and scratchpad memory 131R as disclosed in Pat. No. 4,016,540; application Ser. No. 101,881; and applications related thereto. Further, other memory devices can be used in combination such as bubble memory 801, CCD memory 802, random access memory (RAM) 803, shift register memory 804, core memory 805, and rotating memory 152R.

Computer 112R may be similar to the computer arrangement described in the related applications or may be other computer or processor arrangements such as other general purpose computer arrangements, special purpose computer arrangements, data processor arrangements, signal processor arrangements, or other arrangements. Main memory 130R may be an integrated circuit read only memory or a core memory as discussed in the related patent applications or may be any other main memory arrangement. Scratchpad memory 131R may be a shift register scratchpad memory as discussed in said related patent applications, may be integrated circuit RAMs or other types of memories. Main memory 130R and scratchpad memory 131R may be on-line memories as discussed in said related patent applications or may be other memory structures such as off-line memories.

Other memory technologies may be used in combination with the above-described memory technologies and/or with each other in various combinations. Such other memory technologies may be well-known integrated circuit random access memories (RAMs) 803, well-known integrated circuit shift register memories 804, well-known core memories 805, well-known rotating memories 152R such as disk and drum memories; etc. Various combinations of these memories and other memories can be provided in combinations of on-line and/or off-line memories.

Various types of memories can be used to replace conventional off-line rotating memories. For example, bubble memory 801 and CCD memory 802 can be used either in combination therewith or separately to provide rotating memory replacement. Interface controllers can be used for bubble memory 801 and CCD memory 802 similar to interface controllers used for well-known prior art rotating memories.

Bubble memory 801 can be any bubble memory and CCD memory 802 can be any CCD memory such as those manufactured by Texas Instruments Inc. Bubble memory 801 and/or CCD memory 802 can be used as a shift register memory in an on-line manner such as the shift registers used to implement scratchpad memory 131R discussed in detail in application Ser. No. 101,881. Alternately, bubble memory 801 and CCD memory 802 can be implemented as off-line memories such as rotating memories (disk and drum type memories) as used in prior art systems. For example, such rotating memories generate sequential bit streams of data similar to data provided with shift register memories, wherein a serial bubble memory 801 and/or a serial CCD memory 802 can be used in a manner similar to use of prior art rotating memories.

Bubble memory 801 or CCD memory 802 can be used independently such as for a rotating memory replacement or can be used in combinations. For example, bubble memory 801 can be a non-volatile memory and CCD memory 802 can be a volatile memory. Also bubble memory 801 can be more expensive than CCD memory 802. Therefore, it may be desirable to use bubble memory 801 in combination with CCD memory 802 to achieve non-volatility as provided with bubble memory 801 and to achieve lower cost as provided with CCD memory 802. In one embodiment, a rotating memory replacement can use bubble memory 801 for certain selected non-volatile higher-cost memory channels and can use CCD memory 802 for volatile lower-cost channels; wherein a bubble memory or CCD memory channel can correspond to a portion of a rotating memory such as a track, a group of tracks, or a portion of a track.

Because rotating memories are conventionally interfaced to processors with interface controllers, the interface controller typically provides accessing, writing, and addressing capabilities. The address structure of bubble memory 801 and CCD memory 802 can be organized consistent with the track structure of rotating memories to permit bubble memory and CCD memory addressing consistent with rotating memory addressing. Certain tracks can be implemented as non-volatile memory tracks using bubble memory 801 and other tracks can be implemented as volatile memory tracks using CCD memory 802. Addressing can be in the form of paging, blocking, or other well-known addressing arrangements to distinguish between the various tracks and thereby distinguishing between the various memory devices.

Addressing a plurality of memory elements with common address structures (or with separate address structures) is well known in the art. For example, many integrated circuit memories such as RAMs have a memory disable line that is controlled by decoding the most significant bits of an address word (or with separate address signals) for selecting one of a plurality of memory circuits which are accessed with the less significant bits of the address word. Further, memory pages or memory blocks can be selected by decoding the most significant bits or an address word (or with separate address signals) to select the page or block; wherein the less significant bits of the address words can be used to select the particular data in the selected memory block. In similar form, a memory addressing arrangement can be implemented from the teachings herein to select different pages or blocks or tracks of memory with a common address word (or with separate address words), wherein different memory technologies and different types of memories can be used to implement different blocks, or pages, or tracks. Therefore, the different memory types discussed herein and/or known in the art can be used in combinations theretogether such as by decoding a common address word (or providing separate memory words) to select the particular memory unit and to select the particular data stored in that selected memory unit. For separate address word arrangements, separate address words can be provided on separate channels such as to address a disk memory on one channel, a magnetic tape memory on another channel, and a core memory on still another channel such as with prior art computer systems.

Charge Couple Device Signal Processor (FIG. 9)

Charged couple devices (CCDs) may be used to provide signal processing in accordance with the present invention. CCDs are well known in the art, being monolithic integrated circuits having charge storage and charge transfer capability. The CCD may have one or more input terminals, one or more output terminals, and a plurality of charge transfer stages to "shift" the charge between stages. Arrangement of input stages, output stages, and transfer circuits are well known in the art. For simplicity of discussion, a CCD will be considered as a circuit having input signal lines, output signal lines, and various shiftable stages coupling input and output lines. The monolithic implementation of such a CCD is well known in the art and therefore will not be discussed herein.

CCD signal processors will be discussed with reference to FIG. 9 hereinafter in the embodiment of an acoustic imaging system. These CCD signal processor arrangements are intended to be generally applicable for many signal processing uses that will become obvious to those skilled in the art from the teachings of the present invention. For example, this CCD signal processor arrangement may be used as a demodulator, multiplexer, or sample-and-hold circuit for use in systems including data acquisition, analog signal processing, computer peripheral, telemetry, and other systems. Further, a hybrid memory embodiment may be used as an off-line computer memory, an on-line computer memory, a disc memory replacement, an analog memory for an analog or hybrid computer, and other arrangements.

A signal processing arrangement in accordance with the present invention may use an analog memory device such as a charge coupled device (CCD) for processing analog signals. Array input signals may be demodulated such as with electronic switches excited in response to a reference generator with the demodulated output signals being processed by a CCD memory. Each of the demodulated input signals may be applied to an input line of a CCD for accumulation of the synchronously switched signals by integrating current in charge storage elements. After sufficient cycles have been demodulated, demodulation control signals may be deactivated and shifting control signals may be initiated to shift the analog signals stored in the CCD to provide a sequence of analog output signals related to a plurality of parallel input signals. If an ensonifying signal is a chirp signal, the reference generator may provide a chirp demodulation signal to synchronously demodulate input chirp signals. The CCD may provide a multi-function capability including filtering of demodulated input signals and converting input signals from a parallel form to a serial form for sequential processing with time-shared chrcuits.

In a beam forming embodiment of the present invention, trace signals from transducers may be applied to a CCD in parallel at a plurality of input taps while the CCD is being clocked to shift the analog signal samples between taps. If the spacing between taps in relation to the clock frequency is controlled to be related to a wavelength characteristic of the signals from the transducer array, then the analog signals applied to each of a plurality of taps in sequence may be enhanced if the input signal period is similar to the inter-tap shifting period and the signals may be degraded if the above periods are not similar. Therefore, the CCD clock control signal and tap spacing may select a particular input spacial frequency period for enhancement, wherein the input spacial frequency period may be related to a direction of incident illumination which is herein termed beam forming. Variation of the CCD clock signal frequency will vary the inter-tap shift period and therefore will vary the period of input signal spacial frequency that will be enhanced, thereby controlling the direction of incident illumination that will be enhanced and therefore the incident illumination component that will be processed by the beam forming network.

A hybrid memory arrangement may be provided with an analog memory such as a CCD memory, wherein digital information may be provided to and received from the memory arrangement and wherein the memory arrangement may store information in an analog signal form. Conversion of input information from digital form to analog form may be provided with a digital-to-analog converter for storage of analog signals and conversion of output signals from analog form to digital form may be provided with an analog-to-digital converter for outputting of digital information in response to stored analog information. In a shift register embodiment, recirculation may be provided with analog signals or with digital signals. In the digital recirculation embodiment, the analog samples from the CCD memory may be converted to digital form with an analog-to-digital converter, recirculated to the digital input, and converted from digital to analog signal form with a digital-to-analog converter for storage in the CCD memory in analog signal form. Refreshing of analog signals and digital signals may be provided to compensate for degradation of analog signals as they are shifted through the CCD memory.

In a digital refresh embodiment for an analog memory device, digital signals output from a hybrid memory may be rounded high to compensate for degradation towards a low level or may be rounded low to compensate for degradation towards a high level, wherein degradation of a signal shifted through an analog memory may be compensated by rounding the degraded output signal to a reference level, and wherein the degradation of the analog signal shifted through the memory may be less than the digital resolution of the round-off operation.

A refresh arrangement for a hybrid memory may be provided for detecting the amount of degradation of analog signals shifted through the memory and for refreshing the analog signals in response to the detected degradation. In a preferred embodiment, a reference signal having a reference analog amplitude may be multiplexed with analog data signals input to an analog memory and shifted through the analog memory. Refresh circuitry may sample the reference signal as indicative of the magnitude of the degradation and may refresh the analog signals from the analog memory in response to the amount of degradation of the reference signal. A multiplexer arrangement may be provided for multiplexing an analog reference signal with the input analog data signals, where the multiplexer may be an analog mixer for selecting either an analog recirculation signal or an analog input signal and interspersing an analog reference signal therewith. Selection may be provided with digital logic controlling analog switches for selecting the appropriate source of an analog signal for input to the analog memory such as from a recirculation source, an input source, or a reference source.

Hybrid memory refresh circuitry may include a sample-and-hold network for sampling and storing the reference signal from the analog memory. The output signal from the sample-and-hold circuit may be used to control a refresh circuit for controlling gain of an amplifier to selectively amplify the degraded analog signals to compensate for degradation caused by shifting through the analog memory. In one embodiment, the sampled reference signal may be used to control an AGC circuit for refreshing the analog signals. In another embodiment, the sampled reference signal may be used to control a multiplier circuit for multiplying the degraded signals by a signal related to the degradation of the signals. An implicit servo arrangement may be provided for multiplying the degraded signals by the reciprocal of the reference signal amplitude, wherein the amount of gain or multiplication may be related to the proportional degradation of the signals. The refresh circuitry may be implemented with analog signal processors, digital signal processors, and hybrid signal processors, where analog, digital, and hybrid mulitpliers are well known in the art.

An analog compositor may be implemented by inputting an analog trace signal to an analog shift register memory such as a CCD memory and shifting the analog memory to effectively sample the input trace signal, wherein each clock interval of the analog memory shift clock may be related to a sample interval of the analog signal input to the analog memory. Control logic may initiate shifting of the analog memory in response to a synchronization signal related to the start of a trace signal. As the analog memory is shifted and recirculated, each input sample may be added in analog signal form to a corresponding recirculated analog sample from the analog memory, wherein the adding of corresponding samples may be defined as a compositing operation. A reference signal as described above for a hybrid memory refresh arrangement may be used in conjunction with the analog compositor arrangement for mitigating effects of degradation due to shifting of analog signals. After a plurality of composites has been accomplished, the analog signal samples may be shifted out of the analog memory to an analog-to-digital converter such as for correlation with a digital correlator or for processing with other analog or digital signal processing circuits.

CCD Demodulator and Multiplexer (FIG. 9A)

In accordance with the present invention, a phase sensitive demodulator and a multiplexer arrangement will now be described with reference to FIG. 9A. To exemplify this embodiment of the present invention, it will be described relative to the channel processing arrangement for an acoustic imaging system.

An array of transducer elements 910 is provided to generate transducer signals 912 with each element 911 generating an output signal 913 in response to acoustic inputs sensed by elements 910. Signal processors 914 provide signal processing operations on signals 912, where these signal processing operations may include buffering, amplification, and noise filtering. Processed transducer signals 915 and 916 may each be input to one switch or a pair of switches shown as field effect transistor (FET) switches 917 and 918. One of each pair of switches may be controlled by an in-phase (0°) reference signal 930 and the other switch may be controlled by a quadrature (90°) reference signal 911. Reference generator 929 generates in-phase signal 930 and quadrature signal 931 for complex demodulation of processed signals 915. In one embodiment, reference generator 929 may have substantially the same frequency as the acoustic signals sensed by elements 910. As is well known in the art, sampling or switching an AC signal with a reference signal will provide an output signal that is related to the component of the input signal that is in-phase with the reference signal. Therefore, in-phase reference signal 930 controls in-phase FETs 917 to provide in-phase demodulated signals and quadrature reference signal 931 controls quadrature FETs 918 to provide quadrature demodulated signals. CCD 920 is implemented to receive and store a plurality of demodulated input signals 919 with corresponding charge storage and shift elements, where each storage element in CCD 920 sums or integrates the charge provided by each corresponding signal 919 which is switched or demodulated with FETs 917 and 918. The amount of charge that is accumulated in each CCD storage element is related to the amplitude of the input signal and the time that switches 917 and 918 are conducting. The summation of samples controlled with FETs 917 and 918 cause a charge to be stored that has a magnitude related to the phase related components of the input signal 915 which is sampled in-phase with the corresponding reference signal 930 or 931. Input FETs 917 and 918 may have a charging time constant associated therewith such as with the on-resistance of the FET and the charging capacitance of the CCD. The charging time constant may be increased by connecting resistors in series with FETs 917 and 918 or by reducing turn-on excitation of FETs 917 and 918 to provide a desired charging rate. The charging time constant should be longer than the frequency of the input and reference signals to filter the demodulation switching transients.

Mode logic 921 controls system operations. A plurality of modes may be provided with control signals including demodulate and integrate mode signals 924, shift signal 922 and convert signal 923. These signals control the sequential modes of operation of the system. For example, demodulate and integrate signal 924 enables reference generator 929 to generate in-phase signal 930 and quadrature signal 931 to sample input signals 915 with switches 917 and 918 to build-up charge in corresponding elements of CCD 920, which demodulates and filters processed signals 915. After a pre-determined period of time or quantity of integration samples, the shift and convert mode may be enabled, and the demodulate and integrate mode may be disabled; thereby causing signals 930 and 931 to turn off or "open" switches 917 and 918 to prevent further charge accumulation in CCD 920. Mode logic 921 may then generate clock pulses 922 to shift the stored charge through CCD 920 to output signal line 925. Analog-to-digital converter (ADC) 926 may be controlled with convert signal 923 to convert analog output signal 925 to digital form as digital signals 927. Clock signal 922 and convert signal 923 may be interleaved so that each analog signal 925 that is shifted out of CCD 920 will be converted with ADC 926 to provide sequential digital output signals 927. Therefore, the plurality of demodulated and integrated signals may be stored in CCD 920 and may be sequentially or serially shifted out of CCD 920 as analog output signals 925 and may be converted to sequential digital signals 927 with ADC 926. This arrangement provides a parallel-to-serial signal converter, which is known in the art as a multiplexer.

Mode logic 921 may be a well known counter and decoder arrangement such as a Texas Instruments counter S/N 7490 and decoder 7442. Gating of clock signals and generation of quadrature signals is discussed in copending patent applications which are incorporated herein by reference.

The arrangement described with reference to FIG. 9A further exemplifies a CCD arrangement for summing analog signals. Input signals 919 excite related CCD elements when switches 917 and 918 are conducting, where the CCD elements effectively add new charge that is related to the amplitude of input signal 919 to the charge previously stored in the corresponding CCD element.

Prior art phase sensitive demodulators provide a switching arrangement and a filtering arrangement, wherein the filtering arrangement "smooths" switching transitions to provide a steady state output signal. In system 900, switches 917 to 918 in conjunction with CCD 920 provide operations similar to that used in prior art phase sensitive demodulators. For example, switches 917 and 918 will switch processed signals 915 in-phase with reference signals 930 and 931 and charge storage elements of CCD 920 will integrate or filter the sampled processed signals 919 to provide a steady state charge signal proportional to the phase related component of processed signals 919 as a steady state charge amplitude without switching transients.

The CCD demodulator and multiplexer embodiment has been described for a combined phase sensitive demodulator and multiplexer arrangement. It is herein intended that the demodulator arrangement and the multiplexer arrangement may be usable as separate arrangements and may be combined in a preferred embodiment of the present invention. Further, any reference to a demodulator with reference to the embodiment shown in FIG. 9A is also intended to exemplify a sample-and-hold arrangement wherein the demodulator arrangement described with reference to FIG. 9A provides a sample and storage operation under control of mode signals and therefore further exemplifies a sample-and-hold arrangement. Still further, a plurality of samples may be added or integrated under control of the reference signals 930 and 931 using the storage and charge adding or charge integrating capabilities of the CCDS, exemplifying analog summation or integration and particularly analog summation or integration under control of digital logic signals.

Beam Forming (FIG. 9B)

A beam forming arrangement may be provided with a plurality of transducer elements for receiving incident illumination and a delay line having taps for introducing received energy from the transducers into the delay line. Assuming that the taps are equally spaced relative to the time delay therebetween, if the period of a signal introduced into the plurality of taps is equal to the time delay between taps, that signal may be reinforced at each tap and may exit the delay line having an amplitude related to the incident energy. If the period of the signal is different from the time delay between taps, the signal may not be reinforced to the same degree as in the above-mentioned case. Still further, if the waveform period is half the delay between taps, alternate taps would provide a signal 180 degrees out-of-phase with the preceding tap signal thereby cancelling the signal introduced at two adjacent taps. This is analogous to the operation of a well known phase sensitive demodulator wherein an input signal has a first frequency characteristic and wherein the reference signal has a frequency characteristic that is equal to the input signal frequency, different from the input signal frequency, or half of the input signal frequency respectively relative to the three delay line examples discussed above.

In one beam forming embodiment, a plurality of transducers 910 are shown receiving illumination along lines 969 from source 964. Transducer output signals 968 are connected to taps on CCD delay line 966. The input signals 968 propagate along CCD delay line 966 in the direction shown by arrow 970 to be generated as output signal 971, which is related to the time variying summation of input signals 968 having time delays T1 on input lines 968. If the time delay between signal taps 968 is a fixed delay T1 corresponding to a wavelength and if the spacing between transducers 910 is related to wavelength λ1, then the delay line 966 will enhance the signals by summing the input components in-phase and outputting the time varying summation on signal line 971. If the incident illumination 969 has a frequency f1 with a wavelength λ1, then energy coming from source 964 propagating in direction 973 parallel to the plane of transducers 910 will provide in-phase signal components at each of the transducers 910 for enhancement of signal 971. For frequencies lower than frequency f1, an angle θ may exist wherein the incident illumination projected upon transducer array 910 will have a wavelength component equal to λ1 and thereby satisfying the conditions for enhancement of output signal 971. Therefore, there is a relationship between spacing λ1 of transducer elements 910, time delay T1 between delay line taps 968, frequency of incident illumination, and angle-of-incidence θ for signal enhancement.

In accordance with one feature of the present invention, a beam forming arrangement is provided having a controllable illuminating frequency which defines the angle θ viewed by the array 910. A variable transmitter frequency such as provided with a VIBROSEIS chirp generator may be used with the beam forming arrangement of this inventive feature. It can be seen that the signal that will be enhanced with delay line 966 is related to the frequency of the illumination and the angle θ of incident illumination, wherein the component of wavelength in the plane of sensors 910 must be equal to distance λ1. Therefore, the lower the frequency the greater must be the angle θ and the higher the frequency the smaller must be the angle θ for enhancing signal 971. Further, signal 971 is related to the illuminated environment at an angle θ that is determined by the frequency of the incident illumination. Therefore, the direction of received beam θ is related to the frequency of the illumination, wherein the beam direction can be controlled by the illuminating frequency.

In accordance with the present invention, a variable frequency illuminator is provided to control the direction of the received beam 969 and therefore the portion of the environment to be interrogated, where the information is output as signal 971. Various well known arrangements may be used in conjunction with the system of the present invention including arrangements for controlling the transmitting frequency to sweep through a controllable angle θ to interrogate an environment.

In another embodiment of the present beam forming inventive feature, delay line 966 may be replaced with a CCD, as described above with reference to FIG. 9A. In this embodiment, CCD 920 receives input signals 919 from transducers 910. A clock generator 921 provides clock signals 922 to shift information along CCD 920 to the output signal 925. In this arrangement, the time delay between taps 919 is controlled by the frequency of clock 922, where the time delay is related to the clock frequency and to the number of shift stages between taps 919. For simplicity, it will herein be assumed that taps 919 are located one shift stage apart, wherein each clock pulse 922 will shift the charge that is accumulated at a particular tap 919 by one tap toward output signal 925.

CCDs have the characteristic of accumulating charge in relation to (1) the signal magnitude on an input line and (2) the time for which the signal is present. Therefore, the output signal on line 925 is related to the magnitude of signals 919 and the time of charge accumulation related thereto. Assuming that the time of charge accumulation is related to the shift frequency, the output signal 925 will be related to the signal magnitude on lines 919 for the time of charge accumulation. As discussed relative to FIG. 9B for the delay line 966, the output signal 925 will be related to the frequency of the illuminating energy, the time delay between shifting stored signals between input lines 919 and the angle of incidence θ of the illumination. Assuming that the frequency is constant and the time delay between input signal lines 919 is related to the frequency of shift clock signal 922, then beam angle θ that will cause signal 925 to be enhanced is inversely related to the frequency of clock signal 922, wherein a high clock frequency will steer the beam to a low angle and a low clock frequency will steer the beam to a high angle for enhancement of signals 925 and 971 related to the particular beam angle.

Therefore, beam forming may be achieved with a CCD arrangement and beam angle θ may be controlled by the frequency of clock signal 922.

The CCD arrangement set forth in FIG. 9A has been used to exemplify the CCD arrangement of the beam forming inventive feature. In this embodiment, switches 917 and 918 may be used for demodulating the input signals 916 or may be controlled to be conductive or "on" to provide greater similarity to the delay line embodiment discussed with reference to FIG. 9B. Further, the modes of integrate or shift as discussed for the demodulator and multiplexer arrangement with reference to FIG. 9A are interleaved as alternate integrate (sample) and shift commands for the beam forming feature of the present invention; wherein mode logic 921 may command integrate, shift, integrate, shift, etc. as alternate operations or interleaved operations for beam forming of input signals.

Background on beam forming concepts may be obtained from the prior art literature such as the reference to Dolph listed hereinafter and the references cited therein.

Hybrid Memory (FIGS. 9C et seq)

Memories for storing digital information in digital form are well known in the art and include digital shift registers, disc memories, and magnetic tape. In one embodiment of the present invention, a "digital" memory is provided for storing information in analog signal form and for operating in conjunction with a digital system as a digital memory. The storage of information in analog signal form and the conversion between digital and analog signals for storage, for input, or for output will herein be termed a hybrid memory arrangement.

A CCD memory degrades signals as they are shifted through the memory due to charge transfer inefficiencies. Several CCD memory refresh mechanizations will be described with reference to FIGS. 9A-9J to illustrate refresh embodiments. Refreshing may be provided in the digital domain as will be described with reference to FIG. 9C, in the analog domain as will be described with reference to FIGS. 9F and 9G, or in the hybrid (analog and digital) domain as will be discussed with reference to FIG. 9J. A digital refresh embodiment provides re-establishment of signal amplitudes with digital circuit elements substantially operating on digital signals in the digital domain. An analog refresh embodiment provides re-establishment of signal amplitudes with analog circuit elements substantially operating on analog signals in the analog domain. A hybrid refresh embodiment provides re-establishment of signal amplitudes with a combination of analog and digital circuit elements operating on analog signals and digital signals in combined analog and digital domains. A digital refresh embodiment is discussed with reference to FIG. 9C; where digital circuits add a digital "non-significant" bit to a digital signal to re-establish digital signal amplitude. An analog refresh embodiment is discussed with reference to FIGS. 9H and 9I; where analog circuits control gain with an analog sampled signal to re-establish analog signal amplitude. A hybrid refresh embodiment is discussed with reference to FIG. 9J where digital circuits set the gain of an analog amplifier with a digital gain setting number to control an analog signal.

The hybrid memory feature of the present invention will now be described. This feature provides improved storage utilization. For example, analog signals may be stored and shifted within CCD memory 932 to an accuracy that, for this example, will be assumed to be better than one part in 256 or 8-bits of digital resolution. An analog signal having such resolution may require quickly only a single shiftable memory cell. Digital signals stored and shiftable in CCD memory 932 having such digital resolution would require 8-bits of digital resolution to provide a resolution of one part in 256. Therefore, for this example an improvement in storage capacity by a factor of eight may be achieved, where 8-bit resolution analog information may be stored and shifted in CCD memory 932 requiring only one-eighth of the number of storage elements that would be required to store and shift 8-bit resolution digital information in CCD memory 932.

A hybrid memory arrangement using a CCD will now be described with reference to FIGS. 9C and 9D. Hybrid memory system 902 comprises CCD memory 932, input digital-to-analog converter (DAC) 933 and output analog-to-digital converter (ADC) 934. CCD memory 932 comprises a plurality of shiftable analog storage elements, wherein an analog input signal 949 is stored in a first CCD element and, under control of clock signal 943, input analog signal 949 is shifted through a plurality of CCD analog charge memory stages until it reaches an output stage which provides the shifted analog charge signal as output signal 936. Output analog signal 936 may be converted with ADC 934 to provide digital output signals 935 for use by a digital data processing system. Input digital signals 938B to DAC 933 are converted to analog signal 949 for storage in CCD memory 932. Information shifted out of CCD memory 932 may be recirculated as input information in analog signal form along recirculation path 939 or may be recirculated as digital signals from 938A to signals 938B. Information in CCD memory 932 may be changed by opening the recirculation path, either analog recirculation path 939 with switch 947 or digital recirculation path 938B with logic 940 and enabling digital input signals 938C with well known selection logic 940 or analog input signal 944 with switch 945.

Control logic 937 provides sequential control signals for clocking CCD memory 932 with clock signal 943 and for controlling the conversion of input and output information with convert signals 941 and 942. In one embodiment having digital recirculation, control logic 937 may provide clock signal 943 to provide a new output signal 936, then provide convert signals 941 and 942 to convert analog output signal 936 to digital signal 938A with ADC 934 and to convert digital signals 938B to analog signal 949. Signal 938A may be available to the digital system and may be further available for recirculation.

Operation and error reduction for a hybrid memory will now be discussed. An example will be provided to illustrate the relationships between signal degradation by a CCD memory and resolution of DAC 933 and ADC 934. In a preferred embodiment, ADC resolution is worse than DAC resolution which is worse than signal degradation through the CCD; where DAC and ADC resolution can be set to be worse than signal degradation. ADC 934 is assumed to have a conversion precision of 8-bits or one part in 256 for the present example, where this resolution is assumed to be greater than the degradation of the stored information in CCD memory 932. Further, DAC 933 is assumed to have a resolution greater than the resolution of ADC 934, which will be 9-bits or one part in 512 for the present example. Therefore, it can be seen that DAC 933 may have greater resolution than ADC 934, where the state of the least significant bit of DAC 933 may be considered to have no "significance" and therefore may be set to either the one or the zero state without affecting the operation of hybrid memory 902. Therefore, in accordance with the present invention, the least significant bit of DAC 933, which is a "non-significant bit", will be set to the one-state so that input analog signal 949 will always be on the high side of the permissible input signal variation, where any signal degradation through CCD memory 932 will merely be degradation of a part of the "non-significant" information or degradation of information that is always on the high side of the permissible variations within the resolution of ADC 934. Although analog signal 949 is degraded as it is shifted through CCD memory 932, the degradation will be less than the "insignificant" bit or "bias" imposed on signal 949 by DAC 933. This bias does not overlap to the next count of ADC 934 because it is also less than the resolution of ADC 934. Therefore, degradation of analog signal 949 through CCD memory 932 may be less than the bias signal due to this "insignificant" bias bit in DAC 933 and therefore can never be degraded to the next lower count associated with ADC 934. Therefore, DAC 933 will re-establish the level of signal 949 independent of degradation through CCD memory 932, but neither re-establishment of the signal level with DAC 933 nor degradation of the signal shifted through CCD memory 932 will overlap the next highest count or degrade below the next lower count of ADC 934.

The error reduction concept can be better understood with reference to FIG. 9D, where a resolution increment of ADC 934 is shown bracketed by upper limit 955 and lower limit 956. Analog output signal 936 is shown having an amplitude 957 into ADC 934. ADC 934 converts signal 957 and rounds-off the output digital nunber to amplitude 956. The digital number related to amplitude 956 is recirculated as signals 938A and 938B to DAC 933 which converts amplitude 956 to an analog signal level and introduces an "insignificant" bit or bias having an amplitude VB which is less than the resolution increment between resolution amplitudes 956 and 955 but which is greater than the degradation of the signal 949 when shifted through CCD memory 932. Therefore, input signal 949 will have an amplitude that is equal to amplitude 956 plus the bias amplitude VB for a total amplitude shown as amplitude 958. As the analog input signal 949 is shifted through memory 932, it is degraded toward amplitude 959 and output as signal 936. Again, conversion of signal 936 having amplitude 959 with ADC 934 provides amplitude 956, which is again recirculated and converted to amplitude 950 and again shifted through CCD memory 932. Therefore, the roundoff with ADC 934 and the introduction of bias VB with DAC 933 automatically compensates for degradation of the signal shifted through memory 932, thereby precluding an accumulation of error; neither round-off, nor bias, nor memory shift related degradation.

In still another example, output analog signal 936 may be degraded to level 951, where ADC 934 converts analog signal 951 to digital form and "rounds high" to the next higher increment of amplitude 952. Signal amplitude 952 is then degraded through recirculation, D/A conversion and shifting as described above to amplitude level 953 (the same as amplitude 951) as output signal 936 but is again converted with ADC 934 to digital form and again "rounded-high" to amplitude 954 (the same as amplitude 952) before again recirculating.

Rounding high may be accomplished with well known analog biasing, digital biasing, adding one digital increment, or other well known rounding techniques. For example, a "non-significant" or bias bit may be set to a fixed state to bias the digital number to the high side for a "round-high" arrangement.

In view of the above, degradation of an analog signal such as due to shifting, can be limited to a finite error or resolution region and can be prevented from accumulating without limit. Therefore, limiting the magnitude of error accumulation permits analog signal degradation to be tolerated and permits unlimited shifting operations with only a limited error accumulation.

The above described embodiments for elimination of accumulating error has been described relative to recirculation for a hybrid memory. It should be understood that this inventive feature has broad applicability, where this inventive feature may be practiced with any embodiment that either biases an input analog signal or rounds-off an output analog signal or both, biases an input signal and rounds-off an output signal as discussed relative to FIGS. 9C and 9D above.

In the above example, biasing and round-off of signals has been shown using digital techniques. Other bias and round-off techniques may be used. For example, analog biasing such as with summing resistors or by scaling the signals may be used. Similarly, round-off may be achieved with digitizing a signal. Other arrangements will now become obvious to those skilled in the art from the teachings of the present invention.

An adaptive refresh arrangement will now be described with reference to FIG. 9F. CCD memory 932 stores information under control of clock signal 943. The information is loaded as signal 949 and output as signal 936 in serial form. These signals may be analog level signals or digital single-bit signals. Refresh circuit 996 refreshes memory output signal 936 for output and for recirculation as signal 960. The output signal from the memory system may be the unrefreshed memory signal 936 or the refreshed signal 960, shown as outputs from memory 932 by arrows pointing out of the memory system to other systems. Refreshed signal 960 may be recirculated back to the input of memory 932 under control of selection circuitry and a FET electronic switch 947.

Input signals to memory 932 are selected with input selector switches 947, 991 and 992 to generate input signal 949. Switch 947 selects recirculation signal 960 from memory output. Switch 991 selects analog input signal AI to load new information into memory 932. Switch 992 selects a reference signal REF. Switches 947, 991, and 992 may be controlled with a digital gate such as AND-gates 987 and 988 and inverter-gate 989 respectively. When decoder signal 990 is low, AND-gates 987 and 988 are disabled and inverter 989 is enabled for non-selecting switches 947 and 991 and for selecting switch 992. When decoder signal 990 is high, AND-gates 987 and 988 are enabled and inverter 989 is disabled for selecting either switch 947 or 991 in response to recirculation mode command signal RECIRC and input mode command signal INPUT or for non-selecting switch 992 respectively. Recirculation is enabled with recirculation command signal RECIRC to gate 987 and input signal AI is enabled with input command signal INPUT to gate 988. Therefore, memory 932 may load recirculated information, input information, or a reference signal under control of signals to gates 987, 988, and 989.

An arrangement will now be discussed for adaptively controlling refreshing of information stored in memory 932 by using a reference signal to control gain of the refresh circuitry 996. Clock pulses 943 will herein be assumed to be from a free-running clock for simplicity of discussion, where memory 932 is continually clocked to load either recirculation signal 960, analog input signal AI, or reference signal REF under control of logical signals 948, 967, and 968 from gates 987, 988, and 989; respectively. Clock signal 943 may clock a counter 993 to provide a count that is indicative of the number of clock pulses received and therefore the position of the information shifted into memory 932. For example, counter 993 provides operation similar to the bit, word, and sector counters associated with well known prior art disk memories which are used for counting disk memory clock pulses to keep track of the location of information on a rotating disk. Counter output signals 994 are provided to decoder 995 generating decoder output signal 990 in response to a particular code of counter signals 994 from counter 993. Well known decoders such as the Texas Instruments S/N 7445 decoder provides a high signal output when the input code is not true and provides a low signal output when the input signal code is true. Therefore, when counter 993 increments through a selected code, decoder 995 may provide a low output signal 990; which may enable switch 992 through inverter 989 and which may disable switches 947 and 991 through gates 987 and 988 respectively to load a reference signal REF into memory 932 through switch 992 as signal 949. In one embodiment, the selected code in counter 993 lasts for one period of clock signal 943, where the next clock pulse increments counter 993 to a different code condition. Therefore, decoder output signal 990 may have a single clock pulse width and reference signal REF loaded into memory 932 may be loaded into a single-bit position.

Mode selection may be performed with a mode flip-flop M1 for selecting a recirculation mode with the $\overline{Q}$ signal RECIRC or for selecting an input mode with the Q signal INPUT. The state of the mode flip-flop M1 may be controlled with well known logic arrangements such as toggling a S/N 7473 J-K flip-flop or loading a mode condition into a S/N 7474 D flip-flop. The recirculation mode is commanded when the M1 flip-flop generates a high recirculation mode signal RECIRC thereby enabling gate 987, where recirculation control signal 948 becomes high for the period of time that decoder signal 990 is high. Recirculation control signal 948 controls recirculation switch 947 to be conductive for the period of time decoder signal 990 is high to conduct recirculation signal 960 to the input of CCD memory 932 as signal 949. Similarly, the input mode is commanded when the M1 flip-flop generates a high input mode signal INPUT, thereby enabling gate 988, where input control signal 967 becomes high for the period of time that decoder signal 990 is high. Input control signal 967 controls input switch 991 to be conductive for the period of time decoder signal 990 is high to conduct input signal AI to the input of CCD memory 932 as signal 949. Mode command signals RECIRC and INPUT are mutually exclusive, where only one of these mode command signals may be high at a time, which is characteristic of flip-flop Q and $\overline{Q}$ output signals. Therefore, either the recirculation switch 947 will be conductive as enabled by recirculation control signal 948 being high, or the input switch 991 will be conductive as enabled by input control signal 967 being high, or neither recirculation switch 947 nor input switch 991 will be conductive as disabled by decoder signal 990 being low.

Decoder signal 990 is high for the data load portion of a memory cycle and low for a reference load portion of a memory cycle as will be discussed with reference to FIG. 9G. A memory cycle may be defined as a storage sequence of a combination of data and reference signals. In a simplified example used herein, a memory cycle may be the number of clock pulses required to shift a stored signal from the input of memory 932 to the output of memory 932. For example, a memory having a 512 data-bit capacity and a one reference-bit capacity may have a memory cycle of 513 clock pulses. Therefore, the decoder signal 990 will be high for the 512 data-bit portion of the memory cycle and will be low for the one reference-bit portion of the memory cycle. When decoder signal 990 is high, inverter 989 will be disabled and gates 987 and 988 will be enabled; where data will be recirculated through switch 947 or data will be input through switch 991 under control of mode signals RECIRC or INPUT. When decoder signal 990 is low, inverter 989 will be enabled and gates 987 and 988 will be disabled independent of the state of mode signals RECIRC and INPUT. Inverter 989 will invert a low decoder signal 990 to produce a high reference control signal 968 to make reference switch 992 conductive, which results in reference signal REF being input to memory 932 as signal 949 where reference signal REF will be input through switch 992.

Reference signals can be introduced into selected bit positions of memory 932 with counter 993, decoder 995, and input circuitry 908. Reference signal REF may be a precise amplitude signal, wherein the precision of the amplitude may be preserved with a good quality electronic switch 992 or other switch which are well known in the art, wherein a precision reference amplitude signal input to CCD memory 932 through switch 992 as signal 949 may be stored in a selected bit position. The reference signal bit may be shifted through memory 932 under control of clock signal 943 and shifted out of memory 932 as output signal 936 to refresh circuitry 996. The reference signal may be degraded as it is shifted through memory 932, consistent with the charge transfer inefficiency of the CCD type memory devices. Reference signal REF stored in and shifted through memory 932 may be degraded by substantially the same amount as other signals stored in and shifted through memory 932. Because reference signal REF was initially stored in memory 932 as a precise signal amplitude, the amplitude of the reference signals when shifted out of memory 932 is indicative of the degradation through memory 932. Therefore, the reference signal output from memory 932 may be used to control the refresh circuitry to provide an adaptive control for amplitude reconstruction. Adaptive control is herein intended to mean control that is adjusted to the actual conditions, where refresh circuitry 996 operating under control of a degraded reference signal may be used to control refresh operations as a function of actual degradation of the signal and may therefore be used over a range of degradation variables such as over a temperature range, over a clock pulse frequency range, and over variations between different CCD memory devices and may further be used to adaptively compensate for other variations such as charge leakage, aging of CCD memory elements, and other such effects.

In a simplified embodiment, it may be assumed that counter 993 contains a number of counts equal to the number of bits in memory 932 and that a particular count code, which may be the first count code for the present simplified example, is detected with decoder 995 to generate decoder signal 990. For the first count of each memory shifting sequence, the output of decoder 995 will go low thereby commanding loading of reference signal REF into memory 932 as discussed above and simultaneously enabling refresh circuitry 996 with decoder signal 990 to sample or otherwise monitor a signal being shifted out of memory 932; wherein the synchronization counter 993 provides another frame, or initialization point, or start of the shift operation with a reference signal being loaded into memory 932 and the last prior reference signal being simultaneously available as the output signal 936 of memory 932. Therefore, decoder 995 may enable loading of a new reference signal into memory 932 and may also enable sampling of the degraded reference signal as signal 936 output from memory 932 with refresh circuitry 996.

In a simplified example, it will be assumed that memory 932 has a four-bit storage capacity and that counter 993 is a two-bit counter for a four-count operation, known as a modulo-3 counter. This example will now be discussed with reference to the waveforms shown in FIG. 9G. Clock signal 943 is represented as a sequence of clock pulses. Signal 990 is shown as a square-wave signal which is low for each fourth-bit time, which is consistent with decoder 995 decoding the output of a two-bit four-state counter 993. Data signal 949 is shown in digital squarewave form for convenience but may also be implemented as analog amplitude signals. Data waveform 949 is shifted into memory 932 and similarly is shifted out of memory 932 as signal 936 after a four-bit time shift delay. Therefore, signals 949 and 936 are substantially the same signal except that signal 936 has been delayed by four-clock pulse periods and has been degraded by the shifting operations through memory 932. It will further be assumed for this example that recirculation control signal RECIRC is high and the input control signal INPUT is false. Therefore, three data-bits will be recirculated during the high period of decoder signal 990 and one reference-bit will be loaded during the low period of decoder signal 990. As shown in FIG. 9G, data signals (shown as "1" and a pair of "0"s following the reference signal R) will be recirculated as signal 990 through switch 947 under control of decoder signal 990 and mode signal RECIRC. Therefore, when decoder signal 990 goes low, gate 987 will cause control signal 948 to go low thereby making switch 947 non-conductive and disabling recirculation signal 960. Further, when decoder signal 990 goes low, inverter 989 will cause control signal 968 to go high thereby enabling reference signal REF to load a precision voltage into the CCD memory, shown in FIG. 9G as signal R in waveform 949. Similarly, when decoder signal 990 goes high, recirculation signal 960 will be enabled with gate 987 and switch 947 and reference signal REF will be disabled with inverter 989 and switch 992, thereby permitting the three data-bits shown as a "100" code to be recirculated as signal 960 into memory 932 as signal 949. Therefore; as counter 993 increments from a count of 0 to a count of 3, decoder 995 enables the reference signal REF to be loaded into memory 932 at the count of 0 and the digital data in memory 932 (consisting of a "100" sequence) to be recirculated and loaded into memory 932 at the counts of 1, 2, and 3. Refresh circuitry 996 monitors the reference signal shifted out of memory 932 as signal 936, identified by a low decoder output signal 990 to refresh circuitry 996; where refresh circuitry 996 will adaptively re-establish the amplitude levels of the data in response to the reference signal, as described in detail hereinafter.

A simplified embodiment of a refresh circuit will now be described with reference to FIG. 9H. Output signal 936 from memory 932 is processed with amplifier 963. Sample-and-hold circuit 961 samples the output signal 936 under control of the decoder sample signal 990; where decoder signal 990 going low enables sample-and-hold 961 to sample the reference bit of output signal 936; thereby providing output signal 962 indicative of degradation of the reference signal through memory 932. Amplifier 963 may be an RCA Model No. CA3080 transconductance amplifier, wherein the gain through amplifier 963 is controlled by control signal 962. Therefore, memory output signal 936 is adjusted in amplitude with amplifier 963 as a function of control signal 962, thereby providing refreshed recirculation signal 960. Control signal 962 may be connected to control input $I_{ABC}$ of amplifier 963 and signal 936 may be applied to the inverting input of amplifier 963, wherein the output signal 960 is related to the product of the signals 962 and 936. It may be desired that the amplitude of signal 960 be inversely proportional to the control signal 962, wherein control signal 962 may be implemented as a complement signal by subtraction from a reference signal or may be inverted as a reciprocal signal inversely proportional to the sampled signal 936 for complement or inverse control of amplifier 963. Reciprocal and subtraction circuits are well known in the art and may be introduced in signal line 962 to complement or invert the signal from sample and hold 961.

Figure 9G:
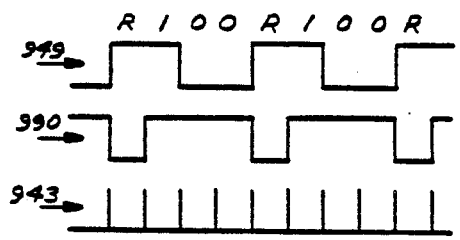
FIG. 9G illustrates the signal forms associated with the adaptive memory refresh arrangement of FIG. 9F.
Figure 9H:
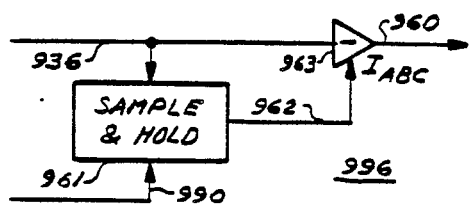
FIG. 9H illustrates a first refresh circuit.
Figure 9I:
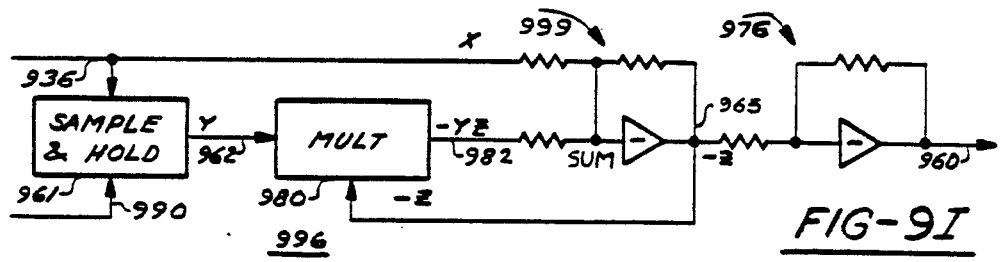
FIG. 9I illustrates refresh circuitry having an analog implicit servo.

An alternate embodiment of refresh circuitry 996 is shown in FIG. 9I, where memory output signal 936 is loaded into sample-and-hold 961 under control of decoder signal 990, as described with reference to FIG. 9H, and signal 936 is further processed with an inverting circuit to provide an output amplitude that is inversely proportional to the degradation of the reference signal. An implicit servo is shown in FIG. 9I, implemented with multiplier 980 and summer 999, wherein an implicit servo is well known in the art and is described in the reference by Levine listed hereinafter. The sampled reference signal is provided as signal 962 to multiplier 980. Multiplier 980 generates a product signal 982 which is proportional to the sampled signal 962 and the memory output signal 965 ($-Z$). The product signal 962 and the input signal 936 are algebraically summed with summing amplifier 999 to provide an implicit servo output signal 965; which can be shown to be related to input signal 936 divided by sampled signal 962. Amplifiers 999 and 976 may be used to adjust the scale factor of signal 965 to the desired values with feedback and input resistors and may be used to provide amplification, buffering, and inversion of summation signal SUM. Output signal 960 can be shown to have an amplitude proportional to the amplitude of input signal 936 and inversely proportional to the amplitude of degraded reference signal 962 stored in sample-and-hold circuit 961.

The implicit servo shown in FIG. 9I will now be described. The implicit servo discussion will reference equation (10) through equation (14) below to provide a simplified explanation of operation. Signals will be represented in equations (10)–(14) by the reference designation of the signal as shown in FIG. 9I provided in parentheses ( ) in the equation as being indicative of the signal magnitude.

$$(SUM) = (936) + (982) \approx 0 \qquad \text{equation (10)}$$

$$(982) = (962)(965) = -YZ \qquad \text{equation (11)}$$

$$(SUM) = (936) + (962)(965) = X - YZ \approx 0 \qquad \text{equation (12)}$$

$$(965) = -(936)/(962) \qquad \text{equation (13)}$$

$$Z = X/Y \qquad \text{equation (14)}$$

Summation signal SUM is equal to the difference between product signal 982 and input signal 936. Because output signal 965 is fedback in servo form to multiplier 980 to close a servo loop, signal SUM is controlled to be a very low magnitude near zero signal, as shown by the approximately zero ($\approx 0$) symbol in equation (10). Multiplier signal 982 from multiplier 980 is equal to the product of signal 965 and adaptive scale factor signal 962, as shown in equation (11). Substitution of equation (11) into equation (10) to eliminate the signal 982 term yields equation (12). Grouping of terms, factoring of the signal 965 term, and solving for the signal 965 yields the input signal 936 term divided by adaptive scale factor signal 962; as shown in equation (13). This solution is based upon the assumption that signal 965 is servoed to a very low signal amplitude then amplified with amplifier 999 to generate signal 965 for output and for feedback. In a high gain servo, the error in assuming that signal SUM is approximately equal to zero may be very small and will be assumed to be negligible. Equation

(13) shows that different signal 965 is approximately equal to input signal 936 divided by the adaptive scale factor signal 962; wherein the greater the degradation through memory 932, the smaller will be adaptive scale factor signal 962 and therefore the larger will be the signal 965. In other words, the degraded signal 936 is multiplied by the reciprocal of the sampled reference signal to increase the signal 936 to a level related to the amount of degradation, as defined by adaptive scale factor signal 962. Other analog signal processing and implicit servo arrangements will now become obvious to those skilled in the art such as providing various function generation circuits to adjust the amplitude of degraded signal 936 as a function of adaptive control signal 962.

An alternate discussion of an implicit servo will now be presented with reference to the textbook by Levine listed hereinafter; wherein the following description is similar to the example provided on page 157 therein and wherein signals 936, 962, and 965 will be referred to as signals X, Y, and Z respectively for compatability with the description in the book by Levine. It is desired to solve the equation $Z = X/Y$ as shown in equation (14), wherein Z is the corrected output signal 965, X is the degraded memory signal 936, and Y is the adaptive control signal 962 defining the magnitude of the required re-scaling. The servo output signal $(-Z)$ is fedback to multiplier 980 to be multiplied with adaptive scale factor signal Y 962 to provide output signal $(-YZ)$ as signal 982. Signal 982 $(-YZ)$ is added to the uncorrected signal X 936 at the summing junction of operational amplifier 999 to generate the summation signal SUM which is amplified with amplifier 999 to provide output signal $(-Z)$ 965 as a solution to equation (14).

The corrected signal $(-Z)$ 965 is processed with inverting amplifier 976 to generate a non-inverted output and recirculation signal 960. Scale factors may be readjusted by a fixed amount by selecting feedback resistors of operational amplifiers 999 and 976.

Figure 9J:
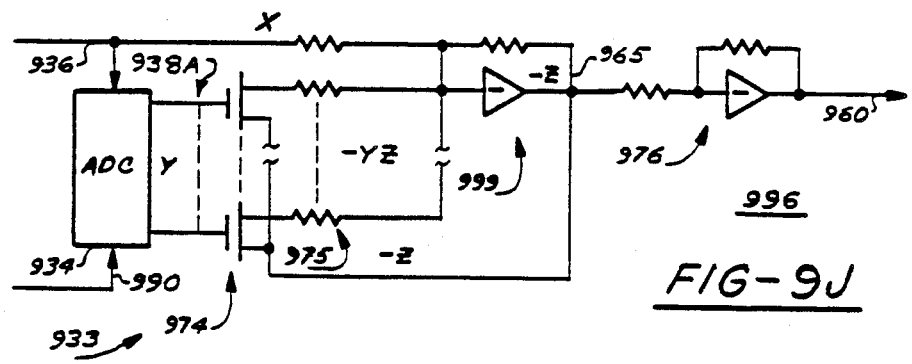
FIG. 9J illustrates hybrid refresh circuitry having an implicit servo.

Still another embodiment of the refresh circuit 996 is shown in FIG. 9J. Decoder signal 990 may be used to enable analog-to-digital converter (ADC) 934 to convert a reference bit of the memory output signal 936 to provide a digital output number Y 938A proportional to the degraded reference signal. Output word 938A may be used to excite multiplying digital-to-analog converter (DAC) 933. The DAC is implemeted with analog switches 974 and weighted summing resistors 975 in a well known arrangement. Multiplying DAC 933 generates an output signal to the summing junction of operational amplifier 999 that is proportional to the digital number (Y) 938A and proportional to the excitation signal $(-Z)$ 965 fedback from the output of operational amplifier 999. Similar to the mechanization discussed for FIG. 9I above, feedback signal $(-Z)$ 965 is multiplied by digital input number (Y) 938A to generate output analog signal $-YZ$. Signal $-YZ$ is summed with input signal X at the summing junction of operational amplifier 999 to generate output signal $(-Z)$ 965 for feedback and for output. Buffer amplifier 976 is used for inversion, scaling, and buffering as discussed with reference to FIG. 9I above.

The instant reference signal refresh feature of the present invention has been described in detail with reference to FIGS. 9F–9J for scale factor compensation related error mechanisms such as charge transfer inefficiencies. In accordance with another feature of the present invention, a reference signal bias refresh compensation arrangement will now be discussed with reference to FIGS. 9F–9J.

An important CCD error mechanism may be relatively independent of signal magnitude scale factor such as being related to time, temperature, and/or other variables. This error mechanism may be defined as a bias error mechanism and may be caused by thermal leakage, recombination, or other well known affects as described in the article by Carnes and Kosonowsky referenced hereinafter. Compensation for bias errors may be accomplished in a manner similar to the arrangement discussed above for scale factor errors.

A bias reference signal may be multiplexed into a CCD memory as discussed for the scale factor reference signal with reference to FIGS. 9F–9J above. For simplicity of discussion, the bias reference signal REF (FIG. 9F) and R (FIG. 9G) may be described as a zero magnitude reference signal but the bias reference signal may be any convenient magnitude signal. As the bias reference signal is shifted through CCD memory 932, the magnitude will change as a function of leakage and other bias error mechanisms. The bias reference signal will be shifted out of CCD memory 932 to refresh circuit 996 for compensating the data signal 936 for bias errors. The bias reference signal may be loaded into sample and hold 961 to generate stored bias reference signal 962 (FIG. 9H). Bias reference signal 962 may be subtracted from memory output signal 936 to generated refreshed or compensated output signal 960.

The arrangement shown in FIG. 9H has been implemented to illustrate scale factor compensation, where changes to FIG. 9H will now be discussed relative to FIG. 9M to illustrate bias compensation. Amplifier 977 may be connected as well known differential amplifier, wherein memory output signal 936 may be connected to the negative input and stored reference signal 962B may be connected to the positive input or conversely to generate differential output signal 960. Differential signal 960 may represent memory output signal 936 with the bias error signal subtracted out therefrom, thereby compensating for bias errors.

The scale factor and bias compensation arrangements discussed with reference to FIGS. 9F–9J above may be combined to form a combination scale factor and bias compensation arrangement which will now be discussed with reference to FIGS. 9K–9O. Decoder 995 may generate a first output signal 990A and a second output signal 990B for controlling multiplexing of scale factor reference signal REF and bias reference signal GND respectively into different samples of CCD memory 932 (samples B and R as shown in FIG. 9L) with multiplexing circuits 989A and 989B respectively and switches 992A and 992B respectively of multiplexer 908 and for controlling sampling of scale factor reference signal REF and bias reference signal GND respectively with different sample and hold circuits similar to sample and hold circuits 961 for scale factor and bias compensation respectively. Scale factor compensation may be performed with product circuits 963, 980, and 974 shown in FIGS. 9H–9J and bias compensation may be simultaneously performed with differential circuits by subtracting the bias reference signal from the memory output signal such as before scale factor compensation with differential amplifier 963 or after scale factor compensation with differential amplifier 976. In alternate arrangements, the bias reference signal may be sampled before or after scale factor compensation, the scale factor reference signal may be sampled before or after bias compensation, and the memory output signal may be compensated for bias errors before or after it is compensated for scale factor errors by appropriate arrangements of circuit placement and input signal selections.

An adaptive refresh arrangement having combined scale factor and bias capability will now be described with reference to FIG. 9K in the same context as discussed for the scale factor capability alone with reference to FIG. 9F. CCD memory 932 stores information under control of clock signal 943. The information is loaded as signal 949 and output as signal 936 in serial form. These signals may be analog level signals or digital single-bit signals. Refresh circuit 996 refreshes memory output signal 936 for output and for recirculation as signal 960. The output signal from the memory system may be the unrefreshed memory signal 936 or the refreshed signal 960, shown as outputs from memory 932 by arrows pointing out of the memory system to other systems. Refreshed signal 960 may be recirculated back to the input of memory 932 under control of selection circuitry and a FET electronic switch 947.

Input signals to memory 932 are selected with input selector switches 947, 991, 992A and 992B to generate input signal 949. Switch 947 selects recirculation signal 960 from memory output. Switch 991 selects analog input signal AI to load new information into memory 932. Switch 992A selects a scale factor reference signal REF. Switch 992B selects a bias reference signal GND. Switches 947, 991, 992A and 992B may be controlled with digital gates such as AND-gates 987 and 988 and NOR-gates 989A and 989B respectively. When one of the decoder signals 990A or 990B is low, AND-gates 987 and 988 are disabled and one of the NOR-gates 989A or 989B is enabled for non-selecting switches 947 and 991 and for selecting one of the two switches 992A or 992B. When both decoder signals 990A and 990B are high, AND-gates 987 and 988 are enabled and NOR-gates 989A and 989B are disabled for selecting either switch 947 or 991 in response to recirculation mode command signal RECIRC and input mode command signal INPUT and for non-selecting switches 992A and 992B respectively. Recirculation is enabled with recirculation command signal RECIRC to gate 987 and input signal AI is enabled with input command signal INPUT to gate 988. Therefore, memory 932 may load recirculated information, input information, a scale factor reference signal or a bias reference signal under control of signals to gates 987, 988, 989A and 989B respectively.

Figure 9K:
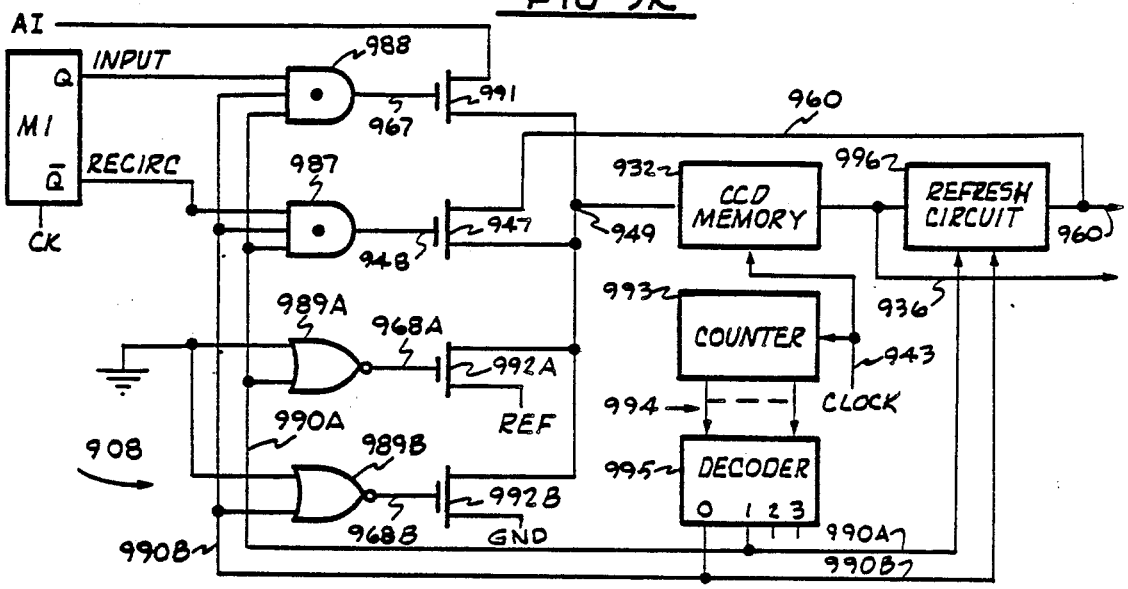
FIG. 9K illustrates an adaptive memory refresh arrangement having a plurality of reference signals.
Figure 9L:
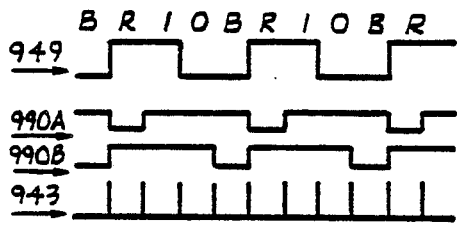
FIG. 9L illustrates signal forms associated with the adaptive memory refresh arrangement of FIG. 9K.

With reference to FIG. 9K, gates 989A and 989B provide the primary function of inverting decoder signals 990A and 990B to control switches 992A and 992B respectively, as discussed with reference to FIG. 9F for inverter 989 controlling switches 992. In one embodiment, it may be desirable to reestablish the reference signals for each recirculation by introducing a new reference signal for each recirculation, as discussed with reference to FIG. 9F using inverter 989 for selection. In an alternate embodiment, it may be desirable to permit the reference signals to degrade with the data signals over a plurality of recirculations and to be reestablished only at certain times. Such an alternate embodiment will now be described with reference to FIG. 9K wherein NOR-gates 989A and 989B are used in place of inverters for gating the reference signals under control of an enable signal. For example, the reference signals may be disabled during the recirculation mode and enable during the input mode controlled with mode flip-flop MI (FIG. 9K) by disabling NOR-gates 989A and 989B during the recirculation mode with the true RECIRC signal and correspondingly enabling NOR-gates 989A and 989B during the input mode with the false RECIRC signal. Many other embodiments related thereto will now become obvious to those skilled in the art from the teachings herein.

The arrangement shown in FIG. 9K may be used to illustrate both reference signal insertion embodiments; the first embodiment being where reference signals are inserted for input and for recirculation and the second embodiment being where reference signals are inserted for input but not for recirculation. For the first embodiment where reference signals are inserted for input and for recirculation; AND-gate 987 is disabled with signals 990A and 990B as shown in FIG. 9K and NOR-gates 989A and 989B are not disabled with the RECIRC signal such as by connecting the upper signal line of each of NOR-gates 989A and 989B to ground. For the second embodiment where reference signals are inserted for input but not for recirculation; AND-gate 987 is not disabled with signals 990A and 990B such as by leaving the lower two signal lines of AND-gate 987 open or by connecting the lower two signal lines of AND-gate 987 to a "one", high, or true voltage level and NOR-gates 989A and 989B are disabled with the RECIRC signal such as by connecting the upper signal line of NOR-gates 989A and 989B to the RECIRC signal.

In the second reference signal insertion embodiment shown in FIG. 9K, reference signals are not multiplexed into CCD memory 932 for each recirculation to permit the effects of refreshing with refresh circuit 996 to accumulate in the reference signals in addition to the stored data signals such as permitting bias and scale factor error components to build up over many refresh recirculations. In this second embodiment, reference signals may be multiplexed into CCD memory 932 when analog input data AI is loaded into CCD memory 932 in response to the input mode signal INPUT but not when signals are being recirculated to CCD memory 932 from refresh circuit 996 as signal 960 in response to the recirculation mode signal RECIRC to gate 987 for controlling switch 947. In this second embodiment, the input mode may enable selection of switches 992A and 992B and the recirculation mode may disable selection of switches 992A and 992B. This may be accomplished by using a well-known two-input NOR-gate in place of inverter 989 (FIG. 9K) enabled with recirculation mode signal RECIRC (which is the same as the complement of the input mode signal $\overline{\text{INPUT}}$) to enable decoder signal 990A to NOR-gate 989A and decoder signal 990B to NOR-gate 989B for enabling switches 992A and 992B respectively; but only when the recirculation mode signal RECIRC is false as indicative of the input mode signal INPUT being true. Therefore, the reference signals will be multiplexed into CCD memory 932 while analog input signal AI is being multiplexed into CCD memory 932 and the reference signals will be preserved in whatever degraded form may occur during recirculation of reference, bias, and data signals through CCD memory 932 and refresh circuit 996. Other arrangements for conditionally multiplexing reference signals into CCD memory 932 will now become obvious to those skilled in the art from the teachings herein.

An arrangement will be discussed hereinafter in the context of the first reference signal insertion embodiment for adaptively using reference signals to control scale factor and bias of the refresh circuitry 996. Clock pulses 943 will herein be assumed to be from a free-running clock for simplicity of discussion, where memory 932 is continually clocked to load either recirculation signal 960, analog input signal AI, scale factor reference signal REF, or bias reference signal GND under control of logical signals 948, 967, 968A, and 968B respectively from gates 987, 988, 989A and 989B respectively. Clock signal 943 may clock a counter 993 to provide a count that is indicative of the number of clock pulses received and therefore the position of the information shifted into memory 932. For example, counter 993 provides operation similar to the bit, word, and sector counters associated with well-known prior art disk memories which are used for counting disk memory clock pulses to keep track of the location of information on a rotating disk. Counter output signals 994 are provided to decoder 995 generating decoder output signals 990A and 990B in response to particular codes of counter signals 994 from counter 993. Well-known decoders such as the Texas Instruments S/N 7445 decoder provides a high signal output when the input code is not true and provides a low signal output when the input signal code is true. Therefore, when counter 993 increments through a selected code, decoder 995 may provide a low output for either signal 990A or signal 990B which may enable either switch 992A or 992B respectively through NOR-gates 989A or 989B respectively which may disable switches 947 and 991 through gates 987 and 988 respectively to load a scale factor reference signals REF or a bias reference signal GND respectively into memory 932 through switch 992A or switch 992B respectively as signal 949. In one embodiment, the selected code in counter 993 lasts for one period of clock signal 943, where the next clock pulse increments counter 993 to a different code condition. Therefore, decoder output signal 990A or 990B may have a single clock pulse width and scale factor reference signal REF or bias reference signal GND loaded into memory 932 may each be loaded into a single-bit position.

Decoder 995 generates signals 990A and 990B in mutually exclusive form; wherein if one of these two signals is selected, the other of these signals is non-selected. For example, when gate 989B is enabled with signal 990B to select switch 992B, then gate 989A is disabled to non-select switch 992A and, conversely, when gate 989A is enabled with signal 990A to select switch 992A, then gate 989B is disabled to non-select switch 992B. Further, when either of signals 990A and 990B select the reference and bias signals respectively, signals 990A and 990B automatically disable gates 987 and 988 to non-select the analog input signal AI and to non-select the recirculation signal 960 through switches 991 and 947 respectively.

Mode selection may be performed with a mode flip-flop M1 for selecting a recirculation mode with the $\overline{Q}$ signal RECIRC or for selecting an input mode with the Q signal INPUT. The state of the mode flip-flop M1 may be controlled with well-known logic arrangements such as toggling a S/N 7473 J-K flip-flop or loading a mode condition into a S/N 7474 D flip-flop. The recirculation mode is commanded when the M1 flip-flop generates a high recirculation mode signal RECIRC thereby enabling gate 987, where recirculation control signal 948 becomes high for the period of time decoder signals 990A and 990B are both high. Recirculation control signal 948 controls recirculation switch 947 to be conductive for the period of time decoder signals 990A and 990B are both high to conduct recirculation signal 960 to the input of CCD memory 932 as signal 949. Similarly, the input mode is commanded when the M1 flip-flop generates a high input mode signal INPUT, thereby enabling gate 988, where input control signal 967 becomes high for the period of time that decoder signals 990A and 990B are both high. Input control signal 967 controls input switch 991 to be conductive for the period of time decoder signals 990A and 990B are both high to conduct input signal AI to the input of CCD memory 932 as signal 949. Mode command signals RECIRC and INPUT are mutually exclusive, where only one of these mode command signals may be high at a time, which is characteristic of flip-flop Q and $\overline{Q}$ output signals. Therefore, either the recirculation switch 947 will be conductive as enabled by recirculation control signal 948 being high, or the input switch 991 will be conductive as enabled by input control signal 967 being high, or neither recirculation switch 947 nor input switch 991 will be conductive as disabled by one of the signals 990A or 990B being low.

Decoder signals 990A and 990B are both high for the data load portion of a memory cycle and alternately become low for a reference load portion of a memory cycle as will be discussed with reference to FIG. 9L. A memory cycle will be defined as a storage sequence of a combination of data and reference signals. In a simplified example used herein, a memory cycle may be the number of clock pulses required to shift a stored signal from the input of memory 932 to the output of memory 932. For example, a memory having a 512 data-bit capacity and a two reference-bit capacity may have a memory cycle of 514 clock pulses. Therefore, the decoder signals 990A and 990B will be high for the 512 data-bit portion of the memory cycle and will go low in sequence, one and only one at a time, for the two reference-bit portion of the memory cycle. When decoder signals 990A or 990B are high, gates 989A and 989B will be disabled and gates 987 and 988 will be enabled; where data will be recirculated through switch 947 or data will be input through switch 991 under control of mode signals RECIRC or INPUT. When one of the decoder signals 990A or 990B goes low, the related NOR-gates 989A or 989B respectively will be enabled, the non-related NOR-gates 989A or 989B will be disabled, and gates 987 and 988 will be disabled independent of the state of mode signals RECIRC and INPUT. NOR-gates 989A and 989B will invert a low decoder signal 990A and 990B respectively to produce a high reference control signal 968A and 968B respectively to make reference switches 992A and 992B respectively conductive, which results in a scale factor reference signal REF and a bias reference signal GND respectively being input to memory 932 as signal 949 where scale factor reference signal REF will be input through switch 992A and bias reference signal GND will be input through switch 992B.

Reference signals can be introduced into selected bit positions of memory 932 with counter 993, decoder 955, and input circuitry 908. Scale factor reference signal REF and bias reference signal GND may be precise amplitude signals, wherein the precision of the amplitude may be preserved with good quality electronic switches 992A and 992B or other switches which are well known in the art, wherein a precision reference amplitude signal input to CCD memory 932 through switches 992A and 992B as signals 949 may be stored in selected bit positions. The reference signal bits may be shifted through memory 932 under control of clock signal 943 and shifted out of memory 932 as output signal 936 to refresh circuitry 996. The reference signals may be degraded as they are shifted through memory 932, consistent with the charge transfer inefficiency, thermal bias, and other error mechanisms of the CCD-type memory devices. Reference signals stored in and shifted through memory 932 may be degraded by substantially the same amount as other signals stored in and shifted through memory 932. Because the reference signals were initially stored in memory 932 as precise signal amplitudes, the amplitudes of a reference signal when shifted out of memory 932 is indicative of the degradation through memory 932. Therefore, the reference signals output from memory 932 may be used to control the refresh circuitry to provide an adaptive control for amplitude reconstruction. Adaptive control is herein intended to mean control that is adjusted to the actual conditions, where refresh circuitry 996 operating under control of a degraded reference signal may be used to control refresh operations as a function of actual degradation of the signal and may therefore be used over a range of degradation variables such as over a temperature range, over a clock pulse frequency range, and over variations between different CCD memory devices and may further be used to adaptively compensate for other variations such as charge leakage, aging of CCD memory elements, and other such effects.

In a simplified embodiment, it may be assumed that counter 993 contains a number of counts equal to the number of bits in memory 932 and that particular count codes, which may be the first and second count codes for the present simplified example, are detected with decoder 995 to generate decoder signals 990A and 990B. For the first and second counts of each memory shifting sequence (decoder outputs 0 and 1 respectively), the output signals 990A and 990B respectively of decoder 995 will go low thereby commanding loading of the scale factor reference signal REF and the bias reference signal GND respectively into memory 932 as discussed above and simultaneously enabling refresh circuitry 996 with decoder signals 990A and 990B respectively to sample or otherwise monitor a signal being shifted out of memory 932; wherein the synchronization counter 993 provides another frame, or initialization point, or start of the shift operation with a reference signal being loaded into memory 932 and the last prior corresponding reference signal being simultaneously available as the output signal 936 of memory 932. Therefore, decoder 995 may enable loading of a new reference signal into memory 932 and may also enable sampling of the corresponding degrading reference signal as signal 936 output from memory 932 with refresh circuitry 996.

In a simplified example, it will be assumed that memory 932 has a four-bit storage capacity and that counter 993 is a two-bit counter for a four-count operation, known as a modulo-3 counter. This example will now be discussed with reference to the waveforms shown in FIG. 9L. Clock signal 943 is represented as a sequence of clock pulses. Signals 990A and 990B are shown as squarewave signals, where each one is low for each corresponding fourth-bit time, which is consistent with decoder 995 decoding the output of a two-bit four-state counter 993. Data signal 949 is shown in digital square-wave form for convenience but may also be implemented as analog amplitude signals. Data waveform 949 is shifted into memory 932 and similarly is shifted out of memory 932 as signal 936 after a four-bit time shift delay. Therefore, signals 949 and 936 are substantially the same signal except that signal 936 has been delayed by four-clock pulse periods and has been degraded by the shifting operations through memory 932. It will further be assumed for this example that recirculation control signal RECIRC is high and the input control signal INPUT is false. Therefore, three data-bits will be recirculated during the high period of decoder signals 990A and 990B and one of each of the reference bits will be loaded during the low period of the related decoder signals 990A and 990B. As shown in FIG. 9L, data signals (shown as a "1" and a "0" following the reference signal R) will be recirculated as signal 960 through switch 947 under control of decoder signals 990A and 990B and mode signal RECIRC. Therefore, when one of the decoder signals 990A or 990B goes low, gate 987 will cause control signal 948 to go low thereby making switch 947 non-conductive and disabling recorculation signal 960. Further, when one of the decoder signals 990A or 990B goes low, the corresponding NOR-gate 989A or 989B respectively will cause the related control signal 968A or 968B respectively to go high thereby enabling the corresponding reference signal REF or GND respectively to load a precision voltage into the CCD memory, shown in FIG. 9L as signal R or as signal B respectively in waveform 949. Similarly, when decoder signals 990A and 990B go high, recirculation signal 960 will be enabled with gate 987 and switch 947 and reference signals REF and GND will be disabled with gates 989A and 989B respectively and switches 992A and 992B respectively, thereby permitting the two data-bits shown as a "10" code to be recirculated as signal 960 into memory 932 as signal 949. Therefore, as counter 993 increments from a count of 0 to a count of 3, decoder 995 enables the reference signal REF to be loaded into memory 932 at the count of 0, enables the reference signal GND to be loaded into memory 939 at the count of 1, and enables the digital data in memory 932 (consisting of a "10" sequence) to be recirculated and loaded into memory 932 at the counts of 2 and 3. Refresh circuitry 996 monitors the reference signals shifted out of memory 932 as signal 936, identified by low decoder output signals 990A and 990B to refresh circuitry 996; where refresh circuitry 996 will adaptively reestablish the amplitude and bias levels of the data in response to the reference signal, as described in detail hereinafter.

The information stored in CCD memory 932 will now be discussed in greater detail with reference to FIG. 9L for a 2-bit 4-state counter. The first state of counter 993 decoded with decoder 995 selects "zero" output signal 990B of decoder 995 to multiplex bias signal B in waveform 949 into CCD memory 932. The second state of counter 993 decoded with decoder 995 selects "one" output signal 990A of decoder 995 to multiplex scale factor bias signal R in waveform 949 into CCD memory 932. The last two states of counter 993 are decoded with decoder 995 to select the "two" and "three" output signals of decoder 995; thereby disabling signals 990A and 990B for disabling gates 989A and 989B and for enabling gates 987 and 988. If for example gate 987 is selected with flip-flop M1 to recirculate signal 960 through switch 947; recirculated signal 960 (consisting of a "one" state followed by a "zero" state as shown in waveform 949 in FIG. 9L) is multiplexed into CCD memory 932 following sequentially B and R reference signals.

In view of the above, a four-bit CCD memory 932 continually recirculates and refreshes signals with refresh circuit 996; comprising a bias reference signal B, a scale factor reference signal R, and a one-zero sequence of data signals (waveform 949 as shown in FIG. 9L). Each recirculation selects reference bias signal GND with switch 992B in response to selected decoder signal 990B; followed by selection of scale factor reference signal REF with switch 992A in response to selected decoder signal 990A; and followed by one-zero sequence of data signals through recirculation switch 947 or input switch 991 in response to non-selected signals 990A and 990B and selected mode signal RECIRC.

Refreshing of signal 936 with refresh circuit 996 may be performed with a single refresh circuit, as discussed with reference to FIGS. 9H–9J above, or may be performed with a plurality of refresh circuits, as discussed with reference to FIGS. 9K–9T hereinafter. For example, a scale factor refresh circuit and a bias refresh circuit may be combined to compensate for both scale factor and bias errors using the arrangement discussed with reference to FIG. 9K. This plurality of refresh circuits may be arranged in various combinations. In one embodiment, bias compensation may be provided before scale factor compensation wherein scale factor compensation is applied to a bias compensated signal, as discussed with reference to FIGS. 9M–9O hereinafter. In another embodiment, scale factor compensation may be provided before bias compensation wherein bias compensation is applied to a scale factor compensated signal, as discussed with reference to FIGS. 9P and 9Q hereinafter. In still another embodiment, it may be desirable to apply both bias and scale factor compensation to an uncompensated signal for a parallel rather than a sequential refresh arrangement, as discussed with reference to FIGS. 9R–9T hereinafter. These alternative sequential and parallel refresh arrangements are presented to illustrate the broader teachings of the present invention related to refreshing of signals with a plurality of refresh circuits connected in sequential and parallel arrangements and exemplified by scale factor and bias refresh circuits.

A bias refresh circuit will now be discussed with reference to FIGS. 9M—9O. Decoder signal 990B (FIG. 9M) is related to the bias reference signal from CCD memory 932 as memory output signal 936. Decoder signal 990B controls sampling of bias reference signal 936 with sample and hold circuit 961B. Sampled bias signal 962B is provided to differential amplifier 977 through input resistor R2 to be differentially compared with memory output signal 936 through input resistor R1 to generate differentially refreshed output signal 978 having reduced bias errors. Bias refreshed signal 978 may then be input to a scale factor refresh circuit (FIG. 9N or FIG. 9O).

Figure 9M:
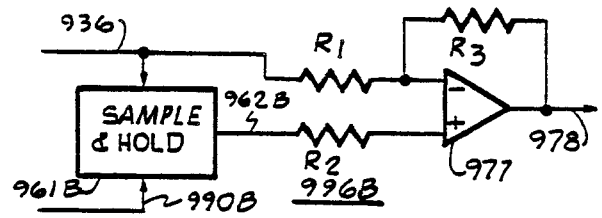
FIG. 9M illustrates a bias refresh circuit.
Figure 9N:
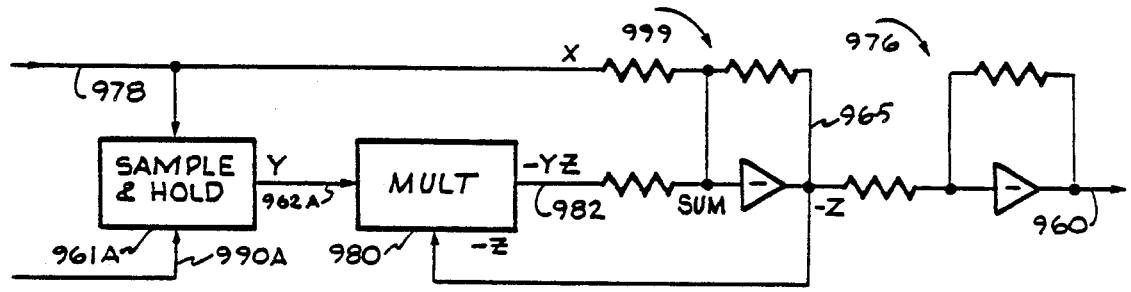
FIG. 9N illustrates a refresh circuitry having an analog implicit servo.

In FIG. 9N, bias refreshed signal 978 may be sampled with sample and hold circuit 961A in response to decoder signal 990A to sample the scale factor reference signal from CCD memory 932 after the scale factor reference signal has been bias compensated with the circuits shown in FIG. 9M. The bias compensated scale factor signal is stored in sample and hold circuit 961A as signal 962A. Bias compensated scale factor reference signal 962A is input to an implicit servo comprising multiplier 980 and operational amplifier 999 to generate bias and scale factor refreshed signals 965 and 960, having first been bias compensated with the circuit of FIG. 9M and then scale factor compensated with the explicit servo of FIG. 9N. The operation of the scale factor compensation arrangement shown in FIG. 9N has been discussed in detail with reference to FIG. 9I above.

Figure 9O:
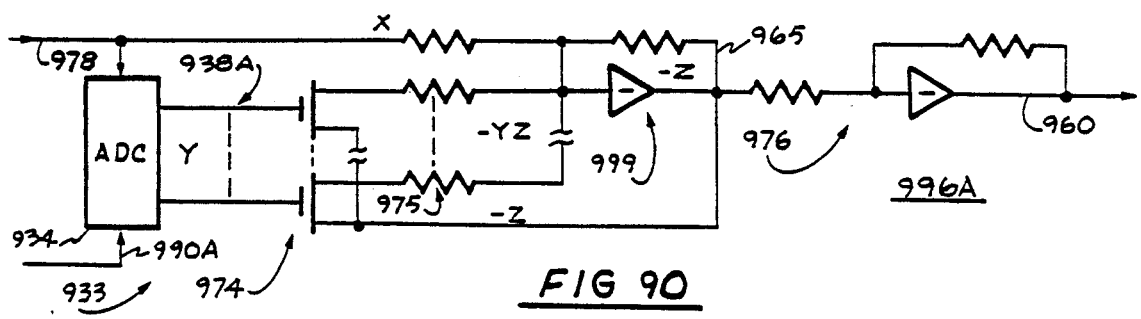
FIG. 9O illustrates a hybrid refresh circuit having a hybrid implicit servo.

In FIG. 9O, bias compensated signal 978 is converted to a digital number 938A with converter 934 in response to the scale factor related decoder signal 990A. Therefore, digital number 938A is related to the scale factor reference signal that has been bias compensated with the circuit shown in FIG. 9M. Operation of the circuit shown in FIG. 9O has been discussed in detail with reference to FIG. 9J above, where the primary difference is that the scale factor signal sampled in response to scale factor decoder signal 990A has already been bias compensated with the circuit discussed with reference to FIG. 9M; thereby providing output signals 965 and 960 having both bias and scale factor compensation.

Figure 9P:
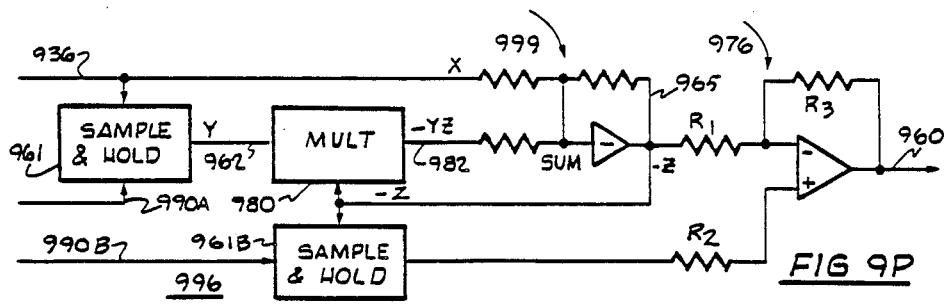
FIG. 9P illustrates an analog scale factor refresh implicit servo in combination with a bias refresh circuit.
Figure 9Q:
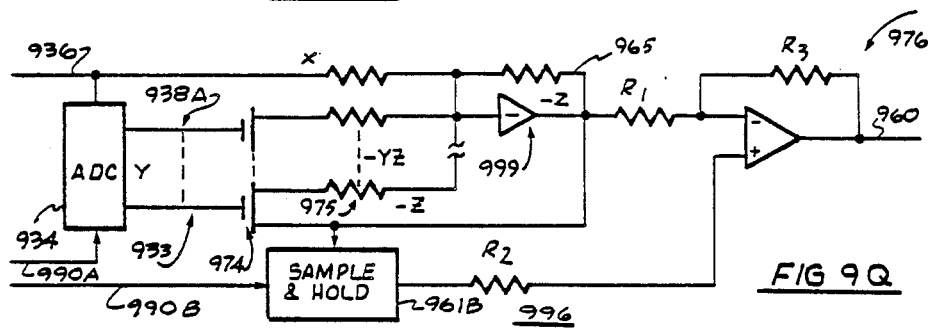
FIG. 9Q illustrates a hybrid scale factor refresh implicit servo in combination with a bias refresh circuit.

The circuits shown in FIGS. 9P and 9Q provide first for compensating memory output signal 936 for scale factor errors and then for bias compensating the scale factor compensated signal to provide a scale factor and bias compensated output signal 960. The scale factor compensation arrangements of FIGS. 9P and 9Q are implemented as an analog implicit servo (FIG. 9P) and a hybrid implicit servo (FIG. 9Q); discussed above with reference to FIGS. 9I and 9J respectively. In this multiple refresh embodiment, scale factor refreshed signal 965 (FIGS. 9P and 9Q) is sampled in response to decoder bias signal 990B with sample and hold circuit 961B to sample the bias reference signal from CCD memory 932 after it has been scale factor compensated. The scale factor compensated bias signal 965 is stored in sample and hold circuit 961B and is applied to differential amplifier 976 through input resistor R2 to be differentially summed with the scale factor compensated but non-bias compensated signal 965 which is applied to differential amplifier 976 through input resistor R1. Output signal 960 is both scale factor compensated and bias compensated, where the stored bias reference signal has been scale factor compensated prior to being stored and subtracted from the scale factor compensated memory signal 965.

Figure 9R:
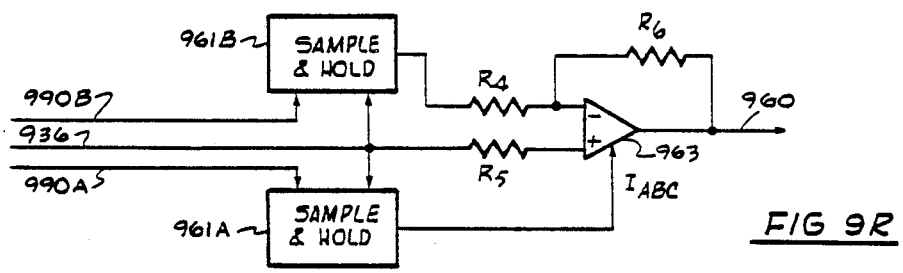
FIG. 9R illustrates combined scale factor and bias refresh circuits in parallel form.

The circuit shown in FIG. 9R provides an arrangement for compensating stored signals in parallel form, without first scale factor compensating the bias compensation signal and without first bias compensating the scale factor compensation signal. Sample and hold circuit 961B samples the bias reference signal 936 from CCD memory 932 in response to decoder bias signal 990B to generate the bias reference signal through resistor R4 to amplifier 963. Similarly, sample and hold circuit 961A samples the scale factor reference signal 936 from CCD memory 932 in response to decoder scale factor signal 990A to generate the scale factor reference signal to the IABC input of operational amplifier 963. Operational amplifier 963 may be the well-known RCA transconductance amplifier 963 discussed with reference to FIG. 9H above, wherein the bias reference signal through resistor R4 and the uncompensated data signal 936 from CCD memory 932 through resistor R5 are differentially subtracted with amplifier 963 and wherein the scale factor reference signal from sample and hold 961A to the IABC input of amplifier 963 provides a multiplication or scale factor related correction. Therefore, output signal 960 is bias compensated through the differential input circuitry of amplifier 963 and is scale factor compensated with the IABC product input of amplifier 963. One difference of the arrangement of FIG. 9R over the arrangements of FIGS. 9K-9Q is that the bias compensation signal from sample and hold circuit 961B and the scale factor signal from sample and hold circuit 961A (FIG. 9R) may not have been previously compensated, wherein the bias compensation signal has not been previously scale factor compensated and the scale factor compensation signal has not been previously bias compensated.

Figure 9S:
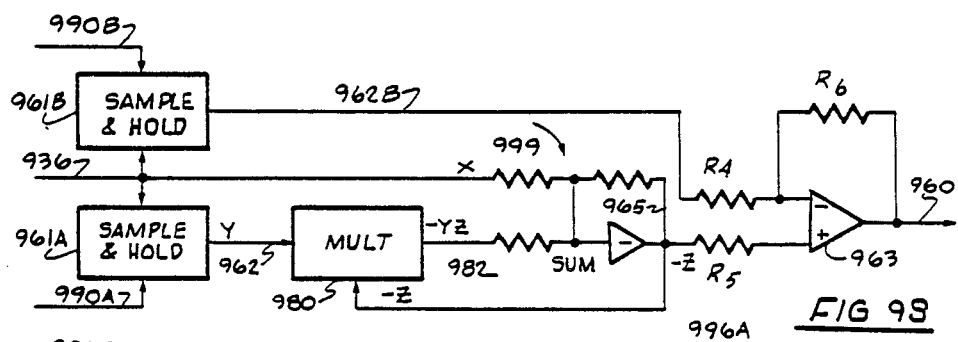
Figure 9T:
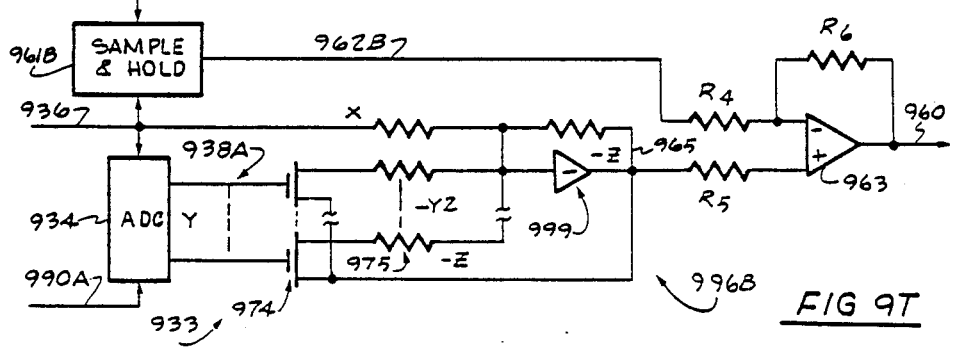

The compensation arrangement shown in FIGS. 9S and 9T conceptually similar to the arrangement discussed above with reference to FIG. 9R, wherein the bias reference signal has not been first scale factor compensated and the scale factor reference signal has not been first bias compensated; wherein compensation of the data signals are provided with both the uncompensated scale factor reference signal and the uncompensated bias reference signal. Two alternate scale factor compensation channels 996A and 996B are shown as alternatives in FIGS. 9S and 9T, where only one of these channels would usually be used in a system. The primary difference between channels 996A and 996B is that channel 996A uses an analog implicit servo and channel 996B uses a hybrid implicit servo, as discussed in detail above with reference to FIGS. 9I and 9J.

Sample and hold circuit 961B samples CCD memory output signal 936 in response to decoder bias signal 990B to generate an uncompensated bias reference signal 962B to differential amplifier 963. Implicit servo circuits 996A and 996B (FIGS. 9S and 9T respectively) are discussed in detail above with reference to FIGS. 9I and 9J respectively. These implicit servo circuits provide scale factor compensated signal 962B in differential amplifier 963 to generate compensated signal 960; which is then both scale factor compensated and bias compensated. Scale factor compensation is implemented with the implicit servo multiplying by the reciprocal of the scale factor reference signal and then being bias compensated by subtracting the bias compensation signal 962B with differential amplifier 963.

FIGS. 9K-9S generally represent modified versions of FIGS. 9F-9J which have been discussed in detail above. For example, FIG. 9K is similar to FIG. 9F, FIG. 9L is similar to FIG. 9G, FIG. 9M is similar to FIG. 9H, FIG. 9N is similar to FIG. 9I, FIG. 9O is similar to FIG. 9J, FIG. 9P is similar to FIG. 9I, FIG. 9Q is similar to FIG. 9J, FIG. 9R is similar to FIG. 9H, and FIGS. 9S and 9T are similar to FIGS. 9H-9J; wherein the above discussions relative to FIGS. 9F-9J provide a basis for the discussion of FIGS. 9K-9T. Therefore, the discussions of FIGS. 9K-9T are directed primarily to the differences of FIGS. 9K-9T relative to FIGS. 9F-9J; wherein the similarities have already been described above with reference to FIGS. 9F-9J.

For the examples provided herein, a scale factor correction may be considered to be a multiplicative correction and a bias correction may be considered to be an additive or differential correction. Alternately, a bias term may be considered to be a zero order term and a scale factor term may be considered to be a first order term, wherein a bias correction may be a fixed correction independent of signal amplitude and wherein a scale factor correction may be a correction that is a function of the magnitude of the signal.

The discussions of bias (zero order) and scale factor (first order) refreshing is exemplary of other error correction methods that may be other than scale factor and bias corrections such as a second order correction or other higher order correction which will now become obvious to those skilled in the art from the teachings of the present invention. Further, the various refresh arrangements may be combined to compensate for a combination of error mechanisms, implementable from the teachings of the above disclosure. This combination of error correction arrangements is exemplified herein with separate and then with combination arrangements of scale factor and bias refresh.

Devices shown in FIGS. 9F et seq are well known in the art. For example, counter 993 may be a Texas Instruments (TI) counter S/N 7493, decoder 995 may be a TI decoder S/N 7441-S/N 7449, inverter 989 may be a TI inverter S/N 7404 and AND-gates 987 and 988 may be TI gates S/N 7408. Switches 947, 991, and 992 may be any well known switches and, in a preferred embodiment, may be electronic switches implemented with field effect transistors (FETs). CCD memory 932 may be a well known CCD memory shift register device. Sample-and-hold circuit 961 is well known in the prior art, wherein one prior art sample-and-hold circuit is manufactured by Datel Systems Inc as Model SHM-3. Analog multipliers are well known in the art and may be implemented with any well known analog multiplier such as with a RCA model CA3080 transconductance amplifier connected as an analog multiplier. One form of analog multiplier is shown in block diagram form as multiplier 980. A RCA CA3080 transconductance amplifier form of multiplier is shown as device 963. These two forms are exemplary of the present invention which may be implemented with other well known forms of analog multipliers. Converters such as ADC 934 and multiplying DAC 934 are well known in the art, wherein commercial ADC and multiplying DAC devices are exemplified by Datel Systems Inc devices model ADC 89 series and model DAC-HI 12B respectively. Operational amplifiers for summing and buffering operations are well known in the prior art such as the Fairchild μA709 and μA741 operational amplifiers which may be arranged with input and feedback resistors as shown with circuit 999 and 976.

The arrangements discussed with reference to the figures are presented in a simplified form to better exemplify the present invention although many other arrangements may be utilized which will now become obvious to those skilled in the prior art. For example, refresh circuitry 996 may be implemented with a well known automatic gain control (AGC) circuitry. An AGC circuit may operate from the reference signal 962 that is sampled in response to decoder signal 990 as described above. In an alternate embodiment which finds primary advantage in a digital memory arrangement, refresh circuitry 996 may integrate the signals from CCD memory 932 to provide a gain control signal related to the average of the information stored in memory 932. Information in memory 932 may include control signals to equalize the number "1" and "0" counts being loaded into memory 932 so that the integral of the output signals 936 will have an average value of zero and will have an amplitude related to the degraded signal amplitude. Further, for a digital memory arrangement, refresh circuitry 996 may merely sample digital one-bits shifted out of CCD memory 932, being indicative of signal degradation without the use of the reference signal discussed above.

In an alternate embodiment, the amplitudes of the input signals 949 to memory 932 may be adjusted in relation to the degradation through memory 932 to normalize output signals 936 in contrast to the arrangement described above wherein refresh circuitry 996 re-establishes the amplitude of output signals for input of a normalized signal to memory 932 as signal 949.

Input circuitry; consisting of logic gates such as gates 987–989 and analog switches such as switches 947, 991, and 992; may be considered to be a multiplexer because this circuitry combines or multiplexes a plurality of analog signals (particularly data signal 960 or AI with a reference signal). Further, refresh circuitry 996 may be considered to be a demultiplexer because this circuitry separates or demultiplexes a plurality of analog signals (particularly the reference signal which is separated with sample-and-hold 961 from the memory output signal).

It can be seen that CCD memory 932 are electronic devices that may be shifted or not shifted under control of gated clock pulses 943 from control logic 937. Therefore, control of CCD memory may permit outputting of information on line 936 and inputting of information on line 949 while clocking CCD memory 932 or while holding the state of CCD memory 932 stationery by disabling clock 943. This is a significant advantage over the well known rotating memories such as disc memories, where a disc memory is continually rotating and may not be conveniently stopped due to the inertia of the memory and other such considerations. Therefore, a CCD memory that may be stopped under control of electronic signals will provide greater versatility in accessing and loading information and generally in operation of the memory device.

Although the present memory arrangement may be described with respect to a CCD memory and signal processing arrangement, it is intended that the inventive features described herein be applicable to signal processing and memory arrangements in general and not be limited to CCD arrangements. For example, an adaptive refresh arrangement described herein is equally applicable to other memory arrangements such as a magnetostrictive delay line memory and an IC delay line memory.

The CCD arrangements discussed with reference to FIGS. 9C et seq are described for embodiments wherein signals are stored in analog form having analog resolution. It will now become apparent to those skilled in the art that these arrangements may also be used to store digital information such as in single-bit form. For example, ADC 934 may be a single-bit ADC such as a threshold detector. In one embodiment, as well known Schmidt trigger threshold detector may be used as a one-bit ADC 934 to detect whether the output information 936 is above or below a threshold, indicative of a binary one or a binary zero condition. If above the threshold, Schmidt trigger ADC 934 may restore the amplitude to an upper amplitude magnitude and, if below a threshold, Schmidt trigger ADC 934 may restore the signal to a lower amplitude magnitude. As described with reference to FIGS. 9C and 9D above, ADC 934 would restore the input signal 949 to an amplitude that may permit degradation through CCD memory 932 without traversing the higher level threshold, detected with ADC 934. This arrangement can be described with reference to FIG. 9D, where amplitude 956 may be defined as the high level threshold of Schmidt ADC 934, where an input signal 936 to ADC 934 above amplitude 956 such as amplitude 951 may be detected as a high level signal and may be restored to a high level recirculation amplitude 952. Shifting through CCD memory 932 would degrade amplitude 952 to amplitude level 953 which is still greater than the minimum high level amplitude 956; where ADC 934 may restore amplitude 953 to the high level recirculation amplitude 954. The system may have a characteristic where the difference between input threshold 956 and recirculation amplitude 955 is greater than the degradation of signal 949 when shifted through CCD memory 932, where this degradation may be the difference in amplitude between points 952 and 953 which is less than the difference in amplitude 955 (952) and 956. Input signals 936 to ADC 934 which are below threshold 956 may be recirculated as low low level magnitudes.

Degradation of low level amplitudes may be of only secondary consideration because degradation of amplitudes through CCD memory 932 may tend to reduce the amplitude of the signal, thereby minimizing the detrimental effect on low level amplitudes. According to this consideration, it may be desirable to provide a high level amplitude for a first binary state and a low level amplitude for a second binary state, where the low level amplitude may be closer to zero voltage than to a high level negative amplitude. For example, representation of two binary states with a high level positive amplitude and a low level amplitude or a high level negative amplitude and a low level amplitude are preferred over an arrangement with representation of two binary states with a high level positive amplitude and a high level negative amplitude; where degradation of high level negative signals may be comparable to degradation of high level positive signals and where degradation of low level positive or negative signals may be minimized.

Now, an example will be provided to illustrate this degradation consideration. A binary signal will be assumed representing a one-state whenever the signal amplitude is greater than a threshold amplitude 956 and a zero-state whenever the signal amplitude is less than a threshold amplitude 956. Threshold signal amplitude 956 is assumed to be three-volts, degraded signal amplitude 951 and 953 is assumed to be four-volts, restored one-level signal amplitude 952 and 954 are assumed to be five-volts, and restored zero-level signal amplitude (not shown) is assumed to be zero-volts. As restored signal 952 is shifted through CCD memory 932, the signal is shown being degraded from a five-volt amplitude 952 to a four-volt amplitude 953, but four-volts is greater than the three-volt threshold of Schmidt trigger 934. Therefore, the four-volt input signal 936 will be restored to an equivalent five-volt output signal 938A at amplitude 954. As a zero-level signal is shifted through CCD memory 932, the signal will be reduced in amplitude toward zero-volts (if it is not already at zero-volts) and will, therefore, not be degraded toward the threshold amplitude 956.

In another embodiment, the threshold signal is assumed to be zero-volts, the restored binary one signal is assumed to be plus three-volts, the restored binary zero signal is assumed to be minus three-volts, and signal degradation is assumed to be from the plus-voltage level and from the minus-voltage level toward the zero-voltage threshold level. Therefore, both the binary one and the binary zero voltage levels will degrade toward the threshold level. Therefore, this embodiment may be less desirable than the embodiment of the above example where only the binary one voltage level will degrade toward the threshold voltage level.

In still a further embodiment of the hybrid memory arrangement of the present invention, a ternary memory may be provided with a three-state ADC 934, where the recirculation line 938A from ADC 934 may have three-states including a positive-amplitude, a zero-amplitude, or a negative-amplitude. ADC 934 may be implemented with a pair of Schmidt triggers, where a positive Schmidt trigger may generate a high level amplitude or low level amplitude in response to a high level or a low level positive amplitude of input signal 936 and a negative Schmidt trigger may generate a high level amplitude or a low level amplitude in response to a high level or low negative amplitude of input signal 936. Therefore, if input signal 936 had a high level positive amplitude, the positive Schmidt trigger would be in the positive high level state and the negative Schmidt trigger would be in the low level state; if input signal 936 had a low level amplitude, both positive and negative Schmidt triggers would be in the low level state; and if input signal 936 had a negative high level amplitude, the positive Schmidt trigger would be in the low level state and the negative Schmidt trigger would be in the negative high level state. Summing of Schmidt trigger outputs would provide a high level output if the positive Schmidt trigger was in the high level state, a negative output if the negative Schmidt trigger was in the negative high level state, and low level output if both Schmidt triggers were in the low level state. It should be noted that when one of the Schmidt triggers is in a high level state, the other Schmidt trigger is in the low level state consistent with ternary signal forms and with the binary nature of Schmidt trigger threshold detectors.

CCD Compositor FIG. 9E)

Compositors are well known in the geophysical art. One well known prior art compositor is implemented in the CAFDRS system sold by United Geophysical Corporation, an affiliate of Bendix Corporation located in Pasadena, Calif., which is implemented with a General Automation Corp SPC-16 computer. Another well known compositor is the trace compositor, model 1011 manufactured by Scientific Data Systems of Santa Monica, Calif. and described in Technical Manual SDA 98 02 62A dated November 1967. Such compositors accept input waveforms from geophone transducers and store the sampled waveforms in memory, where corresponding samples of such sequential waveform are added together. The sampling and adding of input waveform samples to previously sampled and added corresponding waveform samples is known as compositing. Compositing effectively sums or integrates corresponding samples in the temporal or time-domain to reduce the signal-to-noise ratio.

An improved compositor arrangement is shown in FIG. 9E using a CCD memory arrangement. CCD compositor 903 is shown for a single transducer input waveform. In a preferred embodiment, a plurality of compositor channels may be provided wherein one compositor channel per transducer may be used to composite each transducer input waveform known as a trace.

In reference to FIG. 9E, input transducer 911 generates transducer signal 913 which is preprocessed with buffer amplifier 983. Transducer signal from buffer amplifier 983 is input to CCD memory 932 through summing resistor 984. As data in CCD memory is shifted with clock pulses 943, input signal 986 is shifted into and stored in CCD memory 932. Control signal 972 enables control 937 to generate clock pulses 943 for the period of a trace, where control signal 972 enables the shifting of CCD memory 932 at the start of an input trace from transducer 911 and control signal 972 disables the shifting of CCD memory 932 at the completion of the input trace from transducer 911. The first trace may be loaded into CCD memory 932, where the recirculation path 960 is disabled by making FET switch 947 non-conductive with control signal 948, which is indicative of the first trace to be loaded into CCD memory 932. Opening of the recirculation path 960 insures that the first trace will be loaded into CCD memory 932 and that prior contents of the CCD memory will not carry-over to the new composited information. For subsequent traces following the first trace, control signal 948 controls FET 947 to be conductive to provide a recirculation path for the composited information in CCD memory 932 to be recirculated and added to the input trace through summing resistor 985 to summing point 968, where the input trace signal will be added at summing point 986 through input summing resistor 984. Therefore, when a trace subsequent to the first trace is sensed by transducer 911, this new input trace will be summed with the recirculated composited information 960 and then shifted into CCD memory 932. Therefore, CCD memory 932 provides the operation of storing the composited information and summing resistors 984 and 985 provide the operation of adding the input information to the stored information.

The information stored in CCD memory 932 may be analog samples, wherein the shift clock 943 effectively samples a portion of input signal 913 by inputting to CCD memory on input signal line 986, then shifting under control of clock 943.

Input control signal 972 to control logic 937 may be related to the ensonifying signal such as well known chirp signal, where the system generates a control signal to the transmitter which may be a well known VIBROSEIS device for ensonifying an underground environment. Control signal line 972 may be derived from the ensonifying signal to start the sampling and compositing of input signal 913 with CCD memory 932. Control 937 may include a timer such as a well known counter to provide clock pulses 943 for a fixed period of time starting with the transmitter command signal 145 input to control 937 as signal 972.

One distinction of the CCD compositor of the present invention is that the signals are added in the analog domain and are stored as analog signals in contrast to digital domain summing and storage in prior art systems. Another distinction is that a separate compositor channel may be used for each input channel rather than using the prior art time-shared adder and disc memory storage.

Additional distinctions and advantages may be obtained by using the hybrid memory teachings of the present invention discussed with reference to FIGS. 9C and 9D in conjunction with the compositor discussed with reference to FIG. 9E. In this arrangement, analog trace signals may be provided as analog input signal 944 to be added with recirculated signal 979 at summing point 949. Alternately, input signals may be digitized with a well known ADC and may be input as signals 938C to logic 940 which may be well known adding logic to add input signals 938C to recirculated signal 938A to provide the summed digital signal 938B for storage in CCD memory 932.

Another feature of the present invention provides for summing of analog signals which are input to a CCD. Such analog summing is exemplified with summing resistors 984 and 985 to summing junction 986 shown in FIG. 9E. Similarly, CCD input signals 919 (FIG. 9A) may be summed or otherwise combined with other analog signals. Further, input signal 944 and recirculation signal 936 from hybrid memory arrangement 902 shown in FIG. 9C may be summed as input signal 949 if recirculation control signal 948 makes recirculation FET 947 conductive at the same time that input control signal 946 makes input FET 945 conductive. In one embodiment, summing may be performed with summing resistors as is well known in the art such as with summing resistors 984 and 985 to summing junction 986 as shown in FIG. 9E. For simplicity, summing resistors may not be shown such as for recirculation signal 936 and input signal 944 to summing junction 949. Still further, other analog summing arrangements are well known in the art.

In CCD compositor arrangement 903, an arrangement may be used to reduce signal degradation, as discussed with reference to FIGS. 9C et seq. Further, recirculation signal 960 may be scaled to the proper amplitude such as with well known scaling techniques using ADC 934 or, alternately, by adjusting summing resistors 984 and 985.

CCD Correlator

A CCD correlator may be provided in accordance with the present invention using CCD memory and analog signal processing techniques. This CCD correlator will now be discussed relative to FIGS. 4, 6, 7, and 9 of copending application Ser. No. 550,231.

One embodiment of a CCD correlator will now be discussed with reference to FIG. 4. Loading of a pilot signal into register 412 and loading of a trace signal into register 417 have been described for single-bit digital signal samples with reference to FIG. 4 above. If registers 412 and 417 are CCD registers, then analog signal samples may be stored therein. For a CCD correlator embodiment, pilot signal samples may be processed with amplifier 410 and trace signal samples may be processed with amplifier 415 which may be µA709 operational amplifiers. Gates 411 and 416 have been discussed above as digital gates for a digital embodiment but may be analog gates such as FET analog switches in an analog embodiment. Pilot signal samples may be loaded into CCD register 412 in analog signal form with a LOAD P signal in the zero-state inverted with inverter 414 for selecting input pilot signal from amplifier 410 with FET switch gate 411 for loading into register 412. Similarly, the LOAD P signal in the zero-state may be inverted with inverter 418 to select input trace signal from amplifier 415 with analog gate 416 for loading into CCD register 417 as analog trace signal samples. When the LOAD P signal and LOAD T signal go to the one-state, input pilot and trace signals from amplifiers 410 and 415 respectively are disabled with inverters 414 and 418 respectively and recirculation signals are enabled. Pilot sample register 412 may have an extra CCD shift register stage 413 for providing an extra one-bit time delay for recirculation through analog selection gate 411 and trace signal samples from CCD register 417 may be recirculated back to the input of CCD register 417 through analog selection gate 416.

Analog switches 411 and 416 may be field effect transistor (FET) switches with the outputs connected together either directly or with resistors for summing or conducting the selected signal from the selected FET switch to the input of CCD registers 412 and 417. Selection of the FET switches for conduction or for non-conduction may be provided with the LOAD P and LOAD T signals for gates 411 and 416 respectively. Therefore, analog signal gates may be provided for selection operations similar to the digital signal gates discussed above.

Product circuit 419 has been discussed as an exclusive-OR circuit for generating a single-bit product signal 424 in response to single-bit output signals from registers 412 and 417 for a digital single-bit embodiment. In the instant CCD embodiment, product circuit 419 may be any well known analog multiplier circuit such as discussed in detail for multiplier 778 (FIG. 7E).

Counter 420 and register 421 may be replaced by a CCD register for shifting analog product samples 424 as a CCD shift register for storage and for adding new correlated output signal samples to prior correlated output signal samples for compositing-after-correlation in the same form discussed for CCD compositor 903 (FIG. 9E).

In an alternate embodiment, one of the input signals may be stored as single-bit digital signal samples and the other input signal may be stored as analog signal samples. For example, pilot signal logic comprising squaring amplifier 410, inverter 414, gate 411, register 412, and flip-flop 413 may be single-bit digital logic elements as discussed above for the single-bit digital embodiment and operational amplifier 415, inverter 418, analog gates 416, and CCD memory 417 may be analog sample elements as discussed for the CCD correlator embodiment immediately above. Multiplier 419 may be implemented to multiply a single-bit digital sample and an analog sample such as a FET switch for conducting an analog signal sample from CCD register 417 in response to a one-state of the digital bit from register 412 and for non-conducting an analog signal sample from register 417 in response to a zero-state digital bit from register 412. Therefore, product signal 424 may be equal to the analog signal from CCD register 417 when the digital signal from register 412 is in the one-state and product signal 424 may be a zero signal when the signal from register 412 is in the zero-state. CCD register or compositor comprising stages 420–421 may load or sum analog signal samples generated as signal 424 into register stages 420–421 for storage and for compositing operations. Therefore, a single-bit sample and an analog sample product arrangement may be implemented using the combination of techniques discussed for the single-bit digital embodiment and for the CCD analog embodiment above.

The arrangement discussed herein with reference to FIGS. 9F–9J may be used for preserving the precision of analog signal samples stored in CCD memories such as registers 412, 417, and 420–421. Therefore, input logic to registers 412, 417, and 420–421 may include a multiplexer for multiplexing an analog reference signal with the input signal samples and the output of these registers may contain refresh circuitry operating in response to the analog reference signal sample.

In an alternate embodiment, the correlation processing may be performed in parallel word form as will be described hereinafter for a single-bit digital pilot signal and an analog trace signal. A plurality of digital pilot signal bits from register 412 may each be used to select or non-select a corresponding FET multiplier switch such as indicated by multiplier 419 to control the updating of a plurality of analog output signal sample bits stored in register stages 420-421 in response to a single analog sample from register 417. Alternately, a single output digital sample from register 412 may control a plurality of multiplier gates 419 to either select or nonselect updating of a plurality of output signal samples in register stages 420-421 in response to a plurality of analog signal samples from register 417. Therefore, although the arrangement shown in FIG. 4 has been discussed for a serial arrangement wherein a plurality of serial words in registers 412 and 417 may be processed with a single multiplier circuit 419 in sequential or serial form to update a plurality of output signal samples shifted between stages 420-421 in sequential serial form; the communication paths shown in FIG. 4 may also represent parallel signal communication paths or may represent combinations of serial and parallel commmunication paths. Further, sets of parallel processors such as parallel multipliers 419 may be provided for processing parallel signals in parallel signal paths.

The arrangement discussed with reference to FIG. 6D may also be implemented with a CCD register embodiment. For example, trace signal T may be processed with an operational amplifier 623 to provide input signal samples $T_L$. Sample device 624 may be a well known sample-and-hold circuit as discussed with reference to sample-and-hold 777 (FIG. 7E). Alternately, sample circuit 624 may be eliminated. P-ROM 625 may store single-bit digital signal samples for gating trace signal sample $T_L$ in response to a one-state pilot signal sample and for not gating trace signal sample $T_L$ in response to a zero-state pilot signal sample from P-ROM 625. Product circuit 626 may be a single FET switch as discussed with reference to FIG. 4 above for either gating or not gating the input analog trace signal samples to be summed into the output signal sample memory. Z-RAM 614 and Z-counter 613 may be replaced with a CCD memory for storing analog signal samples from product circuit 626 as discussed for a CCD embodiment with reference to FIG. 4 above and as discussed for compositor 903 with reference to FIG. 9E above. Digital detector circuits 643 and 645 have been discussed as digital detectors with reference to FIG. 6D. Alternately, detectors 643 and 645 may be implemented as analog detectors such as Schmidt triggers or other analog threshold detectors for an analog output signal sample embodiment. Control circuitry including compositor control 632, one-shot 651, counters 616-619, decoder 622, and decoder 628 which have been discussed above for a digital embodiment but may also be used in conjunction with the analog or hybrid CCD memory embodiment.

A hybrid correlator embodiment has been discussed above with reference to FIGS. 4 and 6D, wherein the term hybrid correlator is herein intended to mean a correlator that provides correlation between a first signal having a plurality of digital signal samples and a second signal having a plurality of analog signal samples processed with a hybrid multiplier such as multiplier 419 (FIG. 4) and multiplier 626 (FIG. 6D). In the hybrid embodiments discussed above, the digital signal samples were assumed to be pilot signal samples and the analog signal samples were assumed to be trace signal samples. Alternately, the digital signal samples may be trace signal samples and the analog signal samples may be the pilot signal samples. For simplicity of discusion, the digital signal samples have assumed to be single-bit digital signal samples and hybrid multiplier 419 (FIG. 4) and 626 (FIG. 6) has been assumed to be single-bit hybrid multipliers such as a single FET switch. In an alternate embodiment, the digital signal samples may be multi-bit digital signal samples such as 4-bit digital signal samples and hybrid multiplier 419 (FIG. 4) and 626 (FIG. 6) may be a multipling digital-to-analog (DAC) converter such as multiplying DAC 933 (FIG. 9J) or may be other well known multiplying DAC circuits.

For the CCD correlator arrangement discussed with reference to FIG. 6D, the Z-store may be a CCD shift register being shifted under control of clock $\overline{C2}$ as gated by composite signal $\overline{COM}$ and correlate enable signal Lm through OR-gate 629. Although Z-store has been discussed for a Z-RAM 614 with reference to FIG. 6D, replacement of Z-RAM 614 with a CCD shift register under control of the clock signal from gate 629 permits use of a CCD memory in the arrangement shown in FIG. 6D. Further, Z-counter 613 may be eliminated, wherein output signals $Z_K$ from a CCD Z-store may be recirculated and summed with analog product signal from analog multiplier 626 and analog gate 627. In this CCD compositor embodiment, CCD shift registers are not random access devices and therefore cannot be instantaneously synchronized with an input sync signal to gate 638. Therefore, it may be desirable to discontinue recirculation of the CCD shift register after completion of compositing and correlation operations under control of the Lm and $\overline{COM}$ signals to OR-gate 629. Therefore, Z-store implemented with a CCD shift register may be maintained in a static state except when compositing and correlating. As is well known in the art, a shift register such as a CCD shift register is a sequential access device under control of a clock signal, wherein accessing may not be performed in response to an address on a random access basis as discussed for Z-RAM 614 operating in response to K-addresses from K-counter 619. Therefore, K-counter 619 may not be required for accessing the Z-store but may be used primarily for initiating another load of J-counter 627 with the Jo-parameter and K-counter 619 with a zero-state or other initial condition with signal Km through NOR gate 621.

Alternate Memory Arrangements

For convenience of discussion, the hybrid memory arrangement of the present invention has been discussed in a preferred embodiment of a CCD memory arrangement. Such a hybrid memory arrangement may be applied to other memory systems such as bubble memory systems, magnetic memory systems, etc. Such other applications will now be exemplified with a discussion of a bubble memory system. Information in bubble memory systems is typically conveyed in digital form by the presence or the absence of a bubble, by a large bubble or a small bubble, or by positive-domain magnetization or negative-domain magnetization. In accordance with other features of the present invention, an analog bubble memory arrangement, a hybrid bubble memory arrangement, and an adaptive memory arrangement are provided using the techniques discussed for CCD memories with reference to FIG. 9.

The hybrid memory arrangement discussed for CCD memories with reference to FIG. 9 may also be used for the bubble memory arrangement or other memory arrangements of the present invention. For example, an analog bubble memory may be used in a digital system wherein the input signals may be digital signals that are converted to analog bubble form and the output signals may be analog bubble signals that are converted to digital signal form.

In an analog bubble memory arrangement, the analog information may be contained in the size of the bubbles or in other forms. For example, a bubble having a controlled size may be formed by applying analog techniques to well-known digital bubble formation arrangements. In one embodiment, a bubble may be formed with a bubble generator by stretching a seed bubble through attraction to an adjacent propogation structure pattern wherein field strength, field rotation, rate, and/or other such parameters permit control of bubble size or other bubble characteristics in a variable or analog form. Therefore, bubbles may be formed having analog characteristics such as bubble sizes that are related to the control of the bubble generation mechanization.

An analog output circuit may be any known output circuit adapted for analog signal processing. Typical digital bubble memory output circuits such as a pickup coil, a Hall effect generator, an optical detector, or a magneto-resistive detector which are used for digital bubble sensing in prior art systems may also be used for analog bubble sensing because the magnitude of the analog bubble parameter is proportional to the magnitude of the analog bubble parameter; i.e., the signal induced in an output sensing coil is proportional to the bubble size.

The adaptive refresh arrangement and other refresh arrangements discussed for CCD memories with reference to FIG. 9 may also be used for a bubble memory arrangement and for other memory arrangements, either analog or digital. For example, a reference signal may be multiplexed into an analog bubble memory together with data signals. The reference signal, when output from the bubble memory, may be used to compensate for errors in the data signals output from the bubble memory as discussed for the CCD memory adaptive refresh arrangement.

Similarly, other memory arrangements that are considered by the prior art to be digital memories can be used as analog memories. For example, magnetic disk, drum, and tape memories are used in the prior art as digital memories by storing digital one and zero signals, but such magnetic memories can also store analog signals such as with tape recorders storing sound information for high fidelity systems. Therefore, information can be stored in analog signal form in such magnetic memory devices; wherein the hybrid memory arrangement, adaptive compensation arrangement, and other features of the present invention exemplified with CCD memories can be used for such magnetic memories. For example, digital information can be stored in analog signal form on magnetic disk, drum, and tape memories; wherein the stored analog information can be output as digital information in accordance with the hybrid memory feature of the present invention. Further, reference signals can be stored on magnetic disk, drum, and tape memories for adaptively compensating for memory errors in accordance with the adaptive compensation feature of the present invention.

Still further, other types of memories such as magnetostrictive memories, core memories, optical memories, and other memories can store information in analog signal form in accordance with the analog memory arrangement of the present invention, can receive digital information and generate digital output information while storing information in analog signal form in accordance with the hybrid memory feature of the present invention, and can store reference signals for compensation of memory errors in accordance with the adaptive compensation feature of the present invention.

Memory Access Arrangement

An improved memory access arrangement 1000 will now be discussed relative to FIGS. 10A and 10B. In prior art systems exemplified by the Intel 2416 CCD serial memory described in the Intel Data Catalog 1977, serial memories are implemented as parallel combinations of multiple serial memories to enhance access time. For example, the 16,384-bit Intel 2416 memory is configured in the form of 64 independent recirculating shift registers of 256 bits each to achieve a 100-microsecond access time. Each 256-bit shift register has a separate refresh circuit in the Intel 2416 memory. Further, the Intel 2416 memory is a digital memory, wherein digital refresh is a simple operation and does not involve analog refresh complexities. In accordance with the improved memory access arrangement of the present invention, access time is significantly improved with only a minor increase in refresh circuit complexity. For example, in the Intel 2416 memory, increasing access time by 64 times requires approximately 64 times increase in refresh circuit complexity. In the memory arrangement of the present invention, increasing access time by 64 times would only double refresh circuit complexity for a 32 times improvement over the Intel 2416 memory approach. Further, use of the hybrid memory feature of the present invention provides a significant improvement in memory capacity such as a factor of five times improvement for a five-bit (one part in 32) resolution analog storage capability.

Although the improved memory access arrangement of the present invention will be discussed herein for a hybrid memory having analog refresh, it will now become obvious that this improved access arrangement is also applicable to digital memories having digital refresh, analog memories having analog refresh, etc.

Arrangement 1000 (FIG. 10A) is illustrative of general accessing arrangements and is discussed for simplicity in the embodiment of accessing intermediate portions of a long serial CCD memory. To exemplify the improved accessing technique of the present invention; a plurality of CCD memory segments 932A, 932B, 932C, etc are connected in serial form as a long shift register for refreshing with refresh circuit 996C and for recirculating to multiplexer 908 as recirculation signal 960A. Such an arrangement has been discussed with reference to FIGS. 9F-9T; where multiplexer 908, refresh circuitry 996C, and CCD elements 932A, etc correspond to multiplexer 908, refresh circuitry 996, and CCD element 932 and related elements discussed with reference to FIGS. 9F-9T. For example, multiplexer 908 can include multiplexing of recirculation signal 960, analog input signal AI, and various reference signals. Further, CCD elements 932A, etc can correspond to CCD memory element 932 either as a single CCD element, or as a plurality of interconnected CCD elements, or other forms thereof. Yet further, refresh element 996C can be any refresh element and in a preferred embodiment may be the refresh elements discussed with reference to FIGS. 9F-9T. Therefore, the memory arrangement exemplified with elements 908, 932A to 932C, and 996C represents an arrangement that has been discussed in detail with reference to FIGS. 9F-9T except that the CCD memory in FIG. 10 is provided in segmented form, which can be implemented from the teachings herein.

For the improved access feature of the present invention, fast access capability is provided with a reduced number of refresh circuits, where the number of refresh circuits can be determined by the access requirements. For example, access can be improved by a factor of 1024 times with the addition of only a second refresh circuit. For that example, the arrangement shown in FIG. 10A can be configured having 1024 different memory channels such as channels 932A, etc; wherein the 1024 channel signals 1014 are processed with channel multiplexer 1012 to select the particular one of 1024 channels for processing with fast access refresh circuit 996D. Therefore, a particular channel out of 1024 channels can be selected with multiplexer 1012 for refreshing with a single refresh arrangement 996D to output a fast access refreshed signal 960B while all memory information is preserved by refreshing with refresh arrangement 996C and recirculating as refresh signal 960A to multiplexer 908.

An intermediate access arrangement is exemplified with channel multiplexer 1012 and refresh circuit 996D. Channel multiplexer 1012 receives a plurality of intermediate memory signals 1014 from intermediate memory elements such as signal 1014A from channel 932A, signal 1014B from channel 932B, and signal 1014C from channel 932C. The plurality of intermediate memory signals 1014 are multiplexed together or selected with multiplexer 1012 in response to address 1021 to provide the selected memory signal 1013 to output refresh circuit 996D to generate a refreshed output signal 960B. Channel multiplexer 1012 will be discussed in detail with reference to FIG. 10B herein and refresh arrangement 996D has been discussed in detail with reference to FIGS. 9F-9T as refresh arrangement 996 and related designations.

Channel multiplexer 1012 may be a well-known digital multiplexer such as an SN74150 multiplexer for a digital memory embodiment or may be a well-known analog multiplexer such as a DDC series 1506 analog multiplexer for an analog memory embodiment. Multiplexer 1012 will now be discussed in a preferred embodiment with reference to FIG. 10B. A plurality of channel signals 1014 can be processed with isolation and buffer amplifiers 1015 and selected with switches 1016 to provide selected channel signal 1013 to refresh circuit 996D for refreshing thereof. Buffer amplifiers 1015 can be any well-known buffer amplifier such as well-known operational amplifiers designated μA709 and μA741, or can be a transconductance operational amplifier such as discussed for amplifier 963 (FIG. 9H), or can be any other known arrangement. Switches 1016 can be any multiplexing, switching, or selection arrangement such as FET switches, relay switches, ILC Data Device Corp series 1506 multiplexer or any other switching arrangement. One multiplexing arrangement using FETs for multiplexing analog signals has been described for multiplexer 908 (FIGS. 9F and 9K). The multiplexed signal from switches 1016 can be output directly as signal 1013 or can be loaded into buffer register 1026 for temporary storage. In a digital memory embodiment, buffer register 1026 can be a serial-in serial-out register such as an SN7491 register or can be a serial-in parallel-out register such as an SN74164 register. In an analog memory embodiment, buffer register 1026 can be a well-known sample-and-hold circuit or can be an analog register such as a serial-in serial-out register or a serial-in parallel-out register such as implemented with well-known analog CCD register technology.

A channel selection addressing structure can be implemented with address register 1020 and address decoder 1022 in forms known in the art. For example, a channel address may be provided as digital signals 1021 for temporary storage in buffer register 1020. Stored signals 1023 can be processed with decoder 1022 to generate decoded signals 1025 to control switches 1016. For a 1024-segment memory embodiment, address 1021 and 1023 can be a 10-bit word that is decoded to select one of 1024 decode signals 1025 to select one of 1024 multiplexing switches 1016.

In view of the above, an arrangement is provided having a pair of refresh circuits shared between a plurality of channels, wherein a first refresh circuit is used for refreshing all stored information and a second refresh circuit is used for refreshing information from a selected channel to be output from the memory system. Such an arrangement provides significant advantages over prior art systems such as for rapid access in combination with efficient circuitry. The arrangement in FIGS. 10A and 10B represents a preferred embodiment. Other embodiments will now become obvious from the teachings herein such as using a single refresh circuit, using more than two refresh circuits, using parallel memory channels, using combined serial and parallel memory channels, using other types of memories, etc. Also, a plurality of multi-channel serial memories can be implemented in parallel, wherein the particular channel of the particular memory can be selected with a multiplexer to generate rapid access refreshed output signals.

Arrangement 1000 (FIG. 10A) can be considered analogous to a track or channel arrangement of a rotating memroy; each channel output signal 1014A, etc can be considered analogous to a different read head for a different track; multiplexer 1012 can be considered analogous to read head multiplexers in prior art rotating memories; etc. Alternately, arrangement 1000 can be considered analogous to prior art multiple head-per-track rotating memory arrangements. In this alternate analogy each memory element 932A, etc can be considered analogous to a read head sector; each channel output signal 1014A, etc can be considered analogous to a sector-related read head; multiplexer 1012 can be considered analogous to prior art read head multiplexing arrangements; etc.

A multiple-channel memory 932A, etc can be implemented as a tapped shift register arrangement which can be implemented by cascading shift registers 932A, etc.

Although the access arrangement of the present invention has been discussed with reference to FIG. 10A in the embodiment of a hybrid CCD memory; this arrangement is also applicable to other memory arrangements. For example, memory accessing arrangements 1000 can be used for analog, digital and/or hybrid memories and can be used for analog or bubble memories, magnetostrictive memories, magnetic rotating memories, and other serial memories in addition to hybrid CCD serial memories. Further, memory accessing arrangement 1000 can be used for other memory arrangements such as parallel memory arrangements with adaptations to the arrangements shown in FIGS. 10A and 10B which will now become obvious from the teachings herein.

Because many error mechanisms are time related such as thermally generated leakage, shifting operations such as recirculation may be implemented as relatively high-speed operations. Also, because access time is related to shift rate, shifting operations such as recirculation may be implemented as relatively high-speed operations. Alternately, output operations such as for A/D conversion in a hybrid memory embodiment, or interfacing to a slower speed serial data channel, etc may require a lower output rate. For example, in the hybrid memory embodiment, refresh and recirculation may be relatively higher speed operations while A/D conversion may be a relatively lower speed operation. Therefore, refresh and/or recirculation may be performed at higher speed and A/D conversion may be performed at lower speed. A temporary storage device such as an output register or a sample-and-hold circuit may be used for temporary storage of analog signal samples which are shifted out of memory at higher speed so that the output operation can be performed at lower speed. In one embodiment, refresh circuit 996D can include a sample-and-hold circuit and/or an A/D converter circuit such as sample-and-hold circuit 625 (FIG. 6A), 652 (FIG. 6C), 961 (FIGS. 9H and 9I), 961B (FIGS. 9M, 9Q, 9R, 9S, and 9T), and 961A (FIGS. 9N and 9S) and such as A/D converter circuit 934 (FIGS. 9C, 9J, 9O, 9Q, and 9T). Alternately, refresh circuit 996D can include a buffer register such as CCD register 932A for being loaded at a higher shift rate consistent with the shift rate of recirculation signal 960A and for being converted or otherwise processed at a lower shift rate consistent with the shift rate of output signal 960B.

A control arrangement for rapid access memory 1000 may be implemented in many different forms. In one arrangement, the memory may be clocked at the desired output clock rate and the selected channel 1013 may be directly output through channel multiplexer 1012 as signal 1013. In an alternate embodiment, the memory may be clocked at a high clock rate greater than (or less than) the output clock rate. In this embodiment, the output data may be loaded into buffer resister 1026 at the higher (or lower) recirculation clock rate and then output from buffer register 1026 at the lower (or greater) output clock rate. In still another embodiment, buffer register 1026 may be a well-known serial-in parallel-out register where the data to be output may be loaded into buffer register 1026 in serial form and may be output from buffer register 1026 in parallel form. Yet other output embodiments will now become obvious from the teachings herein.

In one rapid access embodiment, an address counter and address register arrangement may be used such as the arrangement shown in FIG. 6A and described relative thereto, wherein the arrangement shown in FIG. 10A may be used in place of the analog ROM arrangement shown in FIG. 6A comprising elements 172, 174, 175, 179, 182, 192, 104R, and 625. Address counter 316 can be used to keep track of the location of the data in a serial shift register. Address register 624 can be used to store a desired address which may be the start address of a desired block of data to be accessed. Comparison logic 617 compares counter address 613 with register address 612, where a coincidence of addresses such as identified by coincidnece signal A=B can initiate transfer of a block of data as it is shifted past the serial register output port. The address words can have a block or channel address, being the most significant part of the address word, and a bit or byte address, being the least significant part of the address word. Multiple-channel arrangement 1000 can be accessed where the bit or byte address in address counter 316 is used to identify the start of a block of data and the block or channel address in address counter 316 is used to identify the channel output which is sensing that block of data at that time. Subtraction logic can be used to subtract the block address in address counter 316 from the block address in address register 624 to generate a difference address. In this embodiment, a subtraction circuit such as an SN74181 circuit may be used in place of or in addition to comparitor 617 to perform the subtraction function. The difference address can be used to select the output channel with multiplexer 1012, where the accessed channel is the desired channel address in the address register offset by the shifted position of the data in the memory as determined by the channel address in the address counter.

Adaptive Hybrid Communication Link

The adaptive refresh and/or hybrid arrangement disclosed in the embodiment of a CCD memory may also be used to enhance communication systems with adaptive precision and with hybrid increased capacity. Further, the adaptive illumination source control arrangement of the referenced patents can be used in combination with the adaptive refresh and hybrid data processing arrangements of the present invention to provide a compound adaptive control arrangement for a hybrid optical communication arrangement such as a laser or fiber optic communication arrangement. The combination of adaptive source control, adaptive refresh, and hybrid signal processing represents a preferred embodiment although adaptive source control and adaptive refresh can be used together without hybrid communcation, or adaptive refresh and hybrid communication can be used together without adaptive source control, or other combinations thereof can be used together.

The broad inventive feature of an adaptive arrangement has herein been exemplified with a hybrid adaptive memory arrangement and in particular a hybrid storage and adaptive refresh CCD memory arrangement. The general applicability of this inventive feature is further exemplified with a hybrid and adaptive communication link wherein digital, hybrid, and/or analog information can be communicated and can be adaptively processed. For example, reference and calibration signals can be communicated with the information signals over a communication link to a remote location, wherein the reference and calibration signals can be used to adaptively compensate the information signals. One embodiment of a communication link will now be discussed for a fiber optic communication link, wherein it is intended that this fiber optic communication link be exemplary of other communication links such as a transmission line communication link, a radio communication link, a microwave communication link, a laser communication link, and other communication links and further exemplary of other systems in addition to the memory systems and communication systems discussed herein.

A hybrid and adaptive communication arrangement will now be discussed in the embodiment of a fiber optic communication arrangement with reference to FIGS. 9F-9T. In FIGS. 9F and 9K, a well-known fiber optic communication link can be used in place of CCD memory 932. Input information 949 controls a fiber optic modulator such as a light emitting diode (LED) or injection laser diode for transmitting light signals along the fiber optic communication link 932. Output signals 936 are generated with a fiber optic demodulator such as a photocell.

The adaptively refreshed hybrid fiber optic communication link is herein exemplified with the adaptively refreshed hybrid CCD memory arrangement of FIGS. 9F and 9K, wherein substitution of a well-known fiber optic communication system (including electrical-to-light and light-to-electrical interfaces) for CCD memory 932 will now become obvious to one skilled in the art from the teachings herein. For example, analog data signals and analog reference signals can be multiplexed into communication link 932 as multiplexed signal 949 using FET switches 991, 992, and 947 (FIG. 9F) and FET switches 991, 992A, 992B, and 947 (FIG. 9K). Multiplexed signal 949 is communicated over fiber optic link 932 with well-known fiber optic communication equipment. Refresh circuit 996 adaptively compensates signal 936 from communication link 932 is response to the reference signals such as discussed in the embodiment of a CCD memory arrangement with reference to FIG. 9 herein.

With the substitution of a communication link for CCD memory 932 in FIGS. 9F and 9K, all of the discussions provided herein for the embodiment of a CCD memory arrangement are now directly applicable to the communication link arrangement of the instant feature of the present invention. For example, scale factor compensation discussed with reference to FIGS. 9H-9J and 9M-9T herein; bias compensation discussed with reference to FIGS. 9M-9T herein; waveform discussions with reference to FIGS. 9G and 9L herein; and other discussions related thereto apply to the communication link embodiment of the present invention and to other uses of the adaptive compensation arrangement of the present invention. Further, several of the referenced patent applications are related to illumination control, fiber optic communication, and communication links, where the adaptive communication link features of the present invention is directly applicable thereto.

Although fiber optic communications links and other communication links are typically digital in nature, such communication links can be considered to be either analog or digital or hybrid in accordance with the features of the present invention as exemplified herein with a CCD memory arrangement.

The referenced illumination control patent applications provide adaptive source control and the arrangement of the present invention provides adaptive refresh control, wherein these two forms of adaptive control are compatible and can be used in combination to provide still further advantages. This dual adaptive control capability is generally applicable to multitudes of systems and will be described herein for the specific embodiment of a fiber optic control system to exemplify the features of this dual adaptive control arrangement.

In an adaptive source control arrangement, feedback is provided around the illumination source to linearize or otherwise compensate for illumination characteristics prior to transmission. In an adaptive refresh control arrangement, illumination is transmitted having compensation signals transmitted therewith for adaptively compensating received transmitted signals at the destination. For example, in FIG. 10 of Patent No. 3,986,022, illumination source 100 is controlled with a feedback arrangement through elements 1014, 1016, 134, 120, 234, and 1018 to adaptively control source 100. Similarly, adaptively controlled illumination 108 can be transmitted on a fiber optic communication link. Command device 127 can be an analog command device or a digital command device and can have reference signals multiplexed therewith such as discussed with reference to multiplexer 908 of FIGS. 9F and 9K herein. Fiber optic communication link 932 can output optical communication signals as electrical signal 936 such as by providing the optical-to-electrical conversion with a photocell receiver as is well known in the fiber optic art. Output electrical signals 936 are processed with refresh circuit 996, as disclosed in the embodiment of a CCD memory arrangement herein.

Adaptive source compensation is further discussed in referenced Patent No. 3,818,496. Source 48 generates adaptively controlled illumination which may be communicated on a fiber optic communication link, exemplified with optics 70 and 71. Sensor 56 senses illumination from source 48 and generates feedback signals 57 for comparison with command signal 55 to control sources 48 using comparitor 54 through power amplifier 60. Command means 80, which may be a computer 84, generates command signals 26 which may include reference compensation signals for refresh compensation for transmission by modulating source 48 to illuminate the optical communication arrangement.

In view of the above, adaptive source compensation can be used in combination with adaptive refresh compensation to provide precision signals such as for a fiber optic communication arrangement. Further, hybrid signal processing can be used in combination with adaptive source compensation and/or adaptive refresh compensation to enhance capacity in addition to precision. Yet further, either hybrid signal processing, or adaptive source compensation, or adaptive refresh compensation can be used separately or in various other combinations thereof, or in various combinations of the features disclosed herein, disclosed in the referenced applications and patents, and/or known in the art. For example, analog signal communication can be provided over a fiber optic communication link, either with or without adaptive refresh, either with or without adaptive source control, either with A/D and/or D/A converters for a hybrid communication link or without A/D and D/A converters for an analog communication link, etc.

It should be noted that, for an adaptive and/or hybrid communication link; an adaptive source control arrangement can be located at the source side of the communication link and an adaptive refresh arrangement can be located at the destination side of the communication link remote from the source.

Servo Compensation (FIG. 11)

The adaptive compensation feature of the present invention will now be exemplified with an alternate memory embodiment shown in FIG. 11. Because similar arrangements have already been discussed such as with reference to the arrangements shown in FIGS. 9F to 9T, the arrangements shown in FIG. 11 will now be discussed in simplified form. For example, differential amplifier 976 and gain control amplifier 963 are shown in FIG. 9 having input resistors and feedback resistors, but for simplicity of illustration, gain control amplifier 1114 and differential amplifier 1118 are shown in FIG. 11 without resistors. The use of resistors for amplifiers 1114 and 1118 shown in FIG. 11 will become obvious from the discussions of FIG. 9, wherein resistors may be considered to be included in gain controlled amplifier 1114 and differential amplifier 1118.

As discussed with reference to FIG. 9, various forms of compensation may be used either separately or in combinations. Compensation may include scale factor compensation, bias compensation, and other forms of compensation. For simplicity of discussion, scale factor compensation and bias compensation will be discussed in various combinations and configurations relative to FIG. 11 to exemplify the more general features of the present invention. Memory signal compensation arrangement 1100 is shown in FIG. 11 having various alternate compensation configurations.

FIGS. 11A to 11C illustrate different configurations 1100 of scale factor and bias compensation in block diagram form. In FIG. 11A, memory output signal 936 is first scale factor compensated with scale factor compensation circuit 1110 generating scale factor compensated signal 960A and is then bias compensated with bias compensation circuit 1111 generating scale factor and bias compensated signal 960B. In FIG. 11B, memory output signal 936 is first bias compensated with bias compensation circuit 1111 generating bias compensated signal 960C and is then scale factor compensated with scale factor compensation circuit 1110 generating bias and scale factor compensated signal 960D. In FIG. 11C, memory output signal 936 is scale factor compensated with scale factor compensation circuit 1110 generating scale factor compensated signal 960E and is substantially simultaneously bias compensated with bias compensation circuit 1111 generating bias compensated signal 960F for combining with combining circuit 1112 to generate scale factor and bias compensated signal 960G. Other types of compensation and other combinations of various compensation arrangements will now become obvious to those skilled in the art from the teachings herein.

Various arrangements are provided for scale factor and bias compensation, wherein a preferred embodiment provides scale factor compensation after bias compensation to minimize saturation and to enhance dynamic range. For example, scale factor compensation may tend to increase amplitude while bias compensation may tend to decrease amplitude. Therefore, it may be more desirable to provide bias compensation prior to scale factor compensation to enhance dynamic range by providing the amplitude reduction compensation before the amplitude increasing compensation.

Servo and scale factor compensation arrangements will now be discussed with reference to operational transconductance amplifiers (OTAs) 1114 and 1116, where such an OTA is characterized by the RCA CA3060 and CA3080 circuits and related circuits. These circuits are discussed in detail in the RCA Solid State '74 Databook series SSD-201B at pages 30-51 therein. These circuits have both differential inputs and gain control, wherein arrangements are discussed herein for using either differential inputs, or gain control inputs, or both differential and gain control inputs.

Scale factor compensation circuit 1110 will now be discussed with reference to FIG. 11D. Memory output signal 936 is sampled with circuit 961A under control of scale factor strobe 990A and is scale factor compensated with controllable gain operational transconductance amplifier (OTA) 1114. OTA 1114 generates scale factor compensated output signal 960. Sample-and-hold circuit 961A samples a scale factor reference signal under control of strobe 990A, as discussed with reference to FIG. 9 above. The sampled reference signal is used to generate a gain controlling signal 1115 with servo 1113 to control gain of OTA 1114.

For simplicity of discussion, an OTA servo arrangement is provided for scale factor compensation. This arrangement is merely exemplary of other servo arrangements and other scale factor arrangements which can be implemented by those skilled in the art from the teachings herein. Servo 1113 comprises OTA 1116 for amplifying the sampled signal from sample-and-hold circuit 961A. The sampled signal is compared with reference signal $V_{REF}$ using differential amplifier 1117 for generating a feedback error signal to OTA gain controlling input $I_{ABC}$. Servo 1113 is connected so that a deviation of the amplified sampled signal from the $V_{REF}$ signal is indicative of an amplitude error condition. The output signal from differential amplifier 1117 is a servo error signal which is fedback to control the gain of OTA 1116 with the amplifier bias current (ABC) $I_{ABC}$ to adjust the output signal from OTA 1116 to the amplitude of reference signal $V_{REF}$. Gain controlling current $I_{ABC}$ is also used to compensate the memory output signal 936 by controlling gain of OTA 1114 with signal 1115 to OTA gain control input $I_{ABC}$ to compensate for scale factor errors in memory output signal 936, generating compensated output signal 960. The $I_{ABC}$ current signal to OTAs 1114 and 1116 can be generated by well known current generators such as with well known current sources; shown functionally as differential amplifier 1117.

In servo arrangement 1113, $V_{REF}$ may be a comparison signal selected to be the same as the output from OTA 1116 if the scale factor reference signal from sample-and-hold 961A did not have any scale factor errors. Alternately, other values of $V_{REF}$ may be selected. Further advantages may be achieved if OTA 1116 and OTA 1114 had similar characteristics such as similar gain control characteristics. As is well known in the art, circuits on the same integrated circuit chip have improved matching or tracking characteristics. Therefore, in a preferred embodiment OTAs are controlled by the same controlling signal to the $I_{ABC}$ input such as OTA 1116 and OTA 1114 are selected to be on the same integrated circuit chip.

Bias compensation circuit 1111 will now be discussed with reference to FIG. 11E. Memory output signal 936 is sampled with sample-and-hold circuit 961B under control of bias strobe 990B. The sampled bias reference signal from sample-and-hold circuits 961B is differentially subtracted from uncompensated memory output signal 936 with differential amplifier 1118 to provide compensated memory output signal 960.

An arrangement having scale factor compensation before bias compensation as discussed with reference to FIG. 11A will now be discussed in greater detail relative to FIG. 11F. Scale factor compensation circuit 1110 processes memory output signal 936 to generate scale factor compensated signal 960A which is then processed with bias compensation circuit 1111 to generate scale factor and bias compensated signal 960B. Compensation circuits 1110 and 1111 are discussed in detail above with reference to FIGS. 11D and 11E. Sample-and-hold circuit 961A samples memory signal 936 under control of scale factor strobe 990A. Servo 1113 generates gain controlling signal 1115 to control the gain of OTA 1114 for amplifying memory signal 936 to compensate for scale factor errors. Sample-and-hold circuit 961B samples the scale factor compensated bias reference signal under control of bias strobe 960B. Signal 960A is bias compensated with differential amplifier 1118 by subtracting the bias signal stored in sample-and-hold circuit 961B from the scale factor compensated memory output signal 960A to generate scale factor and bias compensated signal 960B.

An arrangement having bias compensation before scale factor compensation as discussed with reference to FIG. 11B will now be discussed with reference to FIG. 11G. Bias compensation circuit 1111 generates bias compensated signal 960C in response to memory signal 936. Scale factor compensation circuit 1110 scale factor compensates signal 960C to generate scale factor and bias compensated signal 960D. Bias compensation circuit 1111 and scale factor compensation circuit 1110 are discussed with reference to FIGS. 11E and 11D respectively. In this arrangement, memory signal 936 is sampled with bias sample-and-hold circuit 961B under control of bias strobe 990B for generating bias reference signal to differential amplifier 1118. Memory signal 936 is differentially compared with bias reference signal from sample-and-hold 961B with differential amplifier 1118 to generate bias compensated signal 960C. Bias compensated signal 960C is sampled with scale factor sample-and-hold circuit 961A under control of scale factor strobe 990A for processing with servo 1113 to generate gain controlling signal 1115 to scale factor compensation OTA 1114. OTA 1114 compensates signal 960C under control of compensating signal 1115 to generate scale factor and bias compensated signal 960D.

An arrangement having parallel and/or merged scale factor and bias compensation circuits will now be discussed with reference to FIG. 11H. Bias compensation circuit 1111 and scale factor compensation circuit 1110 are shown merged or combined. The input to servo 1113A is a bias compensated signal, wherein the differential input characteristics of OTA 1114 can be used to replace differential amplifier 1118 (FIGS. 11D and 11E). Memory output signal 936 is sampled with sample-and-hold circuit 961A under control of scale factor strobe 990A and is sampled by sample-and-hold circuit 961B under control of bias strobe 990B. The scale factor reference signal from sample-and-hold circuit 961A is bias compensated with the bias reference signal from sample-and-hold circuit 961B and is processed with servo 1113 to generate bias compensated gain control signal 1115 to control gain of OTA 1114, 1118 to generate bias and scale factor compensated signal 960G. Differential inputs of OTA 1116A are used to bias compensate the scale factor reference signal by subtracting the bias reference signal from the scale factor reference signal with OTA 1116A. Except for use of the bias compensation differential input of OTA 1116A, servo 1113A (FIG. 11H) operates in the same manner as discussed for servo 1113 (FIG. 11D). OTA 1114, 1118 bias compensates memory signal 936 by differentially comparing the memory output signal 936 with the bias compensation signal from sample-and-hold circuit 961B and also scale factor compensates memory output signal 936 by controlling the gain of OTA 1114, 1118 with signal 1115 to generate bias compensated and scale factor compensated signal 960G.

A multiple-stage bias and scale factor compensation arrangement will now be discussed with reference to FIG. 11I. Memory output signal 936 is first processed with bias compensated circuit 1111, then processed with scale factor compensation circuit 1110, and then processed with another bias compensation circuit 111A. Bias compensation circuits 1111 and 1111A (FIG. 11I) are similar to circuit 1111 discussed with reference to FIG. 11E except that differential amplifier 1118 (FIG. 11E) is shown as a differential OTA 1114, 1118 (FIG. 11I) having controllable gain. Similarly, scale factor compensation circuit 1110 (FIG. 11I) is similar to the arrangement discussed with reference to FIG. 11D except that OTA 1114, 1118 uses a differential input to provide bias compensation not provided with OTA 1114 in FIG. 11D. Memory signal 936 is sampled with sample-and-hold circuit 961B under control of bias strobe 990B to generate a sampled bias reference signal to OTA 1114, 1118 to generate bias compensated memory output signal 960H. Sample-and-hold circuit 961A samples bias and scale factor compensated signal 960H under control of scale factor strobe 990A for servo control of scale factor compensation. Alternately, sample-and-hold 961A could sample input signal 936 under control of scale factor strobe 990A. Servo 1113 provides scale factor control signal 1115 to OTA 1114, 1118 to generate scale factor compensated signal 960H in response to uncompensated signal 936. Scale factor and bias compensated signal 960H may again be bias compensated with bias compensation circuit 1111A. Sample-and-hold circuit 961C samples a bias and scale factor compensated bias reference signal 960H under control of bias strobe 990C. Bias strobe 990C may control sampling of the same bias reference signal sampled with bias strobe 990B or may control sampling of an auxiliary bias reference signal; wherein use of the additional reference signals will become obvious based upon the teachings herein relative to use of a single bias and a single scale factor reference signal. Scale factor and bias compensated signal 960H is again bias compensated with amplifier 1118 in response to the stored bias reference signal from sample-and-hold circuit 961C to generate output compensated signal 960I. Similarly, multiple stages of similar types or different types of compensation may be provided, multiple stages of bias compensation may be provided, multiple stages of scale factor compensation may be provided, multiple stages of scale factor and bias compensation may be provided, and other multiple stages of other compensation arrangements may be provided similar to the multiple stage bias compensation arrangement discussed with reference to FIG. 11I.

A parallel compensation arrangement will now be discussed with reference to FIGS. 11J to 11M. The parallel compensation arrangement shown in FIG. 11J includes scale factor compensation circuit 1110B and bias compensation circuit 1111B which are similar to scale factor and bias compensation circuits 1110 and 1111 respectively, as discussed with reference to FIGS. 11D and 11E respectively, except that composite differential amplifier and OTA arrangement 1120 (FIG. 11J) is used to replace separate OTA 1114 (FIG. 11D) and differential amplifier 1118 (FIG. 11E). Memory output signal 936 is sampled with sample-and-hold 961A under control of scale factor strobe 990A to generate stored scale factor reference signal to servo 1113 and bias sample-and-hold 961B is sampled under control of bias strobe 990B to generate stored bias reference signal 960F. Output circuit 1120 compensates memory signal 936 in response to stored bias signal 960F and scale factor signal 960E to generate scale factor and bias compensated signal 960G.

Three differential and gain control circuits are shown in FIGS. 11K to 11M as alternate embodiments for implementing output circuit 1120 (FIG. 11J). A separate differential amplifier and OTA arrangement providing bias compensation before scale factor compensation is shown in FIG. 11K. Differential amplifier 1118 provides bias compensation and OTA 1114 provides scale factor compensation to generate scale factor and bias compensated signal 960G similar to the bias before scale factor compensation arrangement discussed with reference to FIG. 11G. A separate differential amplifier and OTA arrangement providing scale factor compensation before bias compensation is shown in FIG. 11L. OTA 1114 provides scale factor compensation and differential amplifier 1118 provides bias compensation to generate scale factor and bias compensated signal 960G similar to the scale factor before bias compensation arrangement discussed with reference to FIG. 11F. Alternately, a differential OTA circuit providing combined scale factor and bias compensation is shown in FIG. 11M. OTA 1114, 1118 provides both scale factor and bias compensation as discussed with reference to FIG. 11I. The plus, minus, and $I_{ABC}$ terminals of output circuit 1120 (FIG. 11J) correspond to similarly marked terminals in FIGS. 11K to 11M to illustrate common connections.

In order to distinguish between differential amplifier inputs, positive and negative polarities of inputs are shown herein; but only to distinguish between inputs and to illustrate that different polarity inputs exist. These polarity connections can be configured in alternate ways to achieve the desired results by one skilled in the art from the teachings herein. For single input arrangements, the polarity of the inputs may not be shown but will become obvious to one skilled in the art from the polarity required to achieve the described result. For example, differential amplifiers 1117 and 1118 are shown as having positive and negative polarity inputs to illustrate differential inputs; OTA 1114 is shown in FIGS. 11H, 11I, and 11M as having positive and negative inputs to illustrate differential signals; and OTAs 1114 and 1116 are shown in FIGS. 11D to 11G, 11K, and 11L with a single input which may be to either the positive or negative differential input depending upon the polarity required for circuit polarity consistency.

Various embodiments have been described such as embodiments for sampling or otherwise using uncompensated reference signals and/or for sampling or otherwise using compensated reference signals. For simplicity of discussion, the arrangement shown in FIG. 11 provides for scale factor compensation of a non-scale factor compensated signal and bias compensation of a non-bias compensated signal. In alternate embodiments, compensation may be provided with reference to previously compensated signals. For example, sample-and-hold circuit 961A (FIG. 11D) can sample scale factor compensated signal 960 in place of uncompensated signal 936. Also, bias sample-and-hold circuit 961B (FIG. 11E) can sample bias compensated circuit 960 instead of uncompensated signal 936. Further, sample-and-hold 961A (FIG. 11F) can sample scale factor compensated signal 960A or scale factor and bias compensated signal 960B instead of sampling uncompensated signal 936.

The scale factor servo arrangement can be used to exemplify an implicit servo. This implicit servo will now be described for linearizing a CCD output signal which is exemplary of the broader use of implicit servos for CCD applications and for non-CCD applications, for scale factor refresh and for non-scale factor refresh, for linearizing and for implementing other inverse functions, etc.

Servo 1113 can have a function inserted in feedback signal path 1115 to $I_{ABC}$ input of OTA 1116, where the implicit servo generates the inverse of the particular function. For example, a write amplifier, or a read amplifier, or both a write amplifier and a read amplifier used in a CCD memory may be non-linear. Therefore, the CCD memory output signal 936 may be a non-linear function of the CCD memory input signal 949. This non-linearity can be reduced with an implicit servo such as implementing servo 1113 as an implicit servo. The non-linearity introducing function may be provided in the feedback signal line with many known methods such as diode piecewise linear circuits well known in the analog computer art or alternate by placing a similar non-linear element in the feedback signal line. For example, if servo 1113 is implemented in monolithic form on the same chip as the non-linear element, the non-linear element may be duplicated in the feedback signal path; i.e. if the non-linear element is a write amplifier, a read amplifier, or a write and a read amplifier; then a duplicate write amplifier, or a read amplifier, or a combined write and read amplifier (with or without intervening CCD memory stages) may be repeated in the feedback signal path.

Alternately, function generating circuits can be used in a non-feedback path, or a servo circuit, or in a non-servo circuit, or in other forms to practice the present feature of the invention.

Further, voltage and current signals are implied herein to be equivalent or compatible for simplicity of discussion, where one skilled in the art can provide the proper conversion therebetween. For example, voltage and current signals can be converted therebetween with resistive networks; i.e. an output current signal from OTA 1116 can be converted to an input voltage signal to amplifier 1117 with a voltage divider network and an output voltage signal 1115 from amplifier 1117 can be converted to $I_{ABC}$ current signals by a resistor in the $I_{ABC}$ signal line of each OTA 1114 and 1116. Therefore, although such components may not be shown explicitely, they are implicit in the disclosure and are assumed to be included in the related amplifier elements shown in the figures.

In yet another embodiment, the scale factor compensation circuit can be simplified, as will now be discussed with reference to FIG. 11I. Sample and hold 961A samples scale factor compensated signal 960H. Servo 1113 need not be implemented, where the output signal from sample and hold 961A may be connected as feedback signal 1115 to $I_{ABC}$ input of OTA 1114,1118. Therefore, scale factor servo compensation can be implemented with one sample and hold circuit and one OTA with the net reduction of one OTA over the arrangement shown in FIG. 11D.

Monolithic Circuit (FIG. 11N)

Various memory control and compensation embodiments have been discussed using discrete components. In a preferred embodiment, an integrated monolithic structure is provided which is compatible with CCD memory processes and which is implemented on the same integrated circuit chip as the CCD memory or alternately is implemented on a separate integrated circuit chip. A simplified circuit arrangement will now be discussed relative to FIG. 11N to exemplify minimizing circuit components for implementation of a refresh circuit in monolithic circuit form.

The refresh arrangement of the present invention is particularly advantageous when implemented in monolithic form such as on the integrated circuit chip containing the CCD memory. A circuit arrangement of the analog refresh embodiment of FIG. 11H will now be discussed with reference to FIG. 11N. This arrangement is shown in simplified schematic form to exemplify the features of the present invention, wherein one skilled in the art will be able to provide an operating circuit from the teachings set forth herein.

The arrangements shown in FIGS. 11H and 11N have three input signals, five circuit elements, and various interconnections. The input signals are the memory output signal 936 being sampled by each of two sample-and-hold circuits 961A and 961B with two strobe signals 990A and 990B for strobing the sample-and-hold circuits to sample the memory output signal 936 at the appropriate times. A servo 1113A including OTA 1116A and operational amplifier 1117 generates gain controlling signal 1115 to control differential OTA 1114, 1118 for controlled amplification of memory output signal 936 to generate bias and scale factor compensated signal 960G.

Sample-and-hold circuits 961A and 961B may be any conventional sample-and-hold circuits or alternately may be simplified sample-and-hold circuits 961A and 961B shown in FIG. 11N. A simplified sample-and-hold circuit is implemented with transistor Q1 controlled with a strobe signal 990A or 990B for gating charge from input signal 936 into capacitor C1 for storage with time constant set by charging resistor R7. Strobe signal 990A or 990B enables transistor Q1 to charge capacitor C1 in response to the amplitude of signal 936 when the strobe signal causes transistor Q1 to be conductive. When the strobe signal causes transistor Q1 to be non-conductive, the charge stored on capacitor C1 is preserved for a period of time determined by the RC time constant and the output loading. Alternately, sample-and-hold circuits 961A and 961B may be implemented for storing charge on a CCD memory element or in many other forms compatible with the CCD and monolithic integrated circuit technology under control of a strobe signal. In the CCD embodiment, a strobe signal may be implemented as a multiphase strobe signal for shifting the sampled reference signal onto a CCD storage element at the appropriate time and for not shifting information onto that element for the duration of the storage time. Monolithic transistors such as a floating gate transistor may be used to buffer a charge signal stored on the CCD sample-and-hold element for driving an output load.

OTA 1116A, differential amplifier 1117, and differential OTA 1114, 1118 can be implemented with a differential OTA circuit such as the RCA model CA3080 referenced herein. A differential OTA is shown in simplified schematic form as elements 1116A, 1117, and 1114, 1118 (FIG. 11N). Latitude has been taken in showing the schematic representation for simplicity of discussion consistent with conventional simplified differential amplifier notation. The differential inputs are shown to bases of transistors Q2 and Q3 and the gain controlling input is shown to the base of transistor Q4. Gain controlling transistor Q4 is connected to the common emitter connections of transistors Q2 and Q3. Differential collector load resistors R8 and R9 are shown connected to positive voltage V+. A more detailed differential OTA schematic is shown in FIG. 2 at page 39 of said RCA reference. This RCA circuit uses transistor and diode components in well-known configurations such as for replacing resistors as load elements, although resistors are shown in simplified schematic form in FIG. 11N for purposes of illustration.

For a non-differential amplifier OTA embodiment, one of the differential inputs can be connected to a fixed signal such as to ground or resistor R11 in element 1117 (FIG. 11N). For a non-gain control differential amplifier embodiment, the amplifier bias current can be held constant such as by connecting the base of transistor Q4 to a fixed voltage shown as V− for element 1117 (FIG. 11N).

Transistors Q2 and Q3 provide a conventional common emitter differential amplifier arrangement. Differential inputs are provided to the bases of the Q2 and Q3 differential amplifier transistors. Collector load resistors R8 and R9 provide differential output signals. Gain setting emitter load transistor Q4 provides control of differential amplifier gain by regulating emitter current of differential transistors Q2 and Q3 with the base control signal. Positive and negative power supply voltages and ground connections are shown for illustrative purposes, but may be adjusted to meet the particular circuit requirements.

In view of the above, a simple monolithic circuit may be used to provide the refresh capabilities of the present invention.

Memory Discharge (FIG. 12A)

Another feature of the present invention will now be discussed with reference to FIG. 12A. As is well known in the art, charge accumulates in a CCD structure such as charge lost through charge transfer inefficiency, thermally generated charge buildup, charge captured in crystaline structures, etc. The instant feature of the present invention provides an arrangement to discharge, or "sweep out", or "vacuum out" accumulated unwanted charges. Although this feature may be described relative to discharging or "sweeping out" charge, it is equally applicable to charging or "sweeping in" charge as may be required. Although the instant feature will be discussed relative to a CCD memory embodiment, this feature is generally applicable such as for charging a coaxial transmission line, wherein it is herein intended that this feature be broadly interpreted as with the other features of the present invention and shall be applicable to other embodiments of CCD memories, to non-CCD embodiments, and to other non-memory embodiments, as will become obvious to those skilled in the art from the teachings herein.

The instant feature is implemented by multiplexing a discharge signal into the CCD memory and shifting this signal through the memory to provide the discharge function. This predetermined discharge signal may be part of a memory record preamble to discharge the memory prior to recirculation similar to the preamble described relative to FIG. 9 for refresh reference signals. In a preferred embodiment, the discharge signal is multiplexed in the beginning of the preamble and the reference signals are multiplexed as a subsequent part of the preamble. The data signals are multiplexed into the memory following the preamble. In this manner, the discharge signal discharges or cleans up the memory charge structure prior to reference or data signals being loaded. In this embodiment, the reference signals can be entered and output prior to the data signals; wherein the memory will be discharged and then calibrated prior to the data signals being shifted through so that the memory will be "clean" and the most recent reference signals will be available for compensation as the first data is shifted out of the memory. In alternate embodiments, discharge and reference signals can be introduced as a postamble, as combinations of preamble and postambles, as interspersed throughout the data signals, or in other forms. Further, the discharge signals can be adaptively processed, wherein the memory can be discharged until the discharge signals are shifted out of the memory have an amplitude indicative of the memory being discharged, or normalized. Many other embodiments can be configured with this method.

FIG. 12A has been organized for consistency with FIGS. 9F and 9K to show similarities. Flip-flop M1 controls loading of analog input signal AI with the INPUT signal M1Q and controls recirculation of memory signals with the RECIRC signal $\overline{M1Q}$. Decoder 995 decodes output signals 994 of sequence counter 993 to control multiplexer 908 for multiplexing analog signals 949 into CCD memory 932. Refresh circuit 996 refreshes memory output signal 936 to generate refreshed signal 960 for output and for recirculation through switch 947. Analog input signal AI is loaded through switch 991. Bias and scale factor reference signals are loaded through switches 992B and 992A respectively under control of bias decode signal 990B and scale factor decode signal 990A respectively. The general operation of the circuit shown in FIG. 12A is the same as discussed with reference to FIGS. 9F and 9K.

FIG. 12A shows the addition of normalization discharge signals and spare reference signals to the arrangement discussed with reference to FIG. 9K. A more elaborate decoder 995 (FIG. 12A) is provided, which is defined in logical form with reference to the DECODER LOGIC TRUTH TABLE and DECODER LOGIC EQUATIONS TABLE. For simplicity of discussion, counter 993 is shown as an eight-bit counter having uncomplemented outputs B0–B7 and complemented outputs $\overline{B0}$–$\overline{B7}$. Many well-known integrated circuit counters are available such as the S/N 7490 counter. If the selected counter does not have complemented outputs, the output signals may be complemented with S/N 7404 integrated circuits. Decoder 995 decodes the counter output signals in accordance with the DECODER LOGIC TRUTH TABLE.

The DECODER LOGIC TRUTH TABLE shows a preamble consisting of eight normalization signals P0–P7, a bias reference signal P8, a scale factor reference signal P9, six spare reference signals P10–P15, and 240 data storage signals P16–P255 following the preamble. The B0–B7 columns of the DECODER LOGIC TRUTH TABLE pertain to the stages of counter 993 and the ones and zeros in those columns pertain to the counter states. The P column identifies the counter state, wherein the numeric term represents the decimal numerical value of the binary combination of ones and zeros.

The equations for decoder elements 995 are completely defined in the DECODER LOGICAL EQUATIONS TABLE, wherein the decoder functions will now be discussed with reference to decoder 995 (FIG. 12A) and the DECODER LOGICAL EQUATIONS TABLE.

The F1 signal controls the analog input signal AI with switch 991 through NAND gate 1213. The AI signal is multiplexed into memory 932 when the M1 flip-flop is in the input mode when the counter is in the data storage states P16 to P255 by enabling gate 1213. The data storage states are characterized by the B4 to B7 states being not zeros; characterized by the F1 equation in the DECODER LOGICAL EQUATIONS TABLE and can be verified by inspection of the DECODER LOGIC TRUTH TABLE.

Two different embodiments have been described with reference to FIGS. 9F and 9K, wherein FIG. 9F provides for reestablishing the reference signals during the recirculation mode and wherein FIG. 9K provides for non-reestablishing the reference signals during the recirculation mode. For simplicity of discussion, FIG. 12A shows an embodiment for non-reestablishing reference signals during the recirculation mode; characterized by the input signal from the M1 flip-flop disabling decoder gates 1217–1220 during the recirculation mode. AND gate 1216 controls the normalized signals and is never disabled by the M1 flip-flop in this preferred embodiment in order to normalize the memory prior to all data loading operations including loading input data or loading recirculating data. The normalized decoder gate 1216 disables switch 1210 to multiplex the normalized voltage $V_N$ into CCD memory 932 for normalization states P0–P7 of counter 993. Normalized voltage $V_N$ may be a ground voltage, a negative voltage, a positive voltage, a small amplitude voltage, etc. as may be required to properly normalize memory 932. In one embodiment, $V_N$ may be a ground voltage for discharging memory 932.

Recirculation switch 947 provides for multiplexing of refreshed output signal 960 to CCD memory 932 as input signal 949. Input signal 949 includes data signals and reference signals, wherein the reference signals are not reestablished for each recirculation in the instant embodiment but may be reestablished in alternate embodiments. As shown in the DECODER LOGIC TRUTH TABLE and the DECODER LOGIC EQUATIONS TABLE, the F2 signal controlling recirculation switch 947 is the complement of the normalized control signal F3, wherein normalized control signal F3 is inverted with inverter 1215 to control AND gate 1214 to generate the F2 decode signal.

Switches 992B and 992A provide for multiplexing a bias reference signal $V_B$ and a scale factor reference signal $V_{SF}$ into CCD memory 932 as signal 949 under control of the F4 and F5 decoder signals respectively generated by decode AND gates 1217 and 1218 respectively. As shown in the DECODER LOGIC TRUTH TABLE, the bias reference signal and the scale factor reference signal are the P8 and P9 signals which are implemented and shown in the DECODER LOGICAL EQUATIONS TABLE as the F4 and F5 logical equations. In the embodiment shown in FIG. 9K, the scale factor signal is shown as an REF signal and the bias signal is shown as a ground signal, wherein the generalization of this specific embodiment was discussed relative to FIG. 9K. This generalization is illustrated in FIG. 12A, where the bias reference signal is shown as the $V_B$ signal which may be a ground signal or any other bias signal and the scale factor reference signal is shown as the $V_{SF}$ signal which may be a peak amplitude signal or any other scale factor signal. The bias decoder signal F4 generates the sample-and-hold bias strobe 990B to refresh circuit 996 and the scale factor decoder signal F5 provides the scale factor strobe signal 990A to refresh circuit 996, as discussed with reference to FIG. 9K.

Multiplexer switches 1211 and 1212 multiplex other reference signals $V_{R1}$ and $V_{R2}$ into CCD memory 932 as signal 949 under control of decoder signals F6 and F7 respectively from decoder gates 1219 and 1220 respectively. The $V_{R1}$ reference signal is multiplexed into memory 932 for four bit times as the P12 to P15 spare reference signals and the $V_{R2}$ reference signals are multiplexed into memory 932 for two bit times as the P10 and P11 spare reference signals; as defined with the F6 and F7 equations respectively in the DECODER LOGICAL EQUATIONS TABLE. Although the use of reference signals $V_{R1}$ and $V_{R2}$ have not been specifically defined herein, these signals characterize the ability to provide additional reference signals, wherein such additional reference signals may be a single signal as with the bias and scale factor reference signals, or double and quadruple reference signals as discussed for $V_{R2}$ and $V_{R1}$ spare reference respectively, or eight state reference signals as discussed for the normalization signal. Further, multiple normalization signals having different signal amplitudes may be multiplexed into memory 932 to normalize the memory with an embodiment similar to discussed for multiple reference signals.

In one embodiment, the discharge voltage may be greater than the data voltages. For example, the discharge voltage $V_{R1}$ and $V_{R2}$ may be large negative voltages. Alternately, the clock voltage may be selected to hve a higher (or lower) voltage for the discharge states.

| DECODER LOGIC TRUTH TABLE | | | | | | | | |
|---|---|---|---|---|---|---|---|---|
| Pn | B7 | B6 | B5 | B4 | B3 | B2 | B1 | B0 | FUNCTION |
| P0 | 0 | 0 | 0 | 0 | 0 | 0 | 0 | 0 | Normalize |
| P1 | 0 | 0 | 0 | 0 | 0 | 0 | 0 | 1 | Normalize |
| P2 | 0 | 0 | 0 | 0 | 0 | 0 | 1 | 0 | Normalize |
| P3 | 0 | 0 | 0 | 0 | 0 | 0 | 1 | 1 | Normalize |
| P4 | 0 | 0 | 0 | 0 | 0 | 1 | 0 | 0 | Normalize |
| P5 | 0 | 0 | 0 | 0 | 0 | 1 | 0 | 1 | Normalize |
| P6 | 0 | 0 | 0 | 0 | 0 | 1 | 1 | 0 | Normalize |
| P7 | 0 | 0 | 0 | 0 | 0 | 1 | 1 | 1 | Normalize |
| P8 | 0 | 0 | 0 | 0 | 1 | 0 | 0 | 0 | Bias Reference |
| P9 | 0 | 0 | 0 | 0 | 1 | 0 | 0 | 1 | Scale Factor Reference |
| P10 | 0 | 0 | 0 | 0 | 1 | 0 | 1 | 0 | Spare Reference - 2 |
| P11 | 0 | 0 | 0 | 0 | 1 | 0 | 1 | 1 | Spare Reference - 2 |
| P12 | 0 | 0 | 0 | 0 | 1 | 1 | 0 | 0 | Spare Reference - 1 |
| P13 | 0 | 0 | 0 | 0 | 1 | 1 | 0 | 1 | Spare Reference - 1 |
| P14 | 0 | 0 | 0 | 0 | 1 | 1 | 1 | 0 | Spare Reference - 1 |
| P15 | 0 | 0 | 0 | 0 | 1 | 1 | 1 | 1 | Spare Reference - 1 |
| P16 | 0 | 0 | 0 | 1 | 0 | 0 | 0 | 0 | Data Storage |
| P17 | 0 | 0 | 0 | 1 | 0 | 0 | 0 | 1 | Data Storage |
| P18 | 0 | 0 | 0 | 1 | 0 | 0 | 1 | 0 | Data Storage |
| P254 | 1 | 1 | 1 | 1 | 1 | 1 | 1 | 0 | Data Storage |
| P255 | 1 | 1 | 1 | 1 | 1 | 1 | 1 | 1 | Data Storage |

DECODER LOGICAL EQUATIONS TABLE $F1 = B7 + B6 + B5 + B4 + = \overline{B7} \cdot \overline{B6} \cdot \overline{B5} \cdot \overline{B4}$ $F3 = \overline{F2} = \overline{B7} \cdot \overline{B6} \cdot \overline{B5} \cdot \overline{B4} \cdot \overline{B3}$ $F4 = \overline{B7} \cdot \overline{B6} \cdot \overline{B5} \cdot \overline{B4} \cdot B3 \cdot \overline{B2} \cdot \overline{B1} \cdot \overline{B0}$ $F5 = \overline{B7} \cdot \overline{B6} \cdot \overline{B5} \cdot \overline{B4} \cdot B3 \cdot \overline{B2} \cdot \overline{B1} \cdot B0$ $F6 = \overline{B7} \cdot \overline{B6} \cdot \overline{B5} \cdot \overline{B4} \cdot B3 \cdot B2$ $F7 = \overline{B7} \cdot \overline{B6} \cdot \overline{B5} \cdot \overline{B4} \cdot B3 \cdot \overline{B2} \cdot B1$

Input/Output And Refresh Operations (FIG. 12B)

For simplicity of discussion, many of the embodiments discussed herein are discussed in the form of input and output operations having data transfers, etc. compatible with those of the input and output equipment. In many embodiments, internal operations may be different from external operations such as being at different clock rates, having asynchronous clocks, etc. A simplified discussion of transfer operations having different clocks will now be provided for several exemplary embodiments, wherein these methods are generally applicable and may be used with other arrangements set forth herein and with prior art arrangements, which will become obvious to those skilled in the art from the teachings herein.

One embodiment of serial data processor operations is set forth in copending application S/N 101,881 and in the related chain of continuations and divisionals therefrom, where serial data processor operations, serial I/O operations, asynchronous data transfers, etc are set forth in said chain of continuing applications. For example, transfer of serial data between a servo command structure and a data processor synchronous with the data processor clock and processing of information with the servo command structure synchronous with the servo command structure; wherein the data processor clock and servo command structure clock are disclosed in said application S/N 101,881 and are disclosed in detail in continuation in part application S/N 134,958; which disclosures are incorporated herein by reference. In said application S/N 134,958 transfer of serial data along a data pipe is illustrated in FIG. 2, logic for gating clock signals to select the data processor clock for data transfers and the servo command structure clock for servo processing is illustrated in FIG. 3B, and the servo clock synchronized loading and processing logic is illustrated in FIGS. 3B and 4. Flip flops N20 and N21 (FIG. 3B therein) provide for sychronous control of clock selection. Data processor I/O signals DC-15 and SD-13 provide "hand shaking" between the data processor and the servo command structure to synchronize operations. The operation of such logic is disclosed in said related applications which are incorporated herein by reference. Alternately, buffer register 1026 (FIG. 10D herein), may be controlled with gated clock pulses for loading at an input rate and for processing or unloading at an output rate such as using the gated clock pulse loading and processing arrangement discussed in said application S/N 134,958.

In accordance with the disclosure in the related applications discussed above, CCD registers may be used in place of the registers of the related applications, wherein the same type of logic may be used for synchronizing data transfers. For example, the data processor clock may be a relatively high speed clock for loading data at relatively high frequency and the servo command structure clock may be a relatively low frequency clock for processing data at a relatively low rate. Conversely the data processor clock may be a relatively low frequency clock for loading data at a relatively low frequency and the servo command structure clock may be a relatively high frequency clock for processing data at relatively high frequency. Further, high and low frequency clocks may be combined in various forms from the teachings of said related applications such as by inputting low frequency data, processing high frequency data, and outputting low frequency data; or inputting high frequency data, processing low frequency data, and outputting high frequency data; or other such arrangements and combinations. For example, in a sound processing system analog samples may be input at a relatively low rate, may be processed and refreshed at a relatively high rate, and may be output at a relatively low rate. Many other combinations and alternatives thereof will now become obvious to one skilled in the art from the teachings herein.

An alternate embodiment of clock synchronization arrangement will now be discussed with reference to FIG. 12B as exemplary of the more general aspects of the present invention for processing information at different clock rates. To exemplify the broad features of the present invention, a specific arrangement will be discussed in the embodiment of a reverberation circuit for a sound system. In this embodiment, audio information is sampled at a relatively low audio rate, recirculated at a relatively high rate related to refreshing operations, and output at a relatively low audio rate. The purpose of this different rate embodiment is based upon the difference between audio rates and refresh rates. Audio sample rates are in the magnitude of 10,000 samples per second. Electronic registers can be recirculated or shifted at a rate in the magnitude of megahertz, which represents a rate difference of approximately 1,000 times. Although electronic circuits can be slowed down to acoustical frequencies, detrimental effects may occur. For example, in a CCD register embodiment, errors may build up to an undesireable magnitude within 10 milliseconds; wherein it may be desireable to refreshed stored information within each 10 millisecond period. In accordance with one feature of the present invention, audio signals may be sampled at a KHz rate, stored for seconds of time, and refreshed at a MHz rate to reduce the effects of thermally generated charge buildup errors. Further, in accordance with this feature of the present invention, stored samples may be preserved for a relatively long period of time in the presence of short term storage limitations by providing short term refresh of long term storage of information.

It is desired to sample an analog input signal AI 504, store the sampled signal for a predetermined period of time in memory 932, and then output the stored signal as signal 507, after having been stored for the predetermined period of time. Because the predetermined time is characterized as being longer than the acceptable time constant for thermal bias charge accumulation, it is desirable to refresh the information stored in memory 932 at a rate higher than the input sample and output sample rate. In one exemplary embodiment discussed with reference to FIG. 12B, refreshing is performed by recirculating the contents of memory 932 through refresh circuit 996 each sample period and sampling analog input signal 504 and outputting sample 507 as memory 932 is recirculated at an input and output sample rate of once per recirculation. Therefore, if the sample rate is a 10 KHz rate and memory 932 has 100 stages, memory 932 must be clocked ar a one MHz rate in order to recirculate 100 samples each 10 KHz related sample period (0.1 millisecond period). In the embodiment shown in FIG. 12B, memory 932 is continually recirculated wherein an input sample 504 is selected once each recirculation under control of signal 990C and an output sample 507 is selected under control of decoder output signal 990D. Further, auxiliary input reference samples are selected under control of signals 990A and 990B and output samples are selected under control of signals 990E and 990F similar to the manner discussed with reference to FIG. 9K, wherein signals 990D to 990F may be selected as appropriate for the precessing or non-precessing embodiments discussed with reference to FIG. 12B.

The circuits shown in FIG. 12B will now be discussed for the embodiment of the reverberation unit of FIG. 5, wherein input signal 504 (FIG. 5) may be the same as analog input signal AI 504 (FIG. 12B) and output signal 507 (FIG. 5) may be the same as analog output signal 507 (FIG. 12B) and wherein register 501 (FIG. 5) may include CCD memory 932, refresh circuit 996, and the other circuitary shown in FIG. 12B. In a preferred embodiment, the analog refresh arrangement of the present invention may be used with the reverberation circuit of FIG. 5 as shown in FIG. 12B. For simplicity of discussion, it will be assumed that clock 943 is a one MHz clock, that CCD memory 932 is a 100 stage shift register, and that analog input AI 504 is sampled and output sample 507 is generated for each recirculation of CCD memory 932; yielding an input and output rate of 10 KHz. This is based upon one input and output sample every 100 clock pulses, which is once per recirculation of CCD memory 932.

Variable input and output sample rates can be provided with many alternate embodiments, one of which will now be described. Clock signal 943 is controlled to have selectable frequencies. The sampling of input signals AI 504 and the generation of output signals 507 will vary in direct proportion. to the clock pulse variations. This is because inputting and outputting of signals in this embodiment is controlled by the recirculation period of CCD memory 932, which recirculation period is directly related to the frequency of clock signal 943. Clock signal 943 may be controlled with a voltage controlled oscillator, rate multiplier, or other well known controllable frequency generators. Voltage control oscillators may be controlled with an operator input potentiometer, or with a digital data processor through a D/A converter, or with other known arrangements. A digital data processor and D/A embodiment is discussed in detail in applications S/N 325,933 and S/N 366,714 which are incorporated herein by reference. A digital rate generator may be controlled by a digital data processor such as with a control number transferred to a register or by an operator from panel switches. Various pulse rate controls are disclosed in copending related application S/N 550,231 incorporated herein by reference. For example, a digital rate multiplier arrangement controlled by a counter is disclosed with reference to FIG. 7G, a digital rate multiplier in the form of a DDA is disclosed with referenece to FIG. 7H, and other rate controls are disclosed elsewhere therein. Therefore, it is clear that many disclosed and/or well known circuits may be used to control the rate of clock signal 943 and therefore to control the input sample rate and output sample rate of the reverberation circuit. Detailed operation of a preferred embodiment of the reverberation circuit will now be discussed with reference to FIG. 12B.

For consistency of discussion, the arrangement shown in FIG. 12B is drawn similar to the arrangement shown in FIG. 9; except that minor modifications have been made to provide the low rate input and output operations in combination with a high rate refresh operation. For simplicity of discussion; continuous input, refresh, and output operations are provided in the circuit shown in FIG. 12B, where input mode flip flop M1

(FIG. 9K) is not used in the circuit of FIG. 12B. Instead of flip flop M1 (FIG. 9K), decoder signal 990C is used to control sampling of analog input signal AI 504 through invertor 1225 to AND gate 988. Therefore, a bias reference signal is selected with decoder signal 990B, a scale factor reference signal is selected with decoder signal 990A and an input signal sample is selected with decoder signal 990C. NOR gates 989A and 989B and AND gate 988 are shown for consistency with the circuit of FIG. 9K. Alternately, NOR gates 989A and 989B may be replaced with single input invertors and invertor 1225 and AND gate 988 may be replaced with a single invertor such as invertor 1225. The purpose of gates 989A, 989B, and 1225 is to invert the negative going signals 990A, 990B, and 990C for controlling switches 992A, 992B, and 991 respectively with the output signals of decoder 995. Further, AND gate 987 is used to enable recirculation through switch 947 for all times except when signals 990A, 990B, or 990C are selected to be low. For example, signal 990B goes low first, multiplexing bias signal GND into memory 932; followed by signal 990A next going low, multiplexing reference signal REF into memory 932; followed by signal 990C next going low, multiplexing an analog input sample AI 504 into memory 932; and followed by recirculation of all other information stored in memory 932 as refreshed signal 960. Therefore, for each recirculation of memory 932 a ground reference signal, a scale factor reference signal, and a new input sample are multiplexed with previously stored information into memory 932.

As will become obvious from the following discussion, two compensation signals GND and REF will replace the previously stored compensation signals and the sampled analog input signal AI 504 will replace the oldest stored sample in memory 932 which is output by sample and hold circuit 1226 as signal 507. Signals in memory 932 may not be replaced in the same storage element but may be replaced in a precessing group of stored samples that are precessing through memory 932 from input sample AI 504 to output sample 507 or from newest to oldest sample.

Another difference between FIG. 9K and FIG. 12B is the expansion of decoder 995 to provide not only the three decoder signals 990A to 990C but to include a group of other decoder signals ranging up to N; which may be a total of 100 decoder states for the 100 stage shift register memory 932 discussed for the above example. Output signals from decoder 995 may be selectively implemented, wherein it is not necessary to implement 100 decoder output circuits for a 100 stage shift register memory 932. Only the desired output stages need be implemented, as will become obvious from well known logical design technology.

Still another difference between FIG. 9K and FIG. 12B is the addition of output sample and hold circuit 1226 for storing a particular output sample 507 of a sequence of output samples 960 under control of sample control signal 990D.

Yet another difference between FIG. 9K and FIG. 12B is selection of sample control signals 990E and 990F for sampling the bias and scale factor reference signals with refresh circuit 996. Selection of signals 990E and 990F from the appropriate output signals of decoder 995 are illustrated with parenthesis 1227 and the related arrow. This selection is provided to take into account precession of signals in memory 932, which will be discussed hereinafter. For example, in an arrangement without precession, signals 990E and 990F (FIG. 12B) may be signals 990A and 990B (FIG. 9K), but alternately may be selected from the other decoder signals for the precessional embodiment discussed with reference to FIG. 12B.

Many method of implementing a counter having a prescribed number of counts may be used for implementing counter 993. For example, if a well known counter having a synchronous clear was used for counter 993, then the last desired decode state could be used to reset counter 993. For example, the 99 state counter discussed herein could be implemented by decoding state 98 with decoder 995 as output signal N, which would then be connected to the synchronous clear input of counter 993 and would reset counter 993 to the zero state on the next clock signal. Alternately, counters having any desired counting sequence and number of states can be designed with well known counter design methods.

Two alternate counter embodiments are set forth in application S/N 134,958 at FIG. 6 therein. In a first embodiment, the signal from gate 113 to asynchronous clear input 123 to counter 98 is used to asynchronously clear counter 98. In a second embodiment, the signal from gate 94 to counter clock input 97 could be used to synchronously clock counter 98 with a gated clock pulse to the asynchronous clear input 123. Many other arrangements for implementing counter 993 and decoder 995 will now become obvious to those skilled in the art from the teachings herein.

The precessional arrangement is implemented in one embodiment by providing a CCD shift register memory 932 having one stage more than the number of states of counter 993 and decoder 995. Therefore, counter 993 and decoder 995 will return to the zero state (defined by signal 990B) before the last sample in memory 932 has been recirculated. This causes a one-bit precessional left shift in memory 932 for each recirculation thereof. This one-bit precessional shift effectively shifts the next output sample into the output time slot and shifts all other stored samples into the next closest output time slot. As the stored samples precess toward the output sample position in memory 932 at a rate of once per recirculation, the system has the appearance of shifting the information in memory 932 in the input stage to the output stage at a once per recirculation shift rate, thereby providing a high speed recirculation refresh rate in conjunction with a low speed output shift rate.

The arrangement shown in the PRECESSIONAL EXAMPLE table provides for progressions from the INPUT column, through the five MEMORY columns to the OUTPUT column, or the COMP column, or recirculated to memory input column 0. The alphabetical symbols in the columns define the time at which that signal is shifted into that element, wherein the transfer occurs on the clock pulse following that stable condition. This causes the alphabetically indicated sample to progress to the left and to the bottom of the PRECESSIONAL EXAMPLE table and to recirculate from memory stage 4 to memory stage 0 as it progresses to the bottom of the PRECESSIONAL EXAMPLE table; showing spacial domain progression horizontally and temporal domain precession vertically with a two dimensional tabular form.

| | | PRECESSIONAL EXAMPLE | | | |
|---|---|---|---|---|---|
| ITERATION | DE-CODE | INPUT | MEMORY 0 1 2 3 4 | OUT-PUT | COMP |
| 1 | 0 | S | — — — — — | | |
| 1 | 1 | A | S — — — — | | |
| 1 | 2 | | A S — — — | | |
| 1 | 3 | | — A S — — | | |
| 2 | 0 | S | — — A S — | | |
| 2 | 1 | B | S — — A S | | |
| 2 | 2 | | B S — — A | ↓ | S |
| 2 | 3 | | A B S — — | ↓ | ↓ |
| 3 | 0 | S | — A B S — | ↓ | ↓ |
| 3 | 1 | C | S — A B S | — | ↓ |
| 3 | 2 | | C S — A B | ↓ | S |
| 3 | 3 | | B C S — A | ↓ | ↓ |
| 4 | 0 | S | A B C S — | ↓ | ↓ |
| 4 | 1 | D | S A B C S | — | ↓ |
| 4 | 2 | | D S A B C | ↓ | S |
| 4 | 3 | | C D S A B | ↓ | ↓ |
| 5 | 0 | S | B C D S A | ↓ | ↓ |
| 5 | 1 | E | S B C D S | A | ↓ |
| 5 | 2 | | E S B C D | ↓ | S |
| 5 | 3 | | D E S B C | ↓ | ↓ |
| 6 | 0 | S | C D E S B | ↓ | ↓ |
| 6 | 1 | F | S C D E S | B | ↓ |
| 6 | 2 | | F S C D E | ↓ | S |
| 6 | 3 | | E F S C D | ↓ | ↓ |
| 7 | 0 | S | D E F S C | ↓ | ↓ |
| 7 | 1 | G | S D E F S | C | ↓ |
| 7 | 2 | | G S D E F | ↓ | S |
| 7 | 3 | | F G S D E | ↓ | ↓ |

For the above example, CCD memory 932 will have 100 stages counter 993 will be a 99 stage counter, and decoder 995 will have 99 output states of 0 to 98; wherein the N output state of decoder 995 is 98. Input signal 504 is sampled each 99 clock pulses or each iteration of counter 993. Output samples 507 are updated each 99 clock pulses or each iteration of counter 993. Stored samples in memory 932 are recirculated 99 times to the right which appears to be a one stage shift to the left for a 100 stage shift register for each 99 clock pulses. Therefore, the input sample rate, the output sample rate, and the refresh rate is once per iteration or once per recirculation comprising 99 clock pulses which is about a 10 KHz rate for a one MHz clock.

The precessional nature of the arrangement shown in FIG. 12B will now be discussed for a simple example shown in the PRECESSIONAL EXAMPLE table. For simplicity of discussion, a five stage memory having stages 0 to 4 and a 4 state counter and decode having states 0 to 3 will be used as exemplary of the larger example of a 100 stage memory and a 99 stage counter and decode discussed above and as further exemplary of the more general features of the present invention of synchronizing input, output, and internal processing speeds. Further simplification is provided in PRECESSIONAL EXAMPLE table by using only a single scale factor compensation sample S. The DECODE column shows the repetitive generation of states 0 to 3 of counter 993 and decoder 995. The INPUT column shows the scale factor compensation sample S input to memory 932 at each decoder time 0 and an analog input sample A to G input to memory 932 at each decoder time 1; wherein sequential input samples are defined in the PRECESSIONAL EXAMPLE table as sequential alphabetical characters A, B, C, etc. The MEMORY column shows the five memory stages 0 to 4 and illustrates the shifting of the input and recirculated signals through memory 932 for each clock pulse.

The shifting of a sample through memory 932 is shown horizontally in the PRECESSIONAL EXAM-PLE table as each clock pulse progresses the samples horizontally from left to right in the five stage memory columns. As the samples progress in time in response to clock pulses, the samples are shown progressing vertically downward in the MEMORY columns 0 to 4 in the PRECESSIONAL EXAMPLE table as indicated by the progression of the DECODE column states from 0 to 3 and back to 0. The ITERATION column of the PRECESSIONAL EXAMPLE table defines the iteration of counter 932 and decoder 995 from the 0 to 3 states as the states are repeated. For simplicity of reference, a particular system state will be defined by the iteration and decode state. For example, state 2-1 comprises the second iteration 2 and the first decode state 1 storing memory signals S--AS. Because the initial state of memory 932 is not defined for this example, the first row of memory states in the PRECESSIONAL EXAMPLE table are shown as dashed (-) conditions. These dashed undefined conditions are shown progressing through the memory stages and being output to the sample and hold circuit as dashed conditions for the period of time that these undefined conditions remain in the memory. The OUTPUT column in the PRECESSIONAL EXAMPLE table shows the changing state of the stored sample and hold signal 507 as signals precess through memory 932 and are output with sample and hold circuit 1226. Similarly, the COMP column in the PRECESSIONAL EXAMPLE table shows the scale factor compensation signal stored in the refresh circuit 996 as it is shifted out of memory 932.

The vertical arrows in the PRECESSIONAL EXAMPLE table indicate that the signals sampled by the output or compensation circuits are stored for the duration indicated by the arrow until a new sample is shown as a new alphabetical character at the tail of an arrow.

The spaces vertically below the input samples (decode states 2 and 3) in the PRECESSIONAL EXAMPLE table indicate the "don't care" nature thereof, wherein the input sample is clocked into the memory at decode state 1, wherein decode states 2 and 3 are related to recirculation of memory output information to the memory input.

The shifting of information into the memory, through the memory, and out of the memory is shown in the PRECESSIONAL EXAMPLE table as proceeding from left to right and from top to bottom. For example, in the 1-0 state, the S sample is available at the input of the memory, followed by the clock pulse stepping to the 1-1 state and shifting the input S sample to the memory 0 stage, followed by the 1-2 state stepping the S sample to the memory 1 stage, followed by the 1-3 state stepping the S sample to the memory 2 stage, etc. The S sample is continually shifted through memory until it appears in the last memory output stage in state 2-1, wherein the next clock pulse stepping to the 2-2 state also clocks the output S sample into the compensation circuit sample and hold, as shown in the COMP column. Similarly, the A input sample is available at the memory input at the 1-1 state, is clocked into the memory 0 stage in the 1-2 state, is clocked through the memory to appear at the output memory stage 4 in the 2-2 state, and is recirculated to the memory 0 stage in the 2-3 state. Therefore, it can be seen from the PRECESSIONAL EXAMPLE table that the 0 decode state enables clocking of the compensation signal S into the memory, the 1 decode state enables clocking of an input sample into the memory, and the 2 decode state and 3 decode state enable the sample in memory stage 4 to be recirculated to memory stage 0.

Memory transfers such as loading a memory input signal or recirculation a memory output signal is enabled at the change of state at the next clock period. Therefore the transferring of input conditions and the transferring of output signals from memory stage 4 to memory stage 0 occurs at the next state vertically down.

The arrangement discussed with reference to the PRECESSIONAL EXAMPLE table is provided for simplicity to illustrate one form of synchronization, storage, and delay; wherein one skilled in the art will be able to understand the simplified shorthand nature of the table and will be able to implement a system exemplifying the simple example in the PRECESSIONAL EXAMPLE table.

It should be noted that the input sample is clocked into the memory following the state that the output sample is clocked into the output sample and hold circuit. For example, the F sample becomes available in the 6-1 state, the F sample is loaded into memory stage 0 in the 6-2 state, the B sample becomes available at memory output stage 4 in the 6-0 state, and the B sample is clocked into the output sample and hold circuit in the 6-1 state.

For the precessional example, the output clock occurs one bit time preceeding the input clock 990C. For this condition, the arrangement shown in FIG. 12B would have the output clock 990D connected to decoder signal 990A which occurs one clock period before the input clock 990C. Therefore, output clock 990D would be the same signal as scale factor enable signal 990A. Also, output signal S is clocked into the refresh circuit in the clock period following clocking of the input compensation signal into the memory. Enable signals 990E and 990F would be connected to decoder output signals 1 and 2 respectively and therefore would be the same as scale factor enable signal 990A and input enable signal 990C respectively. Therefore, the first decoder signal 990B would enable loading of an input bias reference signal into memory 932; the second decoder signal 990A would enable loading of an input scale factor reference signal into memory 932, would enable loading of an output bias reference signal into refresh circuit 996, and would enable loading of an output sample 507 into output sample and hold circuit 1226; and the third decoder signal 990C would enable loading of an input sample into memory 932 and would enable loading of an output scale factor reference signal into scale factor refresh circuit 996 in accordance with the method illustrated in the PRECESSIONAL EXAMPLE table.

In accordance with this discussion, it is assumed that decoder output signals 990A–990C enable or gate clock pulses to load the desired signal but it is assumed that these signals 990A–990C do not themselves perform the clocking function. For example, signals 990A to 990C enable logic circuits 988, 987, 989A, and 989B to select switches 991, 947, 992A, and 992B respectively to provide the appropriate signal to the input of memory 932 as signal 949; but this input signal 949 is not loaded into memory 932 until the next clock pulse. Similarly, data signals 990D to 990F are herein assumed to enable samples and hold circuits but not to directly clock the sample and hold circuits; wherein the clocking of the sample and hold circuits is assumed to be sunchronized with clock signal 943 such as with gated clocks, etc as is well known in the art and as disclosed in the referenced applications. One reason for use of a gated clock is to make the loading of the sample and hold circuits insensitive to race conditions of signals 990D to 990F introducted by decoder 995, as is well known in the art.

If counter 993 was a grey code counter, race conditions would be reduced. A gray code decoder 995 could be used to generate output signals 990D to 990F in response to a grey code counter signals, which could be used to directly clock samples into sample and hold circuits. For this grey code clocking condition, decoder signals 990D to 990F would have to be changed to preceed by one clock period the signals discussed above.

Multiple Refresh Modules

An alternate embodiment of the enhanced refresh rate feature embodiment will now be discussed with reference to FIG. 10A. System 1000 is implemented with a long register comprising CCD memory elements 932A to 932C. For the purpose of this example it will be assumed that system 1000 has a time delay from input multiplexer 908 to refresh circuit 996C exceeding the desired error time constant. In accordance with the instant feature of the present invention, reduction in time between refreshes can be achieved by inserting refresh circuits such as refresh circuit 996C in the memory loop comprising registers 932A to 932C. For example, if memory 1000 had 30,000 memory elements and was shifted at a one MHz rate, it would take 30 milliseconds for a recirculation and therefore 30 milliseconds between refreshes with refresh circuit 996C. If the thermal bias time constant was 10 milliseconds, the refresh rate would therefore be three times too slow. If refresh circuit 996C was repeated after each 10,000 stages such as inbetween 10,000 stage blocks 932A and 932B and inbetween 10,000 stage blocks 932B and 932G, then the refresh would occur after each 10,000 stage shift operations or once every 10 milliseconds for a one MHz clock rate; thereby satisfying the requirement for refresh each ten millisecond thermal bias time constant. With this arrangement, a memory having a virtually unlimited number of stages could be implemented without being constrained by the accumulating errors such as thermal bias errors. Similarly, this arrangement is usable for other errors such as charge transfer errors, etc; which applicability will now become obvious to those skilled in the art.

Alternately, multiple refresh arrangements may be used in multiple parallel channels, wherein a memory may be partitioned so that recirculation of each parallel channel is within the refresh time, number of stages, and other requirements and each parallel channel may contain its own dedicated refresh circuit in parallel with each other channel having dedicated refresh circuits.

Partitioning of memory arrangements can be optimized by the number of memory elements per chip, per module, etc and the distribution of refresh circuits per chip, per module, etc. In a preferred embodiment the refresh arrangement is contained on the same integrated circuit chip containing the memory elements, as discussed with reference to FIG. 11N. Refresh circuits may be provided for output chips and for chip boundaries, as discussed with reference to FIG. 10A. Multiple redundant refresh circuits can be provided in order to achieve partitioning isolation between memory elements. Many other partitioning considerations can be implemented by applying the methods discussed herein to the more general applicability and in combination with other teachings herein.

Different types of refresh circuits can be used at different rates and different places. For example, a CCD memory being shifted at high rate through many stages may have a greater problem with charge transfer inefficiency caused by the number of stages and a lesser problem caused by thermal bias because of the relatively short time for a shift operation. Therefore, more stages of scale factor refresh may be provided than bias refresh. Alternately, a memory may have a slow shift rate and a small number of stages, wherein the lower shift rate may increase the shifting time to a level where the thermal bias error dominates and the small number of stages may minimize the effects of charge transfer inefficiency. In this arrangement, a larger number of bias refresh circuits may be used in conjunction with a smaller number of scale factor refresh circuits.

One guideline may be that a scale factor refresh circuit would be used after a predetermined number of stages such as every 1,000 stages and a bias refresh circuit would be used after a predetermined period; which would be related to the number of stages divided by the clock rate. For example, in a system having a one MHz clock rate, a requirement for scale factor refresh after every 1,000 stages, and a requirement for bias refresh every 10 milliseconds; a scale factor refresh circuit would be spaced every 1,000 stages and a bias refresh circuit would be spaced every 10,000 stages for 10 times fewer bias circuits than refresh circuits. If the clock rate were defined as being 0.01 MHz for the above refresh requirements, then the scale factor refresh circuits would still be spaced every 1,000 stages but the bias refresh circuits would be spaced every 100 stages for 10 times more bias refresh circuits than scale factor refresh circuits.

The servo refresh arrangement discussed with reference to FIG. 11 may cause an error buildup from iteration to iteration for certain circuit configurations. Therefore, it may be desirable to combine several refresh embodiments such as the analog servo embodiment shown in FIG. 11 and the digital embodiments discussed with reference to FIGS. 9C, 9D, etc herein in a heirarchial refresh arrangement. For example, the analog servo refresh arrangements may be higher in speed and lower in cost than the digital or hybrid refresh arrangements, wherein analog servo refresh arrangements may be used more often than digital refresh arrangements. This can be exemplified by an arrangement having a plurality of blocks of memory such as blocks 932A to 932C (FIG. 10A). Each block 932A to 932C may include an analog servo refresh arrangement such as discussed with reference to FIG. 11 included in each block 932A to 932C to provide local analog refresh in a form that is high in speed and low in cost. In addition, refresh circuit 996C may be a digital refresh circuit which reestablishes precision after multiple analog servo refreshes have been performed. In another embodiment, a plurality of memory blocks such as blocks 932A to 932C may be configured in parallel block form each having a dedicated analog servo refresh circuit as part of memory blocks 932A to 932C and each of the plurality of blocks may be connected in parallel in well known arrangements. The output of each of the blocks may be sequentially selected for processing with digital refresh such as refresh 996C being shared between all memory blocks 932A to 932C on a selected, sequential, or multiplexed basis for reestablishing precision of information in each block. Alternately, multiplexer 1012 can sequentially select which memory block 932A to 932C is to be refreshed with shared refresh circuit 996D either for output as shown in FIG. 10A or for recirculation back through a channel multiplexer to the appropriate memory block 932A to 932C. FIG. 10A exemplifies both serial and parallel arrangements for the above discussion. Therefore, a larger number of lower cost, higher speed analog refresh circuits may be used such as dedicated to different blocks and a lesser number of lower speed, higher cost refresh circuits may be used such as shared between a plurality of blocks for providing higher precision refresh.

In accordance with the hierarchial refresh arrangement, a specific example will now be given to exemplify the considerations. Assume that memory blocks 932A to 932C include 128 different blocks having 10,000 samples per block; thereby providing a memory having 1.28 million samples. This 10,000 samples per block and therefore 10,000 samples per local refresh is consistent with conventional charge transfer inefficiency error considerations. Assuming a 4 MHz shift clock rate, a bias refresh will be provided about each 2.5 milliseconds, which is consistent with conventional bias error time constants. If a digital refresh arrangement were used to refresh each block in sequence, such as with digital refresh 996D refreshing a selected block from multiplexer 1012 and recirculating it back to as signal 960B, then all 128 blocks would be digitally refreshed each 320 milliseconds. Although this 320 millisecond refresh period would be inadequate by itself, when used in conjunction with a 2.5 millisecond local refresh period with the dedicated block refresh circuit, the 320 millisecond period would be acceptable. Effectively, this 320 millisecond period refresh is a second order correction for correcting the refresh errors, while the dedicated refresh circuits per block represent a first order refresh capability for reducing primary memory errors.

Further advantages may be achieved by refreshing each block at a lower rate to reduce the cost of the shared refresh circuit. For example, an A/D convertor operating a 4 MHz conversion rate is relatively expensive while an A/D convertor operating at 0.4 MHz rate is relatively inexpensive. Therefore, as each block is refreshed by the shared refresh circuit, the clock rate for that block may be reduced by a factor of 10 to an 0.4 MHz rate.

Various methods may be used to minimize contention for the condition that external equipment would request access to the block being refreshed at the low data rate. One method would be to load a block of data into a buffer register at high rate for shared refresh, refreshing the block of data in the buffer register at low rate while still preserving the same block of data in memory being refreshed at high rate, and then transferring the refreshed block of data from the biffer memory at high rate to replace the unrefreshed block of data in memory. Alternately, use of slow refresh could be used to lockout or preempt accessing that block of data until the slow refresh were completed, which would have the consequence of reducing access time when in contension with refresh operations. Many other arrangements for facilitating hierarchical refresh will now become obvious from the teachings herein.

Charge Coupled Device Processor

A processor arrangement in accordance with the present invention can be implemented as a signal processor or data processor using charge devices exemplified with charge coupled devices (CCDs) such as described in the parent and related applications, which are pertinent to the system of the present invention and may be used to implement alternate embodiments of the present invention. Such processor arrangements are described in said parent application Ser. No. 490,816 now Pat. No. 4,209,853; in said parent application Ser. No. 552,559 now Pat. No. 4,209,852; in said parent application Ser. No. 550,231 now Pat. No. 4,209,843; in said parent application Ser. No. 812,285; in said parent application Ser. No. 844,765; and in parent application Ser. No. 889,301; which patents and patent applications have been incorporated herein by reference.

Pico Computer

Many new generation systems may be characterized as a relatively low computational requirement processor in a memory-intense environment. Therefore, possibly any conventional processor including a single chip microprocessor or other conventional processor may be usable for computational capability. Unfortunately, the memory-intense requirements are more difficult to satisfy. Three important innovations can satisfy this last memory-intense requirement. These are 1. the hybrid memory to get a low cost per bit;
2. the adaptive refresh to facilitate the hybrid memory in the presence of low cost simple memory circuits having relatively high error mechanisms; and
3. a non-volatility implementation.

The combination of the first two innovations for scratch pad and all three innovations for permanent storage facilitates low cost memory-intensive systems for the future.

The hybrid memory and adaptive refresh capability is set forth in application S/N 522,559 filed on Nov. 11, 1974 and continuations therefrom.

The availability of a high precision analog memory such as provided with the adaptive refresh mechanization and particularly in combination with the analog ROM now makes feasible analog data processors that have never previously been feasible. These include special purpose processors, stored program processors, serial processors, parallel processors, and pipeline processors. Particular advantage is achieved with the inexpensive nature of analog signal processing elements. Combinations of analog, hybrid, and digital memories may be used. For example, parameters may be stored in analog signal form, while the program may be partially stored in analog and partially in digital or hybrid form. Data processing may be analog, digital, or hybrid. For example, analog summation can be performed with a differential amplifier, hybrid multiplication can be performed with a multiplying DAC, and an exclusive-OR can be performed with a digital gate. The program can control many different elements and many different data paths simultaneously as in a microprogrammed device. These data paths and elements can include analog, digital, and hybrid devices.

The stored program can be analog, where threshold detectors control paths such as with analog gates or digital gates, where digital logic or digitally selected analog gates can control data paths. The stored program can be hybrid, where a digital signal controls an analog gate. Processing can be also performed with analog, hybrid, and digital elements. Analog differential analyzers can be implemented therewith. Special purpose devices such as filters can be implemented as a soft-wired analog computer such as by using a hard-wired analog computer like the PACE analog differential analyzer in combination with an analog ROM which may also use analog reference refresh. Such a memory arrangement can replace the relay logic to provide programming for analog computers. This capability permits very rapid instruction by instruction operation rather than the prior art slow mode by mode operation, yielding a new generation processor.

Because of the speed of analog processing, the simplicity of the analog elements and the parallel nature of analog circuits; a high speed parallel pipeline analog or hybrid processor can be implemented such as for a high speed filtering operation.

In one embodiment, a processor can receive analog signals from an analog ROM and from an analog input or analog alterable memory to generate analog output information for an improved filter processor, as described in parent application S/N 844,765 filed on Oct. 25, 1977.

The Pico Computer can be an analog or hybrid or digital device. A digital stored program computer is disclosed in application S/N 101,881. A brief discussion of analog stored program techniques will now be provided, where the analog techniques described herein and digital techniques such as disclosed in application S/N 101,881 filed on Dec. 28, 1970 can be combined such as with A/D and D/A converters to provide a hybrid computer.

An analog instruction can be read from analog memory such as a single analog bit or a plurality of analog bits for different instruction fields. The fields or bytes in the analog domain are analogous to fields and bytes in the digital domain. A digital system can read a digital word and decode the digital word with the control signals to enable a function. For an analog or hybrid approach, an analog signal can be distributed to a plurality of threshold detectors. The threshold detector that finds coincidence can generate an output control signal. Therefore, an analog threshold detector replaces a digital decocder; where control functions can be performed in the analog domain as well as the digital domain.

Similarly, addressing can be performed in the analog as well as the digital domain with an analog address such as by using a threshold detector in place of the digital address decoder. Coincident analog addresses can be used such as for conventional coincident current memory arrangements.

Similarly, arithmetic operations can be performed in the analog domain such as by adding and subtracting analog signals with a differential amplifier, multiplying analog signals with an analog multiplier, multiplying analog and digital signals with a multiplying FAC, dividing signals (either analog, digital, or hybrid) with an analog or hybrid implicit servo having a multiplier in a feedback loop, and providing multitudes of other functions in the analog or hybrid domains; as is well known in the analog and hybrid art, but not in the context of a stored analog program analog computer.

Similarly, other functions that can be performed by a stored program digital computer can be performed by a stored analog program analog computer or hybrid computer.

A serial analog memory can be considered to be analageous to a disk memory providing offline storage and loading an online buffer or main memory. Long access time for an analog ROM can be tolerated such as using longer serial memory loops for longer access times and compensated for by using a faster access time online memory than can be a shorter loop volatile CCD or can be an RAM or other online alterable memory. The main memory or scratch pad memory can be loaded from the offline memory on a block basis (as is conventionally performed with a disk memory) for processing the loaded program and then loading other blocks of program, etc in an overlay manner. Alternately, double buffering and dynamic overlaying can be used to reduce latency time while transferring the block. The computer architecture can be serial as with the Verdan computer using a serial rotating memory, can be serial word but random access memory as with the Hyatt microcomputer (patent application S/N 101,881 filed on Dec. 28, 1970), or can be various combinations of serial and/or parallel architecture. Similarly, the architecture can use various combinations of analog digital, and hybrid arrangements to take advantage of the analog memory characteristics. The architecture can also use a cache memory for online rapid access to an offline slow access ROM. Further, programming can be modular in blocks that will fit into the cache or online memory. Also, separate subroutines can be loaded into one online memory and the executive program into another online memory, where a sequential executive can iterate through, branch through, etc the subroutines. A branching architecture can be used with a lookahead to the alternate branch point for more rapid access and reduced latency associated with the reduced access serial memory.

The Pico Computer may be the next generation processor having an improvement over the Micro Computer similar to the improvement that the Micro Computer has over the minicomputer. The Pico Computer can use the hybrid memory approach of patent application S/N 812,285 and parent and continuation applications therefrom for both ROM program memory and alterable or scratch pad memory. The Pico Computer can perform hybrid processing in addition to digital processing. Because it is so low in cost and has so much memory, the Pico Computer can operate slowly and can use an A/D and D/A converter. For example, a very low cost low speed processor with a low speed A/D converter can operate with a very low instruction execution time in the 100 microseconds or even the millisecond range for operator functions. It can also be implemented in a Touring machine manner (in the extreme) because memory is low in cost and speed is relatively unimportant. One embodiment of a low cost A/D ocnverter and D/A converter is disclosed in Pat. No. 4,016,540.

Use of the CTD analog ROM and analog scratch pad memory facilitates a new computer concept to take advantage of these features. One embodiment is a hybrid stored program computer. Other embodiments are also feasible. In the hybrid embodiment, information is stored in an analog ROM as constants and program instructions. A converter such an A/D converter converts an analog instruction to digital form for control purposes. Constants may be stored in the same analog ROM as program instructions or in a separate analog constant ROM. Constants can be used as operands in conjunction with analog operands or digital operands in an alterable scratch pad memory. Control operations such as transfers, data transfer enable, etc can be controlled with digital instructions derived from analog ROM stored instructions. Arithmetic and logical operations can be performed with analog and digital operands. For example, addition and subtraction can be performed by enabling two analog inputs to a differential amplifier and enabling the output to be stored in the alterable memory. Multiplication can be performed with a conventional analog multiplier, or in a hybrid form, by selecting an analog operand and a digital operand for multiplication with a multiplying D/A converter. Division can be performed by switching a multiplying D/A converter into the feedback loop of an implicit servo. Various analog functions such as algorithms, exponentials, etc can be implemented in analog, hybrid, and conventional form. I/O operations can be analog or digital. For example, analog instructions converted to digital form can control the gating of a particular record of analog stored samples from ROM to an I/O port to drive a speaker such as for voice synthesis. Alternately, an analog instruction from ROM converted to digital form can be used to control sampling of an input with a CCD alterable shift register for storing a record of sound samples for a sound actuated device.

One embodiment of the Pico Computer architecture can be characterized as a computer having an analog memory such as CCD analog ROM and a CCD analog scratch pad. For example, these analog memories can replace digital memories of digital computers such as Micro Computers. These memories can also be used in conventional analog and hybrid computer architectures. When combined with the instant memory technology such as the CCD analog ROM technology, stored program capability, etc; such prior art architectures take on a new characteristics. For example, the sound synthesis arrangement accessing a record of sound information from the analog ROM can use a stored program computer or a non-stored program computer and can use records of sound information stored in ROM.

Alternately, an analog stored program arrangement can use instructions stored in analog form and executed in analog form. For example, 16 different types of instructions can conventionally be selected with four digital bits and can be stored as a single analog signal and detected with a 16 level comparator to enable 16 different functions. Alternately, a scanning approach using a ramp such as disclosed in application S/N 366,714 and continuations therefrom can scan over different functions as the ramp progresses. When coincidence is achieved, the scan is stopped and the function is selected. Also, analog addressing of operands is feasible; where a shift register can be recirculated coincident with a ramp started at the beginning of a shift frame. When the ramp amplitude is coincident with an analog address parameter, a comparator output making a transition strobes a particular analog parameter from a shift register to buffer register. Therefore, analog stored program operations are feasible even without hybrid and digital mechanizations; but such analog operations can be used in conjunction with hybrid and digital mechanizations for various applications.

Analog Communciation

For the adaptive communication channel, a reference bit can be packed into a record of information, a group of analog samples can be transmitted across an interface which can be a data link to a peripheral, etc and the reference bit can be used to adaptively compensate for the analog information that is transmitted across the interface. In this form, an analog record can be transmitted to a group of remote peripherals on a shared analog bus, where the reference bits permit reestablishing the precise amplitude levels. A detector such as a comparator in each peripheral can be set for a particular threshold in each peripheral at the analog amplitude address for decoding the analog address to determine which peripheral receives the information.

A dual comparator approach may be used, bracketing an address so that if both comparators are zero set or both one set, the analog address is too high or low; but if one is zero set and the other is one set, then the address is proper. Such a dual comparator approach can use a simple logical exclusive-OR circuit on the output to detect the proper address and to enable loading of the subsequent record of information into that peripheral. In this arrangement, each record can be loaded into all peripherals prior to compensation and address determination. The first bits can be a preamble which can include first the reference bits which are then used to compensate the address bits and then to use the compensated address bits to determine if the following record is to be loaded or not. The peripheral can be an offline memory which can store analog information such as with an offline CCD disk memory replacement, signature memory operating with analog amplitude signatures, etc. Alternately, it can be an audio response device, an analog recording device, an analog tape recorder, or other analog peripheral.

In a voice synthesis system with multiple stations, each station can request a particular word. All words can be transmitted as multiplexed information on the same bus connecting all stations, where the stations look at the analog address signal and determine if that is the record of samples for its requested word. The record of information can be retrieved from the analog ROM and an address sample packed in for the particular terminal. Various methods can be used for assembling the record. The accessed record can have a reference bit for normalizing the amplitude address word in the central device, or the reference sample can be used to normalize the record. Another reference bit can be packed in the record for transmission and use at a remote terminal. Therefore, stored reference bits can be used to normalize external packed information or external reference bits can be used after stored information is normalized with a stored reference bit, or many other alternates can be used.

In the above multiple terminal multiplexed bus arrangement, a record can be transmitted having a full spoken word at high speed for buffering at a particular terminal. Alternately, different samples for different terminals can be multiplexed together so that the terminals don't have to have the buffering capability. For example, the central station can keep track of the address of the next sample for each terminal and, at the right time, can access the sample packed with a reference bit and an address bit for transmission to a terminal. This approach can reduce terminal complexity. The central unit can have a group of counters, one counter at each terminal, to keep track of the next sample. Alternately, the central unit can load records for each terminal into registers and can recirculate the registers and pickoff the next sample from each register for transmission. In an alternate embodiment, output words can have synchronized samples whether or not the start of the word is synchronized. Relative to synchronized samples, the central unit can transmit the sample for each of the terminals at a particular time, such as packed in a record; where the sample for a particular terminal is not explicitly address coded but occupies a particular bit position in the record of analog samples. The audio output might not be critical as to when the samples occur or when the word occurs. Requests for word samples can be used to assemble the analog samples for the word in the central unit. Transmission of samples can be synchronized as described above. The start sample for each word can be synchronized for convenience and simplicity.

The sound synthesis arrangement can also be used for a central computer in a home having many sound generating appliances and sources. Also, voice actuation can be used with multiple microphones. This approach can be called the analog multiplexed bus (AMB).

Multi-Microprocessor Architecture

As levels of integration get greater, multiple microprocessors can be put a on a single chip to enhance processing capability. An architecture will be provided for multi-microprocessors (MMPs) on the same chip. The various techniques will be discussed below.

One microprocessor can be an I/O microprocessor communicating with the outside world such as with serial channels, implemented on the same chip with the other micros. Alternately, all micros can communicate off the chip, where serial channels could be used to reduce pin count. A buffer or cache-type memory can be used to communicate with off-the-chip mass memory to load the on-chip buffer or cache memory for off-chip, or global, or other type memory used in conjunction with on-chip micros and on-chip memory.

Serial channels between micros may be designed for a non-bus-related arrangement and to minimize interconnections. If the system is properly partitioned, the communication on these channels can be minimized and serial channels through can be efficiently implemented, such as with a DMA or program controlled I/O architecture.

References

Technology associated with implementation of the system of the present invention is well known in the art such as with circuit design, logical design, and monolithic design. Further, prior art systems provide background for the system of the present invention. Still further, issued patents define well-known methods and arrangements. References are provided herein to prior art documents, systems, and patents; wherein the documents listed herein and documents listed therein are incorporated herein by reference.

Documents on circuit design include:
1. METHODS FOR SOLVING ENGINEERING PROBLEMS USING ANALOG COMPUTERS by Levine for McGraw Hill (1964);
2. ANALOG COMPUTERS by Korn and Korn; and
3. JUNCTION TRANSISTOR ELECTRONICS by Hurley for John Wiley & Sons (1958).

Documents on logical design include:
1. DIGITAL COMPUTER DESIGN FUNDAMENTALS by Chu for McGraw Hill (1962);
2. DIGITAL COMPUTER DESIGN by Brau for Academic Press (1963);

3. THE TTL DATA BOOK by Texas Instruments Inc (1973); and
4. DATA CATALOG 1977 by Intel Corp (1977).

Documents on CCDs include:
1. CHARGE-COUPLED DEVICES AND APPLICATIONS by Carnes and Kosonocky for Solid State Engineering Magazine (April 1974);
2. CHARGE-COUPLED SEMICONDUCTOR DEVICES by Boyle and Smith for the Bell System Technical Journal (1970); and
3. EXPERIMENTAL VERIFICATION OF THE CHARGE COUPLED DEVICE CONCEPT by Amelio for the Bell System Technical Journal (April 1970).

Documents on filtering include:
1. A CURRENT DISTRIBUTION FOR BROADSIDE ARRAYS WHICH OPTIMIZES THE RELATIONSHIP BETWEEN BEAM WIDTH AND SIDE-LOBE LEVEL by Dolph in the Proceedings of the IRE On Waves And Electronics (June 1946) and
2. THEORY AND APPLICATION OF DIGITAL SIGNAL PROCESSING by Rabiner and Gold for Prentice-Hall (1975).

Documents on programming include:
1. PROGRAMMING: AN INTRODUCTION TO COMPUTER LANGUAGES AND TECHNIQUES by Maurer for Holden Day Inc. (1968);
2. PROGRAMMING FOR DIGITAL COMPUTERS by Jeenel for McGraw Hill (1959); and
3. ELEMENTS OF COMPUTER PROGRAMMING by Swallow and Price for Holt, Rinehart, and Winston (1965).

Other documents include:
1. RCA Solid State '74 Databook series SSD-201B.

Disclosure Documents

The processor capability and applications thereof disclosed herein and in the referenced applications are supplemented by the disclosures filed in the Patent and Trademark Office under the Disclosure Document Program (MPEP 1706) in
(a) Disclosure Document No. 084,221 filed on Sept. 12, 1979;
(b) Disclosure Document No. 085,829 filed on Nov. 14, 1979; and
(c) Disclosure Document No. 087,707 filed on Jan. 28, 1980
which are herein incorporated by reference.

General Considerations

The system of the present invention is intended to be generally applicable to the fields of signal processing, data processing, and filtering. Although the present system may be described with a preferred embodiment such as a correlator digital filter in a geophysical application, descriptions are intended to be merely exemplary of the broad scope of the present invention. For example, the correlator processor is intended to generally exemplify digital filters or signal processing arrangements having broad scope. The geophysical application is intended to exemplify a broad range of signal processing and data processing applications including radar, underwater acoustics, medical diagnostics, equipment diagnostics, and a broad range of other applications. The discussions relative to a correlator data processor are intended to exemplify generalized data processing arrangements including a convolution processor, a deconvolution processor, and a Fourier transform processor.

A signal compensation arrangement using a reference signal has been described with reference to FIG. 9 in the embodiment of a memory system. It is herein intended that this memory system be exemplary of general signal compensation arrangements such as for telemetry systems, data acquisition systems, signal processing systems, and servo systems.

Memory and signal processing arrangements have herein been described in the embodiment of CCD arrangements. It is herein intended that these CCD arrangements be exemplary of general componentry such as biopolar, MOS, etc; various structures such as monolithic and discrete structures; and general technologies such as electronic, magnetostrictive, sonic, surface acoustic wave (SAW), magnetic, etc. For example, magnetic tape and disk, magnetostrictive, SAW, and other memory technologies conventionally store digital bits but can also store analog samples. Therefore, these conventional digital memory devices may be used as analog or hybrid memory devices in accordance with the teachings of the present invention as described for the preferred embodiment of a CCD analog or hybrid memory.

Refresh arrangements have been described in the embodiment of a memory system. It is herein intended that this refresh arrangement be exemplary of general signal processing arrangements.

A memory refresh arrangement has been described with a separate analog reference arrangement such as with the signals REF and GND (FIG. 9). Alternately, reference signals may be input as digital signals together with data signals 938C to logic 940 to generate input signals 938B to DAC 933 (FIG. 9C). For example, a digital scale factor signal and a digital bias signal may be multiplexed or combined with input signals 938C and subsequently stored in memory 932 as analog signals 949; where such digital input reference signals will be stored in memory 932 being degraded with errors of other circuits such as DAC 933; thereby permitting compensation of errors in addition to CCD memory errors.

Another feature of the present invention is the use of CCDs in a servo system such as use of the CCD arrangements of the present invention in the servo system of parent applications S/N 101,881; S/N 134,958; S/N 135,040; S/N 302,771.

The analog ROM of the present invention may be used in a hybrid memory arrangement or in an analog memory arrangement. A hybrid memory arrangement for storing digital information in analog form has been discussed with reference to FIG. 9. An analog memory arrangement may be used in an analog signal processor such as an analog beamformer or a correlator or may output analog signals to other devices such as outputting analog sound samples to a sound transducer. Such hybrid and analog arrangements may be operated under digital control such as with the arrangements discussed with reference to FIG. 9.

The arrangement of the present invention has been discussed for an embodiment using a specific reference signal. It is herein intened that this arrangement be exemplary of any arrangement that stores extra data, or redundant data, or other data for the purpose of error compensation, or error correction, or improved precision, or other related purposes.

For convenience of description, various arrangements such as a plurality of data processor arrangements have been described relative to the serial CCD memory arrangement of the present invention. It is herein intended that any reference to a serial memory shall exemplify a random access memory, a parallel memory, and any other type of architecture that may be implemented in accordance with the features of the present invention. It is further intended that any reference to a CCD memory exemplify other types of memories such as magnetostrictive delay line memories, magnetic memories, cryogenic memories, integrated circuit memories, optical memories or other types of memories that may be used in accordance with the teachings of the present invention.

In accordance with the memory arrangements of the present invention, a preferred embodiment may be implemented using the same technologies for implementing both memory and logic circuits. For example, CCD technology is a MOS FET technology and MOS FET computers are also well known in the art. Therefore, a CCD memory and a MOS FET data processor may be constructed using similar technologies on a single monolithic integrated circuit chip.

Components have been shown in the figures in simplified schematic form to more easily exemplify the present invention, wherein circuit design is a well-known art and wherein use of such components are well known in the art. Further, many alternate circuit embodiments and component types may be used to implement the discussed embodiments. For example, FETs 917 and 918 (FIG. 9A) can be implemented with any well-known switches including electronic switches such as FETs and bipolar transistors and even mechanical switches such as relays. Further, inproved capabilities may be obtained by higher levels of integration. For example, FETs 917 and 918 may be manufactured as part of CCD 920 (FIG. 9A) to provide the combined capabilities of demodulation, filtering, and multiplexing with monolithic circuits.

The system of the present invention is intended to have a broad scope wherein a memory and a signal processing system are intended to exemplify generalized arrangements for storing signals, processing signals and transferring signals; FFT and correlator processors are intended to exemplify generalized filtering or processing arrangements; and other such devices are intended to exemplify generalized arrangements.

The term signal is herein intended to include electrical signals, charge signals, current signals, acoustic signals, illumination signals, magnetostrictive signals, sonic signals, magnetic signals, and other known signals which may be sensed such as with a transducer and which may be processed such as with a filter.

The various features of the present invention have been discussed separately or in particular combinations for simplicity of presentation. Advantages may be obtained by combining or recombining various separately described features or combined features respectively of the present invention. Therefore, it is herein intended that features of the present invention that may be described separately or in particular combinations may be grouped together and recombined in different combinations. For example, many features discussed independently may be compatible and may be used in combination theretogether in alternate embodiments or in preferred embodiments. It is herein intended that the various features discussed herein and the features incorporated by reference herein be usable in combinations to provide still further advantages. For example, the arrangements shown in FIG. 1, FIG. 6A, FIG. 9E, FIG. 9F, and FIG. 9K do not have A/D or D/A converters such as shown in FIG. 9C; wherein it is herein intended that these arrangements be usable with D/A converters and A/D converters as illustrated in FIG. 9C such as to implement the hybrid memory arrangement of the present invention. Further, analog memory arrangements such as shown in FIG. 1, FIG. 6A, FIG. 9A, FIG. 9B, FIG. 9C, and FIG. 9E do not have refresh circuits; wherein it is herein intended that the refresh arrangement of the present invention such as discussed with reference to FIGS. 9C, 9D, and 9F-9T and refresh arrangements knwon in the prior art be usable with the other arrangements of the present invention such as those discussed with reference to FIG. 1, FIG. 6A, FIG. 9A, FIG. 9B, and FIG. 9E.

Figure 4:
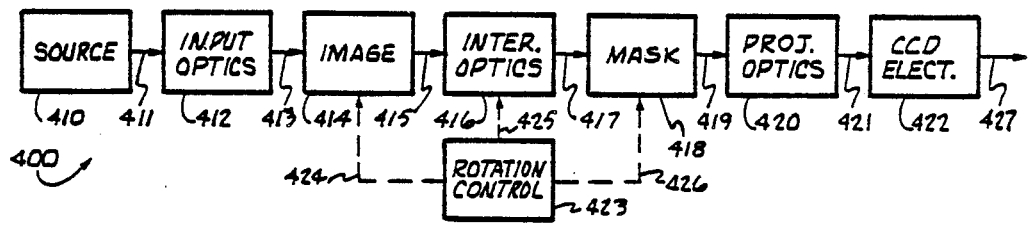
FIG. 4 comprises an optical filter embodiment in accordance with the memory arrangements of FIGS. 1 and 2A of the present invention.

A pattern recognition or correlator arrangement is discussed herein with reference to FIGS. 2A and 4. Another application of this arrangement may be a money changer such as a coin changer or bill changer. For example, the image of a bill may be projected on a CCD array using well-known projection arrangements such as opaque projector arrangements to provide pattern recognition capability.

The analog ROM arrangement discussed with reference to FIGS. 1 and 2 provides shifting of charge signals that are accumulated on large electrodes through smaller electrodes such as discussed with reference to FIG. 2C. An alternate embodiment for implementing such an arrangement would be to accumulate charge in response to a first excitation signal and to shift charge in response to a second excitation signal, wherein the second excitation signal is larger that the first excitation signal. As is well known in the capacitor art, charge accumulation capability is a function of the size of capacitor electrodes, distance between electrodes, and excitation voltage magnitude. Therefore, more charge may be accommodated on capacitor electrodes in response to greater excitation voltages; wherein charge accumulated on larger electrodes in response to a lower accumulation voltage may then be shifted through smaller electrodes with greater excitation voltage. One guideline might be that the charge handling capacity of the largest electrode when excited with the charge accumulation voltage (lower voltage) must not be greater than the charge handling capacity of the smallest electrode when excited with the charge shifting voltage (higher voltage). The two voltage levels may be adjusted to accomplish this guideline.

Many of the circuit combinations set forth herein are unique and distinguish over the art. For example, use of a sample-and-hold circuit in combination with an analog memory such as a CCD memory or a bubble memory provides important distinctions over prior art systems.

An alterable CCD memory and other monolithic memories are typically volatile memories, wherein stored information is typically destroyed when power is removed. In accordance with another feature of the present invention, a battery arrangement may be provided to preserve stored information during power removal. A battery may be connected in parallel with an electronic regulator and may be isolated therefrom with diode isolation. Therefore, when the electronic regulator does not supply power, the battery will automatically supply power through the isolation diodes. The battery may be charged from a battery charger when power is being supplied. Alternately, a battery may be connected across an electronic regulator for charging when the regulator is supplying power to the system and for supplying power to the system when the regulator is inoperable.

The analog refresh arrangement of the present invention has been discussed with reference to FIG. 9 using an implicit servo. Such an implicit servo is exemplary of other arrangements such as other servos, automatic gain control (AGC), etc and many related control arrangements that are well known in the art. In one alternate embodiment, a scale factor reference signal stored in a sample-and-hold circuit such as circuit 961B can be summed (or differenced) as signal 962B through resistor R2 with a scale factor reference signal through resistor R1 to generate a scale factor error signal 978. The scale factor error signal can be used to adjust the gain of an amplifier that amplifies memory output signal 936 to adjust the stored reference signal 962B (and therefore the stored data signals) to equal the scale factor reference signal to resistor R1. Adjustment can be provided with a voltage controlled amplifier such as circuit 963 (FIG. 9H) or such as a well-known AGC circuit. In this embodiment, a differential amplifier such as amplifier 977 and resistors R1 to R3 can be inserted inbetween sample-and-hold 961 and voltage controlled amplifier 963 in signal line 962 (FIG. 9H) to subtract sampled signal 962 from sample-and-hold circuit 961 with a scale factor reference signal for controlling the gain of amplifier 963 with the error or difference signal to input $I_{ABC}$ (FIG. 9H). Other servo and signal control arrangements will now become obvious to one skilled in the art from the teachings herein.

The preferred embodiment of the present invention is directed to charge transfer devices (CTDs) such as charge coupled devices (CCDs) and bucket brigade devices (BBDs) and is also intended to include signal transfer devices (STDs) such as CCD type STDs and various sample and hold and capacitative STDs. Alternate embodiments include non CTD, CCD, BBD, STD, etc circuits such as magnetictostrictive delay lines, etc and non-memory circuits such as for illumination control, communications, etc. Any reference to any one of these embodiments, components, etc is herein intended to be illustrative of all of the others.

The embodiments discussed above can utilize other features that may provide advantages in certain applications. These features are discussed below.

An arrangement has been discussed herein using a clock pulse generator generating clock signals for exciting electrodes and for shifting stored signals between electrodes. In one embodiment, a multi-level or multi-amplitude clock signal can provide advantages. This multi-level clock signal can have a plurality of levels such as a first and a second level, a first level through a fifth level, etc. Multi-level clock signals can be used for various control and operational functions. Use of multi-level clock signals will now be discussed with reference to FIG. 2A as illustrative of the general characteristic of this invention feature. As discussed above, charge may be accumulated on electrodes 210, 213, 216 and 219; where the amount of charge accumulation is related to the dimension of the electrode. After charge is accumulated, it can be shifted through the plurality of electrodes in accordance with operation of such serial memories. As discussed herein, a relatively large amount of charge such as accumulated on one electrode is shifted through a relatively small electrode. In order to reduce saturation of electrodes and the resultant determinental effects to the signals, a multi-level clock pulse signal can be used, as discussed below. A first clock amplitude can be used for charging the electrodes and a second clock amplitude can be used for shifting the charge between electrodes. The charging amplitude can be less than the shifting amplitude, where the greater the amplitude the greater the ability for an electrode to maintain charge. Therefore, charge accumulated at a lower charging amplitude can more readily be shifted through a smaller electrode without saturating by using a higher amplitude shift clock pulse. Therefore, in accordance with another embodiment of the present invention; a plurality of clock amplitudes can be used, where a clock having a lower amplitude is used for charging and a clock having a higher amplitude is used for shifting. Such an approach may be adapted to a magnetic bubble memory using amplitudes of magnetic flux or electrode excitation to provide the multiple amplitude control signal capability.

The arrangements discussed herein have been discussed primarily relative to a serial CCD memory as illustrative of other memories such as serial CTD memories, serial magnetic, bubble memories, parallel CCD memories, and many other types of memories. In particular, it is herein intended that the methods and arrangements discussed for serial memories also be useable for parallel memories, random access memories, and other memories. Similarly, the discussions herein relative to CCD memories, magnetic bubble memories, and other memories be useable with other memories such as other CDT memories including bucket brigade devices (BBDs); other magnetic memories such as magnetic disk and tape memories; and still other types of memories.

The computer discussed in parent application S/N 101,881 includes an arrangement for refreshing of memories under control of the computer, which is claimed in divisional application therefrom S/N 402,520. It is herein intended that the refresh inventive features of said application S/N 101,881 may be used in combination with the refreshable memories and memory features disclosed in the instant application and the parent applications. For example, a refreshable CCD memory may be used as a scratch pad memory for a stored program computer and may have a refresh operation that is synchronized with a computer, as discussed in said parent application S/N 101,881 and may be refreshed in accordance with the disclosure in parent applications S/N 490,816; S/N 522,559; S/N 550,231; S/N 812,285; S/N 844,765; and S/N 889,301.

Another illustrative embodiment of the memory arrangement of the present invention is in the embodiment of a refresh memory for a CRT. An electrostatic deflection CRT typically has three input ports; being the X deflection plates, the Y deflection plates, and the intensity controller. A multiplexed analog memory or separate memories can be used to apply analog voltages to the three CRT ports. For example, three separate memories can be recirculated in synchronziation to repetively apply the stored information to the three ports. The information can be stored in random access form, where the X and Y deflection plate signals represent a two dimensional address of a point on the CRT face and the intensity signal amplitude signal represents the intensity of tht point. Therefore, refresh may be on a sequential basis such as a line-by-line scan as is used in conventional television systems or other types of sequential scans such as a Palmer scan as are well known in the art. Alternately, random access refresh may be provided on the basis where the CRT is refreshed by positioning the electron beam to points that are randomly selected, as contrasted to sequentially selected points. The use of the analog memory refresh provides significant advantages for a CRT display such as low cost and simplified circuitry. The features of a refreshable memory as described herein and in the parent applications and a refreshable display yield important advantages such as low cost and simple circuitry.

Another exemplary inventive feature is use of the refreshable memory or analog memory features of the present invention and the parent memory-related applications with display arrangements of the display-related parent applications. For example, an analog CCD memory used in combination with an analog liquid crystal display (LCD) as discussed in parent and related applications S/N 366,714; S/N 727,330; S/N 730,756; S/N 860,278; S/N 874,444; and S/N 874,445 which may be refreshed as discussed in parent applications S/N 490,816; S/N 522,559; S/N 550,231; S/N 812,285; S/N 844,765; and S/N 889,301. Therefore, an analog memory having memory refresh may be used in combination with an analog display having display refresh.

From the above description it will be apparent that there is thus provided a device of the character described posessing the particular features of advantage before enumerated as desireable, but which obviously is susceptible to modification it it's form, method, mechanization, operation, detailed construction and arrangement of parts without departing from the principles involved or sacrificing any of its advantages.

While in order to comply with the statute, the invention has been described in language more or less specific as to structural features, it is to be understood that the invention is not limited to the specific features shown, but that the means, method, and construction herein disclosed comprise the preferred form of several modes of putting the invention into effect, and the invention is, therefore, claimed in any of its forms or modifications within the legitimate and valid scope of the appended claims.

What I claim is:

1. A hybrid memory system for storing digital information in analog signal form, said system comprising:
    shiftable memory means for storing a plurality of analog signals;
    shifting means for shifting the stored analog signals; and
    converter means for generating digital output signals in response to the stored analog signals.

2. The system as set forth in claim 1 above, wherein said memory means includes a charge transfer device for storing the plurality of analog signals.

3. The system as set forth in clain 1 above, wherein said memory means includes a magnetic disk memory for storing the plurality of analog signals.

4. The system as set forth in claim 1 above, wherein said memory means includes a magnetic bubble memory for storing the plurality of analog signals.

5. A hybrid memory system for storing digital information in analog signal form, said system comprising:
    memory means for storing a plurality of analog signals;
    shifting means for shifting the stored analog signals;
    a refresh circuit for refreshing the stored analog signals; and
    converter means for generating digital output signals in response to the stored analog signals.

6. A hybrid memory system for storing digital information in analog signal form, said system comprising:
    charge memory means for storing a plurality of multiple state charge signals having an information content related to the signal state;
    means for refreshing the stored multiple state charge signals to reduce amplitude degradation;
    shifting means for shifting the stored multiple state charge signals; and
    converter means for generating digital output signals in response to the stored multiple state charge signals.

7. A memory system comprising:
    input means for generating a digital input signal;
    means for generating an analog signal in response to the digital input signal;
    memory means for storing the analog signal generated with said generating means;
    means for shifting the stored analog signal; and
    converter means for generating a digital output signal in response to the stored analog signal.

8. A memory system comprising:
    input means for generating a digital input signal;
    means for generating an analog signal in response to the digital input signal;
    memory means for storing the analog signal generated with said generating means;
    means for shifting the stored analog signal;
    converter means for generating a digital output signal in response to the stored analog signal;
    refresh means for generating a reference signal in response to the analog signal stored in said memory means; and
    means for reducing amplitude degradation of the analog signal stored in said memory means in response to the reference signal.

9. The system as set forth in claim 7 above, wherein said memory means includes a read only memory for storing the analog signal.

10. The system as set forth in claim 7 above, wherein said stored analog signals are multiple state signals having an information content related to the signal state and wherein said memory means includes charge means for storing the multiple state signals as multiple state charge signals: said system further comprising means for refreshing the stored multiple state signals to reduce charge leakage degradation.

11. A memory system comprising:
    digital means for generating at least one digital input signal;
    means for generating analog signals in response to the digital input signal;
    memory means for storing a plurality of the analog signals;
    shifting means for shifting the stored analog signals; and
    converter means for generating digital output signals in response to the stored analog signals.

12. A memory system for storing analog information in response to digital input information, said system comprising:
    memory means for storing information, said memory means including
    (a) means for storing a plurality of analog signals and
    (b) means for shifting the stored analog signals, wherein the shifting of the stored analog signals degrades the stored analog signals; and means for refreshing the degraded analog signals.

13. The memory system as set forth in claim 12 above, further comprising means for generating the analog signals stored in said memory means in response to a digital input signal and means for generating a digital output signal in response to refreshed analog signals.

14. A memory system for storing analog information in response to digital input information, said system comprising:
means for generating digital input information;
means for generating analog signals in response to the digital input information;
memory means for storing information, said memory means including
(a) means for storing the analog signals and
(b) means for shifting the stored analog signals, wherein the shifting of the stored analog signals degrades the stored analog signals; and
means for refreshing the degraded analog signals.

15. A memory system for storing analog information, said system comprising:
memory means for storing information, said memory means including
(a) means for storing a plurality of analog signals and
(b) means for shifting the stored analog signals, wherein the shifting of the stored analog signals degrades the stored analog signals;
means for refreshing the degraded analog signals; and
means for generating a digital output signal in response to the stored analog signals.

16. A memory system comprising:
memory means for storing a plurality of analog signals wherein the storing of the analog signals degrades the stored analog signals; and
means for refreshing the degraded analog signals.

17. A hybrid memory system for storing digital information in analog signal form, said system comprising:
shiftable memory means for storing a plurality of analog signals, wherein the plurality of analog signals stored in said memory means includes a stored program;
shifting means for shifting the stored analog signals;
converter means for generating digital output signals in response to the stored analog signals, wherein the digital output signals from said converter means include stored program digital output signals; and
a stored program digital computer for processing digital information under control of the stored program digital output signals.

18. The system as set forth in claim 1 above, further comprising a digital processor for processing digital information in response to the digital output signals from said converter means and an analog input circuit for generating analog signals in response to the processed digital information from said digital processor means, wherein said memory means includes means for storing the plurality of analog signals in response to the analog signals from said analog input circuit.

19. The system as set forth in claim 1 above, further comprising digital data processor means for generating the digital information to be stored in said memory means in analog signal form in response to processing of the digital output signals.

20. The system as set forth in claim 7 above, wherein said analog signal generating means includes a digital to analog converter for generating analog signals to be stored in said analog memory in response to the digital input signal generated with said input means.

21. The system as set forth in claim 7 above, further comprising a stored program digital computer operating in response to a stored program, wherein the analog signal stored in said memory means includes a stored program for said operating of said digital computer.

22. The system as set forth in claim 7 above, wherein said memory means includes an analog read only memory for storing the analog signals.

23. The system as set forth in claim 7 above, wherein said memory means is a charge transfer device memory for storing the analog signal as a charge signal.

24. The system as set forth in claim 7 above, wherein said memory means is an analog magnetic bubble memory for storing the analog signal in magnetic bubble signal form.

25. The system as set forth in claim 7 above, wherein said memory means is a magnetostrictive delay line memory for storing the analog signal as a magnetostrictive signal.

26. A memory system comprising:
input means for generating a digital input signal;
means for generating an analog signal in response to the digital input signal;
memory means for storing the analog signal generated with said generating means, wherein said memory means includes means for shifting the stored analog signal and wherein the shifting of the stored analog signal degrades the stored analog signal;
means for refreshing the degraded analog signal degraded by the shifting, said refreshing means including
(a) means for generating an analog reference signal in response to the stored analog signal and
(b) means for performing the refreshing in response to the analog reference signal; and
converter means for generating a digital output signal in response to the stored analog signal.

27. A memory system comprising:
input means for generating a digital input signal;
means for generating an analog signal in response to the digital input signal;
memory means for storing the analog signal generated with said generating means;
means for shifting the stored analog signal;
converter means for generating a digital output signal in response to the stored analog signal; and
means for generating a reference signal in response to the stored analog signal from said memory means and means for reducing amplitude degradation of the stored analog signal in response to the reference signal.

28. A memory system comprising:
digital means for generating at least one digital input signal;
means for generating analog signals in response to the digital input signal;
memory means for storing a plurality of the analog signals;
shifting means for shifting the stored analog signals;
refresh means for reducing amplitude degradation of the stored analog signals; and
converter means for generating digital output signals in response to the stored analog signals.

29. A memory system comprising:

digital means for generating at least one digital input signal;

means for generating analog signals in response to the digital input signal;

memory means for storing a plurality of the analog signals;

shifting means for shifting the stored analog signals;

refresh means for reducing amplitude gradation of the stored analog signals, wherein said refresh means includes means for generating a digital number in response to at least one of the analog signals stored in said memory means, means for correcting the digital number to compensate for the signal degradation, and means for generating a corrected analog signal in response to the corrected digital number; and converter means for generating digital output signals in response to the stored analog signals.

30. The system as set forth in claim 11 above, further comprising a digital processor for processing digital signals in response to the digital output signals generated with said converter means and means for storing analog signals in said memory means in response to the processing of digital signals with said processor means.

31. A memory system comprising:

digital means for generating at least one digital input signal;

means for generating analog signals in response to the digital input signal;

memory means for storing a plurality of the analog signals;

shifting means for shifting the stored analog signals;

refresh means for reducing amplitude degradation of the stored analog signals, wherein said refresh means includes (a) means for generating a reference signal in response to at least one of the stored analog signals from said memory means and (b) means for reducing amplitude degradation of the stored analog signals in response to the reference signal; and converter means for generating digital output signals in response to the stored analog signals.

32. The system as set forth in claim 11 above, wherein said memory means includes a read only memory for storing the analog signals.

33. The system as set forth in claim 11 above, further comprising a stored program digital computer for processing information under control of a stored program, wherein the analog signals stored in said memory means include analog stored program signals for control of said digital computer.

34. A memory system comprising:

digital means for generating at least one digital input signal;

means for generating analog signals in response to the digital input signal;

memory means for storing a plurality of the analog signals;

shifting means for shifting the stored analog signals;

converter means for generating digital output signals in response to the stored analog signals; and a digital processor for processing digital information in response to the digital output signals from said converter means.

35. The system as set forth in claim 11 above, further comprising a digital processor for processing digital information and an analog memory input circuit for generating an analog input signal in response to the processed digital information from said digital processor; wherein said memory means includes means for storing the plurality of analog signals in response to the analog input signal from said analog input circuit.

* * * * *